(12) United States Patent
Arayama et al.

(10) Patent No.: US 10,287,422 B2
(45) Date of Patent: May 14, 2019

(54) DISPERSION COMPOSITION, CURABLE COMPOSITION USING THE SAME, TRANSPARENT FILM, MICROLENS, AND SOLID-STATE IMAGING DEVICE

(71) Applicants: Kyouhei Arayama, Shizuoka (JP); Hiroaki Idei, Shizuoka (JP); Makoto Kubota, Shizuoka (JP); Hideki Takakuwa, Shizuoka (JP)

(72) Inventors: Kyouhei Arayama, Shizuoka (JP); Hiroaki Idei, Shizuoka (JP); Makoto Kubota, Shizuoka (JP); Hideki Takakuwa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 79 days.

(21) Appl. No.: 15/229,397

(22) Filed: Aug. 5, 2016

(65) Prior Publication Data
US 2017/0029599 A1   Feb. 2, 2017

Related U.S. Application Data

(63) Continuation of application No. 14/632,329, filed on Feb. 26, 2015, which is a continuation of application No. PCT/JP2013/073229, filed on Aug. 29, 2013.

(30) Foreign Application Priority Data

Aug. 31, 2012  (JP) ................... 2012-192559
Feb. 13, 2013  (JP) ................... 2013-026068

(51) Int. Cl.
| | | |
|---|---|---|
| C08K 9/04 | (2006.01) |
| C08L 101/02 | (2006.01) |
| C08L 81/02 | (2006.01) |
| C09D 4/00 | (2006.01) |
| C08G 59/18 | (2006.01) |
| C08G 65/18 | (2006.01) |
| C09D 201/02 | (2006.01) |
| G02B 1/04 | (2006.01) |
| C08K 3/22 | (2006.01) |
| C09D 133/10 | (2006.01) |
| C09D 201/08 | (2006.01) |
| G03F 7/00 | (2006.01) |
| G03F 7/004 | (2006.01) |
| G03F 7/031 | (2006.01) |
| G03F 7/038 | (2006.01) |
| G03F 7/105 | (2006.01) |
| C08L 63/00 | (2006.01) |
| C08F 22/02 | (2006.01) |
| C09D 135/00 | (2006.01) |
| C09D 7/45 | (2018.01) |
| C08K 3/36 | (2006.01) |
| C08K 9/08 | (2006.01) |

(52) U.S. Cl.
CPC .............. *C08K 9/04* (2013.01); *C08F 22/02* (2013.01); *C08G 59/18* (2013.01); *C08G 65/18* (2013.01); *C08K 3/22* (2013.01); *C08L 63/00* (2013.01); *C08L 81/02* (2013.01); *C08L 101/02* (2013.01); *C09D 4/00* (2013.01); *C09D 7/45* (2018.01); *C09D 133/10* (2013.01); *C09D 135/00* (2013.01); *C09D 201/02* (2013.01); *C09D 201/08* (2013.01); *G02B 1/04* (2013.01); *G02B 1/041* (2013.01); *G03F 7/0007* (2013.01); *G03F 7/0047* (2013.01); *G03F 7/031* (2013.01); *G03F 7/038* (2013.01); *G03F 7/105* (2013.01); *C08K 3/36* (2013.01); *C08K 9/08* (2013.01); *C08K 2003/2241* (2013.01)

(58) Field of Classification Search
CPC .. C08K 9/04; C08K 3/22; C08F 22/02; C08G 65/18; C08L 63/00; C08L 81/02; C08L 101/02
USPC ................................... 524/556, 430
See application file for complete search history.

(56) References Cited

U.S. PATENT DOCUMENTS

| | | | | |
|---|---|---|---|---|
| 5,654,090 A | * | 8/1997 | Kayanoki | ............ C08K 3/22 351/159.57 |
| 2008/0241485 A1 | * | 10/2008 | Shimohara | ........... C09D 11/101 428/195.1 |
| 2009/0041500 A1 | * | 2/2009 | Mitsumori | ........... G03G 9/0819 399/159 |
| 2009/0068575 A1 | | 3/2009 | Fujimaki et al. | |
| 2009/0291236 A1 | * | 11/2009 | Sasada | ................. B22F 1/0059 428/1.1 |
| 2010/0104842 A1 | * | 4/2010 | Suzuki | ................ C08K 3/0008 428/220 |
| 2010/0233595 A1 | | 9/2010 | Takahashi et al. | |
| 2012/0257283 A1 | | 10/2012 | Maruyama et al. | |
| 2014/0175348 A1 | | 6/2014 | Takahashi et al. | |

FOREIGN PATENT DOCUMENTS

| | | | |
|---|---|---|---|
| CN | 101154038 A | | 4/2008 |
| CN | 101405310 A | | 4/2009 |
| JP | 2007-112884 A | | 5/2007 |
| JP | 2007112884 A | * | 5/2007 |
| JP | 2007-277514 A | | 10/2007 |
| JP | 2008-94938 A | | 4/2008 |

(Continued)

*Primary Examiner* — Kelechi C Egwim
(74) *Attorney, Agent, or Firm* — Sughrue Mion, PLLC

(57) ABSTRACT

There is provided a dispersion composition capable of forming a film being excellent in surface conditions, the dispersion composition containing metal oxide particles (A) having a primary particle diameter of 1 nm to 100 nm, a polymer compound (B) having an acid value of less than 120 mgKOH/g, which is represented by the following Formula (1), and a solvent (C).

$$(A^1 - R^2)_n - R^1 - (P^1)_m \quad \text{Formula (1)}$$

22 Claims, 2 Drawing Sheets

(56) References Cited

FOREIGN PATENT DOCUMENTS

| | | | |
|---|---|---|---|
| JP | 2008-94939 A | | 4/2008 |
| JP | 2008088272 A | * | 4/2008 |
| JP | 2008-185683 A | | 8/2008 |
| JP | 2008-239923 A | | 10/2008 |
| JP | 2009-79148 A | | 4/2009 |
| JP | 2009-179678 A | | 8/2009 |
| JP | 2011-127096 A | | 6/2011 |
| JP | 2012-82294 A | | 4/2012 |
| JP | 2012-251125 A | | 12/2012 |
| TW | 201125880 A1 | | 8/2011 |
| WO | 2008/120811 A1 | | 10/2008 |
| WO | 2012/153826 A1 | | 11/2012 |

* cited by examiner

DISPERSION COMPOSITION, CURABLE COMPOSITION USING THE SAME, TRANSPARENT FILM, MICROLENS, AND SOLID-STATE IMAGING DEVICE

CROSS REFERENCE TO RELATED APPLICATION

This is a Continuation application of U.S. application Ser. No. 14/632,329 filed Feb. 26, 2015, which is a continuation of International Application No. PCT/JP2013/073229 filed on Aug. 29, 2013, and claims priority from Japanese Patent Application Nos. 2012-192559 filed on Aug. 31, 2012, and 2013-026068 filed on Feb. 13, 2013, the entire disclosures of which are incorporated herein by reference.

TECHNICAL FIELD

The present invention relates to a dispersion composition, a curable composition using the same, a transparent film, a microlens, and a solid-state imaging device.

BACKGROUND ART

As the use of optical wiring which replaces a microlens or copper wiring used in an image formation optical system of an on-chip color filter, such as an electronic copying machine and a solid-state imaging device, a composition for forming a transparent member is required, which has a high refractive index and is able to form a micro transparent film, transparent wiring and the like.

In particular, a microlens used in a solid-state imaging device has been required to be more miniaturized as the miniaturization of the solid-state imaging device proceeds, and simultaneously to have a high refractive index in order to achieve more effective light focusing. For example, a composition for forming a microlens having a high refractive index or for forming a solid-state imaging device, using silica-coated titanium oxide particles, is disclosed (for example, see Patent Documents 1 and 2). In particular, recently, as a resolution becomes higher, the size of a pixel is accordingly very small, and thus it has been required to collect light more efficiently. For this reason, a microlens having a higher refractive index is required. Further, in order to make more devices in one manufacturing process, the size of a wafer used is increasing, and in that case, coated surface conditions tend to deteriorate.

Meanwhile, Patent Document 3 discloses a dispersion resin having a specific structure, which may enhance dispersibility of an organic pigment for the use of a color filter. In addition, Patent Document 4 discloses a composition for forming a material having a high refractive index, which contains the dispersion resin having a specific structure together with inorganic particles.

CITATION LIST

Patent Document

Patent Document 1: Japanese Patent Application Laid-Open No. 2009-179678
Patent Document 2: Japanese Patent Application Laid-Open No. 2008-185683
Patent Document 3: Japanese Patent Application Laid-Open No. 2007-277514
Patent Document 4: Japanese Patent Application Laid-Open No. 2008-239923

SUMMARY OF INVENTION

Problems to be Solved

However, the composition for forming a material having a high refractive index as described above had a problem in that coated surface conditions deteriorate, such as the generation of uneven portions on the film surface after the composition is applied on a substrate and the like.

As a result of intensive studies, the present inventors have found that the coated surface conditions deteriorate because when the acid value of a dispersion resin as described above is high (for example, an acid value of 120 mgKOH/g or more), the acid groups of the dispersion resin are aggregated with each other, and a phase separation occurs between inorganic particles and the dispersion resin.

The present invention has been made in consideration of the aforementioned circumstances, and an object of the present invention is to provide a dispersion composition which has a high refractive index and is has excellent surface conditions of a film surface after coating, a curable composition using the same, a transparent film, a microlens, and a solid-state imaging device.

Means for Solving the Problems

Specific means for solving the problems are as follows.
<1> A dispersion composition containing a metal oxide particle (A) having a primary particle diameter of 1 nm to 100 nm, a polymer compound (B) having an acid value of less than 120 mgKOH/g, which is represented by the following Formula (1), and a solvent (C).

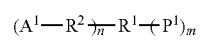

Formula (1)

In Formula (1),
$R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a phenol group, an alkyl group, an aryl group, a group having an alkyleneoxy chain, an imide group, an alkyloxycarbonyl group, an alkyl amino carbonyl group, a carboxylate group, a sulfonamide group, a heterocyclic group, an alkoxysilyl group, an epoxy group, an isocyanate group, and a hydroxyl group. n $A^1$'s and n $R^2$'s may be the same or different.

m represents a positive number of 8 or less, n represents 1 to 9, and m+n satisfies 3 to 10.

$P^1$ represents a polymer chain. m $P^1$'s may be the same or different.

<2> The dispersion composition described in <1>, in which the polymer compound (B) has a weight average molecular weight of 5,000 to 8,000.

<3> The dispersion composition described in <1> or <2>, in which the polymer compound (B) has an acid value of 70 to 90 mgKOH/g.

<4> The dispersion composition described in any one of <1> to <3>, in which a content of the metal oxide particles (A) is 65% by mass or more with respect to a total solid content of the dispersion composition.

<5> The dispersion composition described in any one of <1> to <4>, in which the polymer compound (B) is a polymer compound represented by the following Formula (2).

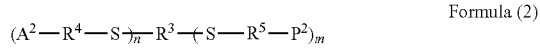

In Formula (2), $R^3$ represents a (m+n)-valent linking group, and $R^4$ and $R^5$ each independently represent a single bond or a divalent linking group. $A^2$ represents a monovalent substituent having at least one group selected from the group consisting of an acid group, a urea group, a urethane group, a group having a coordinating oxygen atom, a group having a basic nitrogen atom, a phenol group, an alkyl group, an aryl group, a group having an alkyleneoxy chain, an imide group, an alkyloxycarbonyl group, an alkyl amino carbonyl group, a carboxylate group, a sulfonamide group, a heterocyclic group, an alkoxysilyl group, an epoxy group, an isocyanate group, and a hydroxyl group. n $A^2$'s and n $R^4$'s may be the same or different. m represents a positive number of 8 or less, n represents 1 to 9, and m+n satisfies 3 to 10.

$P^2$ represents a polymer chain. m $P^2$'s and m $R^5$'s may be the same or different.

<6> The dispersion composition described in any one of <1> to <5>, in which $A^1$ in Formula (1) or $A^2$ in Formula (2) is a monovalent substituent having at least one group selected from the group consisting of an acid group, a phenol group, an alkyl group, an aryl group, a group having an alkyleneoxy chain, a hydroxyl group, a urea group, a urethane group, a sulfonamide group, an imide group, and a group having a coordinating oxygen atom.

<7> The dispersion composition described in any one of <1> to <5>, in which $A^1$ in Formula (1) or $A^2$ in Formula (2) is a monovalent substituent having at least one functional group with a pKa of 5 or more.

<8> The dispersion composition described in <7>, in which the functional group with a pKa of 5 or more is a group having a coordinating oxygen atom, a group having a basic nitrogen atom, a phenol group, a urea group, a urethane group, an alkyl group, an aryl group, an alkyloxycarbonyl group, an alkyl amino carbonyl group, a group having an alkyleneoxy chain, an imide group, a carboxylate group, a sulfonamide group, a hydroxyl group or a heterocyclic group.

<9> The dispersion composition described in any one of <1> to <8>, in which the polymer chain represented by $P^1$ or $P^2$ is a polymer chain derived from at least one selected from a polymer or copolymer of vinyl monomers, an ester-based polymer, an ether-based polymer, a urethane-based polymer, an amide-based polymer, an epoxy-based polymer, a silicone-based polymer and a modified product or copolymer thereof.

<10> The dispersion composition described in any one of <1> to <9>, in which the polymer chain represented by $P^1$ or $P^2$ contains at least one repeating unit, and the repeating number k of at least one repeating unit is 3 to 60.

<11> The dispersion composition described in any one of <1> to <10>, in which $R^1$ in Formula (1) or $R^3$ in Formula (2) is a group represented by any one of the following Formulae.

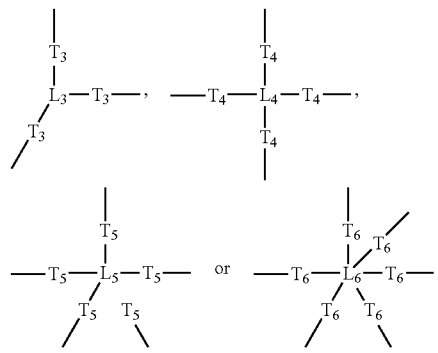

In the Formulae, $L_3$ represents a trivalent group. $T_3$ represents a single bond or a divalent linking group, and the three $T_3$'s may be the same or different.

$L_4$ represents a tetravalent group. $T_4$ represents a single bond or a divalent linking group, and the four $T_4$'s may be the same or different.

$L_5$ represents a pentavalent group. $T_5$ represents a single bond or a divalent linking group, and the five $T_5$'s may be the same or different.

$L_6$ represents a hexavalent group. $T_6$ represents a single bond or a divalent linking group, and the six $T_6$'s may be the same or different.

<12> The dispersion composition described in any one of <1> to <11>, in which the polymer compound (B) is a polymer compound represented by the following Formula (5).

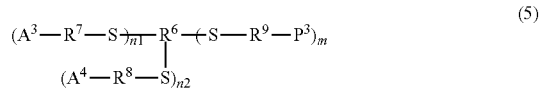

In Formula (5), $R^6$ represents a (m+n1+n2)-valent linking group, and $R^7$ to $R^9$ each independently represent a single bond or a divalent linking group.

$A^3$ represents a monovalent substituent having at least one acid group. $A^4$ represents a monovalent substituent different from $A^3$. n1 $A^3$'s and n1 $R^7$'s may be the same or different. n2 $A^4$'s and n2 $R^8$'s may be the same or different. m represents a positive number of 8 or less, n1 represents 1 to 8, n2 represents 1 to 8, and m+n1+n2 satisfies 3 to 10.

$P^3$ represents a polymer chain. m $P^3$'s and m $R^9$'s may be the same or different.

<13> A curable composition including the dispersion composition described in any one of <1> to <12>, and a polymerizable compound (D).

<14> The curable composition described in <13>, in which the polymerizable compound (D) is at least one selected from the group consisting of a compound having two or more epoxy groups or oxetanyl groups and a compound having two or more terminal ethylenically unsaturated bonds, in a molecule thereof.

<15> The curable composition described in <13> or <14>, further containing at least one selected from the group consisting of a polymerization initiator (E) and a binder polymer.

<16> The curable composition described in <15>, wherein the polymerization initiator (E) is an oxime-based polymerization initiator.

<17> The curable composition described in any one of <13> to <16>, in which the composition is for forming a microlens or for forming an undercoat film of a color filter.

<18> A transparent film formed by using the curable composition described in any one of <13> to <17>.

<19> A microlens formed by using the transparent film obtained by the curable composition described in <17>.

<20> A solid-state imaging device having the microlens described in <19>.

<21> A method for preparing the dispersion composition described in any one of <1> to <12>.

It is also preferred that the present invention has the following configuration.

<22> A method for manufacturing a transparent film, including: a process of coating the curable composition described in any one of <13> to <17> on a wafer, a subsequent first heating process, and also subsequently, a second heating process at a temperature higher than the temperature of the first heating process.

<23> A method for manufacturing a microlens, including a process of subjecting the transparent film described in <18> to post-bake treatment to shape the transparent film, and also a dry etching process.

<24> A method for manufacturing a solid-state imaging device, including a process of forming red pixels, blue pixels, and green pixels on a substrate for a solid-state imaging device having at least a photodiode, a light-shielding film, and a device protective film, a process of coating the curable composition described in any one of <13> to <17> and heating the composition, a process of forming a resist pattern, a process of performing a post-bake treatment to shape the formed resist pattern into a lens-type shape, and a dry etching process.

Effects of Invention

According to the present invention, it is possible to provide a dispersion composition which has a high refractive index and is has excellent surface conditions of a film surface after coating, a curable composition using the same, a transparent film, a microlens, and a solid-state imaging device.

DESCRIPTION OF EMBODIMENTS

Figure 1:
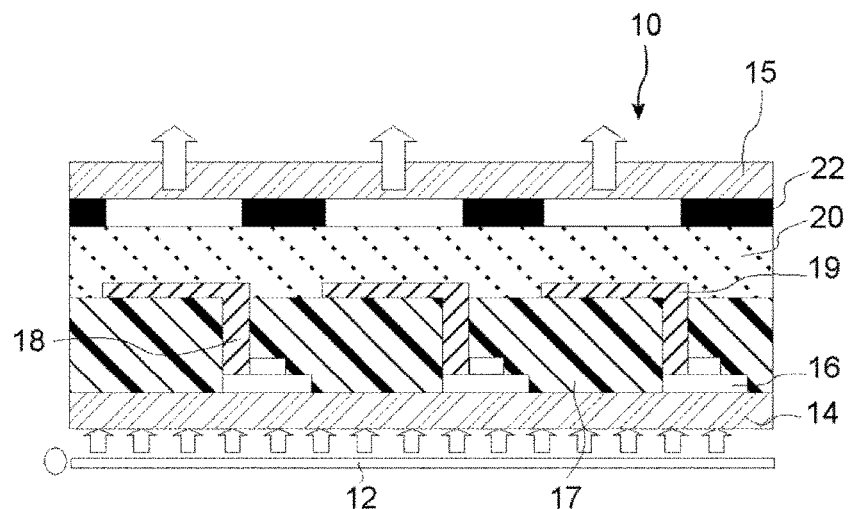
FIG. 1 is a conceptual cross-sectional view illustrating an example of a liquid crystal display device 10 of an active matrix system.

In representation of a group (atomic group) in the present specification, the representation which does not describe the substitution and unsubstitution also includes a representation having a substituent along with a representation having no substituent. For example, "an alkyl group" includes not only an alkyl group having no substituent (an unsubstituted alkyl group) but also an alkyl group having a substituent (a substituted alkyl group).

The explanation of constituent requirements to be described below may be made based on the representative embodiment of the present invention in some cases, but the present invention is not limited to such an embodiment. Meanwhile, in the present specification, a numerical range represented by using "to" means a range including numerical values described before and after "to" as a lower limit and an upper limit.

Further, in the present specification. "(meth)acrylate" represents acrylate and methacrylate, "(meth)acryl" represents acryl and methacryl, and "(meth)acryloyl" represents acryloyl and methacryloyl. In addition, in the present specification, "monomeric body" and "monomer" are synonymous with each other. In the present invention, the monomeric body is differentiated from an oligomer and a polymer, and refers to a compound having a mass average molecular weight of 2,000 or less. In the present specification, the polymerizable compound refers to a compound having a polymerizable group, and may be a monomer or a polymer. The polymerizable group refers to a group which is involved in a polymerization reaction.

Furthermore, in the present invention, "refractive index", unless otherwise specifically agreed, refers to a refractive index with respect to light having a wavelength of 635 nm.

<Dispersion Composition>

The dispersion composition of the present invention contains metal oxide particles having a primary particle diameter of 1 nm to 100 nm (A), a polymer compound having an acid value of less than 120 mgKOH/g, which is represented by the following Formula (1) (B), and a solvent (C).

Formula (1)

In Formula (1), $R^1$ represents a (m+n)-valent linking group, and $R^2$ represents a single bond or a divalent linking group. $A^1$ represents a monovalent substituent having at least one group selected from the group consisting of an acid group, a urea group, a urethane group, a group having a coordinating oxygen atom, a group having a basic nitrogen atom, a phenol group, an alkyl group, an aryl group, a group having an alkyleneoxy chain, an imide group, a heterocyclic group, an alkyloxycarbonyl group, an alkyl amino carbonyl group, a carboxylate group, a sulfonamide group, an alkoxysilyl group, an epoxy group, an isocyanate group, and a hydroxyl group. n $A^1$'s and n $R^2$'s may be the same or different.

m represents a positive number of 8 or less, n represents 1 to 9, and m+n satisfies 3 to 10.

$P^1$ represents a polymer chain. m $P^1$'s may be the same or different.

In the dispersion composition in the present invention, since the substituent $A^1$ which the polymer compound (B) has may interact with the metal oxide particles (A), the polymer compound (B) may have n (1 to 9) substituents $A^1$'s to firmly interact with the metal oxide particles (A). In addition, m polymer chains $P^1$'s which the polymer compound (B) has m pieces may serve as a steric repulsion group, and the polymer compound (B) may have m polymer chains $P^1$'s to exhibit good steric repulsion force, thereby uniformly dispersing metal oxide particles. Furthermore, it is presumed that the polymer compound (B) molecular structurally has no ill effect, such as aggregation of particles caused by interparticular crosslinking which may occur from a dispersant having a graft random structure in the related art.

<(A) Metal Oxide Particles Having Primary Particle Diameter of 1 nm to 100 nm>

As the metal oxide particles (A) in the present invention, colorless, white or transparent inorganic particles having a high refractive index are preferred, examples thereof include oxide particles of titanium (Ti), zirconium (Zr), aluminum (Al), silicon (Si), zinc (Zn) or magnesium (Mg), titanium dioxide ($TiO_2$) particles, zirconium dioxide ($ZrO_2$) particles or silicon dioxide ($SiO_2$) particles are preferred, and among them, titanium dioxide particles (hereinafter, simply referred to as "titanium dioxide" in some cases) are more preferred.

The titanium dioxide particles in the present invention may be represented by the formula $TiO_2$, and have a purity of preferably 70% or more, more preferably 80% or more and even more preferably 85% or more. Lower order titanium oxide, titanium oxynitride and the like represented by the formula $Ti_nO_{n-1}$ (n represents a number of 2 to 4) are preferably 30% by mass or less, more preferably 20% by mass or less and even more preferably 15% by mass or less.

The metal oxide particles in the present invention are not particularly limited as long as the particles have a primary particle diameter of 1 nm to 100 nm, and for example, may be appropriately selected from commercially available metal oxide particles and used.

The metal oxide particles have a primary particle diameter of 1 nm to 100 nm, but preferably 1 nm to 80 nm and particularly preferably 1 nm to 50 nm. When the primary particle diameter of the metal oxide particles exceeds 100 nm, there are some cases where a refractive index and transmittance may be reduced. In addition, when the diameter is less than 1 nm, there are some cases where dispersibility may deteriorate due to aggregation.

Furthermore, in the present invention, an average particle diameter may be used as an index of a primary particle diameter. In the present invention, the average particle diameter of metal oxide particles refers to a value obtained by diluting a mixed solution or a liquid dispersion including metal oxide particles to 80 times with propylene glycol monomethyl ether acetate, and measuring the obtained diluted solution using a dynamic light scattering method.

The average particle diameter is a number average particle diameter obtained by performing the measurement using MICROTRAC UPA-EX150 manufactured by NIK-KISO Co., Ltd.

In the present invention, the refractive index of metal oxide particles is not particularly limited, but is preferably from 1.75 to 2.70, and more preferably 1.90 to 2.70, from the viewpoint of obtaining a high refractive index.

Further, the metal oxide particles have a specific surface area of preferably 10 $m^2$/g to 400 $m^2$/1 g more preferably 20 $m^2$/g to 200 $m^2$/g, and most preferably 30 $m^2$/g to 150 $m^2$/g.

In addition, the shape of metal oxide particles is not particularly limited. For example, the shape may be a rice grain shape, a ball shape, a cubic shape, a spindle shape, or an amorphous shape.

The metal oxide particles in the present invention may be subjected to surface treatment with an organic compound(s). Examples of the organic compound used in the surface treatment include polyol, alkanolamine, stearic acid, a silane coupling agent, and a titanate coupling agent. Among them, the silane coupling agent is preferred.

The surface treatment may be performed either with a surface treatment agent alone or in combination of two or more surface treatment agents.

Furthermore, it is also preferred that the surface of the metal oxide particles is covered with oxides such as aluminum, silicon, and zirconia. Accordingly, the weather resistance thereof is further enhanced.

As the metal oxide particles in the present invention, those commercially available may be preferably used.

Examples of the commercially available products of titanium dioxide particles include TTO series (TTO-51 (A), TTO-51 (C), and the like), TTO-S, and V series (TTO-S-1, TTO-S-2, TTO-V-3, and the like) manufactured by ISHIHARA SANGYO KAISHA, LTD., MT series (MT-01, MT-05, and the like) manufactured by Tayca Corporation, and the like.

Examples of the commercially available products of zirconium dioxide particles include UEP (manufactured by DAIICHI KIGENSO KAGAKU KOGYO Co., Ltd.), PCS (manufactured by Nippon Denko Co., Ltd.). JS-01, JS-03 and JS-04 (manufactured by Nippon Denko Co., Ltd.), UEP-100 (manufactured by DAIICHI KIGENSO KAGAKU KOGYO Co., Ltd.), and the like.

Examples of the commercially available products of silicon dioxide particles include OG502-31 manufactured by Clariant Co., and the like.

The metal oxide particles in the present invention may be used either alone or in combination of two or more thereof.

The content of metal oxide particles in the dispersion composition (or a curable composition to be described below) of the present invention is preferably 65% by mass, and more preferably 70% by mass or more with respect to the total solid content of the dispersion composition from the viewpoint of obtaining a high refractive index.

The upper limit of the content is not particularly limited, but is preferably 90% by mass or less, and more preferably 85% by mass or less with respect to the total solid content of the dispersion composition.

<(B) Polymer Compound Having Acid Value of Less than 120 mgKOH/g, which is Represented by Formula (1)>

In the present invention, the acid value of the polymer compound represented by Formula (1) (B) is less than 120 mgKOH/g, preferably 100 mgKOH/g or less, and more preferably less than 100 mgKOH/g. By setting the acid value within the range, acid groups of the polymer compound (B) may be prevented from being aggregated, the phase separation between the metal oxide particles (A) and the polymer compound (B) may be prevented, and as a result, coated surface conditions may be improved.

Meanwhile, the lower limit of the acid value is not particularly limited, but is preferably 5 mgKOH/g or more, and more preferably 10 mgKOH/g or more from the viewpoint of dispersion stability of the metal oxide particles.

Further, as described below, when a cured film is formed, the visible light transmittance of the cured film is particularly excellent, so that the acid value of the polymer compound (B) is particularly preferably 70 to 90 mgKOH/g.

Here, the acid value of the polymer compound (B) is an acid value of the solid content of the polymer compound (B).

In the present invention, the acid value of the polymer compound (B) may be calculated from the average content of the acid group in, for example, the polymer compound (B). The acid value of the polymer compound (B) may be adjusted by appropriately adjusting the amount of acid groups in the polymer compound (B) and the amount of functional groups having a pKa of 5 or more to be described below. For example, when the polymer compound (B) is synthesized, a polymer compound (B) having a desired acid value may be synthesized by appropriately adjusting the content of a compound having an acid group which is a raw material and a carbon-carbon double bond, the content of a compound having a functional group having a pKa of 5 or more and a carbon-carbon double bond, and the content of a vinyl monomer having an acid group.

Hereinafter, each group in Formula (1) will be described in detail.

$A^1$ represents a monovalent substituent having at least one of a functional group having an adsorption capacity for the metal oxide particles (A) such as an acid group, a group having a basic nitrogen atom, a urea group, a urethane group, a group having a coordinating oxygen atom, a phenol group, an alkyl group, an aryl group, a group having an alkyleneoxy chain, an imide group, an alkyloxycarbonyl group, an alkyl amino carbonyl group, a carboxylate group, a sulfonamide group, an alkoxysilyl group, an epoxy group, an isocyanate group, and a hydroxyl group, and a structure which may have an adsorption capacity for the metal oxide particles (A), such as a heterocyclic structure.

Meanwhile, hereinafter, a site having an adsorption capacity for the metal oxide particles (A) (the functional group and structure) will be described by appropriately generally calling the site as an "adsorption site".

At least one of adsorption site may be included in one $A^1$, and two or more adsorption sites may be included in one A.

Examples of an aspect in which two or more adsorption sites are included in one $A^1$ include an aspect in which through a chain saturated hydrocarbon group (may be straight- or branch-chained, and preferably has 1 to 10 carbon atoms), a cyclic saturated hydrocarbon group (preferably has 3 to 10 carbon atoms), an aromatic group (preferably has 5 to 10 carbon atoms, and for example, a phenylene group), and the like, two or more adsorption sites are combined with each other to form a monovalent substituent $A^1$, and an aspect in which through a chain saturated hydrocarbon group, two or more adsorption sites are combined with each other to form a monovalent substituent $A^1$ is preferred.

Meanwhile, when the adsorption site itself constitutes a monovalent substituent, the adsorption site itself may be a monovalent substituent represented by $A^1$.

First, the adsorption site which constitutes $A^1$ will be described below.

Preferred examples of the "acid group" include a carboxylic acid group, a sulfonic acid group, a monosulfuric acid ester group, a phosphoric acid group, a monophosphoric acid ester group, a phosphonic acid group, a phosphinic acid group, and a boric acid group, and a carboxylic acid group, a sulfonic acid group, a monosulfuric acid ester group, a phosphoric acid group, a monophosphoric acid ester group, a phosphonic acid group, and a phosphinic acid group are more preferred, a carboxylic acid group, a sulfonic acid group, a phosphoric acid group, a phosphonic acid group, and a phosphinic acid group are even more preferred, and a carboxylic acid group is particularly preferred.

Preferred examples of the "urea group" include —$NR^{15}CONR^{16}R^{17}$ (here, $R^{15}$, $R^{16}$, and $R^{17}$ each independently represent a hydrogen atom, an alkyl group having 1 to 20 carbon atoms, an aryl group having 6 or more carbon atoms, or an aralkyl group having 7 or more carbon atoms), and —$NR^{15}CONHR^{17}$ (here, $R^{15}$ and $R^{17}$ each independently represent a hydrogen atom or an alkyl group having 1 to 10 carbon atoms, an aryl group having 6 or more carbon atoms, and an aralkyl group having 7 or more carbon atoms) is more preferred. —NHCONHR$^{17}$ (here, $R^{17}$ represents a hydrogen atom or an alkyl group having 1 to 10 carbon atoms, an aryl group having 6 or more carbon atoms, and an aralkyl group having 7 or more carbon atoms) is particularly preferred.

Preferred examples of the "urethane group" include —$NHCOOR^{18}$, —$NR^{19}COOR^{20}$, —$OCONHR^{21}$, —$OCONR^{22}R^{23}$ (here, $R^{18}$, $R^{19}$, $R^{20}$, $R^{21}$, $R^{22}$, and $R^{23}$ each independently represent an alkyl group having 1 to 20 carbon atoms, an aryl group having 6 or more carbon atoms, and an aralkyl group having 7 or more carbon atoms) and the like, and —$NHCOOR^{18}$, —$OCONHR^{21}$ (here, $R^{18}$ and $R^{21}$ each independently represent an alkyl group having 1 to 20 carbon atoms, an aryl group having 6 or more carbon atoms, and an aralkyl group having 7 or more carbon atoms) and the like are more preferred, —$NHCOOR^{18}$, —$OCONHR^{21}$ (here, $R^{18}$ and $R^{21}$ each independently represent an alkyl group having 1 to 10 carbon atoms, an aryl group having 6 or more carbon atoms, and an aralkyl group having 7 or more carbon atoms) and the like are particularly preferred.

Examples of the "group having a coordinating oxygen atom" include an acetylacetonato group, a crown ether and the like.

Preferred examples of the "group having a basic nitrogen atom" include an amino group (—$NH_2$), a substituted imino group (—$NHR^8$ and —$NR^9R^{10}$, here, $R^8$, $R^9$, and $R^{10}$ each independently represent an alkyl group having 1 to 20 carbon atoms, an aryl group having 6 or more carbon atoms, and an aralkyl group having 7 or more carbon atoms), a guanidyl group represented by the following Formula (a1), an amidinyl group represented by the following Formula (a2), and the like.

In Formula (a1), $R^{11}$ and $R^{12}$ each independently represent an alkyl group having 1 to 20 carbon atoms, an aryl group having 6 or more carbon atoms, and an aralkyl group having 7 or more carbon atoms.

In Formula (a2), $R^{13}$ and $R^{14}$ each independently represent an alkyl group having 1 to 20 carbon atoms, an aryl group having 6 or more carbon atoms, and an aralkyl group having 7 or more carbon atoms.

Among them, an amino group (—$NH_2$), a substituted amino group (—$NHR^8$ and —$NR^9R^{10}$, here, $R^8$, $R^9$, and $R^{10}$ each independently represent an alkyl group having 1 to 10 carbon atoms, a phenyl group, and a benzyl group), the guanidyl group represented by Formula (a1) [in Formula (a1), $R^{11}$ and $R^{12}$ each independently represent an alkyl group having 1 to 10 carbon atoms, a phenyl group, and a benzyl group], the amidinyl group represented by Formula (a2) [in Formula (a2), $R^{13}$ and $R^{14}$ each independently represent an alkyl group having 1 to 10, a phenyl group, and a benzyl group] and the like are more preferred.

In particular, an amino group (—$NH_2$), a substituted amino group (—$NHR^8$ and —$NR^9R^{10}$, here, $R^8$, $R^9$, and $R^{10}$ each independently represent an alkyl group having 1 to 5 carbon atoms, a phenyl group, and a benzyl group), the guanidyl group represented by Formula (a1) [in Formula (a1), $R^{11}$ and $R^{12}$ each independently represent an alkyl group having 1 to 5 carbon atoms, a phenyl group, and a benzyl group], the amidinyl group represented by Formula (a2) [in Formula (a2), $R^{13}$ and $R^{14}$ each independently represent an alkyl group having 1 to 5 carbon atoms, a phenyl group, and a benzyl group] and the like are preferably used.

The alkyl group represented by the monovalent substituent A1 may be straight- or branch-chained, and is preferably an alkyl group having 1 to 40 carbon atoms, more preferably an alkyl group having 4 to 30 carbon atoms, and even more preferably an alkyl group having 10 to 18 carbon atoms.

The aryl group represented by the monovalent substituent A1 is preferably an aryl group having 6 to 10 carbon atoms.

"The group having an alkyleneoxy chain" is preferably a group in which the ends form an alkyloxy group, and more preferably a group in which the ends form an alkyloxy group having 1 to 20 carbon atoms. Further, the alkyleneoxy chain is not particularly limited as long as the chain has at least one alkyleneoxy group, but is preferably a chain which is composed of an alkyleneoxy group having 1 to 6 carbon atoms. Examples of the alkyleneoxy group include —$CH_2CH_2O$—, —$CH_2CH_2CH_2O$—, and the like.

An alkyl group moiety in the "alkyloxycarbonyl group" is preferably an alkyl group having 1 to 20 carbon atoms.

An alkyl group moiety in the "alkyl amino carbonyl group" is preferably an alkyl group having 1 to 20 carbon atoms.

Examples of the "carboxylate group" include a group which is composed of ammonium salt of carboxylic acid, and the like.

With respect to the "sulfonamide group", a hydrogen atom bonded to a nitrogen atom may be substituted with an alkyl group (a methyl group and the like), an acyl group (an acetyl group, a trifluoroacetyl group and the like), and the like.

Preferred examples of the "heterocyclic structure" include thiophene, furan, xanthene, pyrrole, pyrroline, pyrrolidine, dioxolane, pyrazole, pyrazoline, pyrazolidine, imidazole, oxazol, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, hydantoin, indole, quinoline, carbazole, acridine, acridone, and anthraquinone.

Examples of the "imide group" include succinimide, phthalimide, naphthalimide, and the like.

Meanwhile, the "heterocyclic structure" and the "imide group" may further have a substituent, and examples of the substituent include an alkyl group having 1 to 20 carbon atoms, such as a methyl group and an ethyl group, an aryl group having 6 to 16 carbon atoms, such as a phenyl group and a naphthyl group, a hydroxyl group, an amino group, a carboxyl group, a sulfonamide group, an N-sulfonylamide group, an acyloxy group having 1 to 6 carbon atoms, such as an acetoxy group, an alkoxy group having 1 to 20 carbon atoms, such as a methoxy group and an ethoxy group, a halogen atom such as chlorine and bromine, an alkoxycarbonyl group having 2 to 7 carbon atoms, such as a methoxycarbonyl group, an ethoxycarbonyl group and a cyclohexyloxycarbonyl group, a cyano group, a carbonic acid ester group such as a t-butyl carbonate, and the like.

The "alkoxysilyl group may be any one of a monoalkoxysilyl group, a dialkoxysilyl group, and a trialkyloxysilyl group, but the alkoxysilyl group is preferably a trialkoxysilily group, and examples thereof include a trimethoxysilyl group, a triethoxysilyl group, and the like.

Examples of the "epoxy group" include a substituted or unsubstituted oxirane group (an ethylene oxide group).

In particular, $A^1$ is preferably a monovalent substituent having at least one functional group with a pKa of 5 or more, and more preferably a monovalent substituent having at least one functional group with a pKa of 5 to 14, from the viewpoint of achieving an acid value of the polymer compound (B) of less than 120 mgKOH/g, and also improving the interaction with the metal oxide particles (A) while improving the coated surface conditions.

The "pKa" as mentioned herein refers to a definition described in The Chemical Handbook (II) ($4^{th}$ Revised Edition, 1993, edited by The Chemical Society of Japan, MARUZEN Co., Ltd.).

Examples of the functional group with a pKa of 5 or more include a group having a coordinating oxygen atom, a group having a basic nitrogen atom, a phenol group, a urea group, a urethane group, an alkyl group, an aryl group, an alkyloxycarbonyl group, an alkyl amino carbonyl group, a group having an alkyleneoxy chain, an imide group, a carboxylate group, a sulfonamide group, a hydroxyl group, and a heterocyclic group.

Specific examples of the functional group with a pKa of 5 or more include a phenol group (pKa of about 8 to 10), an alkyl group (pKa of about 46 to 53), an aryl group (pKa of about 40 to 43), a urea group (pKa of about 12 to 14), a urethane group (pKa of about 11 to 13), —$COCH_2CO$— (pKa of about 8 to 10) as a coordinating oxygen atom, a sulfonamide group (pKa of about 9 to 11), a hydroxyl group (pKa of about 15 to 17), a heterocyclic group (pKa of about 12 to 30), and the like.

Among those described above, $A^1$ is preferably a monovalent substituent having at least one group selected from the group consisting of an acid group, a phenol group, an alkyl group, an aryl group, a group having an alkyleneoxy chain, a hydroxyl group, a urea group, a urethane group, a sulfonamide group, an imide group, and a group having a coordinating oxygen atom.

In Formula (1), $R^2$ represents a single bond or a divalent linking group, n $R^2$'s may be the same or different.

The divalent linking group represented by $R^2$ include a group which is composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

$R^2$ is preferably a single bond, or a divalent linking group which is composed of 1 to 10 carbon atoms, 0 to 5 nitrogen atoms, 0 to 10 oxygen atoms, 1 to 30 hydrogen atoms, and 0 to 5 sulfur atoms.

$R^2$ is more preferably a group selected from the group consisting of a chain saturated hydrocarbon group (may be straight- or branch-chained, and preferably has 1 to 20 carbon atoms), a cyclic saturated hydrocarbon group (preferably has 3 to 20 carbon atoms), an aromatic group (preferably has 5 to 20 carbon atoms, for example, a phenylene group), a thioether bond, an ester bond, an amide bond, an ether bond, a nitrogen atom, and a carbonyl group, or a group obtained by combining two or more thereof, even more preferably a group selected from the group consisting of a chain saturated hydrocarbon group, a cyclic saturated hydrocarbon group, an aromatic group, a thioether bond, an ester bond, an ether bond, and an amide bond, or a group obtained by combining two or more thereof, and particularly preferably a group selected from the group consisting of a chain saturated hydrocarbon group, a thioether bond, an ester bond, an ether bond, and an amide bond, or a group obtained by combining two or more thereof.

Among those described above, when the divalent linking group represented by $R^2$ has a substituent, examples of the substituent include an alkyl group having 1 to 20 carbon atoms, such as a methyl group and an ethyl group, an aryl group having 6 to 16 carbon atoms, such as a phenyl group and a naphthyl group, a hydroxyl group, an amino group, a carboxyl group, a sulfonamide group, an N-sulfonylamide group, an acyloxy group having 1 to 6 carbon atoms, such as an acetoxy group, an alkoxy group having 1 to 6 carbon atoms, such as a methoxy group and an ethoxy group, a halogen atom such as chlorine and bromine, an alkoxycarbonyl group having 2 to 7 carbon atoms, such as a methoxycarbonyl group, an ethoxycarbonyl group and a cyclohexyloxycarbonyl group, a cyano group, a carbonic acid ester group such as a t-butyl carbonate, and the like.

In Formula (1), $R^1$ represents a (m+n)-valent linking group, m+n satisfies 3 to 10.

The (m+n)-divalent linking group represented by $R^1$ include a group which is composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

The (m+n)-valent linking group represented by $R^1$ is preferably a group represented by any one of the following Formulae.

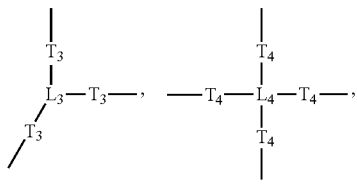

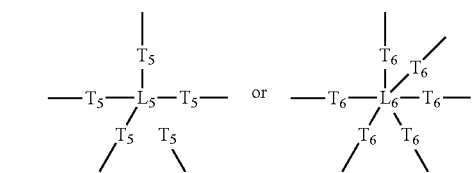

In the Formulae, $L_3$ represents a trivalent group. $T_3$ represents a single bond or a divalent linking group, and the three $T_3$'s may be the same or different.

$L_4$ represents a tetravalent group. $T_4$ represents a single bond or a divalent linking group, and the four $T_4$'s may be the same or different.

$L_5$ represents a pentavalent group. $T_5$ represents a single bond or a divalent linking group, and the five $T_5$'s may be the same or different.

$L_6$ represents a hexavalent group. $T_6$ represents a single bond or a divalent linking group, and the six $T_6$'s may be the same or different.

Specific examples [Specific Examples (1) to (17)] of the (m+n)-valent linking group represented by $R^1$ will be shown below. However, the present invention is not limited thereto.

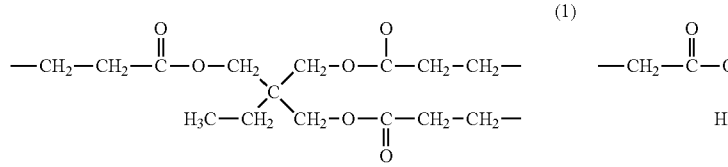

(1)

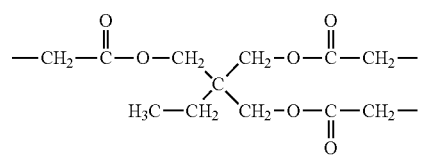

(2)

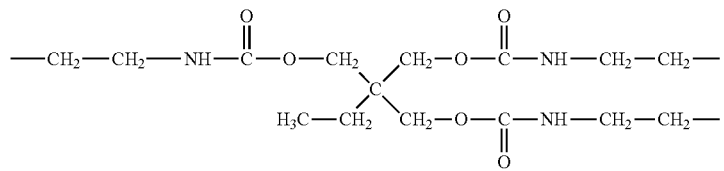

(3)

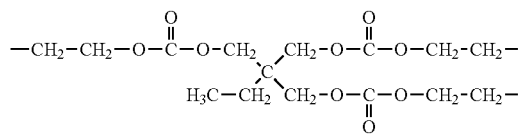

(4)

(5)

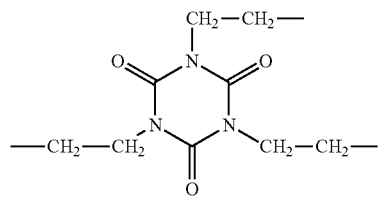

(6)

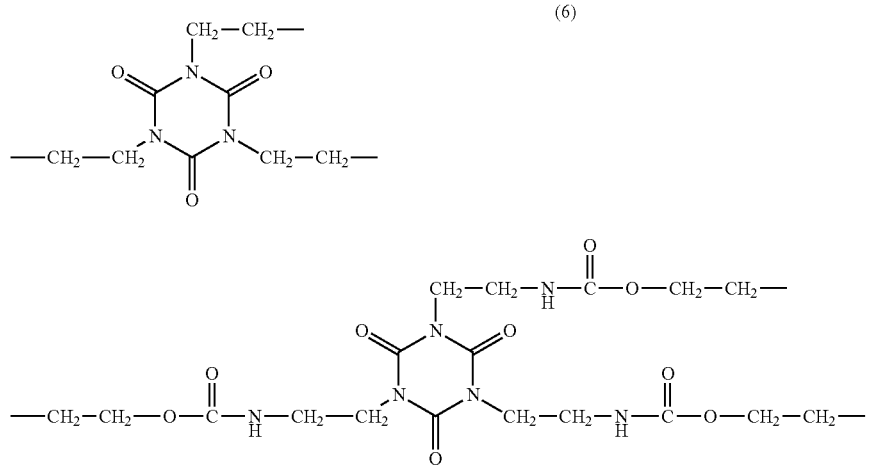

(7)

-continued
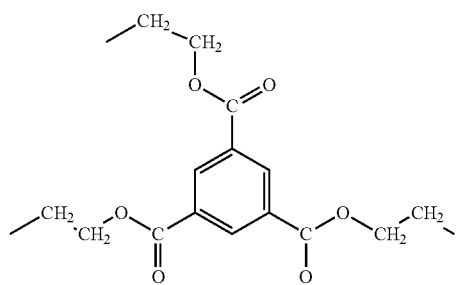 (8)
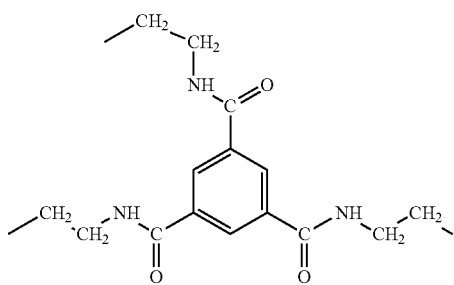 (9)
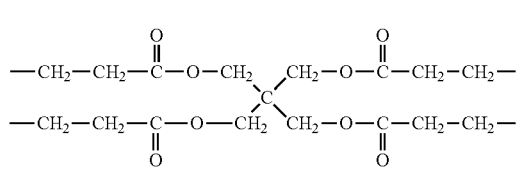 (10)
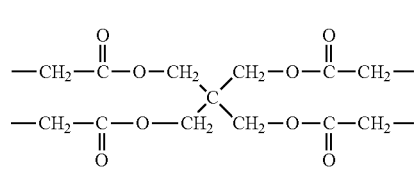 (11)
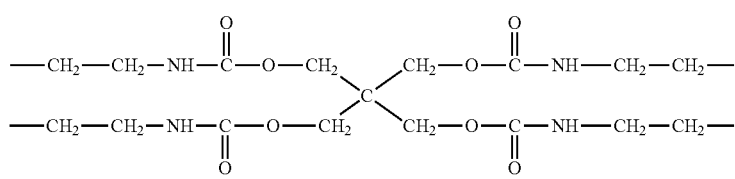 (12)
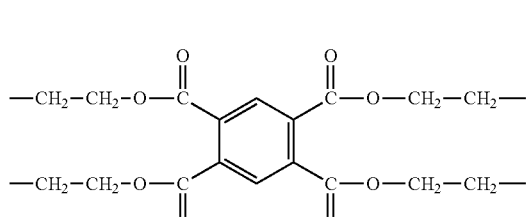 (13)
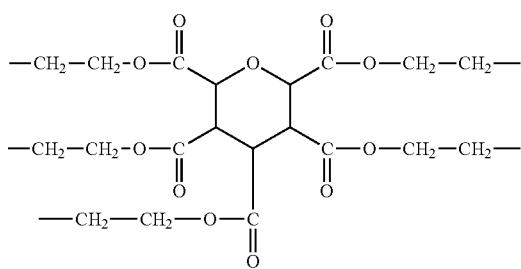 (14)
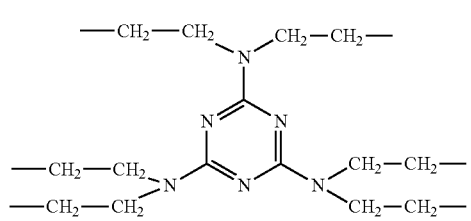 (15)
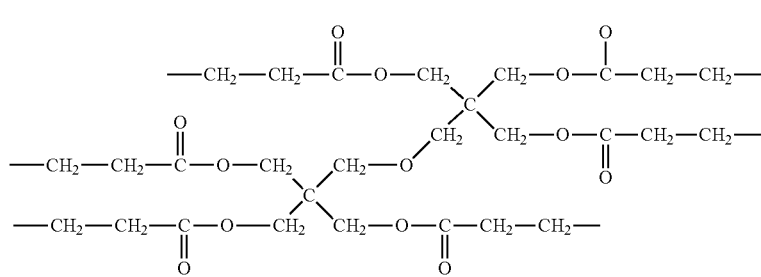 (16)

-continued

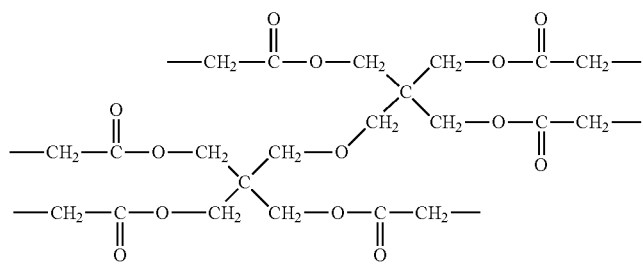
(17)

Among the aforementioned specific examples, the most preferred (m+n)-valent linking groups are the following groups of (1), (2), (10), (11), (16), and (17) from the viewpoint of availability of raw materials, ease of synthesis, and solubility in various solvents.

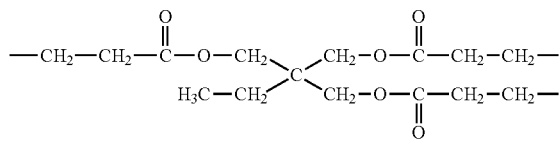
(1)

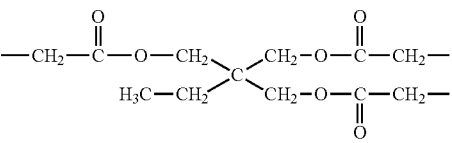
(2)

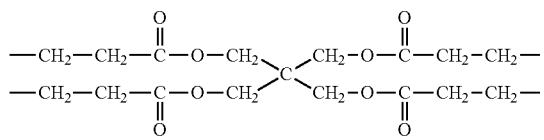
(10)

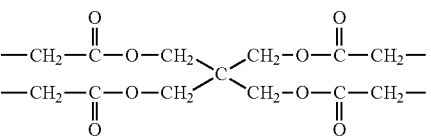
(11)

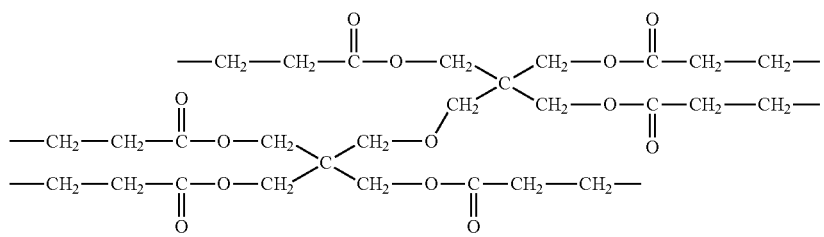
(16)

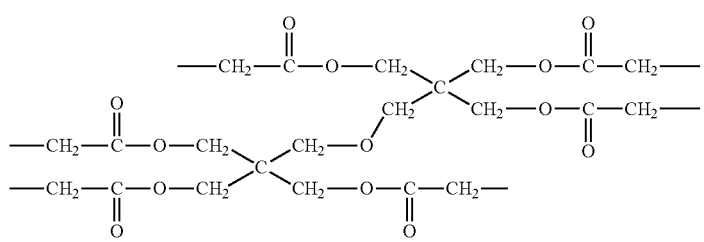
(17)

In Formula (1), m represents a positive number of 8 or less, m is preferably 0.5 to 5, more preferably 1 to 4, and particularly preferably 1 to 3.

Furthermore, in Formula (1), n represents 1 to 9, n is preferably 2 to 8, more preferably 2 to 7, and particularly preferably 3 to 6.

In Formula (1), $P^1$ represents a polymer chain, and may be selected from publicly known polymers and the like, according to the purpose and the like, m $P^1$'s may be the same or different.

Among the polymers, the polymer for constituting the polymer chain is preferably at least one selected from the group consisting of a polymer or copolymer of vinyl monomers, an ester-based polymer, an ether-based polymer, a urethane-based polymer, an amide-based polymer, an epoxy-based polymer, a silicone-based polymer, and a modified product or copolymer thereof [includes, for example, a polyether/polyurethane copolymer, a copolymer of polyether/polymer of a vinyl monomer, and the like, in which the copolymer may be any of a random copolymer, a block copolymer and a graft copolymer], more preferably at least one selected from the group consisting of a polymer or copolymer of vinyl monomers, an ester-based polymer, an ether-based polymer, a urethane-based polymer and a modified product or copolymer thereof, and particularly preferably a polymer or copolymer of vinyl monomers.

The polymer or copolymer of the vinyl monomer, the ester-based polymer and the ether-based polymer, which the polymer chain P1 may have, are preferably those having a structure represented by the following Formulae (L) (M), and (N), respectively.

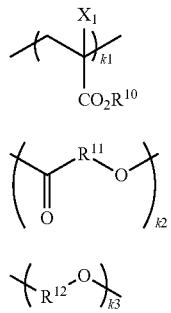

In the Formulae, $X^1$ represents a hydrogen atom, or a monovalent organic group. From the viewpoint of the restrictions on synthesis, a hydrogen atom or an alkyl group having 1 to 12 carbon atoms is preferred, a hydrogen atom or a methyl group is more preferred, and a methyl group is particularly preferred.

$R^{10}$ represents a hydrogen atom or a monovalent organic group, and the structure thereof is not particularly limited, but $R^{10}$ is preferably a hydrogen atom, an alkyl group, an aryl group, and a heteroaryl group, and more preferably a hydrogen atom and an alkyl group. When $R^{10}$ is an alkyl group, the alkyl group is preferably a straight-chained alkyl group having 1 to 20 carbon atoms, a branch-chained alkyl group having 3 to 20 carbon atoms, or a cyclic alkyl group having 5 to 20 carbon atoms, more preferably a straight-chained alkyl group having 1 to 20 carbon atoms, and particularly preferably a straight-chained alkyl group having 1 to 6 carbon atoms. Formula (L) may have two or more of $R^{10}$'s having different structures.

$R^{11}$ and $R^{12}$ represent a branch- or straight-chained alkylene group (having preferably 1 to 10 carbon atoms, more preferably 2 to 8 carbon atoms, and even more preferably 3 to 6 carbon atoms). Each formula may have two or more of $R^{11}$'s or $R^{12}$'s, which have different structures.

k1, k2, and k3 each independently represent a number of 5 to 140.

It is preferred that the polymer chain P1 contains at least one repeating unit.

The repeating number k of at least one repeating unit in the polymer chain $P^1$ is preferably 3 or more, and more preferably 5 or more, from the viewpoint of exhibiting steric repulsion force to enhance dispersibility.

Further, the repeating unit number k of at least one repeating unit is preferably 60 or less, more preferably 40 or less, and even more preferably 30 or less, from the viewpoint of suppressing volume expansion of the polymer compound (B), and achieving a high refractive index by allowing the oxide particles (A) to be densely present in a cured film (transparent film).

Meanwhile, the polymer is preferably those soluble in an organic solvent. When affinity for an organic solvent is low, affinity with a dispersion medium becomes weak, so that there is a case where an adsorption layer sufficient for dispersion stabilization may not be secured.

The vinyl monomer is not particularly limited, but for example, (meth)acrylic acid esters, crotonic acid esters, vinyl esters, a vinyl monomer having an acid group, maleic acid diesters, fumaric acid diesters, itaconic acid diesters, (meth)acrylic amides, styrenes, vinyl ethers, vinyl ketones, olefins, maleimides, (meth)acrylonitrile and the like are preferred, (meth)acrylic acid esters, crotonic acid ester, vinyl esters, and a vinyl monomer having an acid group are more preferred, and (meth)acrylic acid esters and crotonic acid esters are even more preferred.

Preferred examples of these vinyl monomers include vinyl monomers described in paragraph nos. 0089 to 0094, 0096 and 0097 of Japanese Patent Application Laid-Open No. 2007-277514 (paragraph nos. 0105 to 0117, 0119 and 0120 of the corresponding U.S. Patent Application Publication No. 2010/233595), the contents of which are incorporated into the specification of the present application.

In addition to the aforementioned compounds, it is also possible to use, for example, a vinyl monomer having a functional group such as a urethane group, a urea group, a sulfonamide group, a phenol group and an imide group. These monomeric bodies having a urethane group or a urea group may be appropriately synthesized by using, for example, an addition reaction of an isocyanate group and a hydroxyl group, or an amino group. Specifically, the monomeric bodies may be appropriately synthesized by an addition reaction of an isocyanate group-containing monomer with a compound containing one hydroxyl group, or a compound containing one primary or secondary amino group, an addition reaction of a hydroxyl group-containing monomer or a primary or secondary amino group-containing monomer with monoisocyanate, or the like.

Among the polymer compounds (B) represented by Formula (1), a polymer compound represented by the following Formula (2) is preferred.

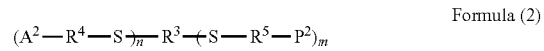

Formula (2)

In Formula (2), $A^2$ has the same meaning as $A^1$ in Formula (1), and preferred aspects thereof are also the same.

In Formula (2), $R^4$ and $R^5$ each independently represent a single bond or a divalent linking group, n $R^4$'s may be the same or different. In addition, m $R^5$'s may be the same or different.

As the divalent linking group represented by $R^4$ or $R^5$, those exemplified as the divalent linking group represented by $R^2$ in Formula (1) are used, and preferred aspects thereof are also the same.

Among them, the divalent linking group represented by $R^4$ or $R^5$ is preferably a group selected from the group consisting of a chain saturated hydrocarbon group (may be straight- or branch-chained, and preferably has 1 to 20 carbon atoms), a cyclic saturated hydrocarbon group (preferably has 3 to 20 carbon atoms), an aromatic group (preferably has 5 to 20 carbon atoms, for example, a phenylene group), an ester bond, an amide bond, an ether bond, a nitrogen atom, and a carbonyl group, or a group obtained by combining two or more thereof, more preferably a group selected from the group consisting of a chain saturated hydrocarbon group, a cyclic saturated hydrocarbon group, an aromatic group, an ester bond, an ether bond, and an amide bond, or a group obtained by combining two or more thereof, and even more preferably a group selected from the group consisting of a chain saturated hydrocarbon group, an ester bond, an ether bond, and an amide bond, or a group obtained by combining two or more thereof.

In Formula (2), $R^3$ represents a (m+n)-valent linking group, m+n satisfies 3 to 10.

The (m+n)-valent linking group represented by $R^3$ may be unsubstituted or may further have a substituent, those exemplified as the (m+n)-valent linking group represented by $R^1$ in Formula (1) are used, and preferred aspects thereof are also the same.

In Formula (2), m and n each have the same meaning as m and n in Formula (1), and preferred aspects thereof are also the same.

Furthermore, $P^2$ in Formula (2) has the same meaning as $P^1$ in Formula (1), and preferred aspects thereof are also the same, $m^P2$'s may be the same or different.

Among the polymer compounds represented by Formula (2), those, which satisfy all of $R^3$, $R^4$, $R^5$, $P^2$, m and n to be represented below, are most preferred.

$R^3$: the Specific Examples (1), (2), (10), (11), (16) or (17)

$R^4$: a single bond, or a group selected from the group consisting of a chain saturated hydrocarbon group, a cyclic saturated hydrocarbon group, an aromatic group, an ester bond, an amide bond, an ether bond, a nitrogen atom, and a carbonyl group, or a group obtained by combining two or more thereof $R^5$: a single bond, an ethylene group, a propylene group, the following group (a) or the following group (b)

Meanwhile, among the following groups, $R^{12}$ represents a hydrogen atom, or a methyl group, and l represents 1 or 2.

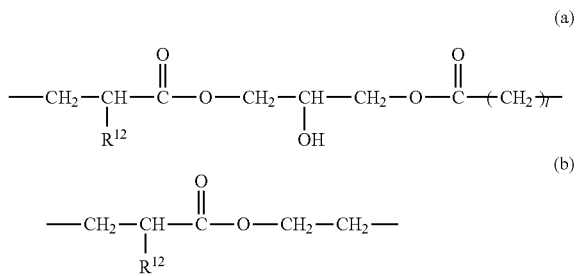

P2: a polymer or copolymer of vinyl monomers, an ester-based polymer, an ether-based polymer, a urethane-based polymer and a modified product thereof m: 1 to 3 n: 3 to 6

Among the polymer compounds (B) represented by Formula (1) or (2), a polymer compound represented by the following Formula (5) is more preferred from the viewpoint of dispersion stability, coated surface conditions, and the like.

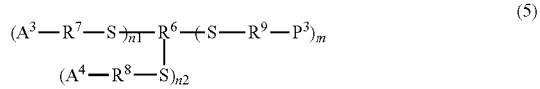

In Formula (5), $R^6$ represents a (m+n1+n2)-valent linking group, and $R^7$ to $R^9$ each independently represent a single bond or a divalent linking group.

A represents a monovalent substituent having at least one acid group. $A^4$ represents a monovalent substituent different from $A^3$, n $A^3$'s and n $R^7$'s may be the same or different. n2 $A^4$'s and n2 $R^8$'s may be the same or different.

m has the same meaning as m in Formula (1), and preferred aspects thereof are also the same, n1 represents 1 to 8, n2 represents 1 to 8, and m+n1+n2 satisfies 3 to 10.

$P^3$ has the same meaning as $P^2$ in Formula (2), and preferred aspects thereof are also the same, m $P^3$'s and m $R^9$'s may be the same or different.

As the (m+n1+n2)-valent linking group with respect to $R^6$, those exemplified as the (m+n)-valent linking group represented by $R^1$ in Formula (1) or $R^3$ in Formula (2) are used, and preferred aspects thereof are also the same.

As the divalent linking group with respect to $R^7$ to $R^9$, those exemplified as the divalent linking group represented by $R^4$ or $R^5$ in Formula (2) are used, and preferred aspects thereof are also the same.

Specific examples and preferred examples of the acid group which the substituent $A^3$ may have include those which are the same as the above-described specific examples and preferred examples with respect to the acid group in Formula (1).

The substituent $A^3$ is even more preferably a monovalent substituent having at least one acid group with a pKa of less than 5, particularly preferably a monovalent substituent having at least one group selected from the group consisting of a sulfonic acid group, a carboxylic acid group, a phosphoric acid group, a phosphonic acid group, and a phosphinic acid group, and most preferably a carboxylic acid group.

Specific examples and preferred examples of the monovalent substituent $A^4$ different from $A^3$ include those which are the same as a group other than the acid group in the above-described specific examples and preferred examples with respect to $A^1$ in Formula (1). Among them, the substituent $A^4$ is more preferably a monovalent substituent having at least one functional group with a pKa of 5 or more, even more preferably a monovalent substituent having at least one group selected from the group consisting of a group having a coordinating oxygen atom, a group having a basic nitrogen atom, a phenol group, a urea group, a urethane group, an alkyl group, an aryl group, an alkyloxycarbonyl group, an alkyl amino carbonyl group, a group having an alkyleneoxy chain, an imide group, a carboxylate group, a sulfonamide group, a hydroxyl group, and a heterocyclic group, and particularly preferably an alkyl group, an aryl group, a group having a coordinating oxygen atom, a group having a basic nitrogen atom, an urea group, or a urethane group.

As a combination of the substituent $A^3$ and the substituent $A^4$, it is preferred that the substituent $A^4$ is a monovalent substituent having at least one functional group with a pKa of 5 or more, while the substituent $A^3$ is a monovalent substituent having at least one functional group with a pKa of less than 5.

It is more preferred that the substituent $A^4$ is a monovalent substituent having at least one group selected from the group consisting of a group having a coordinating oxygen atom, a group having a basic nitrogen atom, a phenol group, a urea group, a urethane group, an alkyl group, an aryl group, an alkyloxycarbonyl group, an alkyl amino carbonyl group, a group having an alkyleneoxy chain, an imide group, a carboxylate group, a sulfonamide group, a hydroxyl group, and a heterocyclic group, while the substituent $A^3$ is a monovalent substituent having at least one group selected from the group consisting of a carboxylic acid group, a sulfonic acid group, a phosphoric acid group, a phosphonic acid group, and a phosphinic acid group.

It is even more preferred that the substituent $A^4$ is an alkyl group, an aryl group, a group having a coordinating oxygen atom, a group having a basic nitrogen atom, a urea group or a urethane group while the substituent $A^3$ is a monovalent substituent having a carboxylic acid group.

It is particularly preferred that the substituent $A^4$ is an alkyl group while the substituent $A^3$ is a carboxylic acid group from the viewpoint that the adsorption of the alkyl group of the substituent $A^3$ to the metal oxide particles (A) to be described below (among them, particularly titanium dioxide particles) is good.

It is presumed that the fact that the adsorption of the alkyl group of the substituent $A^4$ to titanium dioxide particles is good is because as in the case where the titanium dioxide particles are surface-treated with stearic acid, and the like, the alkyl group of the stearic acid interacts with the alkyl group of the substituent $A^4$.

The molecular weight of the polymer compound (B) is preferably 1,000 to 50,000, more preferably 3,000 to 30,000, and even more preferably 3,000 to 20,000 as a weight average molecular weight. When the weight average molecular weight is within the range, the effect of a plurality of the adsorption sites introduced into the ends of the polymer is sufficiently exhibited, so that performance, in which adsorptivity onto the surface of the metal oxide particles is excellent, may be exhibited.

As described below, when a cured film is formed, the visible light transmittance of the cured film is particularly excellent, so that the weight average molecular weight of the polymer compound (B) is particularly preferably 5,000 to 8,000.

(Method for Synthesizing Polymer Compound (B))

The polymer compound represented by Formula (1) or (2) is not particularly limited, but may be synthesized in accordance with the synthesis methods described in paragraph nos. 0114 to 0140 and 0266 to 0348 of Japanese Patent Application Laid-Open No. 2007-277514.

In particular, it is preferred that the polymer compound (B) represented by Formula (1) or (2) is synthesized by a method of performing radical polymerization of a vinyl monomer in the presence of a mercaptan compound having a plurality of the adsorption sites.

Polymerization may be performed by using only one of the aforementioned vinyl monomers, or copolymerization may be performed by using two or more thereof in combination.

Here, Specific Examples (M-1) to (M-9) and (M-14) to (M-16) of the vinyl monomer will be shown below, but the present invention is not limited thereto.

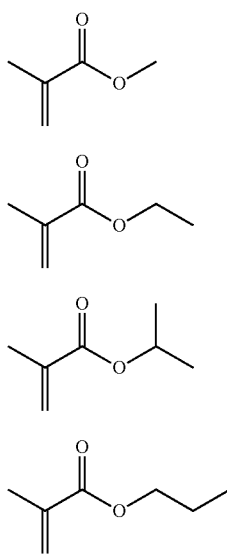

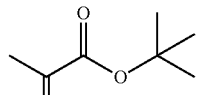

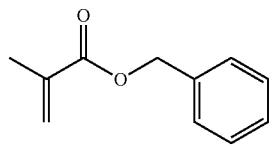

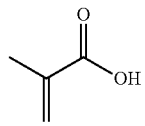

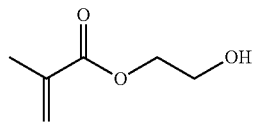

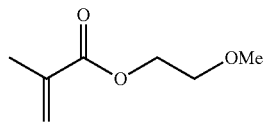

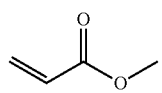

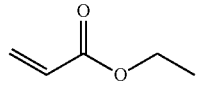

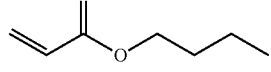

As a method of synthesizing the polymer compound (B) represented by Formula (1) or (2), more specifically, a method of performing radical polymerization of a vinyl monomer in the presence of a compound represented by the following Formula (3) is preferred.

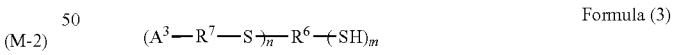

Formula (3)

In Formula (3), $R^6$, $R^7$, $A^3$, m and n each have the same meaning as $R^3$, $R^4$, $A^2$, m and n in Formula (2), and preferred aspects thereof are also the same.

In addition, as the method of synthesizing the polymer compound (B) represented by Formula (1) or (2), a method of adding the compound represented by Formula (3) to a macromonomer having a carbon-carbon double bond (thiol-ene reaction method) is also preferred. It is preferred that as a catalyst for the reaction, a radical generator or a base is used.

Specific examples of the macromonomer having a carbon-carbon double bond will be shown below, but the present invention is not limited thereto. Among the following specific examples, the repeating unit number k is an integer of 3 to 50.

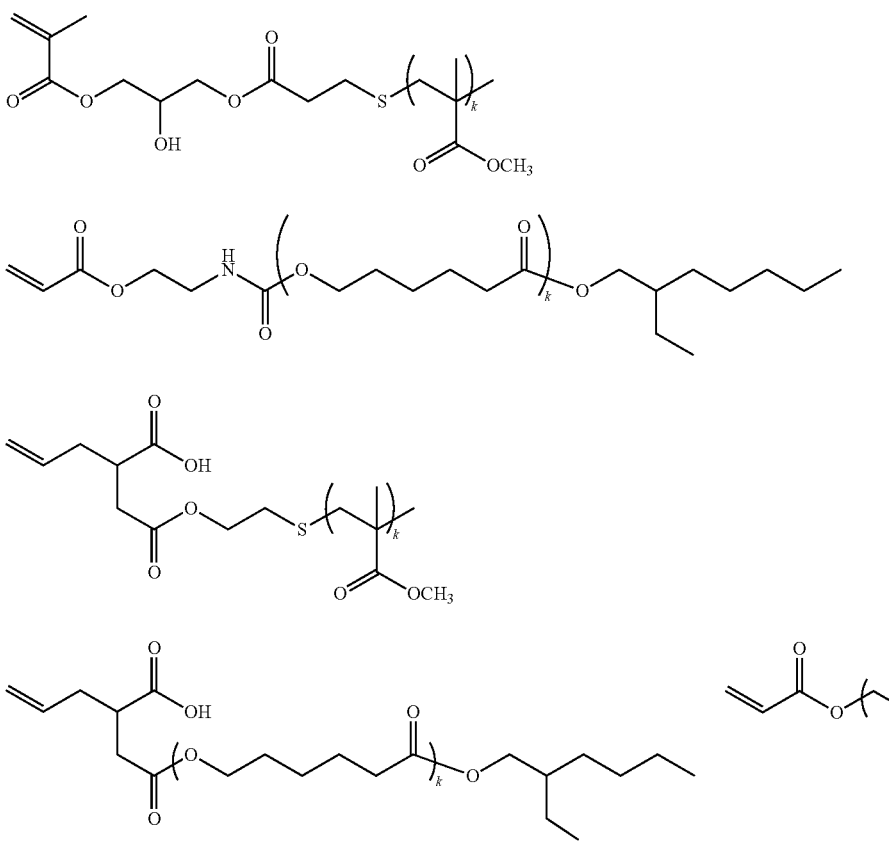

Furthermore, as the method of synthesizing the polymer compound (B) represented by Formula (1) or (2), a method of forming a thioester group by a dehydration condensation reaction of the compound represented by Formula (3) with a polymer compound having a carboxylic acid group is also preferred.

Specific examples of a polymer compound having a carboxylic acid group will be shown below, but the present invention is not limited thereto. Among the following specific examples, the repeating unit number k is an integer of 3 to 50.

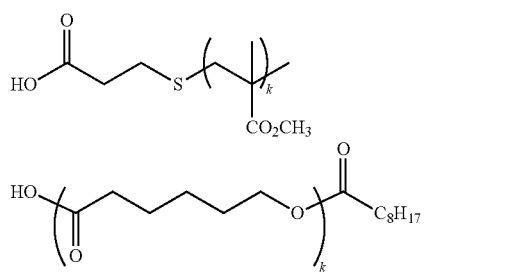

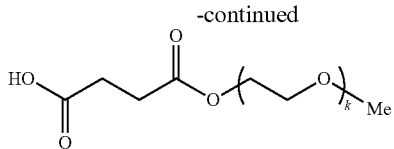

Further, as the method of synthesizing the polymer compound (B) represented by Formula (1) or (2), a method of forming a thioether group by a nucleophilic substitution reaction of the compound represented by Formula (3) with a polymer compound having a leaving group is also preferred. The leaving group is preferably halogen such as iodine, bromine and chlorine, and a sulfonic acid ester such as tosylate, mesylate and trifluoromethanesulfonate.

Specific examples of the polymer compound having a leaving group will be shown below, but the present invention is not limited thereto. Among the following specific examples, the repeating unit number k is an integer of 3 to 50.

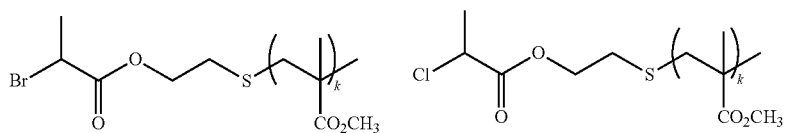

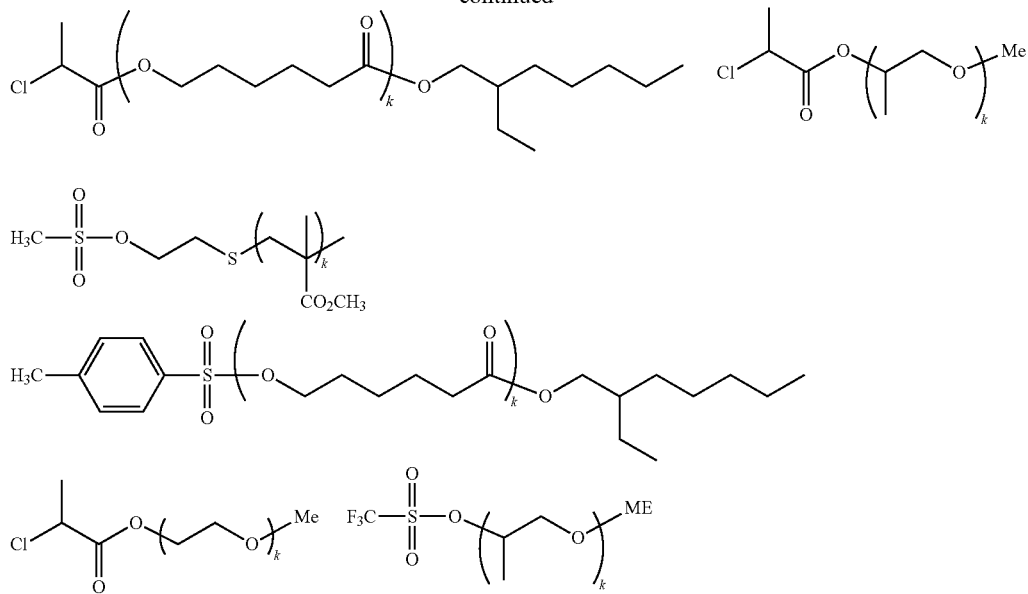

It is preferred that the compound represented by Formula (3) is synthesized by the following method.

A method of performing an addition reaction of a compound having 3 to 10 mercapto groups in a molecule thereof with a compound having a carbon-carbon double bond which may react with a mercapto group while having the adsorption site The addition reaction is particularly preferably a radical addition reaction. Meanwhile, the carbon-carbon double bond is more preferably a one-substituted or two-substituted vinyl group in terms of reactivity with a mercapto group.

Specific examples [Specific Examples (18) to (34)] of a compound having 3 to 10 mercapto groups in a molecule thereof include the following compounds.

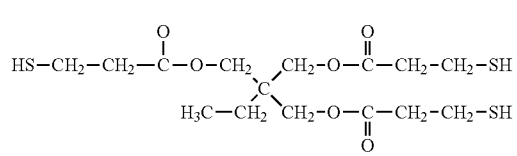 (18)

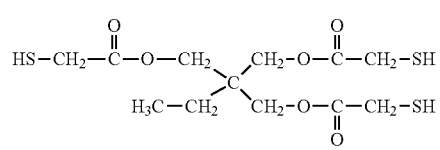 (19)

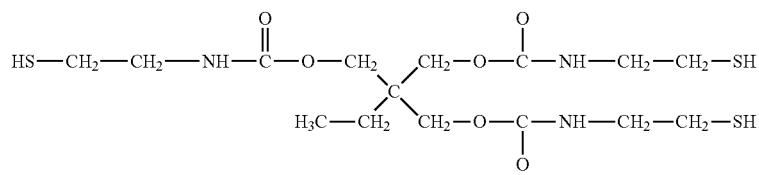 (20)

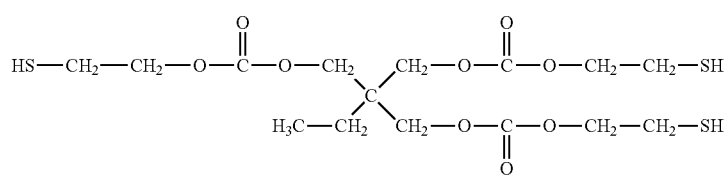 (21)

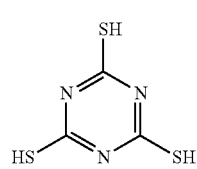 (22)

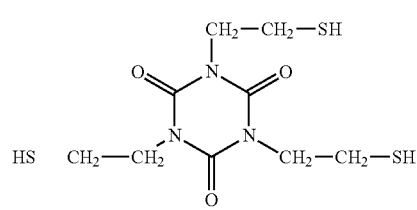 (23)

-continued
(24)
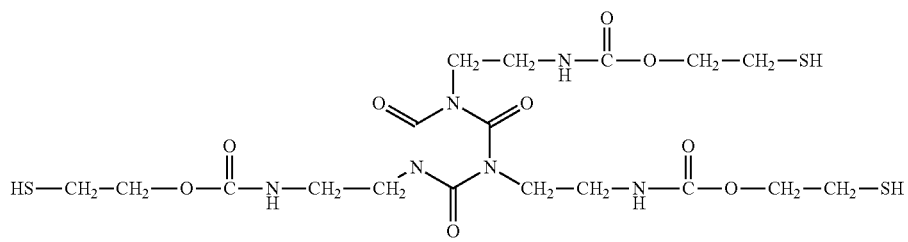
(25)
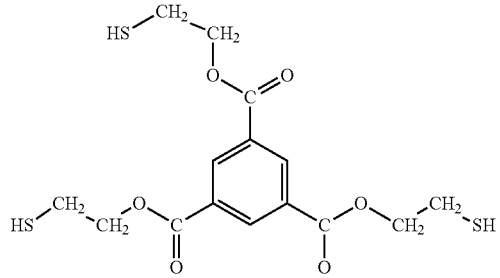
(26)
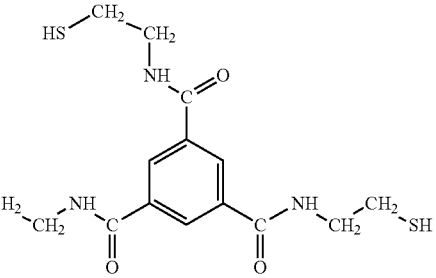
(27)
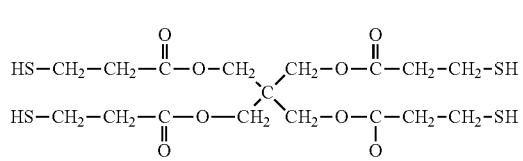
(28)
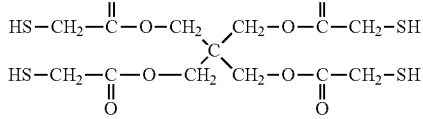
(29)
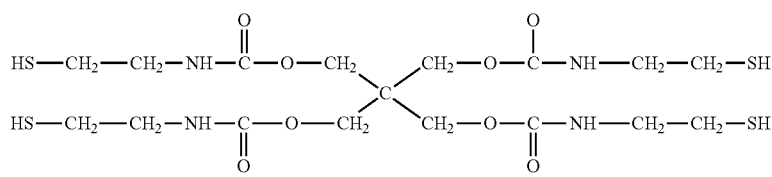
(30)
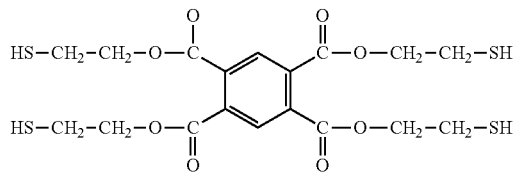
(31)
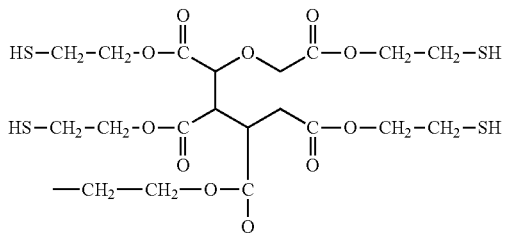
(32)
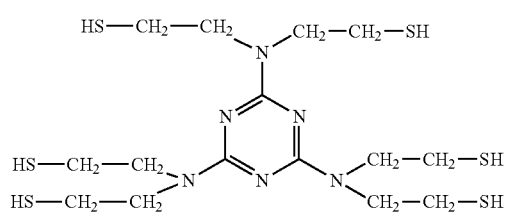
(33)
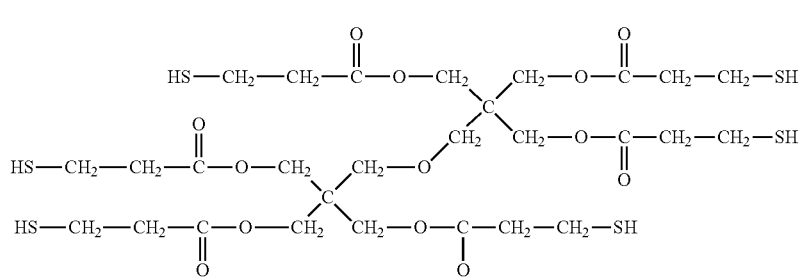

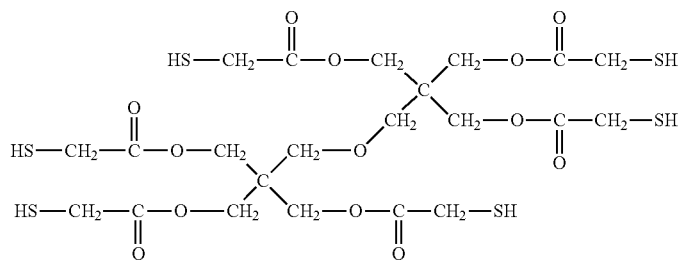
(34)

Among those described above, particularly preferred compounds are the following compounds from the viewpoint of availability of raw materials, ease of synthesis, and solubility in various solvents.

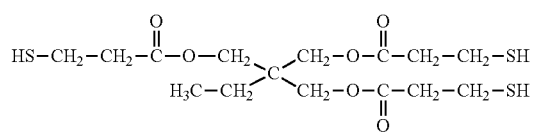
(18)

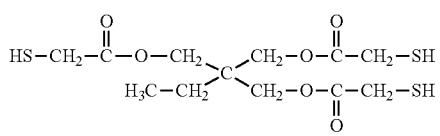
(19)

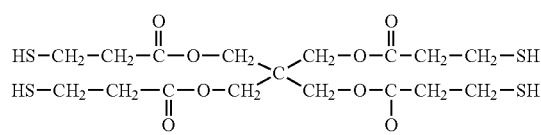
(27)

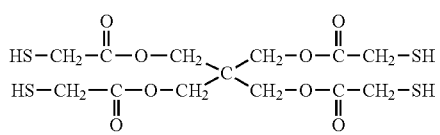
(28)

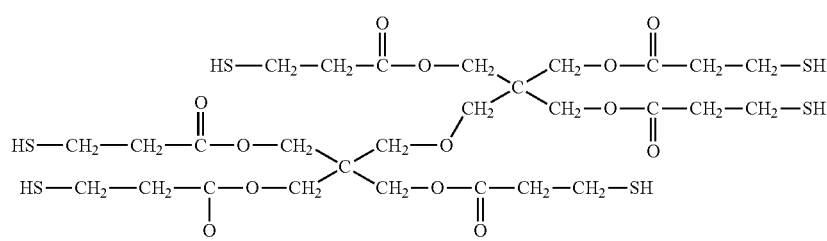
(33)

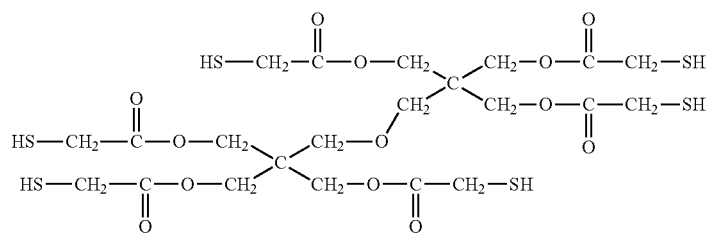
(34)

Among those described above, as a commercially available product, (for example, (33) is dipentaerythritol hexakis (3-mercaptopropionate): manufactured by Sakai Chemical Industry Co., Ltd.) and the like are available.

The compound having a carbon-carbon double bond while having the adsorption site (specifically, a compound having a carbon-carbon double bond while having at least one group selected from the group consisting of an acid group, a urea group, a urethane group, a group having a coordinating oxygen atom, a group having a basic nitrogen atom, a phenol group, an alkyl group, an aryl group, a group having an alkyleneoxy chain, an imide group, an alkyloxycarbonyl group, an alkyl amino carbonyl group, a carboxylate group, a sulfonamide group, a heterocyclic group, an alkoxysilyl group, an epoxy group, an isocyanate group, and a hydroxyl group) is not particularly limited, but examples thereof include those as follows.

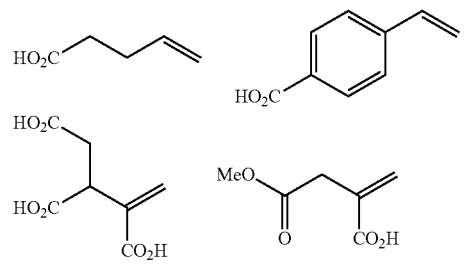

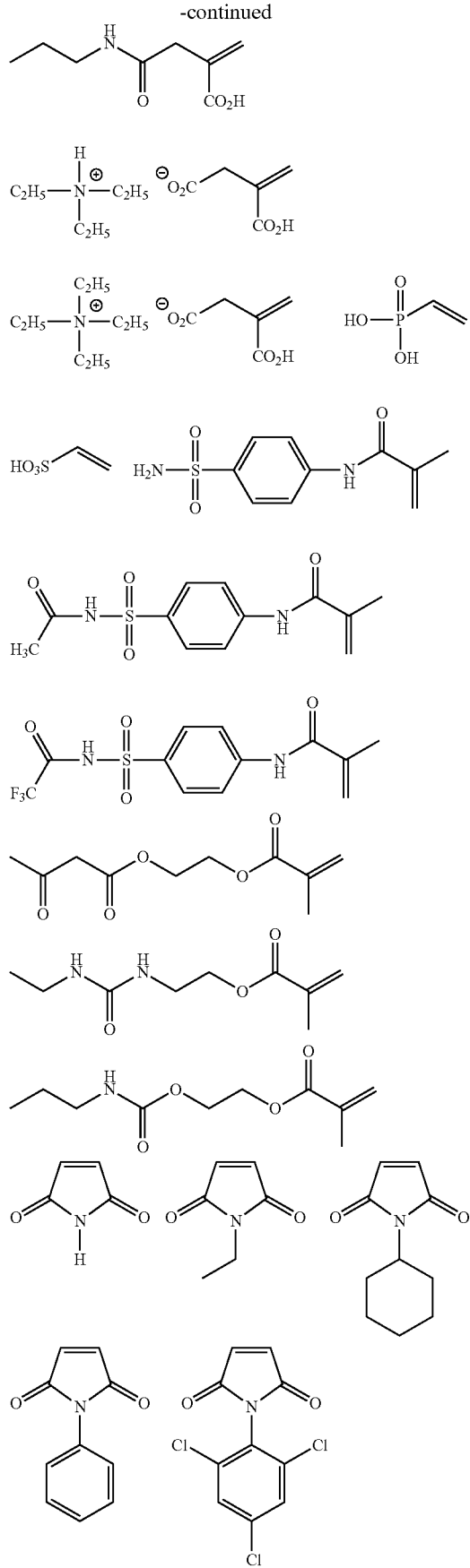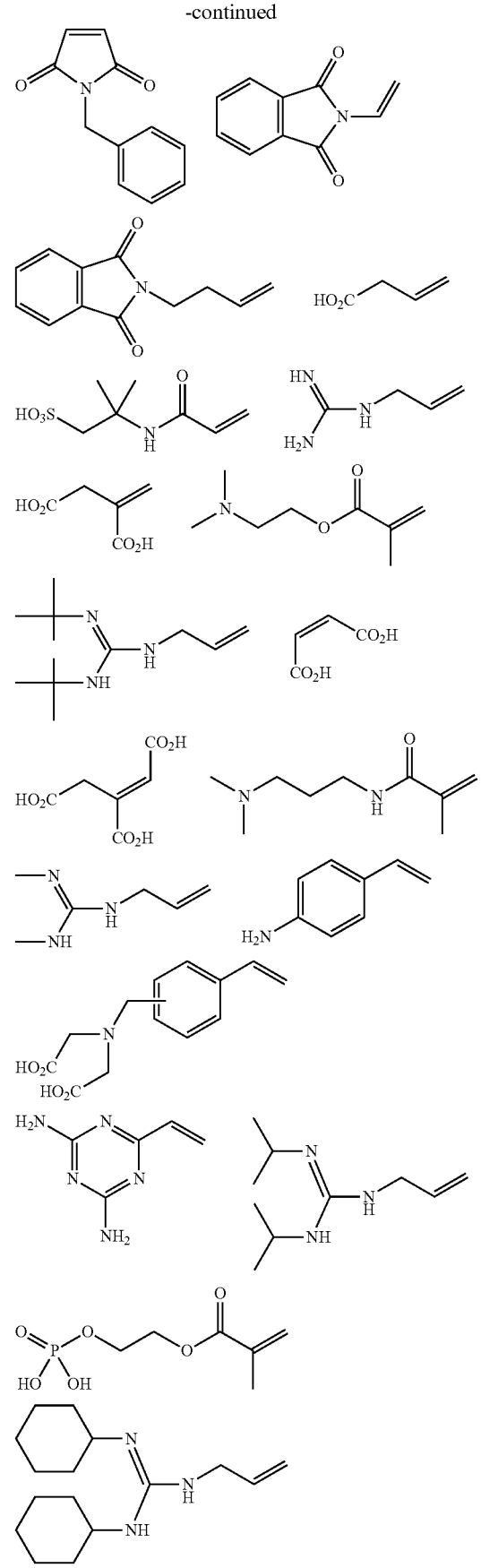

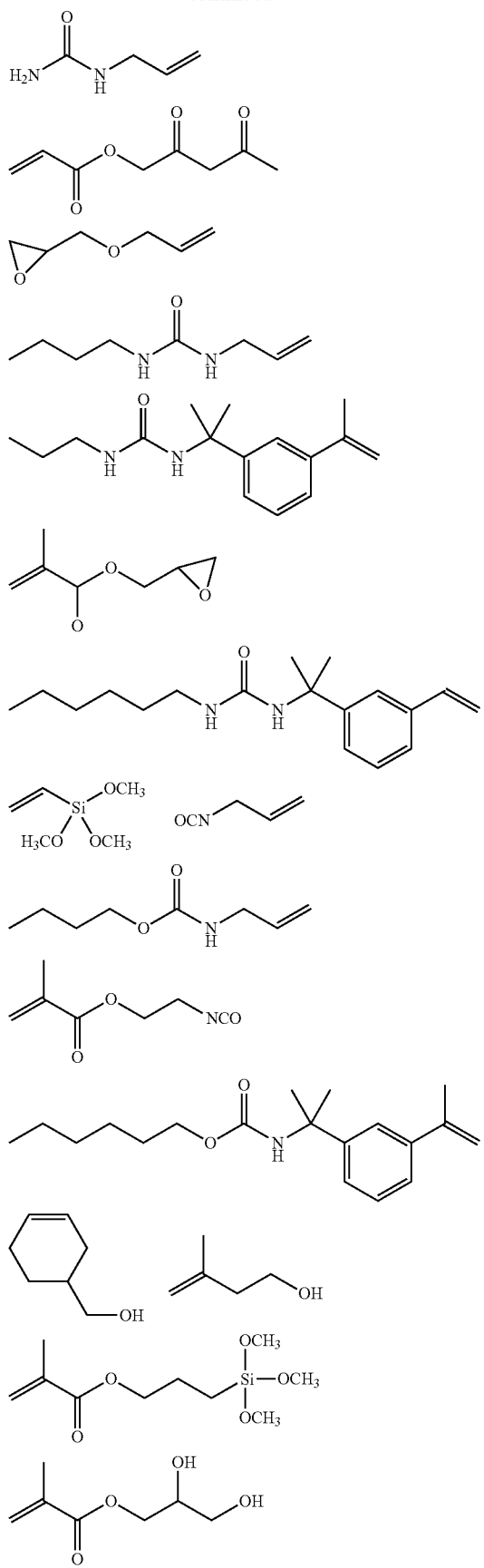
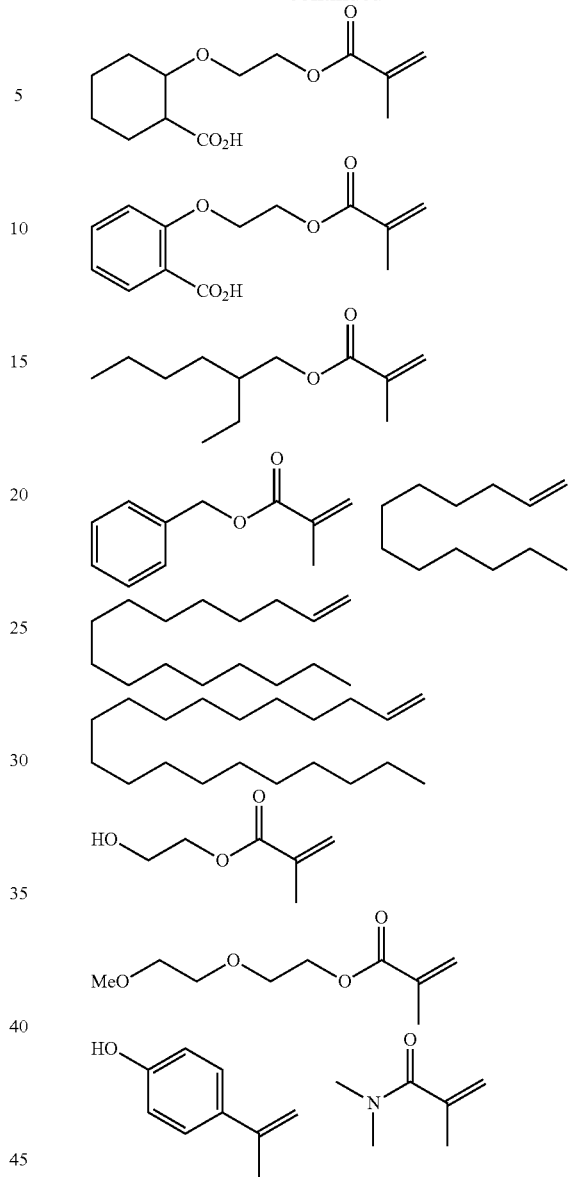

A product of a radical addition reaction of the "compound having 3 to 10 mercapto groups in a molecule thereof" with the "compound having a carbon-carbon double bond while having the adsorption site" is obtained by using, for example, a method including: dissolving the aforementioned "compound having 3 to 10 mercapto groups in a molecule thereof" and the "compound having a carbon-carbon double bond while having the adsorption site" in a suitable solvent, adding a radical generator thereto, and performing addition at about 50° C., to 100° C. (a thiol-ene reaction method).

As an example of the suitable solvent used in the thiol-ene reaction method, any solvent may be selected according to the solubility of "a compound having 3 to 10 mercapto groups in a molecule thereof", "a compound having a carbon-carbon double bond while having the adsorption site" and "a radical addition reaction product to be produced", which are used.

Examples thereof include methanol, ethanol, propanol, isopropanol, 1-methoxy-2-propanol, 2-ethylhexanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. These solvents may be used in mixture of two or more thereof.

In addition, as the radical generator, it is possible to use an azo compound such as 2,2'-azobis(isobutyronitrile) (AIBN), 2,2'-azobis-(2,4'-dimethylvaleronitrile), and 2,2'-dimethyl azobisisobutyrate [V-601, manufactured by Wako Pure Chemical Industries, Ltd.], a peroxide such as benzoyl peroxide, a persulfate such as potassium persulfate and ammonium persulfate, and the like.

It is preferred that the polymer compound of the present invention is obtained by using these vinyl monomers and the compound represented by Formula (3) to polymerize those components according to the usual method by publicly known methods. Meanwhile, the compound represented by Formula (3) in the present invention serves as a chain transfer agent, and hereinafter, there is a case where the compound is simply called "a chain transfer agent".

For example, the polymer compound is obtained by a method including: dissolving these vinyl monomers and the chain transfer agent in a suitable solvent, adding a radical polymerization initiator thereto, and performing polymerization in the solution at about 50° C. to 220° C. (a solution polymerization method).

As an example of the suitable solvent used in the solution polymerization method, any solvent may be selected according to the solubility of a monomer used and a copolymer produced. Examples thereof include methanol, ethanol, propanol, isopropanol, 1-methoxy-2-propanol, 2-ethylhexanol, 1-methoxy-2-propyl acetate, acetone, methyl ethyl ketone, methyl isobutyl ketone, methoxypropyl acetate, ethyl lactate, ethyl acetate, acetonitrile, tetrahydrofuran, dimethylformamide, chloroform, and toluene. These solvents may be used in mixture of two or more thereof.

Furthermore, as the radical polymerization initiator, it is possible to use an azo compound such as 2,2'-azobis(isobutyronitrile)(AIBN), 2,2'-azobis-(2,4'-dimethylvaleronitrile), and 2,2'-dimethyl azobisisobutyrate [V-601, manufactured by Wako Pure Chemical Industries, Ltd.], a peroxide such as benzoyl peroxide, a persulfate such as potassium persulfate and ammonium persulfate, and the like.

In the dispersion composition of the present invention, the polymer compounds (B) may be used either alone or in combination of two or more thereof.

The content of the polymer compound (B) is preferably in a range of 5 to 40% by mass, more preferably in a range of 10 to 35% by mass, and even more preferably in a range of 12 to 30% by mass, with respect to the total solid content of the dispersion composition (or the curable composition to be described below) of the present invention, from the viewpoint of dispersibility, high refractive index, and coated surface conditions.

—Other Dispersion Resins—

The dispersion composition of the present invention may contain a dispersion resin (hereinafter, referred to as "other dispersion resins" in some cases) other than the specific resin, for the purpose of adjusting the dispersibility of the metal oxide particles, and the like.

Examples of other dispersion resins that may be used in the present invention include a polymer dispersant [for example, polyamideamine and salts thereof, polycarboxylic acid and salts thereof, a polymer unsaturated acid ester, a modified polyurethane, a modified polyester, a modified poly(meth)acrylate, a (meth)acrylic copolymer, and a naphthalenesulfonic acid-formalin condensate], polyoxyethylene alkyl phosphoric acid ester, polyoxyethylene alkylamine, alkanol amine, a pigment derivative, and the like.

The other dispersion resins may also be classified into a straight-chained polymer, a terminal end-modified polymer, a graft-type polymer, and a block-type polymer, from the structure thereof.

The other dispersion resins adsorb on the surface of the metal oxide particles, and thus serve to prevent re-aggregation. For that reason, examples of preferred structures of the resin include a terminal end-modified polymer, a graft-type polymer, and a block-type polymer, each of which has an anchor moiety to the surface of the metal oxide particles.

Meanwhile, the other dispersion resins have an effect of modifying the surface of the metal oxide particles, thereby promoting adsorption of the dispersion resin.

Specific examples of other dispersion resins include "DISPERBYK101 (polyamideamine phosphate), 107 (carboxylic acid ester), 110 and 180 (a copolymer including an acid group), 130 (polyamide), 161, 162, 163, 164, 165, 166, and 170 (a polymeric copolymer)" and "BYK-P104 and P105 (a polymer unsaturated polycarboxylic acid)", which are manufactured by BYK Chemie GmbH, "EFKA 4047, 4050, 4010, and 4165 (polyurethane-based), EFKA 4330 and 4340 (block copolymer), 4400 and 4402 (modified polyacrylate), 5010 (polyester amide), 5765 (a polymer polycarboxylic acid salt), 6220 (fatty acid polyester), 6745 (phthalocyanine derivative), and 6750 (azo pigment derivative)" manufactured by EFKA Co., Ltd., "AJISPER PB821, PB822" manufactured by Ajinomoto Fine-Techno Co., Inc., "Florene TG-710 (urethane oligomer)" and "Polyflow No. 50E, No. 300 (acrylic copolymer)", which are manufactured by Kyoeisha Chemical Co., Ltd., "Disparlon KS-860, 873SN, 874, #2150 (aliphatic polyvalent carboxylic acid), #7004 (polyether ester), DA-703-50, DA-705, DA-725" manufactured by Kusumoto Chemicals Ltd., "DEMOL RN, N (a naphthalenesulfonic acid-formalin polycondensate), MS, C, SN-B (an aromatic sulfonic acid-formalin polycondensate)", "HOMOGENOL L-18 (polymeric polycarboxylic acid)", "EMULGEN 920, 930, 935, 985 (polyoxyethylene nonylphenyl ether)", and "ACETAMIN 86 (stearylamine acetate)", which are manufactured by Kao Corporation. "SOLSPERSE 5000 (a phthalocyanine derivative), 22000 (an azo pigment derivative), 13240 (polyester amine), 3000, 17000, and 27000 (a polymer having a functional moiety at a terminal thereof), 24000, 28000, 32000, and 38500 (a graft-type polymer)" manufactured by The Lubrizol Corporation, "Nikkor T106 (polyoxyethylene sorbitanmonooleate) and MYS-IEX (polyoxyethylene monostearate)" manufactured by Nikko Chemicals Co., Ltd., and the like.

Further, examples of other dispersion resins also include a polymer obtained by polymerizing a compound (also referred to as an ether dimmer in some cases) represented by Formula (ED) after paragraph no. 0562 of Japanese Patent Application Laid-Open No. 2012-208494 ([0692] of the corresponding U.S. Patent Application Publication No. 2012/235099) as an essential monomeric body component, the contents of which are incorporated into the specification of the present application.

As a specific example of the ether dimmer, it is possible to consider the description of the ether dimmer of paragraph no. 0565 of Japanese Patent Application Laid-Open No. 2012-208494 ([0694] of the corresponding U.S. Patent Application Publication No. 2012/235099), the contents of which are incorporated into the specification of the present application.

Specific examples of the polymer obtained by polymerizing a compound represented by Formula (ED) as an essential monomeric body component include those which are the same as specific examples of a polymer obtained by polymerizing a compound represented by Formula (ED) to be described below in the clause of the Binder Polymer as an essential monomeric body component.

These other resins may be used either alone or in combination of two or more thereof.

The dispersion composition (or the curable composition to be described below) of the present invention may or may not contain other dispersion resins, but when the composition contains other dispersion resins, the content of the other dispersion resins is preferably in the range of 1 to 20% by mass, and more preferably in the range of 1 to 10% by mass, with respect to the total solid content of the dispersion composition (or the curable composition to be described below) of the present invention.

<(C) Solvent>

The dispersion composition of the present invention includes a solvent, and the solvent may be constituted by using various organic solvents.

Examples of the organic solvents that may be used herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, and the like.

These organic solvents may be used either alone or in mixture. The concentration of the solid content in the dispersion composition of the present invention is preferably 2 to 60% by mass.

A method for preparing the dispersion composition of the present invention is not particularly limited, and a method for preparing a dispersion composition that is typically used may be applied. For example, the dispersion composition may be prepared by mixing metal oxide particles (A), a polymer compound (B), and a solvent (C) and subjecting the mixture to dispersion treatment using a circulation-type dispersion device (bead mill), and the like.

Meanwhile, the present invention relates to a method for preparing the dispersion composition, and also to a method for preparing the following curable composition.

<Curable Composition>

A curable composition of the present invention is preferably a curable composition which is constituted by including the dispersion composition of the present invention and a polymerizable compound (D), and if necessary, other components.

The dispersion composition may be made into a curable composition to form a cured film (a transparent film) having a high refractive index.

Further, the present invention also relates to a transparent film formed by using the curable composition of the present invention.

A cured film to be obtained from the curable composition (a film that is formed by the curable composition and subsequently subjected to a curing reaction) has preferably a refractive index of 1.85 to 2.60, and more preferably 1.90 to 2.60.

The physical properties that the cured film has a refractive index of 1.85 to 2.60 may be suitably achieved by allowing the curable composition of the present invention to contain the polymer compound (B), and may also be achieved by any means, but the physical properties may be more certainly achieved, for example, by adjusting the kind and content of polymerizable compound (D) or binder polymer which may be additionally added, or containing the metal oxide particles (A) in the curable composition and simultaneously adjusting the kind and content of metal oxide particles.

In particular, the above-described physical properties may be preferably achieved by using the metal oxide particles as the aforementioned preferred example.

In addition, the composition of the present invention is preferably a transparent composition, and more specifically, when a cured film having a film thickness of 1.0 μm is formed by the composition, the composition is a composition in which a light transmittance with respect to the thickness direction of the cured film is 90% or more over the entire wavelength region of 400 to 700 nm.

That is, the transparent film of the present invention refers to a film in which a light transmittance with respect to the thickness direction of the film is 90% or more throughout the wavelength region of 400 to 700 nm in a film thickness of 1.0 μm.

The physical properties of this light transmittance may be achieved by any means as long as the curable composition contains the dispersion composition of the present invention and a polymerizable compound (D), and, for example, are suitably achieved by adjusting the kind and content of polymerizable compound (D) or binder polymer which may be additionally added. In addition, the physical properties of the light transmittance may be suitably achieved even by adjusting the particle diameter of the metal oxide particles (A) or the kind and addition amount of polymer compound (B).

In particular, when a cured film is formed, the visible light transmittance of the cured film is particularly excellent, and accordingly, the weight average molecular weight of the polymer compound (B) is preferably 5.000 to 8,000, and the acid value is preferably 70 to 90 mgKOH/g, and it is particularly preferred that the weight average molecular weight is 5,000 to 8,000 and the acid value is 70 to 90 mgKOH/g.

When the content of metal oxide particles is high, there is a case where transparency of the cured film is problematic, but in the present invention, a cured film which is excellent in transparency may be obtained by using the polymer compound (B).

For the curable composition and the transparent film of the present invention, the fact that the light transmittance is 90% or more over the entire wavelength region of 400 to 700 nm is an important factor for, in particular, an undercoat film of a microlens or a color filter to exhibit characteristics required for the undercoat film.

The light transmittance is preferably 95% or more over the entire wavelength region of 400 to 700 nm, more preferably 99% or more, and most preferably 100%.

Considering what has been described above, the curable composition of the present invention does not substantially contain a coloring agent (the content of the coloring agent is preferably 0% by mass with respect to the total solid content of the composition).

(D) Polymerizable Compound

In the present invention, when a microlens is manufactured, it is preferred that as the polymerizable compound (D), "a compound having two or more epoxy groups or oxetanyl groups in a molecule thereof" is used from the viewpoint of solvent resistance of a cured film (a transparent film) when a solid-state imaging device is manufactured.

—Compound Having Two or More Epoxy Groups (Oxiranyl Groups) or Oxetanyl Groups in Molecule Thereof—

Specific examples of the compound having two or more epoxy groups in a molecule thereof as a polymerizable compound (D) include a bisphenol A-type epoxy group, a bisphenol F-type epoxy resin, a phenol novolac-type epoxy resin, a cresol novolac-type epoxy resin, an aliphatic epoxy resin, and the like.

These are available as a commercially available product. Examples of the bisphenol A-type epoxy resin include JER-827, JER-828, JER-834, JER-1001, JER-1002, JER-1003, JER-1055, JER-1007, JER-1009, and JER-1010 (all manufactured by Mitsubishi Chemical Corporation), EPICLON 860, EPICLON 1050, EPICLON 1051 and EPICLON 1055 (all manufactured by DIC Co., Ltd.), and the like, examples of the bisphenol F-type epoxy resin include JER-806, JER-807, JER-4004, JER-4005, JER-4007 and JER-4010 (all manufactured by Mitsubishi Chemical Corporation), EPICLON830 and EPICLON835 (all manufactured by DIC Co., Ltd.). LCE-21 and RE-602S (all manufactured by Nippon Kayaku Co., Ltd.), and the like, examples of the phenol novolac-type epoxy resin include JER-152, JER-154, JER-157 S70, and JER-157S65 (all manufactured by Mitsubishi Chemical Corporation), EPICLONN-740, EPICLONN-740, EPICLONN-770, and EPICLONN-775 (all manufactured by DIC Co., Ltd.), and the like, examples of the cresol novolac-type epoxy resin include EPICLONN-660, EPICLONN-665, EPICLONN-670, EPICLONN-673, EPICLONN-680, EPICLONN-690, and EPICLONN-695 (all manufactured by DIC Co., Ltd.), EOCN-1020 (manufactured by Nippon Kayaku Co., Ltd.), and the like, and examples of the aliphatic epoxy resin include ADEKA RESIN EP-4080S, ADEKA RESIN EP-4085S, and ADEKA RESIN EP-4088S (all manufactured by ADEKA Co., Ltd.), Celloxide 2021P, Celloxide 2081, Celloxide 2083, Celloxide 2085, EHPE-3150, EPO-LEAD PB 3600, and EPOLEAD PB4700 (all manufactured by DAICEL CORPORATION), DENACOL EX-211L, EX-212L, EX-214L, EX-216L, EX-321L, and EX-850L (all manufactured by Nagase ChemteX Corporation), and the like. In addition to these examples, examples thereof include ADEKA RESIN EP-4000S. ADEKA RESIN EP-4003S, ADEKA RESIN EP-4010S, and ADEKA RESIN EP-4011S (all manufactured by ADEKA Co., Ltd.), NC-2000, NC-3000, NC-7300. XD-1000, EPPN-501, and EPPN-502 (all manufactured by ADEKA Co., Ltd.). JER-1031S (manufactured by Mitsubishi Chemical Corporation), and the like.

These may be used either alone or in combination of two or more thereof.

As a specific example of the compound having two or more oxetanyl groups in a molecule thereof. ARONOXETANE OXT-121, OXT-221, OX-SQ, and PNOX (all manufactured by TOAGOSEI CO., LTD.) may be used.

In addition, it is preferred that the compound including an oxetanyl group is used either alone or in mixture with a mixture including an epoxy group.

Furthermore, as (D) the polymerizable compound, an addition polymerizable compound having at least one ethylenically unsaturated double bond may also be used, and it is preferred that a compound having at least one, preferably two or more terminal ethylenically unsaturated bonds is used.

In the present invention, it is more preferred that the polymerizable compound (D) is at least one selected from the group consisting of the above-described compound having two or more epoxy groups or oxetanyl groups and a compound having two or more terminal ethylenically unsaturated bonds, in a molecule thereof.

Such an addition polymerizable compound having at least one ethylenically unsaturated double bond is widely known in the art, and in the present invention, these may be used without particular limitation.

When the compound is used as the polymerizable compound (D), it is preferred that the curable composition of the present invention further contains a polymerization initiator (E) to be described below.

The addition polymerizable compounds having at least one ethylenically unsaturated double bond have chemical forms such as, for example, a monomer, a prepolymer, that is, a dimmer, a trimer and an oligomer, or mixtures thereof and copolymers thereof. Examples of the monomers and copolymers thereof include unsaturated carboxylic acid (for example, acrylic acid, methacrylic acid, itaconic acid, crotonic acid, isocrotonic acid, maleic acid, and the like), and esters and amides thereof, and esters of unsaturated carboxylic acid and an aliphatic polyhydric alcohol compound and amides of unsaturated carboxylic acid and an aliphatic polyvalent amine compound are preferably used. Further, an addition reaction product of unsaturated carboxylic acid esters or unsaturated carboxylic acid amides, which have a nucleophilic substituent such as a hydroxyl group, an amino group, and a mercapto group, with monofunctional or polyfunctional isocyanates or epoxies, a dehydration condensation reaction product of unsaturated carboxylic acid esters or unsaturated carboxylic acid amides with monofunctional or polyfunctional carboxylic acid, and the like are suitably used. In addition, an addition reaction product of unsaturated carboxylic acid esters or unsaturated carboxylic acid amides, which have an electrophilic substituent such as an isocyanate group, and an epoxy group, with monofunctional or polyfunctional alcohols, amines or thiols; and furthermore, a substitution reaction product of unsaturated carboxylic acid esters or unsaturated carboxylic acid amides, which have a leaving substituent such as a halogen group, and a tosyloxy group, with monofunctional or polyfunctional alcohols, amines or thiols, are also suitable. Furthermore, as another example, the group of compounds obtained by substituting the aforementioned unsaturated carboxylic acid with an unsaturated phosphonic acid, styrene, vinyl ether, and the like may also be used. As the specific compounds thereof, the compounds described in paragraph nos. 0095 to 0108 of Japanese Patent Application Laid-Open No. 2009-288705 may be suitably used even in the present invention.

Further, as (D) the polymerizable compound (hereinafter, also simply referred to as "a polymerizable monomer and the like" and "a polymerizable monomer"), a compound having an ethylenically unsaturated group with a boiling point of 100° C., or more under normal pressure, which has at least one addition polymerizable ethylene group, is also preferred. Examples thereof include monofunctional acrylates or methacrylates such as polyethylene glycol mono (meth)acrylate, polypropylene glycol mono(meth)acrylate, and phenoxyethyl(meth)acrylate; those having ethylene oxide or propylene oxide added to polyfunctional alcohols such as polyethylene glycol di(meth)acrylate, trimethylolethane tri(meth)acrylate, neopentyl glycol di(meth)acrylate, pentaerythritol tri(meth)acrylate, pentaerytritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl) isocyanurate, glycerine or trimethylolethane, followed by (meth)acrylation, urethane (meth)acrylates as described in Japanese Examined Patent Application Publication Nos. S48-41708 and S50-6034, and Japanese Patent Application Laid-Open No. 851-37193; polyester acrylates as described in Japanese Patent Application Laid-Open No. S48-64183, Japanese Examined Patent Application Publication Nos. S49-43191 and S52-30490, polyfunctional acrylates or methacrylates such as epoxy acrylates as a product, obtained by reacting epoxy polymers with (meth)acrylic acid, and mixtures thereof.

Examples thereof also include polyfunctional (meth)acrylates obtained by reacting a cyclic ether group such as glycidyl (meth)acrylate with a compound having an ethylenically unsaturated group in polyfunctional carboxylic acid, and the like.

In addition, as the other preferred polymerizable monomers and the like, a compound having a fluorene ring and having an ethylenically polymerizable group at two or more functionalities, described in Japanese Patent Application Laid-Open Nos. 2010-160418 and 2010-129825, Japanese Patent No. 4364216, and the like, and cardo polymers may also be used.

Furthermore, as the compound having at least one ethylenically unsaturated group, which is addition polymerizable, and having a boiling point of 100° C., or more under normal pressure, compounds described in paragraph nos. [0254] to [0257] of Japanese Patent Application Laid-Open No. 2008-292970 are also suitable.

Further, a compound which is described as a compound of Formulae (1) and (2), together with specific examples thereof, in Japanese Patent Application Laid-Open No. H10-62986 and which is obtained by adding ethylene oxide or propylene oxide to the polyfunctional alcohol followed by (meth)acrylation may also be used as the polymerizable monomer.

The polymerizable monomer used in the present invention is also preferably a polymerizable monomer represented by Formulae (MO-1) to (MO-6) described in paragraph nos. 0297 to 0300 of Japanese Patent Application Laid-Open No. 2012-215806.

As a specific example of the radical polymerizable monomers represented by Formulae (MO-1) to (MO-6), compounds described in paragraph nos. 0248 to 0251 of Japanese Patent Application Laid-Open No. 2007-269779 may also be suitably used in the present invention.

Among them, as the polymerizable monomer and the like, dipentaerythritol triacrylate (as a commercially available product thereof. KAYARAD D-330; manufactured by Nippon Kayaku Co., Ltd.), dipentaerythritol tetraacrylate (as a commercially available product thereof, KAYARAD D-320; manufactured by Nippon Kayaku Co., Ltd.), dipentaerythritol penta(meth)acrylate (as a commercially available product thereof, KAYARAD D-310: manufactured by Nippon Kayaku Co., Ltd.), dipentaerythritol hexa(meth)acrylate (as a commercially available product thereof, KAYARAD DPHA; manufactured by Nippon Kayaku Co., Ltd.), and a structure in which the (meth)acryloyl group thereof has an ethylene glycol or propylene glycol reside therethrough, or diglycerin EO (ethylene oxide) modified (meth)acrylate (as a commercially available product, M-460; manufactured by TOAGOSEI CO., LTD.) are preferred. The oligomer types thereof may also be used.

Examples thereof include RP-1040 (manufactured by Nippon Kayaku Co., Ltd.), and the like.

The polymerizable monomer and the like are a polyfunctional monomer, and may have an acid group such as a carboxyl group, a sulfonic acid group, and a phosphoric acid group. Accordingly, the ethylenic compound may be used as it is as long as the compound has an unreacted carboxyl group when the compound is a mixture as described above, but if necessary, an acid group may be introduced by reacting a non-aromatic carboxylic acid anhydride with a hydroxyl group of the above-described ethylenic compound. In this case, specific examples of the non-aromatic carboxylic acid anhydride used include anhydrous tetrahydrophthalic acid, alkylated anhydrous tetrahydrophthalic acid, anhydrous hexahydrophthalic acid, alkylated anhydrous hexahydrophthalic acid, anhydrous succinic acid and anhydrous maleic acid.

In the present invention, a monomer having an acid group is an ester of an aliphatic polyhydroxy compound with an unsaturated carboxylic acid and is preferably a polyfunctional monomer which is allowed to have an acid group by reacting a non-aromatic carboxylic acid anhydride with an unreacted hydroxyl group of an aliphatic polyhydroxy compound, and the aliphatic polyhydroxy compound is particularly preferably pentaerythritol and/or dipentaerythritol in the ester. Examples of the commercially available product include Aronix series M-305, M-510, M-520, and the like as polybasic acid modified-acrylic oligomers manufactured by TOAGOSEI CO., LTD.

The polyfunctional monomer which has an acid group preferably has an acid value of 0.1 to 40 mg-KOH/g, and more preferably 5 to 30 mg-KOH/g. When the polyfunctional monomers having another acid group are used in combination of two or more thereof, or the polyfunctional monomers which have no acid group are used in combination, it is essential to perform the preparation such that the acid value as the total polyfunctional monomer falls within the above-described range.

In addition, as the polymerizable monomer and the like, it is also possible to use a polyfunctional monomeric body having a caprolactone-modified structure described in paragraph nos. 0306 to 0313 of Japanese Patent Application Laid-Open No. 2012-215806.

The polyfunctional monomeric body having such a caprolactone-modified structure is commercially available, for example, as KAYARAD DPCA series from NIPPON KAYAKU Co., Ltd., and examples thereof include DPCA-20, DPCA-30, DPCA-60, DPCA-120, and the like.

In the present invention, a polyfunctional monomeric body having a caprolactone-modified structure may be used either alone or in combination of two or more thereof.

Furthermore, as a polymerizable monomer and the like in the present invention, it is also possible to use a compound represented by Formula (Z-4) or (Z-5) described in paragraph nos. 0314 to 0324 of Japanese Patent Application Laid-Open No. 2012-215806.

Examples of the commercially available product of the polymerizable monomer represented by Formula (Z-4) or (Z-5) and the like include a tetrafunctional acrylate having four ethyleneoxy chains SR-494, manufactured by Sartomer Company, Inc., and a hexafunctional acrylate having six pentyleneoxy chains DPCA-60 and a trifunctional acrylate having three isobutyleneoxy chains TPA-330, which are both manufactured by Nippon Kayaku Co., Ltd., and the like.

Further, as a polymerizable monomer and the like, urethane acrylates as described in Japanese Examined Patent Application Publication No. S48-41708, Japanese Patent Application Laid-Open No. S51-37193, and Japanese Examined Patent Application Publication Nos. H2-32293 and H2-16765, or urethane compounds having an ethylene-oxide-based structure, described in Japanese Examined Patent Application Publication Nos. S58-49860, S56-17654, S62-39417 and S62-39418 are also suitable. In addition, a curable composition having an excellent photosensitive speed may be obtained by using addition polymerizable monomers having an amino structure or a sulfide structure in a molecule thereof, described in Japanese Patent Application Laid-Open Nos. 863-277653, S63-260909, and H1-105238, as a polymerizable monomer and the like.

Examples of the commercially available product of the polymerizable monomer include urethane oligomers UAS-10, UAB-140 (manufactured by Sanyo-Kokusaku Pulp Co., Ltd.). UA-7200 (manufactured by Shin-Nakamura Chemical Co., Ltd.) DPHA-40H (manufactured by NIPPON KAYAKU Co., Ltd.), UA-306H, UA-306T, UA-3061, AH-600, T-600, AI-600 (manufactured by KYOEISHA Co., Ltd.), and the like.

As the polymerizable monomer and the like, it is also possible to use a polyfunctional thiol compound having two or more mercapto (SH) groups in the same molecule described in paragraph nos. 0216 to 0220 of Japanese Patent Application Laid-Open No. 2012-150468.

Furthermore, specific examples of the monomers of amides of an aliphatic polyvalent amine compound and an unsaturated carboxylic acid include methylene bis-acrylamide, methylene bis-methacrylamide, 1,6-hexamethylene bis-acrylamide, 1,6-hexamethylene bis-methacrylamide, diethylenetriamine trisacrylamide, xylylene bisacrylamide, xylylene bismethacrylamide, and the like.

Examples of other preferred amide-based monomers include a monomer having a cyclohexylene structure that is described in Japanese Examined Patent Application Publication No. 854-21726.

Further, urethane-based addition polymerizable compounds prepared by using the addition reaction of isocyanate and a hydroxyl group are also suitable, and specific examples thereof include vinyl urethane compounds having two or more polymerizable vinyl groups in a molecule thereof, which are obtained by adding vinyl monomers containing a hydroxyl group, which are represented by the following Formula (V), to a polyisocyanate compound having two or more isocyanate groups in a molecule, which is described in Japanese Examined Patent Application Publication No. S48-41708.

In the following Formula (V). R7 and R8 each independently represent a hydrogen atom or a methyl group.

$$H_2C=C(R^7)COOCH_2CH(R^8)OH \qquad \text{Formula (V)}$$

In addition, urethane acrylates described in Japanese Patent Application Laid-Open No. S51-37193, Japanese Examined Patent Application Publication Nos. H2-32293 and H2-16765, or urethane compounds having an ethylene oxide-based structure, described in Japanese Examined Patent Application Publication Nos. 558-49860, S56-17654, S62-39417 and S62-39418 are also suitable. Furthermore, a curable composition having an excellent photosensitive speed may be obtained by using polymerizable compounds having an amino structure or a sulfide structure in a molecule thereof, described in Japanese Patent Application Laid-Open Nos. S63-277653, S63-260909, and H1-105238.

Other examples include polyfunctional acrylates or methacrylates such as polyester acrylates as described in Japanese Patent Application Laid-Open No. 548-64183 and Japanese Examined Patent Application Publication Nos. S49-43191 and S52-30490, and epoxyacrylates obtained by reacting an epoxy resin with (meth)acrylic acid. Further, examples thereof also include specific unsaturated compounds described in Japanese Examined Patent Application Publication Nos. S46-43946, H1-40337, and H1-40336, vinyl phosphonic acid-based compounds described in Japanese Patent Application Laid-Open No. H2-25493, and the like. In addition, in some cases, a structure containing a pertluoroalkyl group described in Japanese Patent Application Laid-Open No. S61-22048 is suitably used. Furthermore, photocurable monomers and oligomers, described in Journal of the Adhesion Society of Japan, Vol. 20, No. 7, pp. 300 to 308 (1984) may be used.

For these polymerizable compounds, details of the method of use such as the structure of the compounds, single use or use of a combination, and the amount to be added may be arbitrarily set in accordance with the final performance design of the curable compositions. For example, the details of the method are selected from the following viewpoint.

From the viewpoint of sensitivity, a structure having a high content of unsaturated groups per one molecule is preferred, and in many cases, bifunctionality or higher functionality is preferred. Further, in order to increase the strength of a cured film, trifunctionality or higher functionality is desirable, and in addition, it is effective to use a method of controlling both the sensitivity and the strength by using compounds having different functionalities and/or different polymerizable groups (for example, acrylic acid ester, methacrylic acid ester, styrene-based compound and vinyl ether-based compound) in combination.

Furthermore, the selection and the method of use of the polymerizable compounds are also important factors for the compatibility with other components (for example, a polymerization initiator, metal oxide particles, and the like) contained in the curable composition and for the dispersibility, and for example, the compatibility may be increased by using a compound with low purity, or by using a combination of two or more kinds of other components. Further, in some cases, a specific structure may be selected for the purpose of improving adhesion to a hard surface such as a substrate.

The content of (D) the polymerizable compound is preferably in the range of 1% by mass to 40% by mass, more preferably in the range of 3% by mass to 35% by mass, and even more preferably in the range of 5% by mass to 30% by mass, with respect to the total solid content of the curable composition.

The content within the range is preferred, because the curability is good without deterioration in the refractive index.

It is preferred that the curable composition of the present invention further contains at least one selected from the group consisting of a polymerization initiator (E) and a binder polymer to be described below.

(E) Polymerization Initiator

It is preferred that the curable composition of the present invention further contains a polymerization initiator from the viewpoint of further improving curability.

As the polymerization initiator in the present invention, those known as the polymerization initiator to be described below may be used.

The polymerization initiator is not particularly limited as long as the polymerization initiator has an ability to initiate the polymerization of the polymerizable compound, and may be suitably selected from publicly known polymerization initiators.

In addition, from the viewpoint of improving the curing in the exposure process by irradiation of radiation, such as processes (B) and (b) in the method for forming a microlens to be described below, and the like, for example, it is preferred to have radiation sensitivity to visible light in the ultraviolet region. Furthermore, the polymerization initiator may be an activator which causes any action with a photo-excited sensitizer to produce an active radical, and may be an initiator which initiates the cationic polymerization according to the kind of monomer.

Further, it is preferred that the polymerization initiator contains at least one compound having a molecular extinction coefficient of at least about 50 within the range of about 300 nm to 800 nm (more preferably 330 nm to 500 nm).

Examples of the polymerization initiator include a halogenated hydrocarbon derivative (for example, those having a triazine structure, those having an oxadiazole structure and the like), an acylphosphine compound such as acylphosphine oxide, hexaarylbiimidazole, an oxime compound such as oxime derivative, an organic peroxide, a thio compound, a ketone compound, an aromatic onium salt, a ketoxime ether, an aminoacetophenone compound, hydroxyacetophenone, and the like.

Examples of the halogenated hydrocarbon compound having a triazine structure include the compounds described in Wakabayashi et al., Bull. Chem. Soc. Japan, 42, 2924 (1969), the compounds described in GB Patent No. 1388492, the compounds described in Japanese Patent Application Laid-Open No. S53-133428, the compounds described in German Patent No. 3337024, the compounds described in F. C. Schaefer et al., J. Org. Chem.; 29, 1527 (1964), the compounds described in Japanese Patent Application Laid-Open No. S62-58241, the compounds described in Japanese Patent Application Laid-Open No. H5-281728, the compounds described in Japanese Patent Application Laid-Open No. H5-34920, the compounds described in U.S. Pat. No. 4,212,976 and the like.

In addition, examples of the polymerization initiator other than the aforementioned polymerization initiators include an acridine derivative (for example, 9-phenylacridine, 1,7-bis (9,9'-acridinyl)heptane and the like), N-phenylglycine and the like, a polyhalogen compound (for example, carbon tetrabromide, phenyl tribromomethyl sulfone, phenyl trichloromethyl ketone and the like), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds described in Japanese Patent Application Laid-Open Nos. H5-19475, H7-271028, 2002-363206, 2002-363207, 2002-363208 and 2002-363209, and the like), acylphosphine oxides (for example, bis(2,4,6-trimethylbenzoyl)-phenylphosphine oxide, bis(2,6-dimethoxybenzoyl)-2,4,4-trimethyl-pentylphenylphosphine oxide, LucirinTPO and the like), metallocenes (for example, bis($\eta$5-2,4-cyclopentadien-1-yl)-bis(2,6-difluoro-3-(1H-pyrrol-1-yl)-phenyl) titanium, $\eta$5-cyclopentadienyl-$\eta$6-cumenyl-iron(1+)-hexafluorophosphate (1−) and the like), the compounds described in Japanese Patent Application Laid-Open No. S53-133428 and Japanese Examined Patent Application Publication Nos. 557-1819 and 557-6096 and, U.S. Pat. No. 3,615,455, and the like.

Examples of the ketone compound include the compounds described in paragraph no. 0084 of Japanese Patent Application Laid-Open No. 2011-252945, and the like, the contents of which are incorporated into the specification of the present application.

As the polymerization initiator, a hydroxyacetophenone compound, an aminoacetophenone compound and an acylphosphine compound may also be suitably used. More specifically, for example, an aminoacetophenone-based initiator described in Japanese Patent Application Laid-Open No. H10-291969 and an acylphosphine oxide-based initiator described in Japanese Patent No. 4225898 may also be used.

As the hydroxyacetophenone-based initiator, IRGACURE-184, DAROCUR-1173, IRGACURE-500, IRGACURE-2959 and IRGACURE-127 (trade names: all manufactured by BASF Corp.) may be used. As the aminoacetophenone-based initiator, commercially available products IRGACURE-907, IRGACURE-369 and IRGACURE-379 (trade names: all manufactured by BASF Corp.) may be used. As the aminoacetophenone-based initiator, the compounds described in Japanese Patent Application Laid-Open No. 2009-191179, in which the absorption wavelength matches the light source having a long wavelength such as 365 nm or 405 nm, may also be used. In addition, as the acylphosphine-based initiator, commercially available products IRGACURE-819 or DAROCUR-TPO (trade names: all manufactured by BASF Corp.) may be used.

As the polymerization initiator, an oxime-based compound may also be suitably used. As specific examples of the oxime-based initiator, the compounds described in Japanese Patent Application Laid-Open Nos. 2001-233842, 2000-80068, and 2006-342166 may be used.

Examples of the oxime compound such as an oxime derivative, which is suitably used as the polymerization initiator in the present invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one and the like.

As the oxime ester compound, commercially available products such as TRONLY TR-PBG-304, TRONLY TR-PBG-309, and TRONLY TR-PBG-305 (manufactured by CHANGZHOU TRONLY NEW ELECTRONIC MATERIALS CO., LTD.) may be used. Furthermore, the description of the polymerization initiators described in paragraph nos. 0092 to 0096 of Japanese Patent Application Laid-Open No. 2012-113104 may be considered, the contents of which are incorporated into the specification of the present application. A curable composition having high curing sensitivity and good developability may be provided by using such an oxime compound. The oxime compound is a compound which is described after paragraph no. 0030 of Japanese Patent Application Laid-Open No. 2012-113104. The compound is represented by Formula (I) described in claim 1, more preferably by Formula (I-A) described in claim 3, of Japanese Patent Application Laid-Open No. 2012-113104, as a general formula, the description thereof may be considered, the contents of which are incorporated into the specification of the present application. Further, examples thereof include the compounds described in J. C. S. Perkin II (1979) pp. 1653 to 1660), J. C. S. Perkin II (1979) pp. 156 to 162, Journal of Photopolymer Science and Technology (1995) pp. 202 to 232, Journal of Applied Polymer Science 2012) pp. 725 to 731, Japanese Patent Application Laid-Open No. 2000-66385, paragraph nos. 0218 to 0281 of Japanese Patent Application Laid-Open No. 2000-80068, paragraph nos. 0242 to 0251 of Japanese Unexamined Patent Application Publication No. 2004-534797, and Japanese Patent Application Laid-Open No. 2006-342166, and the like.

As the commercially available product, IRGACURE-OXE01 (manufactured by BASF Corp.) and IRGACURE-OXE02 (manufactured by BASF Corp.) are also suitably used.

In addition, as the oxime ester compound other than oxime ester compounds described above, it is also possible to use the compounds described in Japanese Unexamined Patent Application Publication No. 2009-519904, in which oxime is linked to the N-position of carbazole, the compounds described in U.S. Pat. No. 7,626,957, in which a hetero-substituent is introduced into the benzophenone moiety, the compounds described in Japanese Patent Application Laid-Open No. 2010-15025 and U.S. Patent Application Publication No. 2009-292039, in which a nitro group is introduced into the dye moiety, the ketoxime-based compounds described in International Publication No. WO 2009-131189, the compounds described in U.S. Pat. No. 7,556,910, containing a triazine structure and an oxime structure within the same molecule, the compounds described in Japanese Patent Application Laid-Open No. 2009-221114, having an absorption maximum at 405 nm and exhibiting good sensitivity for a g-ray light source, and the like.

Furthermore, the cyclic oxime compounds described in Japanese Patent Application Laid-Open Nos. 2007-231000 and 2007-322744 may also be suitably used. Among the cyclic oxime compounds, the cyclic oxime compounds condensed to a carbazole dye, described in Japanese Patent Application Laid-Open Nos. 2010-32985 and 2010-185072, have high light absorptivity, and thus are particularly preferred from the viewpoint of high sensitivity.

Further, in the compounds described in Japanese Patent Application Laid-Open No. 2009-242469, having an unsaturated bond at a specific site of an oxime compound, high sensitivity may also be achieved by regenerating an active radical from a polymerization inactive radical, and thus the compounds may be suitably used.

In addition, examples thereof include the oxime compound having a specific substituent described in Japanese Patent Application Laid-Open No. 2007-269779 or the oxime compound having a thioaryl group described in Japanese Patent Application Laid-Open No. 2009-191061.

As the oxime initiator, the explanation of the compounds represented by Formula (OX-1), (OX-2) or (OX-3) after paragraph no. 0513 of Japanese Patent Application Laid-Open No. 2012-208494 (paragraph no. [0632] of the corresponding U.S. Patent Application Publication No. 2012/235099) may be considered, the contents of which are incorporated into the specification of the present application.

Specific examples (PIox-1) to (PIox-13) of oxime compounds which are suitably used will be shown below, but the present invention is not limited thereto.

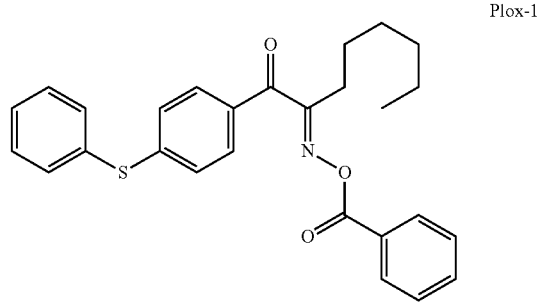
Plox-1

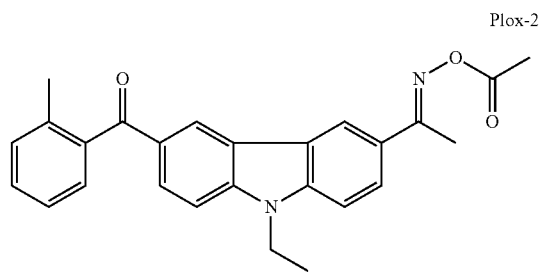
Plox-2

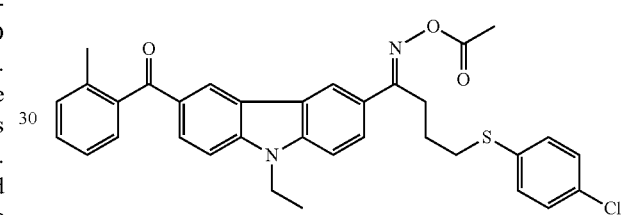
Plox-3

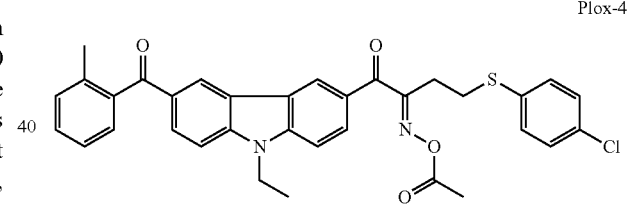
Plox-4

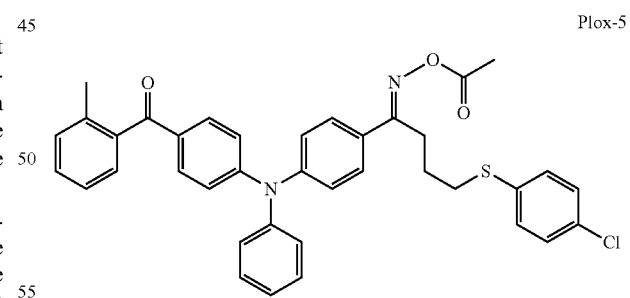
Plox-5

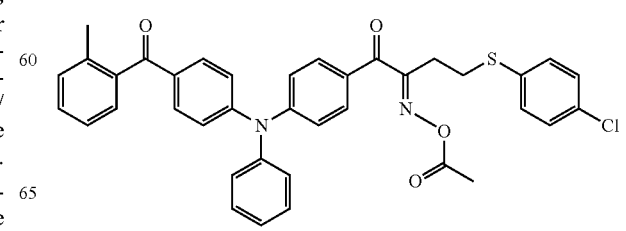
Plox-6

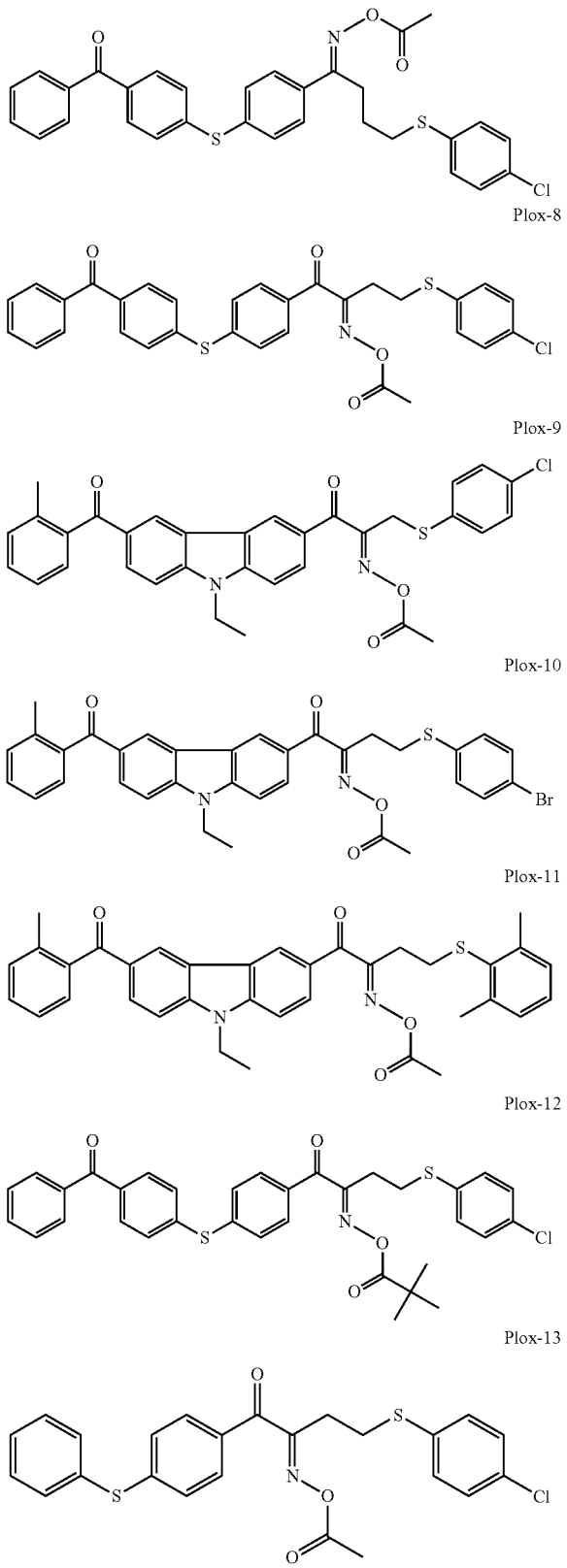

The oxime compound has a maximum absorption wavelength in the wavelength region of 350 nm to 500 nm, preferably an absorption wavelength in the wavelength region of 360 nm to 480 nm, and particularly preferably a high absorbance of 365 nm to 455 nm.

The oxime compound has a molar absorption coefficient of preferably 1,000 to 300,000, more preferably 2,000 to 300,000 and particularly preferably 5,000 to 200,000 in 365 nm or 405 nm, from the viewpoint of sensitivity.

The molar extinction coefficient of the compound may be measured by using a known method, but specifically, it is preferred that the coefficient is measured, for example, by an ultraviolet and visible spectrophotometer (Carry-5 spectrophotometer, manufactured by Varian Inc.) at a concentration of 0.01 g/L using an ethyl acetate solvent.

As the polymerization initiator used in the present invention, two or more thereof may be used in combination, if necessary.

From the viewpoint of curability, (E) the polymerization initiator used in the curable composition of the present invention is preferably a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallylimidazole dimer, an onium compound, a benzothiazole compound, a benzophenone compound, an acetophenone compound and the derivatives thereof, a cyclopentadiene-benzene-iron complex and the salts thereof, a halomethyl oxadiazole compound, or a 3-aryl-substituted coumarin compound.

More preferably, the polymerization initiator is a trihalomethyl triazine compound, an α-aminoketone compound, an acyl phosphine compound, a phosphine oxide compound, an oxime compound, a triallyl imidazole dimer, an onium compound, a benzophenone compound and an acetophenone compound, and at least one compound selected from the group consisting of a trihalomethyl triazine compound, an α-aminoketone compound, an oxime compound, a triallyl imidazole dimer, and a benzophenone compound.

In particular, when a microlens is manufactured by forming the curable composition of the present invention on a color filter of a solid-state imaging device, it is important for the composition to be developed without scum on an unexposed part together with curability because it is required that a fine pattern is formed in a sharp profile. From such a viewpoint, it is particularly preferred that an oxime compound is used as the polymerization initiator. In particular, when a fine pattern is formed in a solid-state imaging device, a stepper exposure is used in exposure for curing, but since this exposure machine is damaged by halogen in some cases, and thus it is required that the amount of polymerization initiator added is suppressed at a low level, it is most preferred that an oxime compound is used as (E) the polymerization initiator in consideration of these circumstances in order to form a fine pattern such as a solid-state imaging device.

The content of (E) the polymerization initiator contained in the curable composition of the present invention (total content in the case of two or more thereof) is preferably 0.1% by mass to 40% by mass, more preferably 0.5% by mass to 20% by mass, and even more preferably 1% by mass to 15% by mass, with respect to the total solid content of the curable composition. When the content falls within these ranges, good curability, good sensitivity and pattern formability may be obtained.

The curable composition of the invention may further contain an arbitrary component if needed, as described in detail below.

[Sensitizer]

The curable composition of the present invention may contain a sensitizer for the purpose of improving radical generation efficiency of (E) the polymerization initiator, and shifting the sensitive wavelength to a longer wavelength.

The sensitizer that may be used in the present invention preferably sensitizes (E) the polymerization initiator by the electron transfer mechanism or the energy transfer mechanism.

Examples of the sensitizer include sensitizers that belong to the compounds to be listed below and have an absorption wavelength in the wavelength region of 300 nm to 450 nm.

The sensitizer is described in detail in, for example, paragraph nos. [0230] to [0253] of Japanese Patent Application Laid-Open No. 2010-106268 (paragraph nos. [0253] to [0273] of the corresponding U.S. Patent Application Publication No. 2011/0124824A1), the contents of which are incorporated into the specification of the present application.

The content of the sensitizer in the curable composition is preferably 0.1% by mass to 20% by mass, and more preferably from 0.5% by mass to 15% by mass, in terms of solid content from the viewpoint of light absorption efficiency to the deep portion and the decomposition efficiency of an initiator.

The sensitizers may be used either alone or in combination of two or more thereof.

[Co-Sensitizer]

It is preferred that the curable composition of the present invention also contains a co-sensitizer.

The co-sensitizer in the present invention has a function of further improving the sensitivity of (E) the polymerization initiator or a sensitizer to the active radiation, suppressing the polymerization inhibition of (D) the polymerizable compound due to oxygen, and the like.

The co-sensitizer is described in detail in, for example, paragraph nos. [0254] to [0257] of Japanese Patent Application Laid-Open No. 2010-106268 (paragraph nos. [0274] to [0279] of the corresponding U.S. Patent Application Publication No. 2011/0124824A1), the contents of which are incorporated into the specification of the present application.

The co-sensitizers may be used either alone or in combination of two or more thereof.

The content of the co-sensitizers is preferably in the range of 0.1% by mass to 30% by mass, more preferably in the range of 1% by mass to 25% by mass, and even more preferably in the range of 1.5% by mass to 20% by mass, with respect to the total solid mass of the curable composition from the viewpoint of increasing the curing rate by means of the balance of the polymerization growth rate and the chain transfer.

[Polymerization Inhibitor]

In the present invention, in order to prevent unnecessary polymerization of a compound having a polymerizable ethylenically unsaturated double bond during the preparation or the storage of the curable composition, it is preferred to add a polymerization inhibitor.

Examples of the polymerization inhibitor that may be used in the present invention include a phenolic hydroxyl group-containing compound, N-oxide compounds, piperidine-1-oxyl free radical compounds, pyrrolidine-1-oxyl free radical compounds, N-nitrosophenyl hydroxylamines, diazonium compounds, cationic dyes, sulfide group-containing compounds, nitro group-containing compounds, transition metal compounds such as FeCl3 or CuCl2, and the like.

The polymerization initiator is described in detail in, for example, paragraph nos. [0259] to [0281] of Japanese Patent Application Laid-Open No. 2010-106268 (paragraph nos. [0281] to [0298] of the corresponding U.S. Patent Application Publication No. 2011/0124824A1).

The polymerization initiators may be used either alone or in combination of two or more thereof.

A preferred amount of the polymerization inhibitor added is preferably 0.01 parts by mass to 10 parts by mass, more preferably 0.01 parts by mass to 8 parts by mass, and most preferably 0.05 parts by mass to 5 parts by mass, with respect to 100 parts by mass of (E) the polymerization initiator.

By setting the amount to the ranges, suppression of a curing reaction in a non-image part and promotion of the curing reaction in an image part are sufficiently achieved, so that image formability and sensitivity are improved.

[Binder Polymer]

It is preferred that the curable composition of the present invention further includes a binder polymer from the viewpoint of improving coating film properties, and the like.

As the binder polymer, it is preferred to use a linear organic polymer. As the linear organic polymer, those publicly known may be arbitrarily used. In order to enable water development or weak alkaline-water development, a linear organic polymer that is soluble or swellable in water or weak alkaline water is preferably selected. The linear organic polymer is selectively used in accordance with the use as water, weak alkaline water or an organic solvent developer as well as the use as a film-forming agent. For example, when a water-soluble organic polymer is used, water development becomes possible. Examples of such linear organic polymers include a radical polymer having a carboxyl acid group in the side chain thereof, for example, polymers described in Japanese Patent Application Laid-Open No. S59-44615, Japanese Examined Patent Application Publication Nos. S54-34327, S58-12577, and S54-25957, Japanese Patent Application Laid-Open Nos. S54-92723, S59-53836, and S59-71048, that is, a resin formed by homopolymerizing or copolymerizing a monomer having a carboxyl group, a resin formed by hydrolyzing, half-esterifying or half-amidizing an acid anhydride unit formed by homopolymerizing or copolymerizing a monomer having an acid anhydride, an epoxy acrylate formed by modifying an epoxy resin with an unsaturated monocarboxylic acid and an acid anhydride, and the like. Examples of the monomer having a carboxyl group include acrylic acid, methacrylic acid, itaconic acid, crotonic acid, maleic acid, fumaric acid, 4-carboxyl styrene, and the like, and examples of the monomer having an acid anhydride include anhydrous maleic acid, and the like.

Further, an acidic cellulose derivative having a carboxylic acid group similarly in the side chain thereof is included. In addition, a polymer formed by adding a cyclic acid anhydride to a polymer having a hydroxyl group, and the like are also useful.

In the present invention, when a copolymer is used as the binder polymer, monomers other than the monomers previously exemplified may be used as a monomer to be copolymerized. Examples of other monomers include the compounds described in the following (1) to (12).

(1) Acrylic acid esters or methacrylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate.

(2) Alkyl acrylate such as methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexyl methylacrylate, vinyl acrylate, 2-phenylvinyl acrylate, 1-propenyl acrylate, allyl acrylate, 2-allyloxyethyl acrylate, and propargyl acrylate.

(3) Alkyl methacrylate such as methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexyl methylmethacrylate, vinyl methacrylate, 2-phenylvinyl methacrylate, I-propenyl methacrylate, allyl methacrylate, 2-allyloxyethyl methacrylate, and propargyl methacrylate.

(4) Acrylamides or methacrylamides, such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, vinyl acrylamide, vinyl methacrylamide, N,N-diallyl acrylamide, N,N-diallyl methacrylamide, allylacrylamide, and allylmethacryl amide.

(5) Vinyl ethers such as ethyl vinyl ether, 2-chloroethyl vinyl ether, hydroxyethyl vinyl ether, propyl vinyl ether, butyl vinyl ether, octyl vinyl ether, and phenyl vinyl ether.

(6) Vinyl esters such as vinyl acetate, vinyl chloroacetate, vinyl butyrate, and vinyl benzoate.

(7) Styrenes such as styrene, α-methylstyrene, methylstyrene, chloromethylstyrene, and p-acetoxystyrene.

(8) Vinyl ketones such as methyl vinyl ketone, ethyl vinyl ketone, propyl vinyl ketone, and phenyl vinyl ketone.

(9) Olefins such as ethylene, propylene, isobutylene, butadiene, and isoprene.

(10) N-vinyl pyrrolidone, acrylonitrile, methacrylonitrile, and the like.

(11) Unsaturated imide such as maleimide, N-acryloyl acrylamide, N-acetyl methacrylamide, N-propionyl methacrylamide, and N-(p-chlorobenzoyl)methacrylamide.

(12) A methacrylic acid monomer in which a hetero atom is bonded to the α-position thereof. Examples thereof include compounds described in Japanese Patent Application Laid-Open Nos. 2002-309057 and 2002-311569, and the like.

In the present invention, these monomers may be combined without particular limitation within the scope of the present invention to be applied to the synthesis of a copolymer. For example, an example of a copolymer obtained by polymerizing monomeric body components including these monomers will be shown, but the present invention is not limited thereto. The composition ratio of the exemplified compound shown below is mol %.

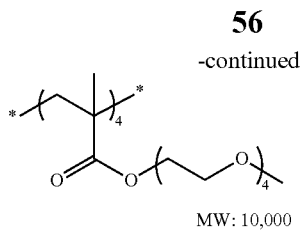

MW: 10,000

In the binder polymer, it is possible to consider the description of the polymer obtained by polymerizing a compound (also referred to as an ether dimmer in some cases) represented by Formula (ED) after paragraph no. 0562 of Japanese Patent Application Laid-Open No. 2012-208494 ([0692] of the corresponding U.S. Patent Application Publication No. 2012/235099) as an essential monomeric body component, the contents of which are incorporated into the specification of the present application.

As a specific example of the ether dimmer, it is possible to consider the description of the ether dimmer of paragraph no. 0565 of Japanese Patent Application Laid-Open No. 2012-208494 ([0694] of the corresponding U.S. Patent Application Publication No. 2012/235099), the contents of which are incorporated into the specification of the present application.

Furthermore, specific examples of the polymer obtained by polymerizing a compound represented by Formula (ED) as an essential monomeric body component will be exemplified below, but the present invention is not limited thereto. The composition ratio of the exemplified compound shown below is mol %.

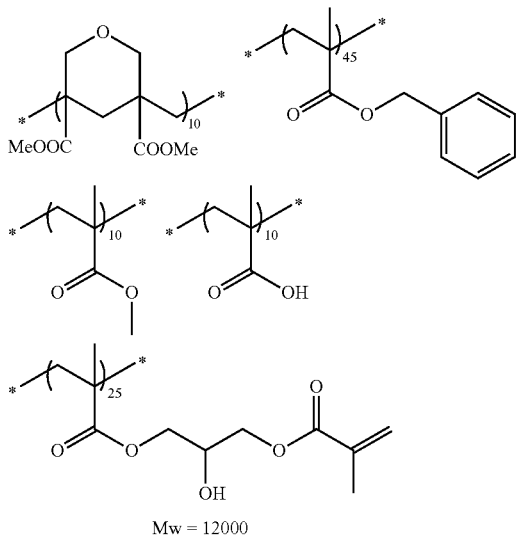

Mw = 12000

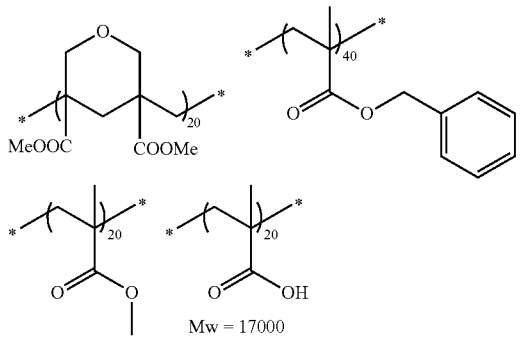

Mw = 17000

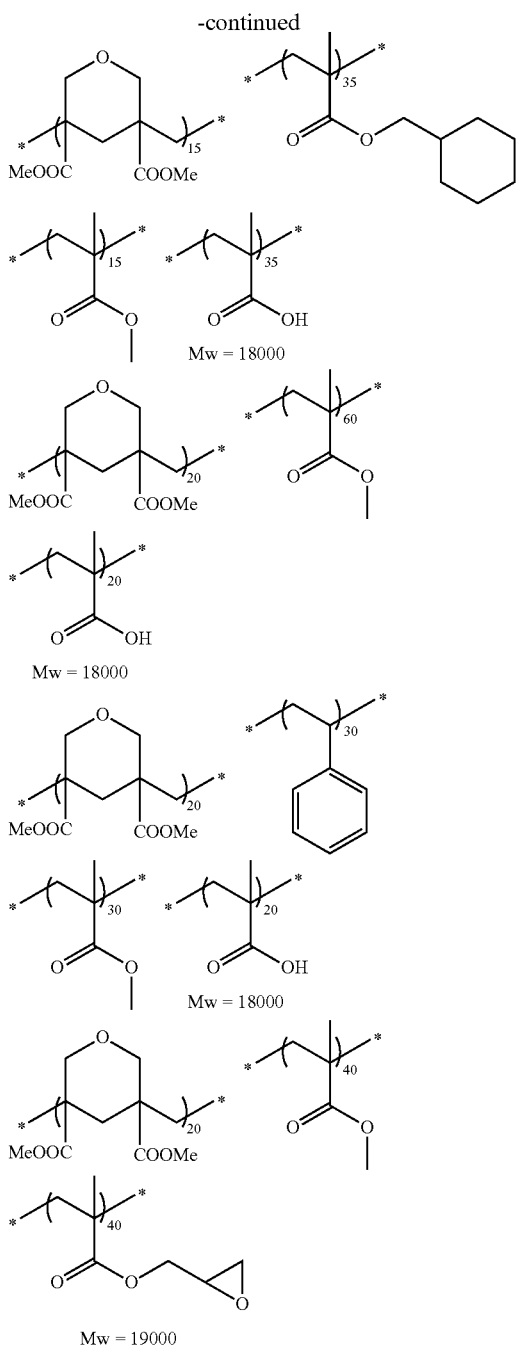

In the present invention, particularly, a polymer obtained by copolymerizing dimethyl-2,2'-[oxybis(methylene)]bis-2-propenoate (hereinafter, referred to as "DM"), benzylmethacrylate (hereinafter, referred to as "BzMA"), methyl methacrylate (hereinafter, referred to as "MMA"), methacrylic acid (hereinafter, referred to as "MMA"), and glycidyl methacrylate (hereinafter, referred to as "GMA") is preferred. In particular, the molar ratio of DM:BzMA:MMA:MAA:GMA is preferably 5 to 15:40 to 50:5 to 15:5 to 15:20 to 30. It is preferred that 95% by mass or more of the components which constitute the copolymer used in the present invention are these components. Further, the weight average molecular weight of the polymer is preferably 9,000 to 20,000.

For the polymer used in the present invention, the weight average molecular weight (a polystyrene converted value measured by a GPC method) is preferably 1,000 to $2 \times 10^5$, more preferably 2,000 to $1 \times 10^5$, and even more preferably 5,000 to $5 \times 10^4$.

Among them, a (meth)acrylic resin having an allyl group or a vinyl ester group and a carboxyl group in the side chain thereof, an alkali soluble resin having a double bond in the side chain thereof, which is described in Japanese Patent Application Laid-Open Nos. 2000-187322 and 2002-62698, or an alkali-soluble resin having an amide group in the side chain thereof, which is described in Japanese Patent Application Laid-Open No. 2001-242612 are suitable due to excellent balance of the film strength, the sensitivity and the developability. Examples of the above-described polymer include Dianal NR series (manufactured by Mitsubishi Rayon Co., Ltd.). Photomer 6173 (COOH-containing polyurethane acrylic oligomer. Manufactured by Diamond Shamrock Co. Ltd.), Biscoat R-264 and KS resist 106 (all manufactured by OSAKA ORGANIC CHEMICAL INDUSTRY LTD.), Cyclomer P series such as Cyclomer PACA230AA, and PRAXEL CF200 series (all manufactured by DAICEL CORPORATION). Ebecryl 3800 (manufactured by Daicel-UCB Co. Ltd.), and the like.

Further, urethane-based binder polymers containing an acid group, described in Japanese Examined Patent Application Publication Nos. H7-12004. H7-120041, H7-120042, and H8-12424, Japanese Patent Application Laid-Open Nos. S63-287944, S63-287947, S63-287947, and H1-271741, and the like, and urethane-based binder polymers having an acid group and a double bond in a side chain thereof, described in Japanese Patent Application Laid-Open No. 2002-107918 have extremely excellent strength, and therefore, are advantageous from the viewpoint of the film strength.

In addition, acetal-modified polyvinyl alcohol-based binder polymers having an acid group, described in European Patent No. 993966, European Patent No. 1204000, Japanese Patent Application Laid-Open No. 2001-318463, and the like have excellent film strength, and thus, are suitable.

Furthermore, in addition to that, polyvinyl pyrrolidone, polyethylene oxide, and the like are useful as a water-soluble linear organic polymer. Further, an alcohol-soluble nylon, a polyether of 2,2-bis(4-hydroxyphenyl)propane with epichlorohydrin, and the like are also useful so as to increase the strength of the cured film.

The weight average molecular weight of the binder polymer which may be used in the curable composition of the present invention (a polystyrene converted value measured by GPC method) is preferably 5,000 or more, and more preferably in the range of 10,000 to 300,000, and the number average molecular weight thereof is preferably 1,000 or more, and more preferably in the range of 2,000 to 250,000. The polydispersity (weight average molecular weight/number average molecular weight) thereof is preferably 1 or more, and more preferably in the range of 1.1 to 10.

These binder polymers may be any one of a random polymer, a block polymer, a graft polymer, and the like.

The binder polymer which may be used in the present invention may be synthesized by a method known in the related art. Examples of solvents used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propylacetate, N,N-dimethyl formamide, N,N-dimethyl acetamide, toluene, ethyl acetate, methyl lactate, ethyl lactate, dimethyl sulfoxide, water, and the like. These solvents may be used either alone or in combination of two or more thereof.

Examples of the radical polymerization initiator used in the synthesis of the binder polymer which may be used in the composition of the present invention include publicly known compounds, such as an azo-based initiator and a peroxide initiator.

In the curable composition of the present invention, the binder polymers may be used either alone or in combination of two or more thereof.

The curable composition of the present invention may or may not contain a binder polymer, but when the composition contains the binder polymer, the content of the binder polymer is preferably 1% by mass to 40% by mass, more preferably 3% by mass to 30% by mass, and even more preferably 4% by mass to 20% by mass, with respect to the total solid content of the curable composition.

[Surfactant]

Various surfactants may be added to the curable composition of the present invention from the viewpoint of further improving coatability thereof. Various surfactants such as fluorine-based surfactants, nonionic surfactants, cationic surfactants, anionic surfactants, and silicone-based surfactants may be used as the surfactant.

In particular, the curable composition of the present invention contains a fluorine-based surfactant, so that when the curable composition is prepared into a coating solution, liquid characteristics (in particular, fluidity) may be further improved, thus resulting in further improvements in uniformity of a coating thickness or liquid saving.

That is, when a film is formed by using a coating solution to which a photosensitive transparent composition containing a fluorine-based surfactant is applied, wettability into a surface to be coated is improved by reducing the interfacial tension between the surface to be coated and a coating solution, thereby improving the coatability into the surface to be coated. Accordingly, it is effective in that the formation of a uniform-thickness film with less thickness unevenness may be more suitably carried out, even when a thin film having a thickness of several μm is formed with a small amount of liquid.

The content by percent of fluorine in the fluorine-based surfactant is suitably 3% by mass to 40% by mass, more preferably 5% by mass to 30% by mass, and particularly preferably 7% by mass to 25% by mass. The fluorine-based surfactant having a fluorine content by percent, which falls within the above-described range, is effective from the viewpoint of thickness uniformity of the coating film and liquid saving, and also exhibits good solubility in the curable composition.

Examples of the fluorine-based surfactant include Megafac F171, Megafac F172, Megafac F173, Megafac F176, Megafac F177, Megafac F141, Megafac F142, Megafac F143, Megafac F144, Megafac R30, Megafac F437, Megafac F475, Megafac F479, Megafac F482, Megafac F554, Megafac F780, and Megafac F-781 (all manufactured by DIC corporation), Fluorad FC430, Fluorad FC431, and Fluorad FC171 (all manufactured by Sumitomo 3M Limited), Surflon S-382, Surflon SC-101, Surflon SC-103, Surflon SC-104. Surflon SC-105, Surflon SC-1068, Surflon SC-381, Surflon SC-383, Surflon SC393, and Surflon KH-40 (all manufactured by Asahi Glass Co., Ltd.), PF636, PF656, PF6320, PF6520, and PF7002 (manufactured by OMNOVA Solutions Inc.), and the like.

Specific examples of the nonionic surfactant include the nonionic surfactants described in paragraph no. 0553 of Japanese Patent Application Laid-Open No. 2012-208494 ([0679] of the corresponding U.S. Patent Application Publication No. 2012/235099), the contents of which are incorporated into the specification of the present application.

Specific examples of the cationic surfactant include the cationic surfactants described in paragraph no. 0554 of Japanese Patent Application Laid-Open No. 2012-208494 ([0680] of the corresponding U.S. Patent Application Publication No. 2012/235099), the contents of which are incorporated into the specification of the present application.

Specific examples of the anionic surfactant include W004, W005, W017 (manufactured by Yusho Co., Ltd.), and the like.

Examples of the silicone-based surfactant include "Toray silicone DC3PA", "Toray silicone SH7PA", "Toray silicone DC11PA", "Toray silicone SH21PA", "Toray silicone SH28PA", "Toray silicone SH29PA", "Toray silicone SH30PA", and "Toray silicone SH8400", which are manufactured by Dow Corning Toray Co., Ltd., "TSF-4440", "TSF-4300", "TSF-4445", "TSF-4460", and "TSF-4452", which are manufactured by Momentive Performance Materials Inc., "KP341", "KF6001", and "KF6002", which are manufactured by Shin-Etsu Chemical Co., Ltd., "BYK307", "BYK323" and "BYK330", which are manufactured by BYK Chemie GmbH, and the like.

The surfactants may be used either alone or in combination of two or more thereof.

The curable composition may or may not contain a surfactant, but when the composition contains a surfactant, the amount of surfactant added is preferably 0.001% by mass to 2.0% by mass, and more preferably 0.005% by mass to 1.0% by mass, with respect to the total mass of the curable composition.

[Other Additives]

In addition, in order to improve physical properties of the cured film, any one of publicly known additives such as a plasticizer and a sensitization agent may be added to the curable composition.

The other additives may be used either alone or in combination of two or more thereof.

Examples of the plasticizer include dioctyl phthalate, didodecyl phthalate, triethylene glycol dicaprylate, dimethylglycol phthalate, tricresyl phosphate, dioctyl adipate, dibutyl sebacate, triacetyl glycerin, and the like, and when a binder polymer is used, the plasticizer may be added in an amount of 10% by mass or less with respect to the total mass of the polymerizable compound and the binder polymer.

(UV Absorber)

The curable composition of the present invention may contain a UV absorber. As the UV absorber, a compound represented by the following Formula (I), which is a conjugated diene compound, is particularly preferred.

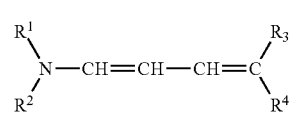

Formula (I)

In Formula (I), $R^1$ and $R^2$ each independently represent a hydrogen atom, an alkyl group having 1 to 20 carbon atoms, or an aryl group having 6 to 20 carbon atoms, and $R^1$ and $R^2$ may be the may be the same or different from each other, but represent a hydrogen atom at the same time in no case.

Further, $R^1$ and $R^2$ may form a cyclic amino group with a nitrogen atom which $R^1$ and $R^2$ are bonded to. Examples of the cyclic amino group include a piperidino group, a morpholino group, a pyrrolidino group, a hexahydroazepino group, a piperazino group, and the like.

In Formula (I), $R^3$ and $R^4$ represent an electron-attractive group. Here, the electron-attractive group is an electron-withdrawing group having a Hammett's substituent constant, a $\sigma_p$ value (hereinafter, simply referred to as "$\sigma_p$ value") of 0.20 to 1.0. The electron-attractive group is preferably an electron-withdrawing group having a $\sigma_p$ value of 0.30 to 0.8.

Hammett's rule is an empirical rule proposed by L. P. Hammett in 1935 in order to quantitatively discuss the influence of substituents exerted on the reaction or equilibrium of a benzene derivative, and the validity of this rule is widely recognized today. The substituent constant determined by Hammett's rule includes a $\sigma_p$ value and a $\sigma_m$ value, and these values are described in many general literatures, but the details thereof are described in, for example, J. A. Dean, Ed., "Lange's Handbook of Chemistry", 12th Edition, 1979 (McGraw-Hill) or "Realms of Chemistry Special Issue", No. 122, pp. 96 to 103, 1979 (Nankodo Co., Ltd.), and Chemical Reviews, Vol. 91, pp. 165 to 195, 1991. In the present invention, it is not meant that the values described in these literatures and already known are not limited only to a certain substituent, but even if the value is not yet known in the literature, the value will be definitely included in the present invention as long as the value falls within the range when measured on the basis of Hammett's rule.

Specific examples of the electron-withdrawing group having a $\sigma_p$ value of 0.20 to 1.0 include an acyl group, an acyloxy group, a carbamoyl group, an alkyloxycarbonyl group, an aryloxycarbonyl group, a cyano group, a nitro group, a dialkylphosphono group, a diarylphosphono group, a diarylphosphinyl group, an alkylsulfinyl group, an arylsulfinyl group, an alkylsulfonyl group, an arylsulfonyl group, a sulfonyloxy group, an acylthio group, a sulfamoyl group, a thiocyanate group, a thiocarbonyl group, an alkyl group substituted with at least two or more halogen atoms, an alkoxy group substituted with at least two or more halogen atoms, an aryloxy group substituted with at least two or more halogen atoms, an alkylamino group substituted with at least two or more halogen atoms, an alkylthio group substituted with at least two or more halogen atoms, an aryl group substituted with another electron-withdrawing group having a $\sigma_p$ value of 0.20 or more, a heterocyclic group, a chlorine atom, a bromine atom, an azo group, or a selenocyanate group.

In addition, $R^3$ and $R^4$ may combine with each other to form a ring.

Furthermore, at least one of the aforementioned $R^1$, $R^2$, $R^3$, and $R^4$ may be in the form of a polymer derived from a monomer which is bonded to a vinyl group via a linking group. A copolymer with other monomers may be used. In the case of a copolymer, examples of the other monomer include acrylic acid, α-chloroacrylic acid, α-aracrylic acid (for example, ester derived from acrylic acids such as methacrylic acid, and the like, preferably lower alkyl ester and amide, for example, acrylamide, methacrylamide, t-butylacrylamide, methyl acrylate, methyl methacrylate, ethyl acrylate, ethyl methacrylate, n-propylacrylate, n-butylacrylate, 2-ethylhexylacrylate, n-hexylacrylate, octyl methacrylate and lauryl methacrylate, methylenebisacrylamide, and the like), vinyl ester (for example, vinyl acetate, vinyl propionate, vinyl laurate, and the like), acrylonitrile, methacrylonitrile, an aromatic vinyl compound (for example, styrene and the derivatives thereof, for example, vinyltoluene, divinylbenzene, vinylacetophenone, sulfostyrene, styrenesulfinic acid, and the like), itaconic acid, citraconic acid, crotonic acid, vinylidene chloride, vinyl alkyl ether (for example, vinyl ethyl ether, and the like), maleic acid ester, N-vinyl-2-pyrrolidone, N-vinylpyridine, 2- and 4-vinylpyridine, and the like.

Two or more of the other monomer compounds may also be used in combination. For example, n-butyl acrylate and divinylbenzene, styrene and methyl methacrylate, methyl acrylate and methacrylate acid, and the like may be used in combination.

The UV absorber represented by Formula (1) may be synthesized by the methods described in Japanese Examined Patent Application Publication No. S44-29620, Japanese Patent Application Laid-Open Nos. 53-128333, S61-169831, S63-53543, S63-53544 and S63-56651, and the like, and the pamphlet of WO2009/123109. Specifically, the exemplary compound (1) may be synthesized by a method described in paragraph no. 0040 of the pamphlet of WO2009/123109.

The curable composition of the present invention may or may not contain a UV absorber, but when the composition contains a UV absorber, the content of the UV absorber is preferably 0.1% by mass to 10% by mass, more preferably 0.1% by mass to 5% by mass, and particularly preferably 0.1% by mass to 3% by mass, with respect to the total solid content of the composition.

Further, in the present invention, the various UV absorbers may be used either alone or in combination of two or more thereof.

It is preferred that the curable composition of the present invention is filtered by a filter for the purpose of removing extraneous substances or reducing defects and the like. Filters that have been used in the related art for filtration use and the like may be used without particular limitation. Examples thereof include filters formed of a fluorine resin such as polytetrafluoroethylene (PTFE), a polyamide-based resin such as Nylon-6 and Nylon-6,6, a polyolefin resin (including a high density and a ultrahigh molecular weight) such as polyethylene and polypropylene (PP), and the like. Among these materials, polypropylene (including high density polypropylene) is preferred.

The filter has a pore diameter of suitably 0.01 to 7.0 μm, preferably 0.01 to 2.5 μm, and more preferably 0.01 μm to 1.5 μm. By setting the diameter to the range, it is possible to certainly remove fine extraneous substances which are incorporated into the dissolved pigment and the like to suppress the preparation of uniform and smooth curable composition in a subsequent process.

When a filter is used, other filters may be combined. At that time, filtering at a first filter may be performed once or two or more times. When other filters are combined to perform filtering two or more times, it is preferred that a pore diameter at a filtering after a second filtering is larger than a pore diameter at a first filtering. In addition, first filters having different pore diameters within the above-described range may be combined. As the pore diameter herein, a reference may be made to nominal values of a filter maker. A commercially available filter may be selected from various filters provided by, for example, Pall Corporation, Advantec Toyo Kaisha, Ltd., Nihon Entegris K.K. (former Nippon Microlith Co., Ltd.), Kitz Micro Filter Corporation, or the like.

As a second filter, a filter formed of a material which is the same as the material for the above-described first filter and the like may be used. The second filter has a pore diameter of suitably 0.5 to 7.0 μm, preferably 2.5 to 7.0 μm and more preferably 4.5 to 6.0 μm. By setting the pore diameter within the range, extraneous substances which are incorporated into a mixed solution and thus inhibit a curable composition from being uniformly and smoothly prepared in a subsequent process may be removed while component particles contained in the mixed liquid are remaining in the solution.

For example, the filtering at the first filter may be performed with only the liquid dispersion, the other components may be mixed, and then the second filtering may be performed.

<Cured Film>

The cured film of the present invention is a cured film obtained by curing the above-described curable composition.

The cured film of the present invention may be suitably used as an interlayer insulating film. Furthermore, the cured film of the present invention is preferably a cured film obtained by a method for manufacturing a cured film of the present invention to be described below.

The insulating property is excellent due to the curable composition of the present invention, so that an interlayer insulating film having high transparency may be obtained even when the film is baked at high temperature. The interlayer insulating film manufactured by using the curable composition of the present invention has high transparency and is excellent in physical properties of the cured film, and thus is useful for an organic EL display device or a liquid crystal display device.

The cured film of the present invention may be suitably used as an optical member such as a microlens, an optical waveguide, an antireflection film, a sealing material for an LED, and a chip coating material for an LED, or a cured product for reducing the visibility of a wiring electrode used for a touch panel.

Further, the cured film of the present invention may be suitably used in, for example, a planarization film or an interlayer insulating film in a liquid crystal display device or an organic EL device, and the like, a protective film of a color filter, a spacer for constantly maintaining the thickness of a liquid crystal layer in the liquid crystal display device, a structural member of a Micro Electro Mechanical Systems (MEMS) device, and the like as described below.

[Method for Manufacturing Transparent Film (Cured Film)]

A method for manufacturing a transparent film of the present invention includes a process of coating the curable composition described above on a wafer by means of a spray method, a roll coat method, a rotary coating method (spin coat method), a bar-coating method and the like, a subsequent first heating process, and also subsequently, a second heating process at a higher temperature.

The conditions in the first heating process are the same as the conditions to be described below as pre-bake conditions in the (B) process in the method for manufacturing a microlens.

The conditions in the second heating process are the same as the conditions to be described below as post-bake conditions in the (D) process in the method for manufacturing a microlens.

<Microlens>

The curable composition of the present invention may form a transparent film which has a high refractive index and high transmittance, and thus, may be very suitably used for forming, for example, a microlens and a microlens array.

That is, the curable composition of the present invention is preferably for forming a microlens.

Further, the present invention also relates to a microlens formed by using a transparent film formed by using the curable composition of the present invention.

[Method for Manufacturing Microlens]

A method of manufacturing a microlens by using the composition or curable composition of the present invention is not particularly limited, a method which is usually used may be applied, and examples thereof include a manufacturing method including a process of subjecting the transparent film described above to post-bake treatment to shape the transparent film and a process of dry etching the transparent film, and the like.

The process of subjecting the transparent film to post-bake treatment to shape the transparent film is the same as the process to be described in detail below as the (f) process.

The dry etching process is the same as the process to be described in detail below as the (g) process.

A preferred aspect of the method for manufacturing a microlens by using the curable composition of the present invention is a manufacturing method, at least including the following (A) to (D) processes.

(A) A process of forming a coating film of the curable composition of the present invention on a substrate.

(B) A process of irradiating radiation on at least some portion of the coating film.

(C) A process of developing the coating film after the irradiation.

(D) A process of heating the coating film after the development.

Hereinafter, these processes will be described.

(A) Process

In this process, the curable composition is preferably coated as a liquid composition on the surface of a substrate and subjected to pre-baking to remove the solvent, thereby forming a coating film on the substrate.

Examples of the substrate include a glass substrate, a silicon wafer, a substrate with various metal layers formed on the surface thereof, a substrate on which an on-chip color filter for an image sensor is coated, and the like.

The coating method is not particularly limited, and an appropriate method such as, for example, a spray method, a roll coat method, a rotary coating method, and a bar-coating method may be employed.

The pre-bake condition may vary according to the kind or use amount of each component, and the like, but is usually at 60 to 120° C., for 30 sec to 15 min. The film thickness of the coating film to be formed is a value after the pre-bake, and is preferably 0.5 to 20 μm.

(B) Process

In this process, radiation is irradiated on at least some portion of the coating film formed.

When radiation is irradiated only on some portion of the coating film, the radiation is irradiated via a mask having a predetermined pattern.

As the radiation to be irradiated, for example, ultraviolet rays such as, for example, g-ray and i-ray, far ultraviolet rays such as KrF excimer laser and ArF excimer laser, X-ray such as synchrotron radiation, charged particle beam such as electron beam, and the like may be used, but among them, ultraviolet rays are preferred.

The exposure amount may be suitably selected according to the constitution of a curable composition, and the like, but is preferably 50 to 2,000 J/m.

(C) Process

In this process, the coating film after the exposure is developed by a developing solution, preferably an alkaline developing solution and a pattern of a predetermined shape is formed by removing unirradiated portions of radiation.

As the alkaline developing solution, it is possible to use aqueous alkaline solutions of, for example, inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetraalkyl ammonium hydroxide such as tetramethyl ammonium hydroxide, tetraethyl ammonium hydroxide, tetrapropyl ammonium hydroxide, tetrabutyl ammonium hydroxide, tetrapentyl ammonium hydroxide, tetrahexyl ammonium hydroxide, tetraoctyl ammonium hydroxide, ethyltrimethyl ammonium hydroxide, butyltrimethyl ammonium hydroxide, methyltriamyl ammonium hydroxide, and dibutyl dipentyl ammonium hydroxide, trimethylphenyl ammonium hydroxide, trimethylbenzyl ammonium hydroxide, and triethylbenzyl ammonium hydroxide, cyclic amines such as pyrrole and piperidine, and the like. These aqueous alkaline solutions may be used either alone or in combination of two or more thereof. In addition, a water-soluble organic solvent such as methanol, ethanol, and the like, a surfactant, or various organic solvents may be added to the alkaline developing solution and used.

As a development method, an appropriate method such as a puddle method, a dipping method, a rocking immersion method, and a showering method may be employed. Meanwhile, after being developed by the alkaline developing solution, the coating film is generally washed by, for example, running water washing and the like.

Development time varies according to the constitution of the curable composition and the constitution of the developing solution, but is usually 30 to 120 sec at normal temperature.

(D) Process

In this process, the coating film is cured by heating (post-baking) the coating film after the development by using a heating apparatus such as a hot plate and an oven.

In the post-bake, the heating temperature is usually 120 to 250° C., and preferably 160 to 230° C. Further, the heating time may vary according to the heating means, but when heating is performed on a hot plate, the heating time is usually 5 to 30 min, and when the heating is performed in an oven, the heating time is usually 30 to 90 min.

Furthermore, when the post-bake is performed, a step bake method including carrying out a heat treatment two or more times and the like may also be employed.

Examples of another preferred aspect of the method for manufacturing a microlens by using the curable composition of the present invention include a manufacturing method, at least including the following (a) to (g) processes.

(a) A process of forming a coating film on a substrate such as a color filter by using the curable composition of the present invention (b) A process of performing at least one of heating the aforementioned coating film to dry (or dry and cure) the coating film or exposing the aforementioned coating film by means of a light source with an appropriate wavelength (g-ray, i-ray, and the like) to cure the coating film, thereby obtaining a high refractive index film (transparent film)

(c) A process of forming a resist coating film on the high refractive index film after the heating (d) A process of exposing the resist coating film by using a light source (g-ray, i-ray, and the like) having an appropriate wavelength (e) A process of developing the resist coating film after the exposure to form a resist pattern (f) A process of shaping the resist pattern into a lens-type by means of post-heating (g) A process of removing the resist pattern and some portion of the high refractive index film by means of dry etching to shape the high refractive index film into a lens type Hereinafter, these processes will be described.

—(a) Process—

In the process, the curable composition of the present invention is coated on a substrate such as a color filter to form a coating film.

Examples of the coating method include the method as in the process (A).

—(b) Process—

In this process, a preferred embodiment of heating the coating film may include a two-step heating treatment of pre-bake and post-bake.

The pre-bake condition may vary according to the kind or use amount of each component, and the like, but is usually at 60 to 120° C., for 30 sec to 15 min. The film thickness of the coating film to be formed is a value after the pre-bake, and is preferably 0.5 to 20 µm. The pre-bake process may be omitted in some cases.

Subsequently, the coating film is cured by heating (post-baking) the coating film using a heating apparatus such as a hot plate and an oven. The post-bake condition is usually at 120° C., to 300° C., for 30 sec to 60 min. Meanwhile, the curing may be promoted by performing exposure prior to the post-bake process.

When the aforementioned coating film is exposed by a light source (g-ray, i-ray, and the like) having an appropriate wavelength to be cured, the kind of radiation and the amount of exposure, which are the same as in the process (B), may be applied to the radiation to be irradiated.

—(c) Process—

In this process, a resist coating film is formed on a high refractive index film. As the resist, a generally commercially available resist from which a pattern may be formed by ultraviolet exposure may be used. For the resist coating film, the pre-bake is performed similarly as in the (a) process.

(d) Process—

In this process, the coating film is exposed into a pattern type by using a mask. The kind of radiation and the amount of exposure, which are the same as in the process (B), may be applied to the radiation to be irradiated.

(e) Process—

In this process, the resist coating film after the exposure is developed by a developing solution, preferably an alkaline developing solution and a pattern of a predetermined shape is formed by removing unirradiated portions or irradiated portions, of the radiation.

Examples of the alkaline developing solution include the alkaline developing solution which is the same as in the process (C).

Examples of the developing method include the method as described above about the process (C).

The developing time is the same as what is described above in the process (C).

—(f) Process—

In this process, a post-heating (post-bake) is performed by a heating apparatus such as a hot plate and an oven, thereby modifying the resist into a lens type after the pattern is formed. The post-bake condition is usually at 120° C., to 300° C., for 30 sec to 60 min. Furthermore, for modification into a lens type, a step bake method including carrying out a heat treatment two or more times may also be employed.

—(g) Process—

Dry etching may be performed by a publicly known method (for example, Japanese Patent Application Laid-Open No. 2010-204154).

As a dry etching gas, it is preferred to use, for example, the following etching gas. $CF_4$, $CHF_3$, $SF_6$, $Cl_2$, $C_2F_6$, $C_4F_6$, $C_4F8$, $C_5F_8$, $H_2$, $N_2$, $NH_3$. Among them, one gas may be selected and used, and also, two or more gasses may be used in combination. Furthermore, among them, from the viewpoint of maintaining rectangularity of a portion to be etched, a fluorine-based gas is preferably one or more selected from the group consisting of $CF_4$, $C_4F6$, $C_2F_6$, $C_4F_8$ and $CHF_3$, more preferably $CF_4$ or $C_4F_6$, and most preferably a mixture gas of $CF_4$ and $C_4F_6$.

Further, it is preferred that the mixture gas used in dry etching includes other gasses in addition to the above-described fluorine-based gas and oxygen gas from the viewpoint of maintaining the partial pressure control stability of etching plasma and the perpendicularity of etched shape. It is preferred for the other gasses to include at least one selected from the group consisting of rare gases, such as helium (He), neon (Ne), argon (Ar), krypton (Kr), and xenon (Xe), halogen-based gases including a halogen atom such as a chlorine atom, a fluorine atom or a bromine atom (for example, $CCl_4$, $CClF_3$, $AlF_3$, $AlCl_3$), $N_2$, CO and $CO_2$, more preferred to include at least one selected from the group consisting of He, Ar, Kr, $N_2$ and Xe, and even more preferred to include at least one selected from the group consisting of He. Ar, and Xe.

Meanwhile, when it is possible to maintain the partial pressure control stability of etching plasma and the perpendicularity of etched shape, the mixture gas used in dry etching may be composed of only fluorine-based gas and oxygen gas.

In this manner, a desired microlens may be manufactured.

According to the method of the present invention for manufacturing a microlens, high-definition microlens and microlens array having excellent properties (for example, high refractive index and high transmittance) may be simply formed with a high product yield.

<Undercoat Film of Color Filter>

Further, the curable composition of the present invention may be used as an undercoat film of a color filter. The curable composition of the present invention may form a transparent and even coating film, and thus the film may be suitably used as an undercoat film.

That is, the curable composition of the present invention is preferably for an undercoat film of a color filter.

The undercoat film is preferably an undercoat film of a color filter to be formed in the following processes.

(A') A process of forming a coating film on a substrate with a device formed thereon, by using the curable composition of the present invention (B') A process of obtaining a transparent film by heating the aforementioned coating film and drying (or drying and curing) the coating film (C') A process of forming a color filter on the aforementioned transparent film by a publicly known method The formation of the coating film and the transparent film may be performed in accordance with the method described in the <microlens>.

The microlens and the undercoat film of the color filter in the present invention are formed from the curable composition of the present invention and has excellent balance in properties, and thus may be very suitably used in a liquid crystal display device for various OA equipment, liquid crystal televisions, portable telephones, projectors, and the like, the image formation optical system of an on-chip color filter such as a facsimile, an electronic copy machine, and a solid-state imaging device, an optical fiber connector, and the like.

<Solid-State Imaging Device>

The solid-state imaging device of the present invention includes the microlens formed by using the above-described curable composition of the present invention.

Since the solid-state imaging device of the present invention includes a microlens which has high refractive index and high transmittance, noise may be reduced, and excellent color reproducibility is shown.

The solid-state imaging device of the present invention is not particularly limited as long as the device has a constitution in which the microlens formed by using the curable composition of the present invention is included, and a constitution in which the device functions as a solid-state imaging device, and examples thereof include a constitution in which a light-receiving element consisting of a plurality of photodiodes, polysilicons, and the like which constitute a light-receiving area of a solid-state imaging device (CCD image sensor, CMOS image sensor, and the like) is disposed on a substrate and the undercoat film is disposed under a color filter, a constitution in which the microlens is disposed on a color filter, and the like.

The method for manufacturing a solid-state imaging device of the present invention is not particularly limited, but a preferred aspect thereof includes a process of forming red pixels, blue pixels, and green pixels on a substrate for a solid-state imaging device having at least a photodiode, a light-shielding film, and a device protective film, a process of coating the above-described composition and heating the composition, a process of forming a resist pattern, a process of performing a post-bake treatment to shape the formed resist pattern into a lens-type shape, and a dry etching process.

The process of coating the curable composition and heating the curable composition is performed in the same manner as in a step of forming a coating film on a substrate in (a) process and (b) process in the above-described method for manufacturing a microlens, and a step of heating the coating film and drying (or drying and curing) the coating film.

The process of forming a resist pattern is performed in the same manner as in the (d) process and (e) process in the above-described method for manufacturing a microlens.

The process of shaping a resist pattern formed by performing a post-bake treatment into a lens-type shape is performed in the same manner as in the (f) process in the above-described method for manufacturing a microlens.

The dry etching process is performed in the same manner as in the (g) process in the above-described method for manufacturing a microlens.

<Liquid Crystal Display Device>

The liquid crystal display device of the present invention includes the above-described cured film of the present invention.

The liquid crystal display device of the present invention is not particularly limited except that the liquid crystal display device has a planarization film or a interlayer insulating film formed by using the curable composition of the present invention, and examples thereof include publicly known liquid crystal display devices having various structures.

For example, specific examples of a thin-film transistor (TFT) included in the liquid crystal display device of the present invention include an amorphous silicon-TFT, a low-temperature silicon-TFT, an oxide semiconductor TFT, and the like. The cured film of the present invention has excellent electrical properties, and thus, may be preferably used in combination with these TFTs.

Further, examples of a liquid crystal driving system which the liquid crystal display device of the present invention may adopt include a twisted nematic (TN) system, a vertical alignment (VA) system, an in-place-switching (IPS) system, a frings field switching (FFS) system, an optical compensated bend (OCB) system, and the like.

Even in a liquid crystal display device of a color filter on allay (COA) system in a panel configuration, the cured film of the present invention may be used, and may be used, for example, as an organic insulating film 115 described in Japanese Patent Application Laid-Open No. 2005-284291, or an organic insulating film 212 described in Japanese Patent Application Laid-Open No. 2005-346054.

In addition, examples of a specific alignment system of a liquid crystal alignment film which the liquid crystal display device of the present invention may adopt include a rubbing alignment method, a photoalignment method, and the like. Furthermore, a polymer may be aligned and supported by a polymer sustained alignment (PSA) technology described in Japanese Patent Application Laid-Open No. 2003-149647 or 2011-257734.

FIG. 1 is a conceptual cross-sectional view illustrating an example of a liquid crystal display device 10 of an active matrix system. The color liquid crystal display device 10 is a liquid crystal panel having a backlight unit 12 on the back surface thereof, and in the liquid crystal panel, a device of a TFT 16 corresponding to all the pixels disposed between two glass substrates 14 and 15 to which a polarization film is adhered is disposed. At each device formed on the glass substrate, an ITO transparent electrode 19 which forms a pixel electrode is wired through a contact hole 18 formed in a cured film 17. A liquid crystal 20 layer and a RGB color filter 22 on which a black matrix is disposed are provided on the ITO transparent electrode 19.

A light source of the backlight is not particularly limited, and a publicly known light source may be used. Examples thereof include, for example, a white LED, a multi-color LED of blue, red, green and the like, a fluorescent lamp (cold cathode tube), an organic EL, and the like.

Further, the liquid crystal display device may be a 3D (stereoscopic vision) type, or a touch panel type. In addition, the liquid crystal display device may also be manufactured into a flexible type, and may be used as a second interphase insulating film 48 described in Japanese Patent Application Laid-Open No. 2011-145686, or as an interphase insulating film 520 described in Japanese Patent Application Laid-Open No. 2009-258758.

<Organic EL Display Device>

The organic EL display device of the present invention includes the above-described cured film of the present invention.

The organic EL display device of the present invention is not particularly limited except that the organic EL display device has a planarization film or a interlayer insulating film formed by using the curable composition of the present invention, and examples thereof include various publicly known organic EL display devices or liquid crystal display devices adopting various structures.

For example, specific examples of a thin-film transistor (TFT) which the organic EL display device of the present invention has include an amorphous silicon-TFT, a low-temperature polysilicon-TFT, an oxide semiconductor TFT, and the like. The cured film of the present invention has excellent electrical properties, and thus, may be preferably used in combination with these TFTs.

Figure 2:
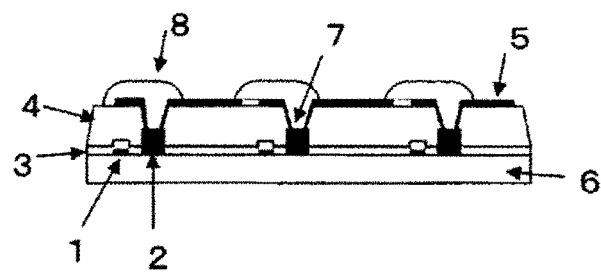
FIG. 2 is a conceptual view illustrating a configuration of an example of the organic EL display device.

FIG. 2 is a conceptual view illustrating a configuration of an example of the organic EL display device. FIG. 2 illustrates a schematic cross-sectional view of a substrate in a bottom emission-type organic EL display device, and the display device has a planarization film 4.

On a glass substrate 6, a bottom gate-type TFT 1 is formed, and an insulating film 3 composed of Si3N4 is formed while covering the TFT 1. A contact hole which is not shown herein is formed in the insulating film, and then a wiring 2 (height 1.0 μm) connected to the TFT 1 through the contact hole is formed on the insulating film 3. The wiring 2 is for connecting the TFT 1 to the TFT 1, or an organic EL device formed in a subsequent process to the TFT 1.

Furthermore, in order to planarize unevenness due to formation of the wiring 2, the planarization layer 4 is formed on the insulating film 3 while embedding the unevenness due to the wiring 2.

A bottom emission-type organic EL device is formed on the planarization film 4. That is, a first electrode 5 composed of ITO is formed on the planarization film 4 while being connected to the wiring 2 through a contact hole 7. Further, the first electrode 5 corresponds to a positive electrode of the organic EL device.

An insulating film 8 which covers the peripheral edge of the first electrode 5 is formed, and a short between the first electrode 5 and a second electrode to be formed in the subsequent process may be prevented by forming the insulating film 8.

Furthermore, even though this process is not illustrated in FIG. 2, a hole transporting layer, an organic light emitting layer, and an electron transporting layer are sequentially deposited and formed through a desired pattern mask, subsequently, a second electrode composed of Al is formed on the entire surface at the upper side of the substrate, the second electrode and those layers are sealed by adhering the second electrode and those layers using a sealing glass plate and a UV curing-type epoxy resin, and an active matrix-type organic EL display device connected to TFT 1 for driving the second electrode and those layers in each organic EL device may be obtained.

Since the curable composition of the present invention is excellent in curability and cured film properties, as a structural member of an MEMS device, a resist pattern formed by using the curable composition of the present invention is used as a partition wall, or is included therein and used as a part of a machine driving part. Examples of the device for an MEMS include parts such as a surface acoustic wave (SAW) filter, a bulk acoustic wave (BAW) filter, a gym sensor, a display microshutter, an image sensor, an electronic paper, an inkjet head, a biochip, and a sealant. More specific examples are exemplified in Japanese Unexamined Patent Application Publication No. 2007-522531, Japanese Patent Application Laid-Open Nos. 2008-250200 and 2009-263544, and the like.

Figure 3:
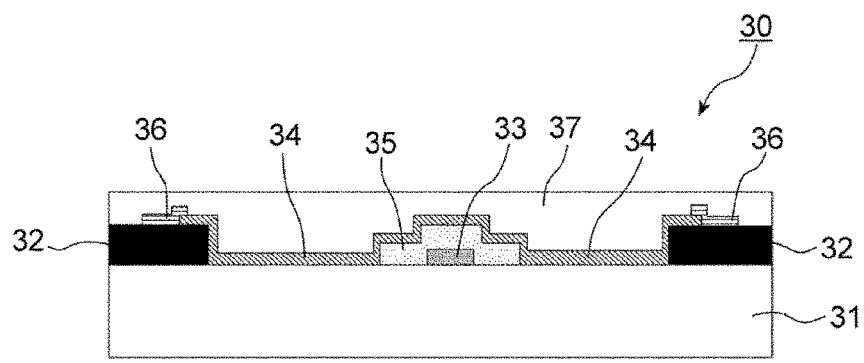
FIG. 3 is a cross-sectional view illustrating a configuration of an electrostatic capacitance-type input device.

The curable composition of the present invention is excellent in flatness or transparency, and thus, may also be used in formation of, for example, a bank layer 16 and a planarization film 57 described in FIG. 2 of Japanese Patent Application Laid-Open No. 2011-107476, a partition wall 12 and a planarization film 102 described in FIG. 4(a) of Japanese Patent Application Laid-Open 2010-9793, a bank layer 221 and a third interlayer insulating film 216b described in FIG. 10 of Japanese Patent Application Laid-Open No. 2010-27591, a second interlayer insulating film 125 and a third interlayer insulating film 126 described in FIG. 4(a) of Japanese Patent Application Laid-Open No. 2009-128577, a planarization film 12 and a pixel separation insulating film 14 described in FIG. 3 of Japanese Patent Application Laid-Open No. 2010-182638, and the like.

<Touch Panel Display Device>

A touch panel display device of the present invention includes an electrostatic capacitance-type input device having the cured film of the present invention. Further, the electrostatic capacitance-type input device of the present invention has the cured film of the present invention.

It is preferred that the electrostatic capacitance-type input device of the present invention has a front plate and at least the following (1) to (5) elements at a non-contact side of the front plate, in which (4) is a cured product of the present invention.

(1) Mask Layer (2) A plurality of first transparent electrode patterns formed while a plurality of pad parts extends through a connection portion in a first direction (3) A plurality of second transparent electrode patterns electrically insulated from the first transparent electrode pattern and composed of a plurality of pad parts formed while extending in a direction crossing the first direction (4) An insulating layer electrically insulating the first transparent electrode pattern from the second transparent electrode pattern (5) A conductive element electrically connected to at least one side of the first transparent electrode pattern and the second electrode pattern, and separate from the first transparent electrode pattern and the second electrode pattern The electrostatic capacitance-type input device of the present invention preferably forms a transparent protective film so as to cover all or a portion of (1) to (5) elements, and the transparent protective layer is more preferably the cured film of the present invention.

First, the configuration of the electrostatic capacitance-type input device will be described. FIG. 3 is a cross-sectional view illustrating a configuration of an electrostatic capacitance-type input device. In FIG. 3, an electrostatic capacitance-type input device 30 includes a front plate 31, a mask layer 32, a first transparent electrode pattern 33, a second transparent electrode pattern 34, an insulating layer 35, a conductive element 36, and a transparent protective layer 37.

The front plate 31 is composed of a translucent substrate such as a glass substrate, and reinforced glass represented by Gorilla glass of Corning Inc, and the like may be used. In addition, in FIG. 3, the side at which each element of the front plate 31 is provided is referred to as a non-contact surface. In the electrostatic capacitance-type input device 30 of the present invention, the input is performed by bringing a finger or the like in contact with the contact surface (the surface opposite to the non-contact surface) of the front plate 31. Hereinafter, the front plate is referred to as "a substrate" in some cases.

Furthermore, the mask layer 32 is formed on the non-contact surface of the front plate 31. The mask layer 32 is a frame-shaped pattern disposed around the display region formed at the non-contact side of the touch panel front plate, and is formed so as to conceal routed wiring and the like.

Figure 4:
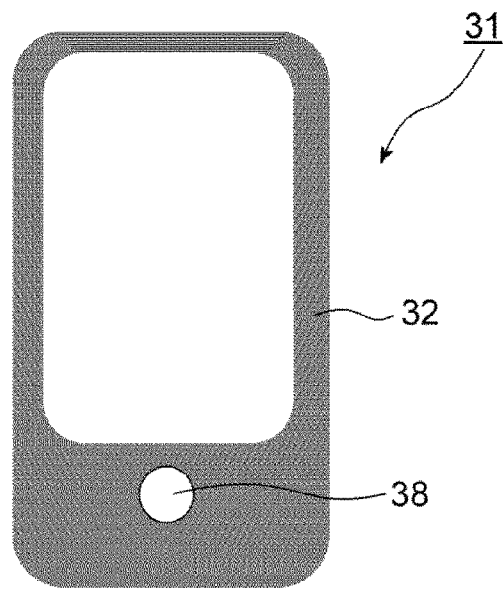
FIG. 4 is a schematic view illustrating a configuration of the electrostatic capacitance-type input device.

In the electrostatic capacitance-type input device of the present invention, the mask layer 32 is formed so as to cover some regions (region other than the input surface in FIG. 4) of the front plate 31, as illustrated in FIG. 4. Further, an opening 38 may be formed on a portion of the front plate 31, as illustrated in FIG. 4. In the opening 38, a mechanical switch driven by press force may be provided.

Figure 5:
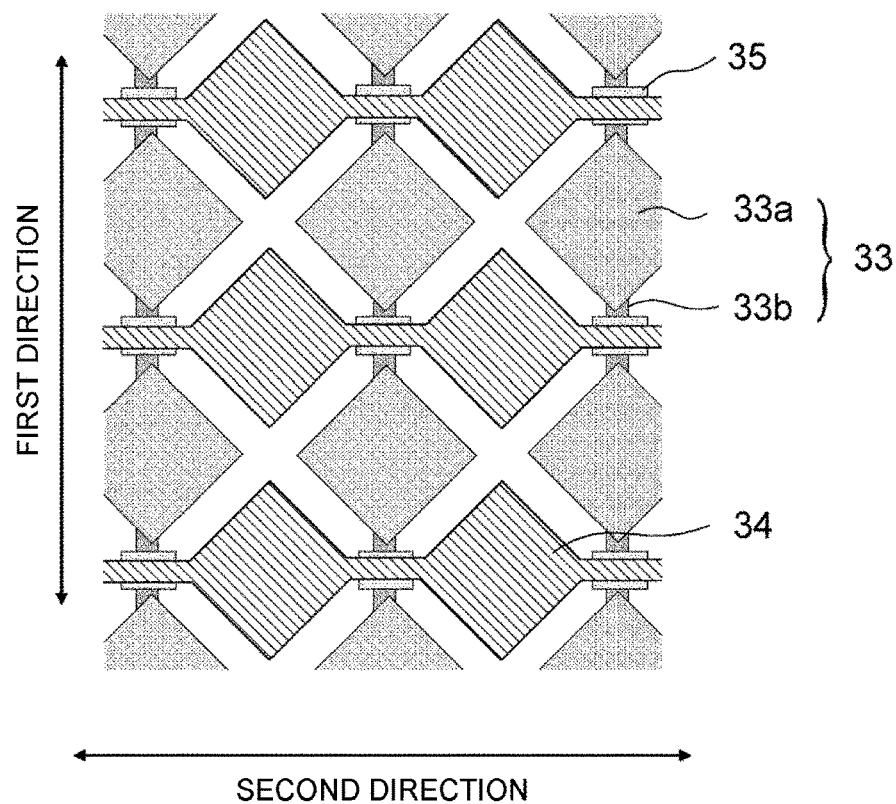
FIG. 5 is an explanation view illustrating an example of a first transparent electrode pattern and a second transparent electrode pattern in the present invention.

As illustrated in FIG. 5, on the contact surface of the front plate 31, formed are a plurality of first transparent electrode patterns 33 formed while a plurality of pad parts extends in a first direction through a connection part, a plurality of second transparent electrode patterns 34 electrically insulated from the first transparent electrode patterns 33 and composed of a plurality of pad parts formed while extending in a direction crossing the first direction, and an insulating layer 35 electrically insulating the first transparent electrode pattern 33 from the second transparent electrode pattern 34. The first transparent electrode pattern 33, the second transparent electrode pattern 34, and a conductive element 36 to be described below may be manufactured of a translucent conductive metal oxide film such as, for example, indium tin oxide (ITO) or indium zinc oxide (IZO). Examples of the metal film include an ITO film; a metal film such as Al, Zn, Cu, Fe, Ni, Cr, and Mo; a metal oxide film such as $SiO_2$, and the like. In this case, the film thickness of each element may be adjusted to 10 to 200 nm. In addition, electrical resistance may also be reduced such that an amorphous ITO film is converted into a polycrystalline ITO film by firing. Furthermore, the first transparent electrode pattern 33, the second transparent electrode pattern 34, and a conductive element to be described below may also manufactured by using a photocurable transfer material having a curable composition using the conductive fiber. In addition, when the first conductive pattern and the like are formed by ITO and the like, reference may be made to paragraph nos. [0014] to [0016] of Japanese Patent No. 4506785, and the like.

Furthermore, at least one of the first transparent electrode pattern 33 and the second transparent electrode pattern 34 may be provided over both regions of the non-contact surface of the front plate 31 and a surface opposite to the front plate 31 of the mask layer 32. FIG. 3 illustrates a view in which the second transparent electrode pattern is provided over both regions of the non-contact surface of the front plate 31 and a surface opposite to the front plate 31 of the mask layer 32.

The first transparent electrode pattern 33 and the second transparent electrode pattern 34 will be described by using FIG. 5. FIG. 5 is an explanation view illustrating an example of a first transparent electrode pattern and a second transparent electrode pattern in the present invention. As illustrated in FIG. 5, the first transparent electrode pattern 33 is formed while a pad part 33a extends in a first direction through a connection part 33b. Further, the second transparent electrode pattern 34 is electrically insulated from the first transparent electrode pattern 33 by the insulating layer 35, and is composed of a plurality of pad parts formed while extending in a direction (second direction in FIG. 5) crossing the first direction. Here, when the first transparent electrode pattern 33 is formed, the pad part 33a and the connection part 33b may be integrally manufactured, or only the connection part 33b is manufactured and the pad part 33a and the second transparent electrode pattern 34 may be integrally manufactured (patterned). When the pad part 33*a* and the second transparent electrode pattern 34 are integrally manufactured (patterned), each layer is formed such that a portion of the connection part 33*b* is linked to a portion of the pad part 33*a*, and the first transparent electrode pattern 33 is electrically insulated from the second transparent electrode pattern 34 by the insulating layer 35, as illustrated in FIG. 5.

In FIG. 3, the conductive element 36 is provided at the surface side opposite to the front plate 31 of the mask layer 32. The conductive element 36 is electrically connected to at least one of the first transparent electrode pattern 33 and the second transparent electrode pattern 34, and is also an element separate from the first transparent electrode pattern 33 and the second transparent electrode pattern 34. FIG. 3 illustrates a view in which the conductive element 36 is connected to the second transparent electrode pattern 34.

In addition, in FIG. 3, the transparent protective layer 37 is provided so as to cover all of the constituent elements. The transparent protective layer 37 may be configured so as to cover only a portion of the constituent elements. The insulating layer 35 and the transparent protective layer 37 may be formed of the same material or different materials.

<Electrostatic Capacitance-Type Input Device and Touch Panel Display Device Including Electrostatic Capacitance-Type Input Device>

It is possible to apply a configuration disclosed in "Current Touch Panel Technology" (published on Jul. 6, 2009, Techno Times Co., Ltd.), "Technology and Development of Touch Panel" supervised by Yuji Mitani, CMC Publishing Co., Ltd. (December, 2004), FPD International 2009 Forum T-11 Lecture Textbook, Cypress Semiconductor Corporation Application Note AN2292 and the like to an electrostatic capacitance-type input device obtained by the manufacturing method of the present invention and a touch panel display device including the electrostatic capacitance-type input device as a constituent element.

EXAMPLES

Hereinafter, the present invention will be specifically described with reference to the Examples, but the present invention is not limited to the Examples. Meanwhile, unless particularly specified, "parts" and "%" are based on mass.

Further, in the Examples, the acid value was determined by a potentiometric method (solvent tetrahydrofuran/water=54/6 (volume ratio), and a volumetric solution 0.1N sodium hydroxide aqueous solution (acid value).

In addition, the subsequent measurement of the weight average molecular weight was carried out by directly connecting HPC-8220GPC (manufactured by TOSOH CORPORATION), a guard column: TSKguardcolumn SuperHZ-L, and a column: TSKgel SuperHZM-M, TSKgel SuperHZ4000, TSKgel SuperHZ3000, TSKgel SuperHZ2000, injecting 10 µl of a tetrahydrofuran solution thereinto at a sample concentration of 0.1% by mass and a column temperature of 40° C., flowing tetrahydrofuran as an elution solvent at a flow rate of 0.35 ml/min, and detecting a sample peak with an RI detection device. The weight average molecular weight was calculated by using a calibration curve prepared by using standard polystyrene.

(Synthesis Example 1) Synthesis of Polymer Compound (C-5)

Polymer compound (C-5) was synthesized in accordance with a synthesis method described in paragraph nos. 0266 to 0348 of Japanese Patent Application Laid-Open No. 2007-277514 (paragraph nos. 0289 to 0429 in the corresponding U.S. Patent Application Publication No. 2010/233595). Specifically, the synthesis is as follows.

400 parts of dipentaerythritol hexakis(3-mercpatopropionate) [(33); manufactured by Sakai Chemical Industry Co., Ltd.] and 232.6 parts of compound having a carbon-carbon double bond while having the following adsorption site (A-3) were dissolved in 1476.1 parts of 1-methoxy-2-propanol, and the resulting solution was heated to 90° C., under nitrogen flow. The content at this time was 1.0:3.5 as a molar ratio.

2.06 parts of dimethyl 2,2'-azobis(2-methyl propionate) [V-601, manufactured by Wako Pure Chemical Industries, Ltd.] were added thereto, and the resulting mixture was heated for 2 hours. In addition, 2.06 parts of V-601 were added thereto, and the resulting mixture was reacted under nitrogen flow at 90° C., for 2 hours. The mixture was cooled to room temperature (25° C.), thereby obtaining a solution of 30% by mass of mercaptan compound (B-5) in which compound (A-3) was added to a part of the sulfur atoms of compound (33).

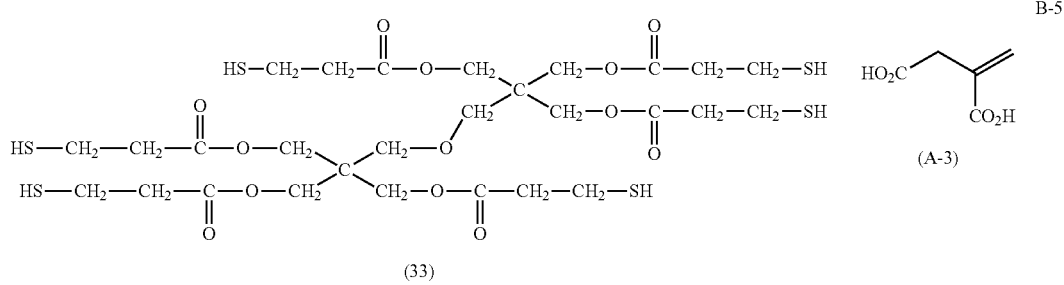

A mixed solution of 652.81 parts of the solution of 30% by mass of mercaptan compound (B-5) and 554.16 parts of methyl methacrylate (M-1) was heated to 90° C., under nitrogen flow. A solution obtained by dissolving 3.823 parts of dimethyl 2,2'-azobis(2-methyl propionate) [V-601, manufactured by Wako Pure Chemical Industries, Ltd.] in 402.52 parts of propylene glycol monomethyl ether acetate was added dropwise thereto over 2 hours, and subsequently, the resulting mixture was heated at 90° C., for 2 hours. Furthermore, 1.274 parts of V-601 were added thereto, the resulting mixture was reacted under nitrogen flow at 90° C., for 2 hours, 1.274 parts of V-601 were again added thereto, and the resulting mixture was reacted under nitrogen flow at 90° C., for 2 hours. Thereafter, 890.51 parts of propylene glycol monomethyl ether acetate were added thereto, and the resulting mixture was cooled to room temperature, thereby obtaining a solution of 30% by mass of a polymer compound (C-5: weight average molecular weight in terms of polystyrene 6400, acid value 80 mgKOH/g) shown below.

(C-5)

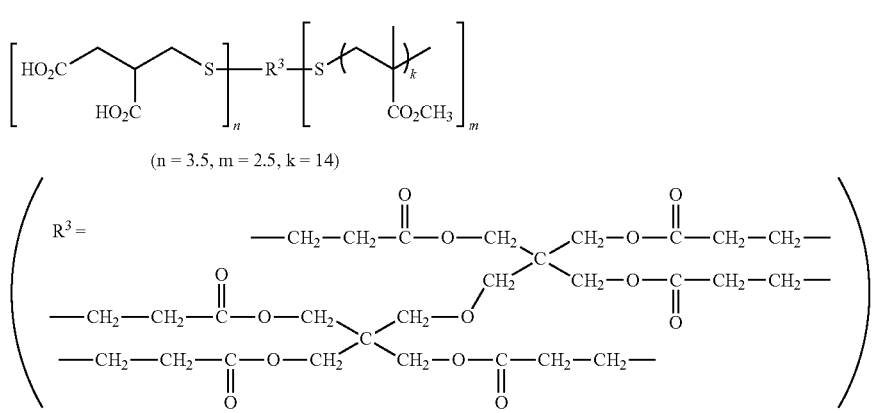

(n = 3.5, m = 2.5, k = 14)

(Synthesis Example 2) Synthesis of Polymer Compound (C-27)

Polymer compound (C-27) was synthesized in accordance with a synthesis method described in paragraph nos. 0266 to 0348 of Japanese Patent Application Laid-Open No. 2007-277514 (paragraph nos. 0289 to 0429 in the corresponding U.S. Patent Application Publication No. 2010/233595). Specifically, the synthesis is as follows.

65.0 parts of dipentaerythritol hexakis(3-mercpatopropionate) [(33); manufactured by Sakai Chemical Industry Co., Ltd.], 44.5 parts of compound having a carbon-carbon double bond while having the following adsorption site (A-16), and 27.0 parts of (A-3) were dissolved in 318.4 parts of 1-methoxy-2-propanol, and the resulting solution was heated to 90° C., under nitrogen flow. The content of (33), (A-16), and (A-3) at this time was 1.0:2.5:2.5 as a molar ratio.

0.478 parts of dimethyl 2,2'-azobis(2-methyl propionate) [V-601, Wako Pure Chemical Industries, Ltd.] was added thereto, and the resulting mixture was heated for 2 hours. Further, 0.478 parts of V-601 was added thereto, and the resulting mixture was reacted under nitrogen flow at 90° C., for 2 hours. The mixture was cooled to room temperature, thereby obtaining a solution of 30% by mass of mercaptan compound (B-27) in which compounds (A-3) and (A-16) were added to a part of the sulfur atoms of compound (33).

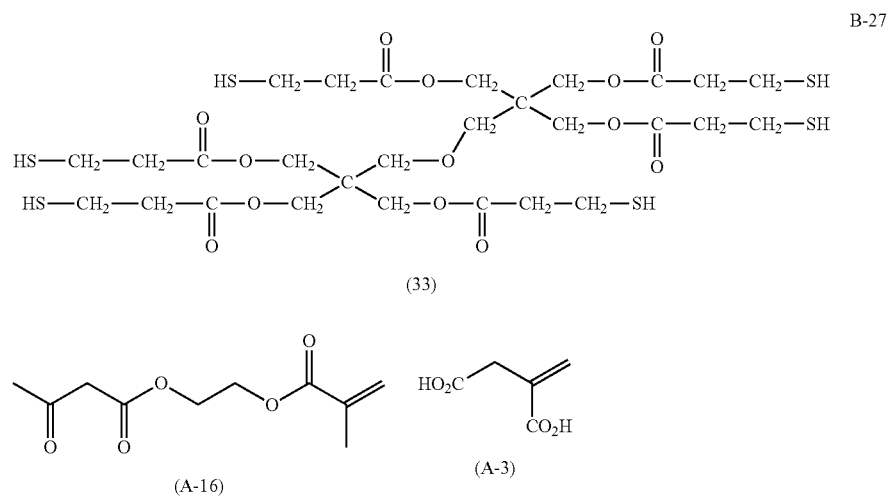

A mixed solution of 150.3 parts of the solution of 30% by mass of mercaptan compound (B-27) and 54.9 parts of methyl methacrylate (M-1) was heated to 90° C., under nitrogen flow. A solution obtained by dissolving 0.379 parts of dimethyl 2,2'-azobis(2-methyl propionate) [V-601, manufactured by Wako Pure Chemical Industries, Ltd.] in 39.9 parts of propylene glycol 1-monomethyl ether 2-acetate was added dropwise thereto over 2 hours, and subsequently, the resulting mixture was heated at 90° C., for 2 hours. Furthermore, 0.126 parts of V-601 was added thereto, the resulting mixture was reacted under nitrogen flow at 90° C., for 2 hours, 0.126 parts of V-601 was again added thereto, and the resulting mixture was reacted under nitrogen flow at 90° C., for 2 hours. Thereafter, 88.3 parts of propylene glycol 1-monomethyl ether 2-acetate were added thereto, and the resulting mixture was cooled to room temperature, thereby obtaining a solution of 30% by mass of a polymer compound (C-27: weight average molecular weight in terms of polystyrene 4400, acid value 77 mgKOH/g) shown below.

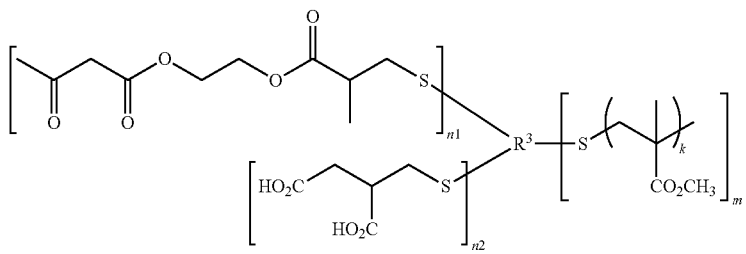

(C-27)

$(n1 + n2 = 5, m = 1, k = 20, n1/n2 = 1/1)$

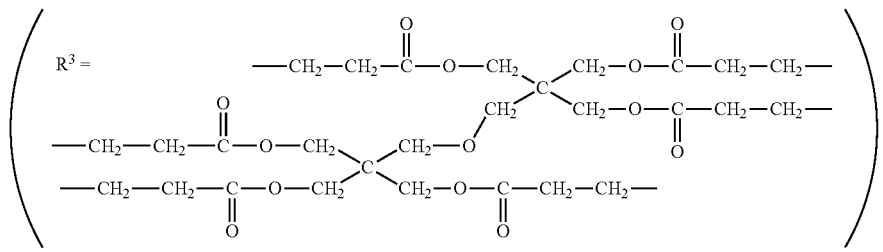

(Synthesis Example 3) Synthesis of Polymer Compound (C-28)

Polymer compound (C-28) was synthesized in accordance with a synthesis method described in paragraph nos. 0266 to 0348 of Japanese Patent Application Laid-Open No. 2007-277514 (paragraph nos. 0289 to 0429 in the corresponding U.S. Patent Application Publication No. 2010/233595). Specifically, the synthesis is as follows.

65.0 parts of dipentaerythritol hexakis(3-mercpatopropionate) [(33); manufactured by Sakai Chemical Industry Co., Ltd.], 44.5 parts of compound having a carbon-carbon double bond while having the following adsorption site (A-17), and 27.0 parts of (A-3) were dissolved in 318.4 parts of 1-methoxy-2-propanol, and the resulting solution was heated to 90° C., under nitrogen flow. The content of (33), (A-17), and (A-3) at this time was 1.0:2.5:2.5 as a molar ratio.

0.478 parts of dimethyl 2,2'-azobis(2-methyl propionate) [V-601, manufactured by Wako Pure Chemical Industries, Ltd.] was added thereto, and the resulting mixture was heated for 2 hours. Further, 0.478 parts of V-601 was added thereto, and the resulting mixture was reacted under nitrogen flow at 90° C., for 2 hours. The mixture was cooled to room temperature, thereby obtaining a solution of 30% by mass of mercaptan compound (B-28) in which compounds (A-3) and (A-17) were added to a part of the sulfur atoms of compound (33).

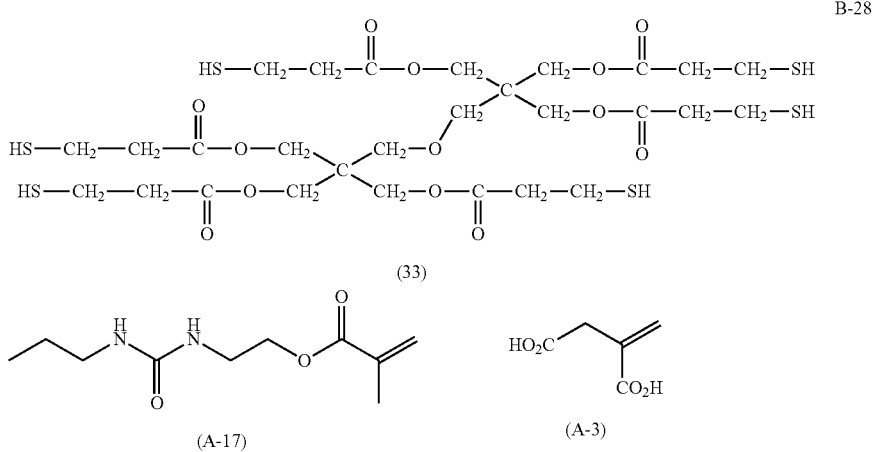

A mixed solution of 150.3 parts of the solution of 30% by mass of mercaptan compound (B-28) and 54.9 parts of methyl methacrylate (M-1) was heated to 90° C., under nitrogen flow. A solution obtained by dissolving 0.379 parts of dimethyl 2,2'-azobis(2-methyl propionate) [V-601, manufactured by Wako Pure Chemical Industries, Ltd.] in 39.9 parts of propylene glycol 1-monomethyl ether 2-acetate was added dropwise thereto over 2 hours, and the resulting mixture was heated at 90° C., for 2 hours. In addition, 0.126 parts of V-601 was added thereto, the resulting mixture was reacted under nitrogen flow at 90° C., for 2 hours, 0.126 parts of V-601 was again added thereto, and the resulting mixture was reacted under nitrogen flow at 90° C., for 2 hours. Thereafter, 88.3 parts of propylene glycol 1-monomethyl ether 2-acetate was added thereto, and the resulting mixture was cooled to room temperature, thereby obtaining a solution of 30% by mass of a polymer compound (C-28: weight average molecular weight in terms of polystyrene 4300, acid value 77 mgKOH/g) shown below.

(C-28)

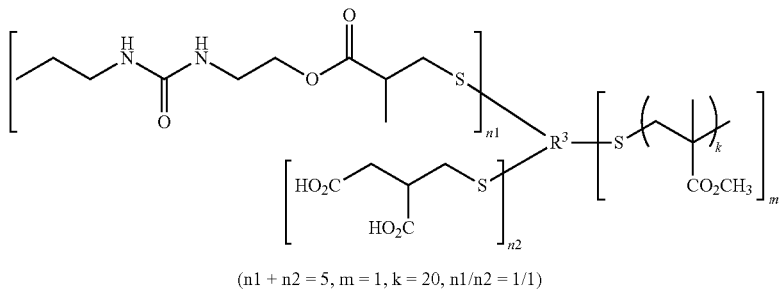

(n1 + n2 = 5, m = 1, k = 20, n1/n2 = 1/1)

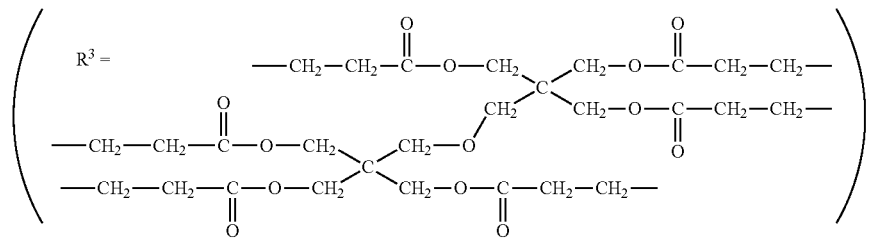

(Synthesis Example 4) Synthesis of Polymer Compound (C-43)

Polymer compound (C-43) was synthesized in accordance with a synthesis method described in paragraph nos. 0266 to 0348 of Japanese Patent Application Laid-Open No. 2007-277514 (paragraph nos. 0289 to 0429 in the corresponding U.S. Patent Application Publication No. 2010/233595). Specifically, the synthesis is as follows.

70.0 parts of dipentaerythritol hexakis(3-mercpatopropionate) [(33); manufactured by Sakai Chemical Industry Co., Ltd.], 17.7 parts of compound having a carbon-carbon double bond while having the following adsorption site (A-23), and 46.5 parts of (A-3) were dissolved in 313.2 parts of 1-methoxy-2-propanol, and the resulting solution was heated to 90° C., under nitrogen flow. The content of (33), (A-23), and (A-3) at this time was 1.0:1.0:4.0 as a molar ratio.

0.515 parts of dimethyl 2,2'-azobis(2-methyl propionate) [V-601, manufactured by Wako Pure Chemical Industries, Ltd.] was added thereto, and the resulting mixture was heated for 2 hours. Further, 0.515 parts of V-601 was added thereto, and the resulting mixture was reacted under nitrogen flow at 90° C., for 2 hours. The mixture was cooled to room temperature, thereby obtaining a solution of 30% by mass of mercaptan compound (B-43) in which compounds (A-3) and (A-23) were added to a part of the sulfur atoms of compound (33).

B-43

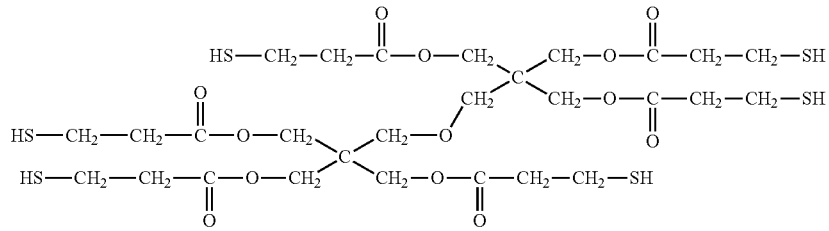

(33)

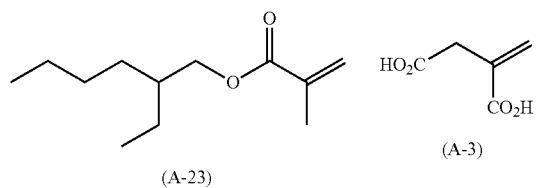

A mixed solution of 155.6 parts of the solution of 30% by mass of mercaptan compound (B-43) and 93.3 parts of methyl methacrylate (M-1) was heated to 90° C., under nitrogen flow. A solution obtained by dissolving 0.644 parts of dimethyl 2,2'-azobis(2-methyl propionate) [V-601, manufactured by Wako Pure Chemical Industries, Ltd.] in 67.8 parts of propylene glycol 1-monomethyl ether 2-acetate was added dropwise thereto over 2 hours, and the resulting mixture was heated at 90° C., for 2 hours. In addition, 0.215 parts of V-601 was added thereto, the resulting mixture was reacted under nitrogen flow at 90° C., for 2 hours, 0.215 parts of V-601 was again added thereto, and the resulting mixture was reacted under nitrogen flow at 90° C., for 2 hours. Thereafter, 150.0 parts of propylene glycol 1-monomethyl ether 2-acetate was added thereto, and the resulting mixture was cooled to room temperature, thereby obtaining a solution of 30% by mass of a polymer compound (C-43: weight average molecular weight in terms of polystyrene 6400, acid value 99 mgKOH/g) shown below.

0348 of Japanese Patent Application Laid-Open No. 2007-277514 (paragraph nos. 0289 to 0429 in the corresponding U.S. Patent Application Publication No. 2010/233595). Specifically, the synthesis is as follows.

31.0 parts of dipentaerythritol hexakis(3-mercpatopropionate) [(33); manufactured by Sakai Chemical Industry Co., Ltd.], 8.88 parts of compound having a carbon-carbon double bond while having the following adsorption site (A-26), and 20.6 parts of (A-3) were dissolved in 141.1 parts of 1-methoxy-2-propanol, and the resulting solution was heated to 90° C., under nitrogen flow. The content of (33), (A-26), and (A-3) at this time was 1.0:1.0:4.0 as a molar ratio.

0.228 parts of dimethyl 2,2'-azobis(2-methyl propionate) [V-601, manufactured by Wako Pure Chemical Industries, Ltd.] was added thereto, and the resulting mixture was heated for 2 hours. Further, 0.228 parts of V-601 was added thereto, and the resulting mixture was reacted under nitrogen

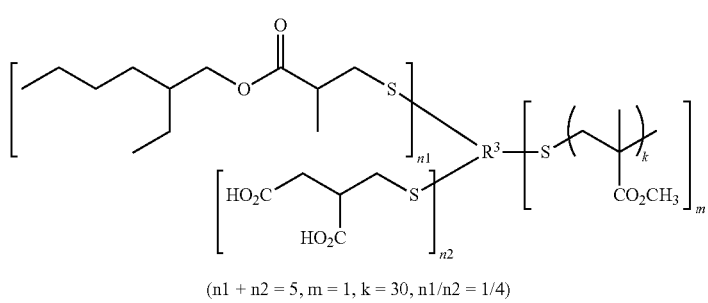

(C-43)

(n1 + n2 = 5, m = 1, k = 30, n1/n2 = 1/4)

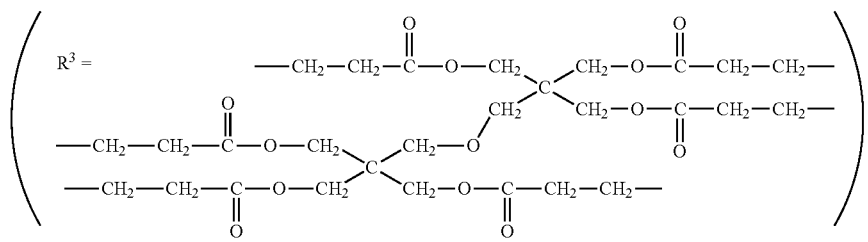

(Synthesis Example 5) Synthesis of Polymer Compound (C-46)

Polymer compound (C-46) was synthesized in accordance with a synthesis method described in paragraph nos. 0266 to flow at 90° C., for 2 hours. The mixture was cooled to room temperature, thereby obtaining a solution of 30% by mass of mercaptan compound (B-46) in which compounds (A-3) and (A-26) were added to a part of the sulfur atoms of compound (33).

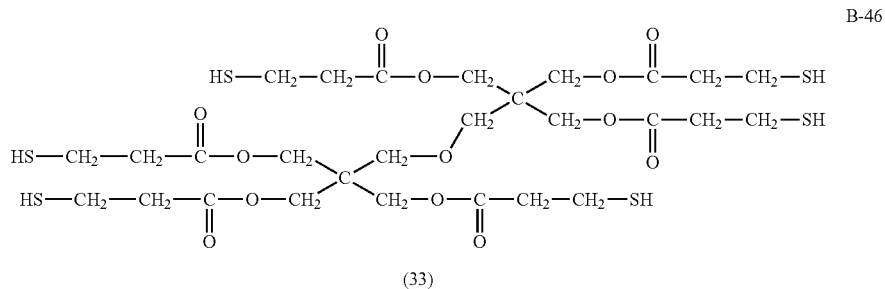

B-46

(33)

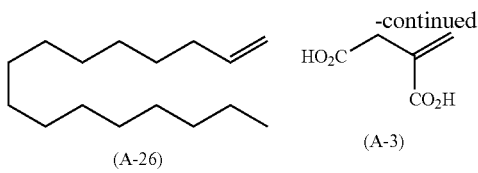

(A-26)    (A-3)

A mixed solution of 157.4 parts of the solution of 30% by mass of mercaptan compound (B-46) and 92.8 parts of methyl methacrylate (M-1) was heated to 90° C., under nitrogen flow. A solution obtained by dissolving 0.640 parts of dimethyl 2,2'-azobis(2-methyl propionate) [V-601, manufactured by Wako Pure Chemical Industries, Ltd.] in 67.40 parts of propylene glycol 1-monomethyl ether 2-acetate was added dropwise thereto over 2 hours, and the resulting mixture was heated at 90° C., for 2 hours. In addition, 0.213 parts of V-601 was added thereto, the resulting mixture was reacted under nitrogen flow at 90° C., for 2 hours, 0.213 parts of V-601 was again added thereto, and the resulting mixture was reacted under nitrogen flow at 90° C., for 2 hours. Thereafter, 149.1 parts of propylene glycol 1-monomethyl ether 2-acetate was added thereto, and the resulting mixture was cooled to room temperature, thereby obtaining a solution of 30% by mass of a polymer compound (C-46: weight average molecular weight in terms of polystyrene 6600, acid value 99 mgKOH/g) shown below.

0348 of Japanese Patent Application Laid-Open No. 2007-277514 (paragraph nos. 0289 to 0429 in the corresponding U.S. Patent Application Publication No. 2010/233595). Specifically, the synthesis is as follows.

70.0 parts of dipentaerythritol hexakis(3-mercpatopropionate) [(33); manufactured by Sakai Chemical Industry Co., Ltd.], 11.6 parts of compound having a carbon-carbon double bond while having the following adsorption site (A-28), and 46.5 parts of (A-3) were dissolved in 299.0 parts of 1-methoxy-2-propanol, and the resulting solution was heated to 90° C., under nitrogen flow. The content of (33), (A-28), and (A-3) at this time was 1.0:1.0:4.0 as a molar ratio.

0.515 parts of dimethyl 2,2'-azobis(2-methyl propionate) [V-601, manufactured by Wako Pure Chemical Industries, Ltd.] was added thereto, and the resulting mixture was heated for 2 hours. Further, 0.515 parts of V-601 was added thereto, and the resulting mixture was reacted under nitrogen (C-46)

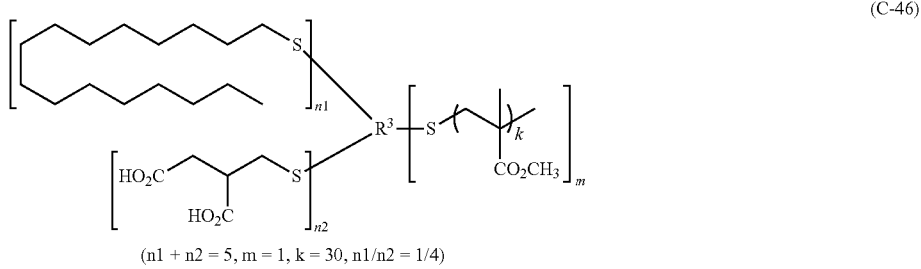

$(n1 + n2 = 5, m = 1, k = 30, n1/n2 = 1/4)$

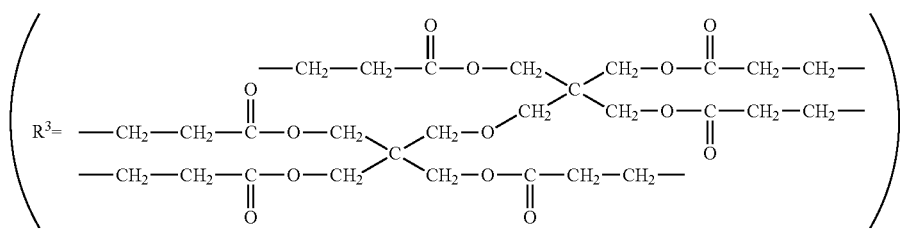

(Synthesis Example 6) Synthesis of Polymer Compound (C-48)

Polymer compound (C-48) was synthesized in accordance with a synthesis method described in paragraph nos. 0266 to flow at 90° C., for 2 hours. The mixture was cooled to room temperature, thereby obtaining a solution of 30% by mass of mercaptan compound (B-48) in which compounds (A-3) and (A-28) were added to a part of the sulfur atoms of compound (33).

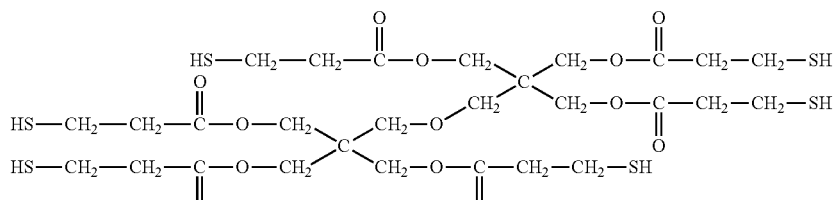

(33)

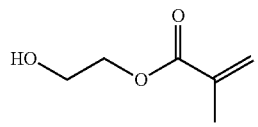

(A-28)

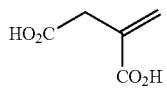

(A-3)

B-48

A mixed solution of 150.8 parts of the solution of 30% by mass of mercaptan compound (B-48) and 94.8 parts of methyl methacrylate (M-1) was heated to 90° C., under nitrogen flow. A solution obtained by dissolving 0.654 parts of dimethyl 2,2'-azobis(2-methyl propionate) [V-601, manufactured by Wako Pure Chemical Industries, Ltd.] in 68.8 parts of propylene glycol 1-monomethyl ether 2-acetate was added dropwise thereto for 2 hours, and subsequently, the resulting mixture was heated to 90° C., for 2 hours. In addition, 0.218 parts of V-601 was added thereto, the resulting mixture was reacted under nitrogen flow at 90° C., for 2 hours, 0.218 parts of V-601 was again added thereto, and the resulting mixture was reacted under nitrogen flow at 90° C., for 2 hours. Thereafter, 152.3 parts of propylene glycol 1-monomethyl ether 2-acetate were added thereto, and the resulting mixture was cooled to room temperature, thereby obtaining a solution of 30% by mass of a polymer compound (C-48: weight average molecular weight in terms of polystyrene 6400, acid value 99 mgKOH/g) shown below.

Polymer compounds (C-1) to (C-4), (C-6) to (C-26), (C-29) to (C-42), (C-44), (C-45), (C-47), and (C-49) to (C-61) were also synthesized in accordance with a synthesis method described in paragraph nos. 0266 to 0348 of Japanese Patent Application Laid-Open No. 2007-277514 (paragraph nos. 0289 to 0429 in the corresponding U.S. Patent Application Publication No. 2010/233595). Specifically, polymer compounds (C-1) to (C-4), (C-6) to (C-26), (C-29) to (C-42), (C-44), (C-45), (C-47), and (C-49) to (C-61) were also synthesized in the same manner as in Synthesis Examples 1 to 6, except that the kind and content of "compound having a (m+n)-valent linking group $R^1$ and a mercapto group" (corresponding to the above-described "compound having 3 to 10 mercapto groups in a molecule thereof") to be a raw material, the kind and content of "compound having a substituent $A^1$ and a carbon-carbon double bond" (corresponding to the above-described "compound having a carbon-carbon double bond while having an adsorption site"), the kind and content of "monomer which forms $P^1$ or $P^2$" (corresponding to the above-described "vinyl monomer") were appropriately modified.

With respect to these synthesized polymer compounds (C-1) to (C-61), "a compound having a (m+n)-valent linking group $R^1$ and a mercapto group" to be a raw material, "a compound having a substituent $A^1$ and a carbon-carbon double bond" (the case of being used in combination represents each content molar ratio) to be a raw material, "a monomer which forms $P^1$ or $P^2$" (the case of being used in combination represents each content molar ratio) to be a raw material, m and n in Formula (1) or (2), and a repeating unit number k of repeating units in $P^1$ in Formula (1) or $P^2$ in Formula (2), an acid value, and a weight average molecular weight are summarized in the following Table 1.

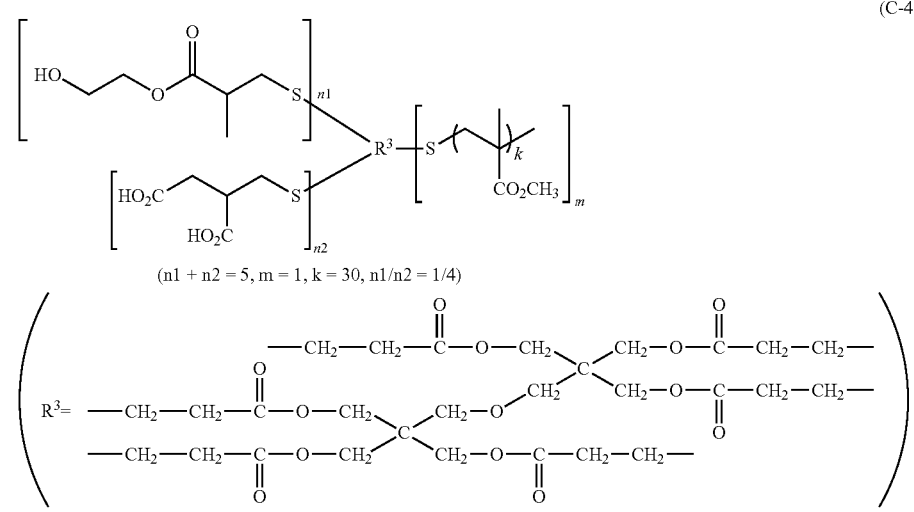

(C-48)

(n1 + n2 = 5, m = 1, k = 30, n1/n2 = 1/4)

TABLE 1

| Dispersant (Compound (B)) | Compound having (m + n)-valent linking group $R^1$ and mercapto group | Compound having substituent $A^1$ and carbon-carbon double bond Molar ratio in parenthesis | Monomer which forms $P^1$ or $P^2$ Molar ratio in parenthesis | n number | m number | k number | Acid value of dispersant (mgKOH/l) | Weight average molecular weight |
|---|---|---|---|---|---|---|---|---|
| C-1 | 33 | A-3 | M-1 | 5.5 | 0.5 | 20 | 241 | 3300 |
| C-2 | 33 | A-3 | M-1 | 5.5 | 0.5 | 30 | 200 | 4100 |
| C-3 | 33 | A-3 | M-1 | 5 | 1 | 20 | 158 | 4800 |
| C-4 | 33 | A-3 | M-1 | 3 | 3 | 7 | 102 | 4100 |
| C-5 | 33 | A-3 | M-1 | 3.5 | 2.5 | 14 | 80 | 6400 |
| C-6 | 33 | A-3 | M-1 | 2 | 4 | 7 | 59 | 4700 |
| C-7 | 33 | A-3 | M-1 | 5 | 1 | 60 | 72 | 11700 |
| C-8 | 33 | A-3 | M-1 | 4 | 2 | 60 | 35 | 17590 |
| C-9 | 27 | A-3 | M-1 | 3 | 1 | 30 | 82 | 6500 |
| C-10 | 18 | A-3 | M-1 | 2 | 1 | 20 | 81 | 4400 |
| C-11 | 18 | A-3 | M-1 | 1 | 2 | 8 | 52 | 3000 |
| C-12 | 18 | A-3 | M-1 | 1 | 2 | 15 | 31 | 5000 |
| C-13 | 18 | A-3 | M-2 | 2 | 1 | 20 | 76 | 4700 |
| C-14 | 33 | A-1 | M-1 | 4 | 2 | 10 | 79 | 4400 |
| C-15 | 33 | A-2 | M-1 | 4 | 2 | 10 | 68 | 4400 |
| C-16 | 33 | A-5 | M-1 | 5.5 | 0.5 | 30 | 99 | 4200 |
| C-17 | 33 | A-6 | M-1 | 5.5 | 0.5 | 30 | 85 | 4100 |
| C-18 | 33 | A-8/A-3(1/4) | M-1 | 3 | 3 | 7 | 82 | 4100 |
| C-19 | 33 | A-9 | M-1 | 2 | 4 | 10 | 47 | 7500 |
| C-20 | 33 | A-9/A-3(1/6) | M-1 | 3.5 | 2.5 | 14 | 80 | 6200 |
| C-21 | 33 | A-10 | M-1 | 2 | 4 | 10 | 40 | 8200 |
| C-22 | 33 | A-11/A-3(1/6) | M-1 | 3.5 | 2.5 | 14 | 80 | 6300 |
| C-23 | 33 | A-12/A-3(1/6) | M-1 | 3.5 | 2.5 | 14 | 75 | 6500 |
| C-24 | 33 | A-13/A-3(1/1) | M-1 | 5 | 1 | 20 | 97 | 4600 |
| C-25 | 33 | A-14/A-3(1/1) | M-1 | 5 | 1 | 20 | 95 | 4500 |
| C-26 | 33 | A-15/A-3(1/1) | M-1 | 5 | 1 | 20 | 99 | 4500 |
| C-27 | 33 | A-16/A-3(1/1) | M-1 | 5 | 1 | 20 | 77 | 4400 |
| C-28 | 33 | A-17/A-3(1/1) | M-1 | 5 | 1 | 20 | 77 | 4300 |
| C-29 | 33 | A-18/A-3(1/1) | M-1 | 5 | 1 | 20 | 85 | 4500 |
| C-30 | 33 | A-19/A-3(1/1) | M-1 | 5 | 1 | 20 | 79 | 4200 |
| C-31 | 33 | A-3 | M-2 | 3 | 3 | 8.5 | 80 | 5400 |
| C-32 | 33 | A-3 | M-1/M-2(1/1) | 3.5 | 2.5 | 13 | 82 | 6500 |
| C-33 | 33 | A-3 | M-3 | 3.5 | 2.5 | 11 | 79 | 6400 |
| C-34 | 33 | A-3 | M-4 | 3 | 3 | 5 | 99 | 4400 |
| C-35 | 33 | A-3 | M-5 | 3 | 3 | 5 | 103 | 4100 |
| C-36 | 33 | A-3 | M-6 | 3 | 3 | 5 | 62 | 6500 |
| C-37 | 33 | A-3 | M-1/M-7(13/1) | 3.5 | 2.5 | 14 | 110 | 6300 |
| C-38 | 33 | A-3 | M-1/M-8(7/3) | 4.5 | 1.5 | 18.3 | 111 | 6800 |
| C-39 | 33 | A-3 | M-1/M-9(7/3) | 4.5 | 1.5 | 18.3 | 105 | 7000 |
| C-40 | 33 | A-20 | M-1 | 5 | 1 | 12 | 86 | 4600 |
| C-41 | 33 | A-21 | M-1 | 5 | 1 | 12 | 87 | 4500 |
| C-42 | 33 | A-22 | M-1 | 3.5 | 2.5 | 12 | 85 | 6500 |
| C-43 | 33 | A-23/A-3(1/4) | M-1 | 5 | 1 | 30 | 99 | 6400 |
| C-44 | 33 | A-24/A-3(1/4) | M-1 | 5 | 1 | 30 | 100 | 6300 |
| C-45 | 33 | A-25/A-3(1/4) | M-1 | 5 | 1 | 30 | 98 | 6700 |
| C-46 | 33 | A-26/A-3(1/4) | M-1 | 5 | 1 | 30 | 99 | 6600 |
| C-47 | 33 | A-27/A-3(1/4) | M-1 | 5 | 1 | 30 | 97 | 6600 |
| C-48 | 33 | A-28/A-3(1/4) | M-1 | 5 | 1 | 30 | 99 | 6400 |
| C-49 | 33 | A-29/A-3(1/4) | M-1 | 5 | 1 | 30 | 98 | 6500 |
| C-50 | 33 | A-30/A-3(1/4) | M-1 | 5 | 1 | 30 | 101 | 6200 |
| C-51 | 33 | A-31/A-3(1/4) | M-1 | 5 | 1 | 30 | 100 | 6300 |
| C-52 | 33 | A-32/A-3(1/1) | M-1 | 5 | 1 | 20 | 83 | 5400 |
| C-53 | 33 | A-26/A-10(1/1) | M-1 | 3 | 3 | 10 | 38 | 6200 |
| C-54 | 33 | A-26/A-12(1/4) | M-1 | 3 | 3 | 10 | 30 | 6200 |
| C-55 | 33 | A-3 | M-14 | 3.5 | 2.5 | 14 | 92 | 6000 |
| C-56 | 33 | A-3 | M-15 | 3.5 | 2.5 | 14 | 80 | 6500 |
| C-57 | 33 | A-3 | M-16 | 3 | 3 | 7.8 | 80 | 5100 |
| C-58 | 27 | A-24/A-3(1/4) | M-1 | 3 | 1 | 30 | 69 | 5500 |
| C-59 | 18 | A-26/A-3(1/4) | M-1 | 2 | 1 | 25 | 56 | 4500 |
| C-60 | 33 | A-23/A-3(1/4) | M-16 | 5 | 1 | 30 | 84 | 7500 |
| C-61 | 33 | A-25/A-3(1/4) | M-9 | 5 | 1 | 20 | 102 | 6200 |

In Table 1, m number and n number represent m and n in Formula (1) or (2). For example, as in (C-18), when Compounds (A-8) and (A-3) are used in mixture (content molar ratio 1:4), 3 as n number represents a number of sum of a structure derived from compound (A-8) and a structure derived from compound (A-3).

k number represents the repeating number k of repeating units in P1 in Formula (1) or P2 in Formula (2). For example, as in (C-32), when monomers (M-1) and (M-2) are used in mixture (content molar ratio 1:1), 13 as k number represents a total repeating number of the repeating unit derived from monomer (M-1) and the repeating unit derived from monomer (M-2).

As the "compound having a (m+n)-valent linking group R1 and a mercapto group" (corresponding to the above-described "compound having 3 to 10 mercapto groups in a molecule thereof") in Table 1, the following compounds (18), (27) and (33) were used.

(18)
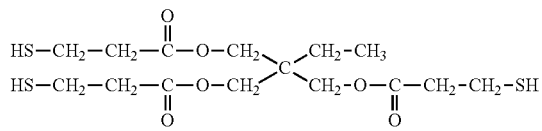
(27)
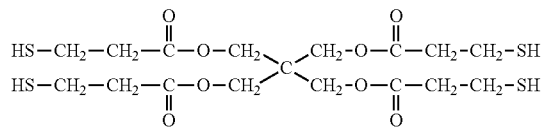
(33)
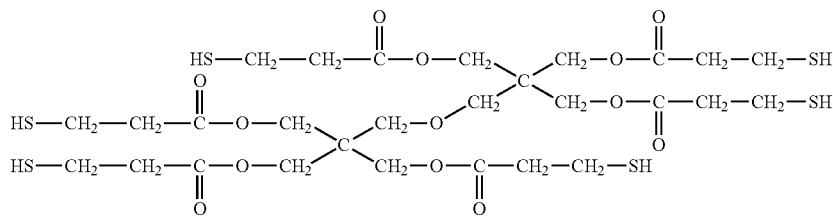
As the "compound having a substituent A1 and a carbon-carbon double bond" (corresponding to the above-described "compound having a carbon-carbon double bond while having an adsorption site") in Table 1, the following compounds (A-1) to (A-32) were used.
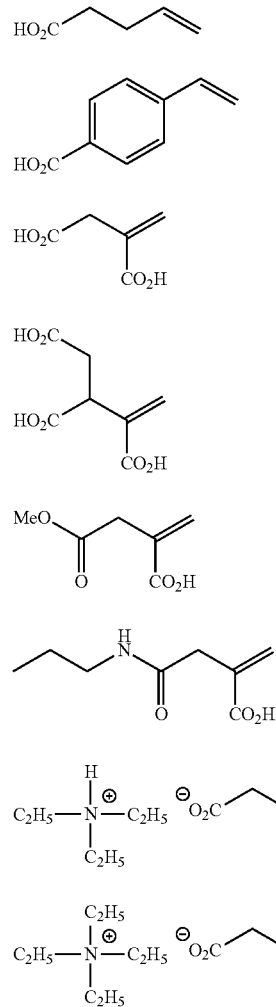
-continued
(A-9)
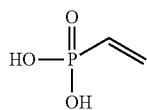
(A-10)
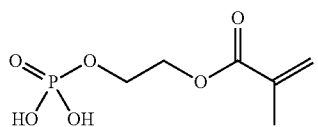
(A-11)
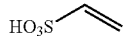
(A-12)
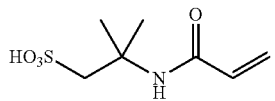
(A-13)
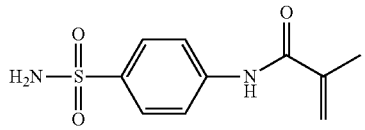
(A-14)
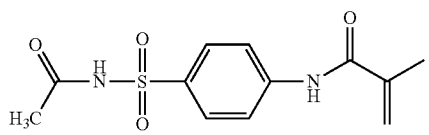
(A-15)
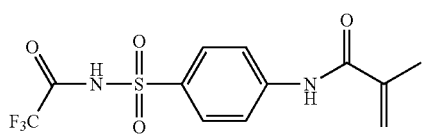
(A-16)
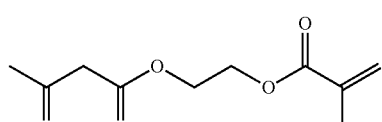
(A-17)

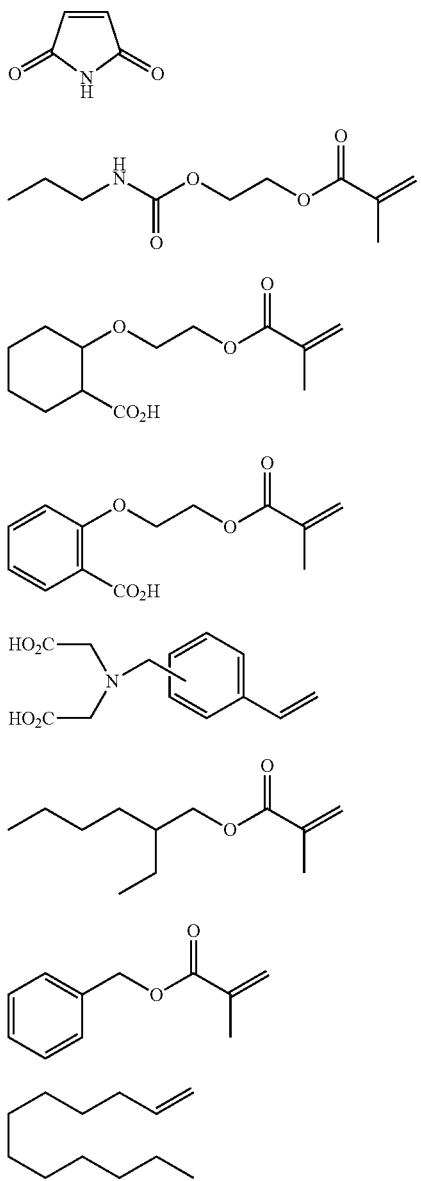
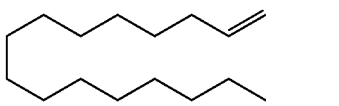
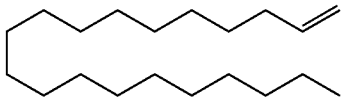
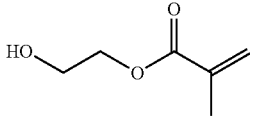
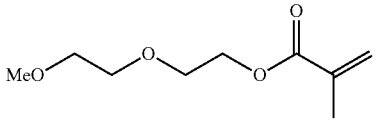
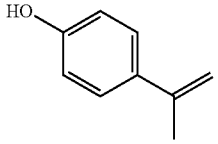
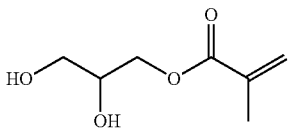
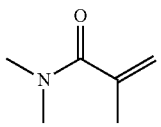
As the "monomer which forms $P^1$ or P2" (corresponding to the above-described "vinyl monomer" in Table 1, a monomer was selected from the above-described monomers (M-1) to (M-9) and (M-14) to (M-16) and used.
Hereinafter, structures of the synthesized polymer compounds (C-1) to (C-61) will be shown.
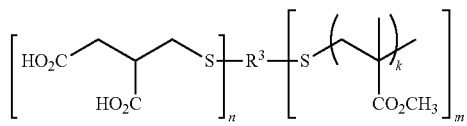
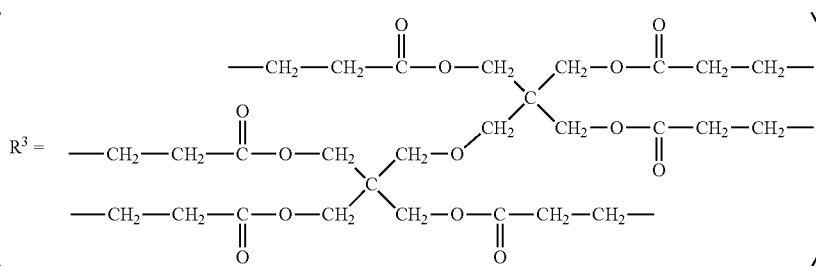

-continued
(C-2)
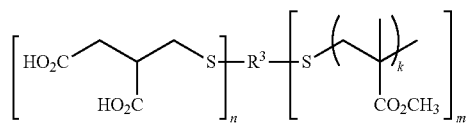
(n = 5.5, m = 0.5, k = 30)
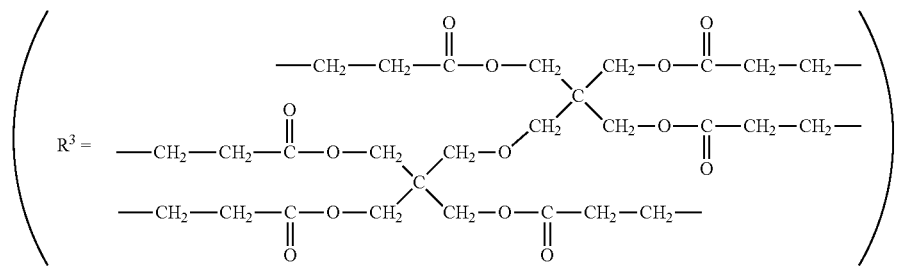
(C-3)
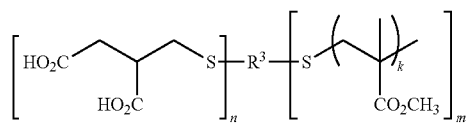
(n = 5, m = 1, k = 20)
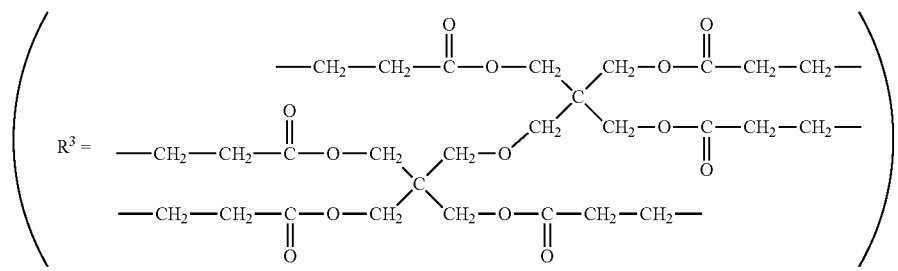
(C-4)
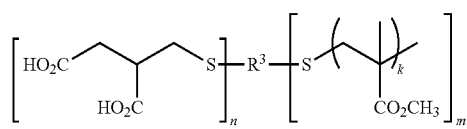
(n = 3, m = 3, k = 7)
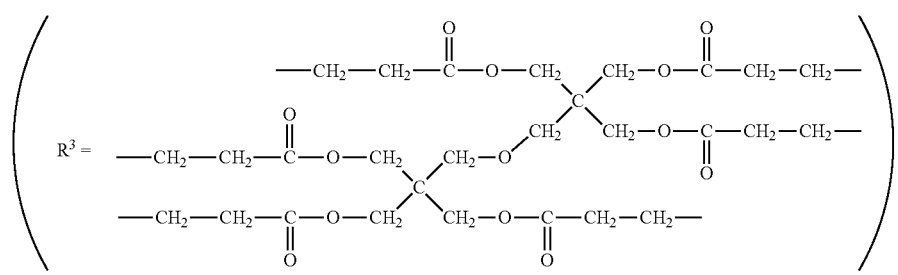
(C-5)
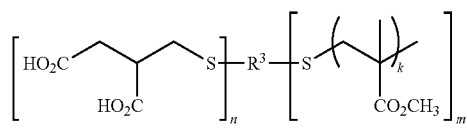
(n = 3.5, m = 2.5, k = 14)

-continued
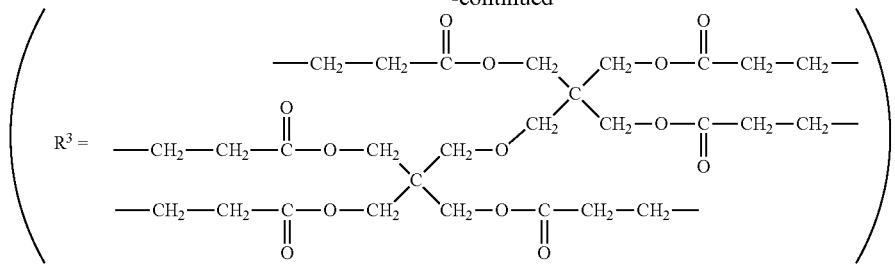
(C-6)
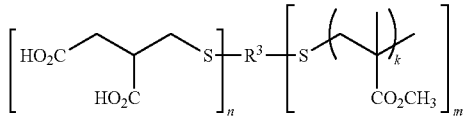
(n = 2, m = 4, k = 7)
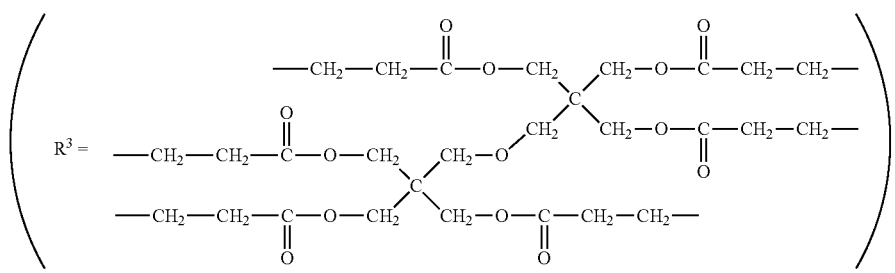
(C-7)
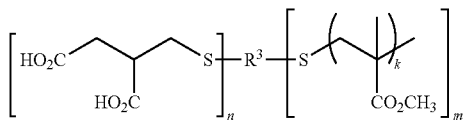
(n = 5, m = 1, k = 60)
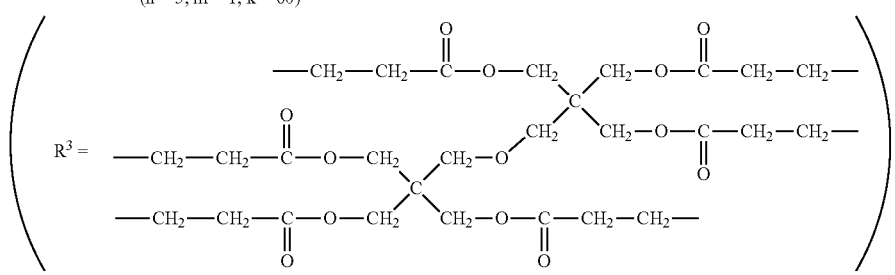
(C-8)
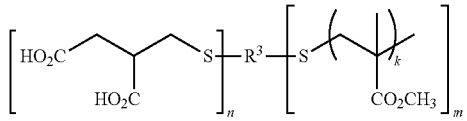
(n = 4, m = 2, k = 60)
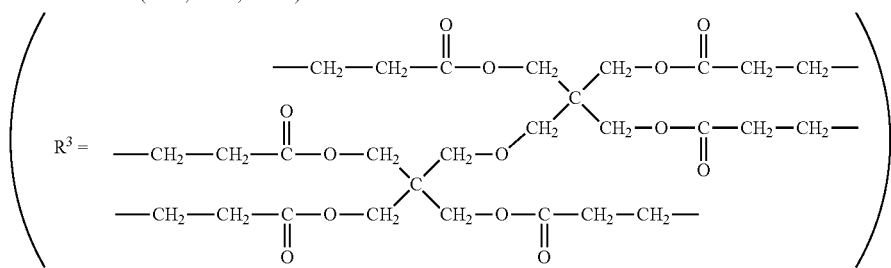

(C-9)
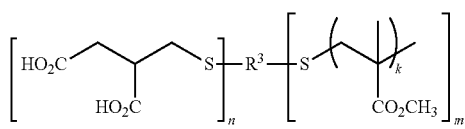
(n = 3, m = 1, k = 30)
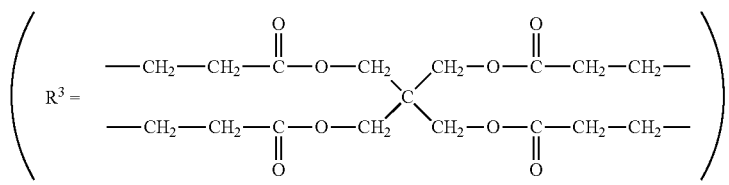
(C-10)
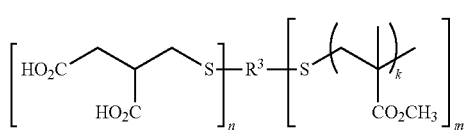
(n = 2, m = 1, k = 20)
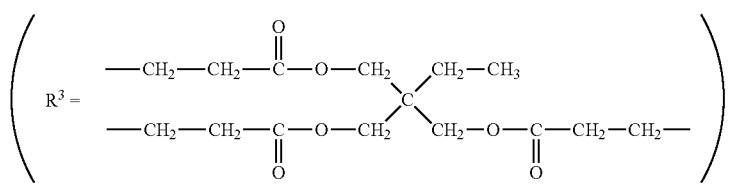
(C-11)
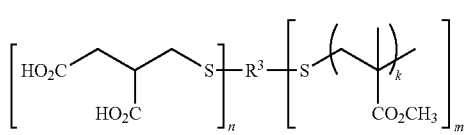
(n = 1, m = 2, k = 8)
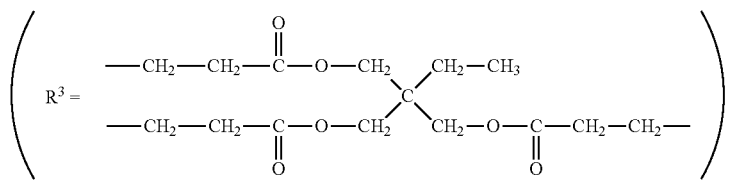
(C-12)
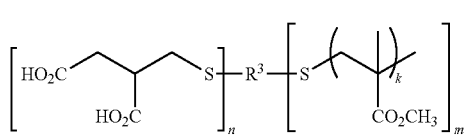
(n = 1, m = 2, k = 15)
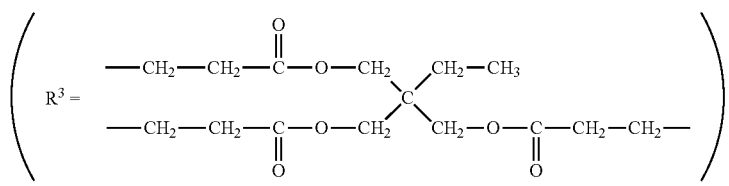
(C-13)
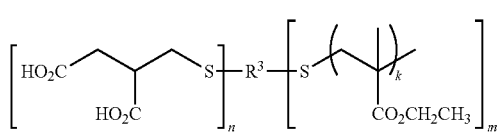
(n = 2, m = 1, k = 20)

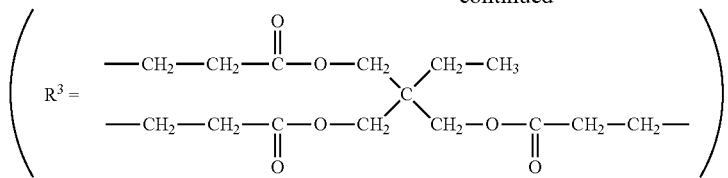
(C-14)
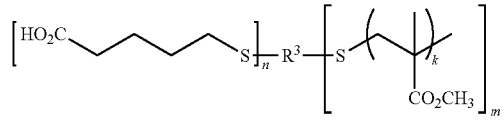
(n = 4, m = 2, k = 10)
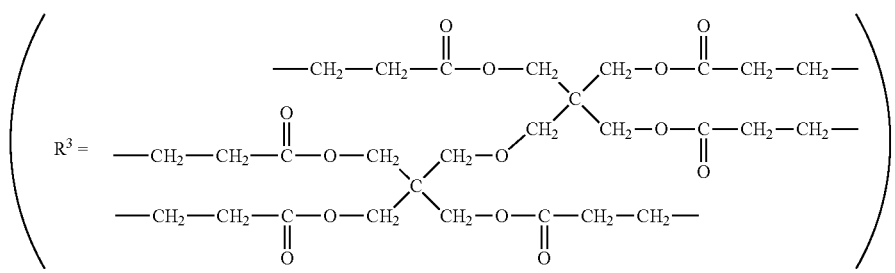
(C-15)
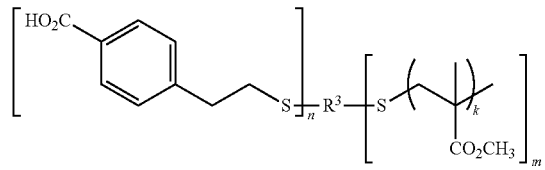
(n = 4, m = 2, k = 10)
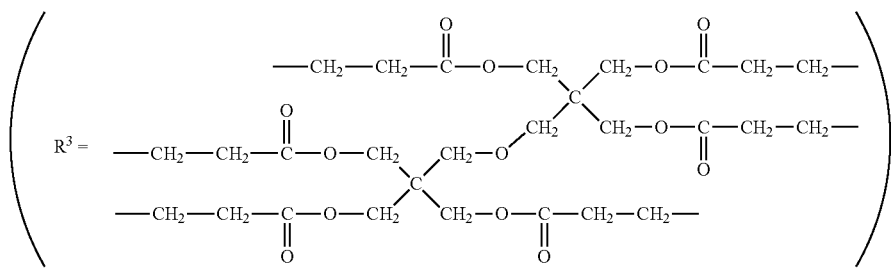
(C-16)
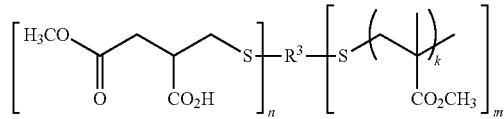
(n = 5.5, m = 0.5, k = 30)
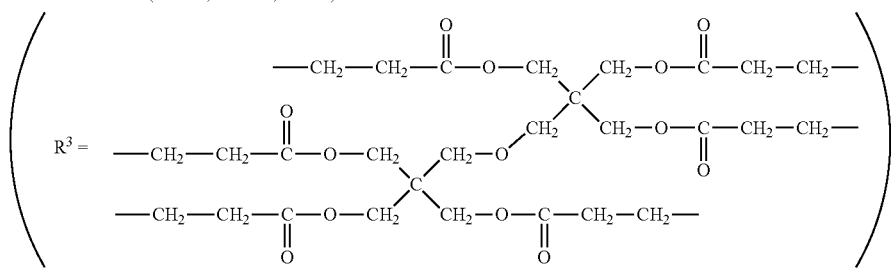

-continued
(C-17)
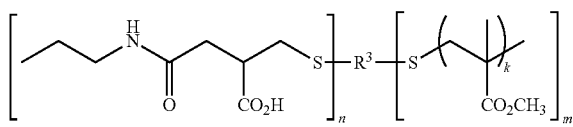
(n = 5.5, m = 0.5, k = 30)
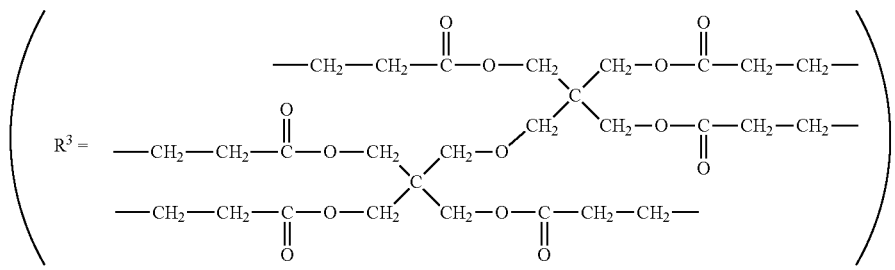
(C-18)
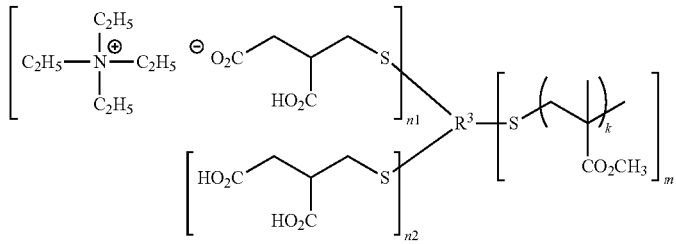
(n1 + n2 = 3, m = 3, k = 7, n1/n2 = 1/4)
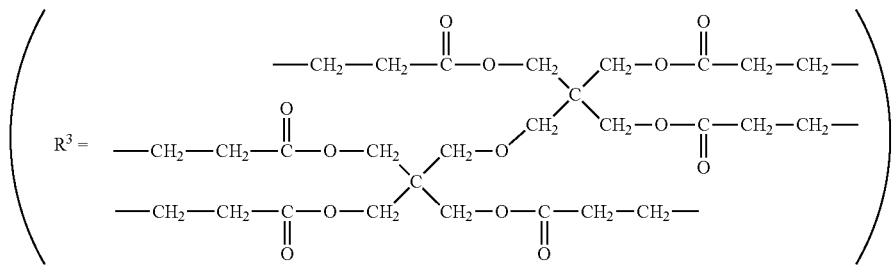
(C-19)
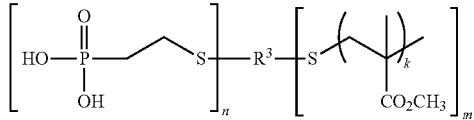
(n = 2, m = 4, k = 10)
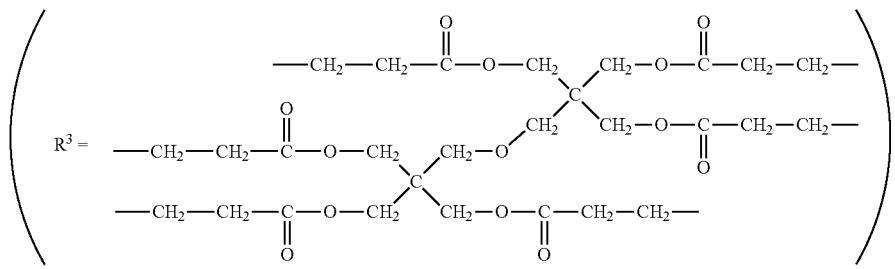

(C-20)
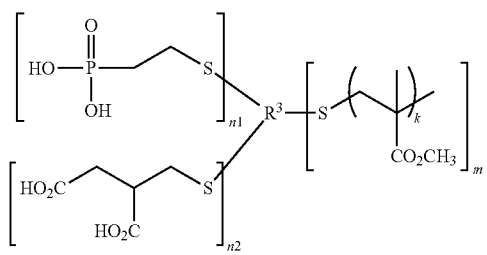
(n1 + n2 = 3.5, m = 2.5, k = 14, n1/n2 = 1/6)
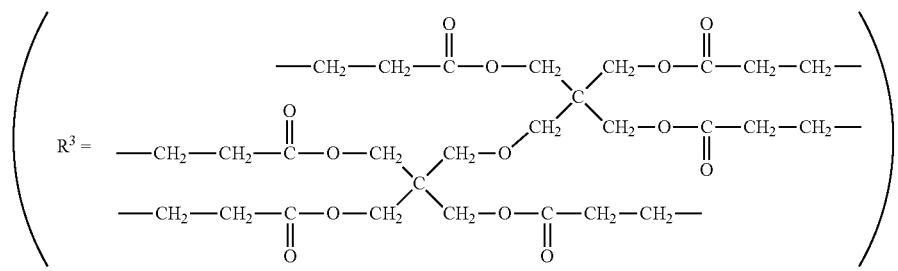
(C-21)
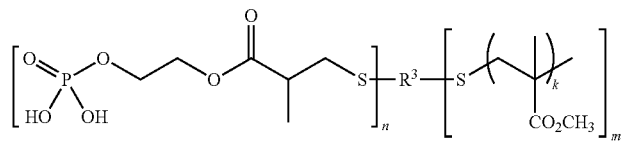
(n = 2, m = 4, k = 10)
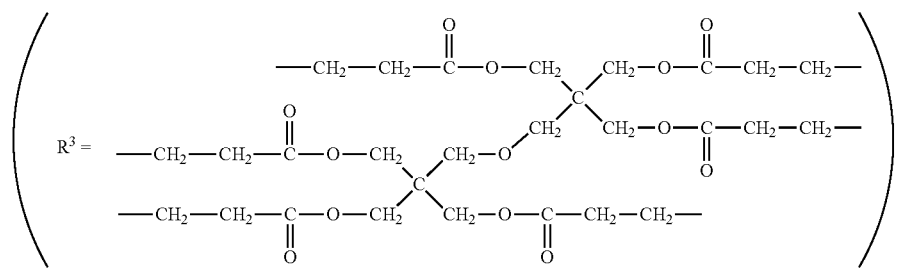
(C-22)
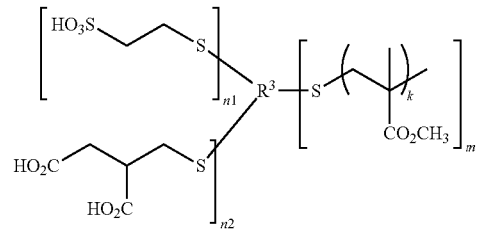
(n1 + n2 = 3.5, m = 2.5, k = 14, n1/n2 = 1/6)
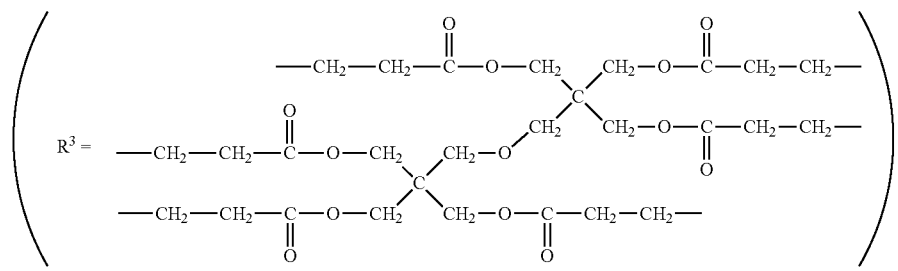

(C-23)
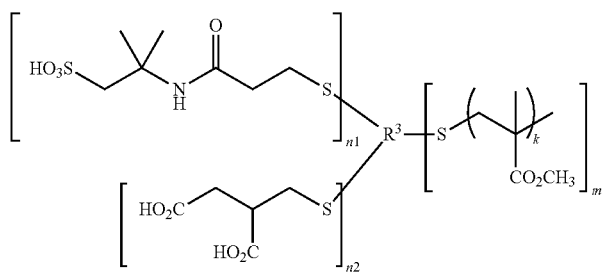
(n1 + n2 = 3.5, m = 2.5, k = 14, n1/n2 = 1/6)
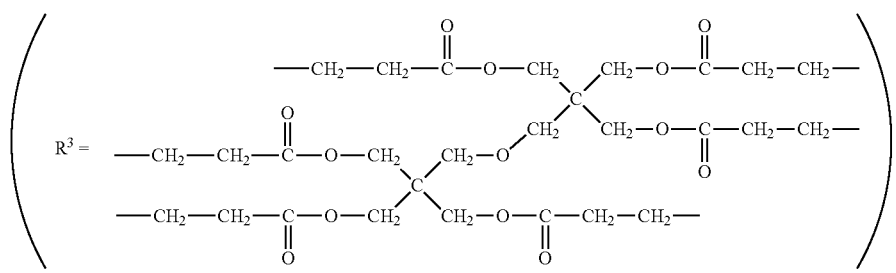
(C-24)
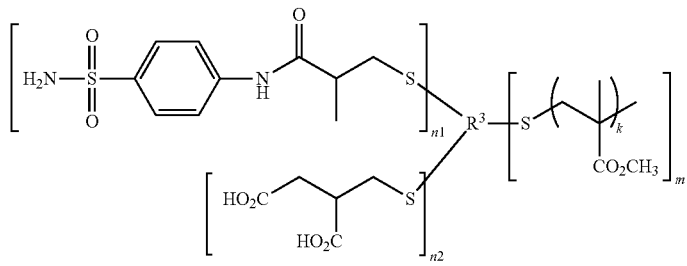
(n1 + n2 = 5, m = 1, k = 20, n1/n2 = 1/1)
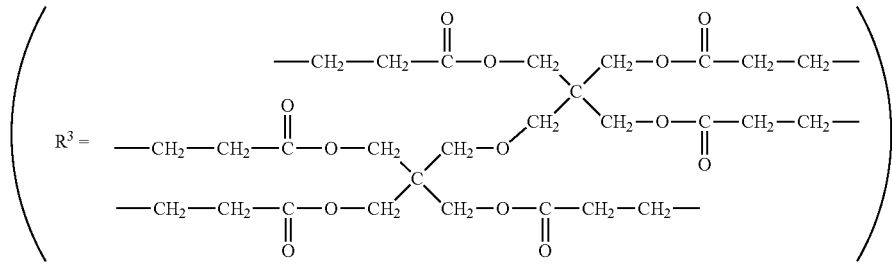
(C-25)
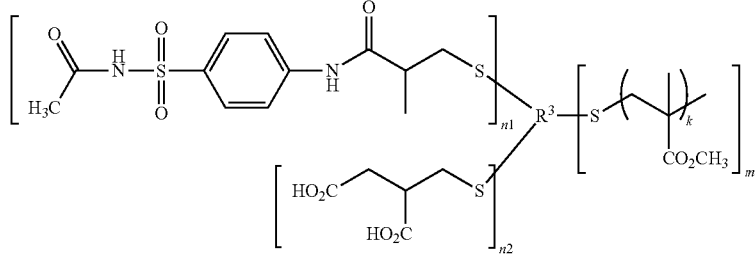
(n1 + n2 = 5, m = 1, k = 20, n1/n2 = 1/1)

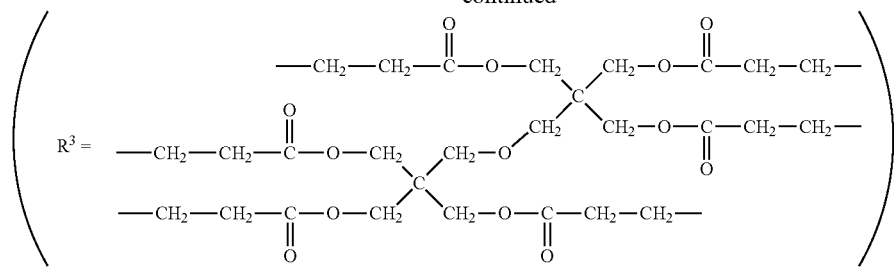
(C-26)
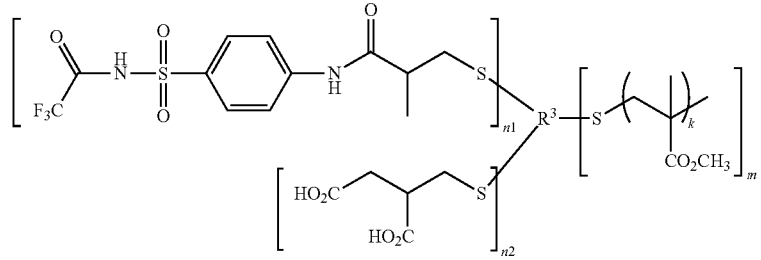
(n1 + n2 = 5, m = 1, k = 20, n1/n2 = 1/1)
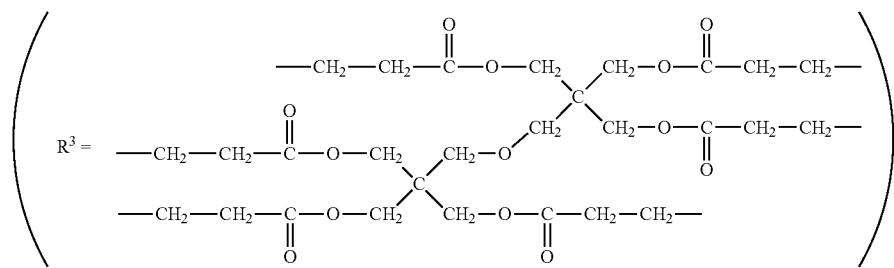
(C-27)
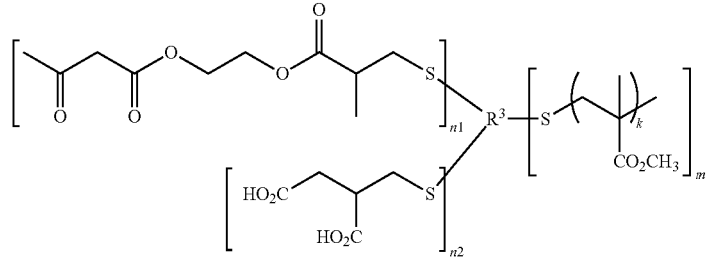
(n1 + n2 = 5, m = 1, k = 20, n1/n2 = 1/1)
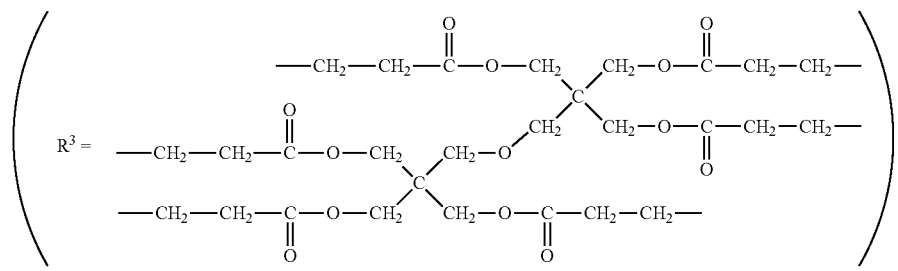

(C-28)
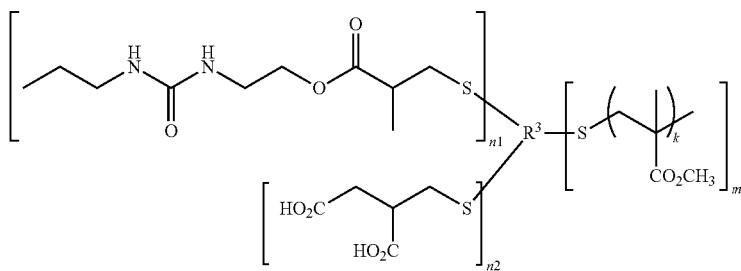
(n1 + n2 = 5, m = 1, k = 20, n1/n2 = 1/1)
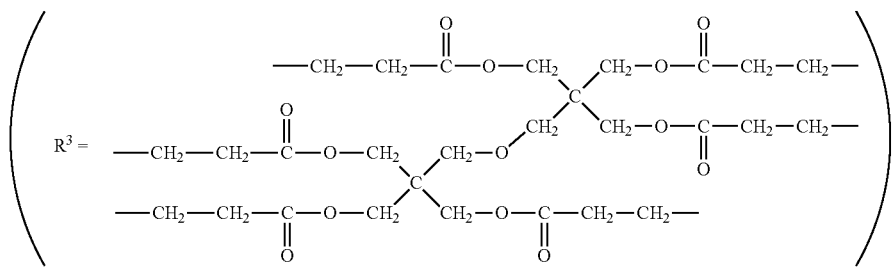
(C-29)
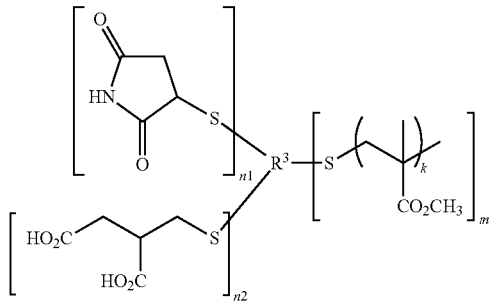
(n1 + n2 = 5, m = 1, k = 20, n1/n2 = 1/1)
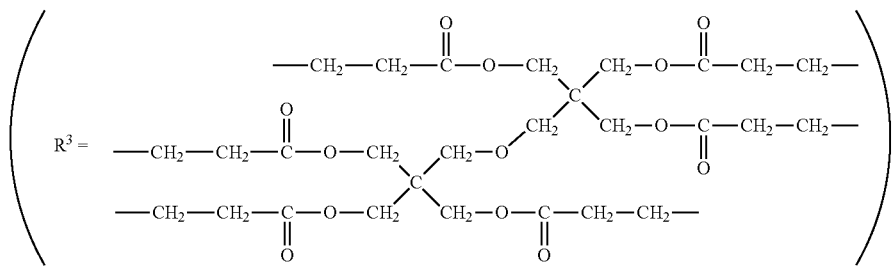
(C-30)
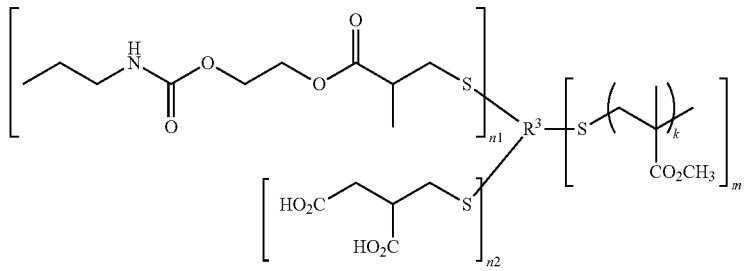
(n1 + n2 = 5, m = 1, k = 20, n1/n2 = 1/1)

-continued
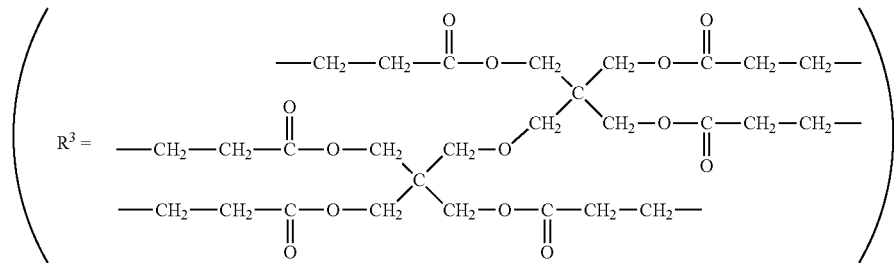
(C-31)
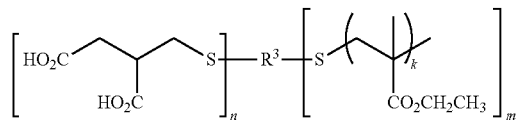
(n = 3, m = 3, k = 8.5)
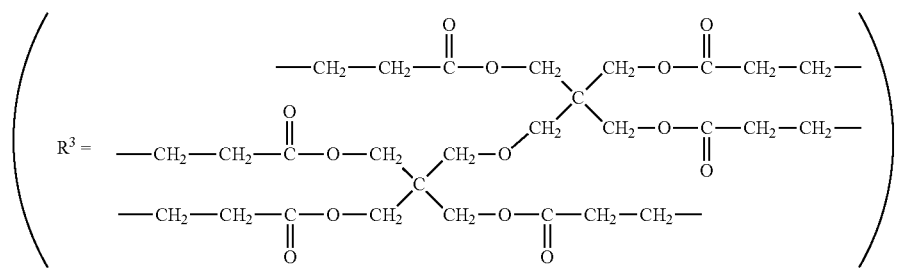
(C-32)
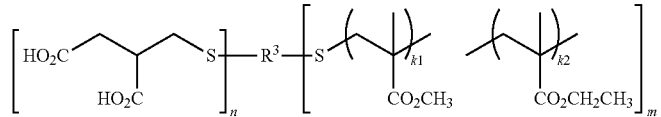
(n = 3.5, m = 2.5, k1 + k2 = 13, k1/k2 = 1/1)
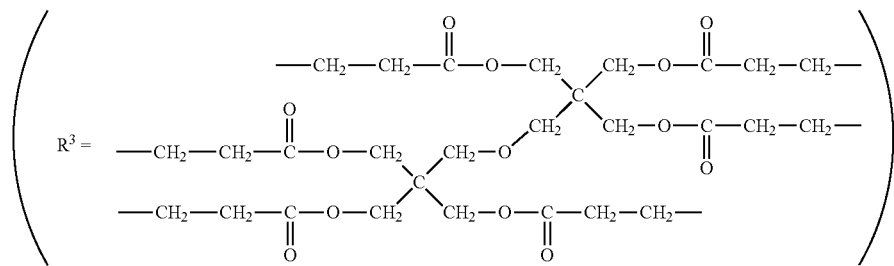
(C-33)
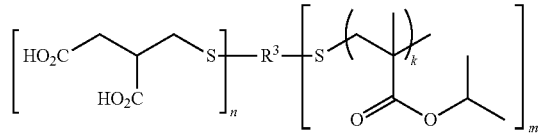
(n = 3.5, m = 2.5, k = 11)
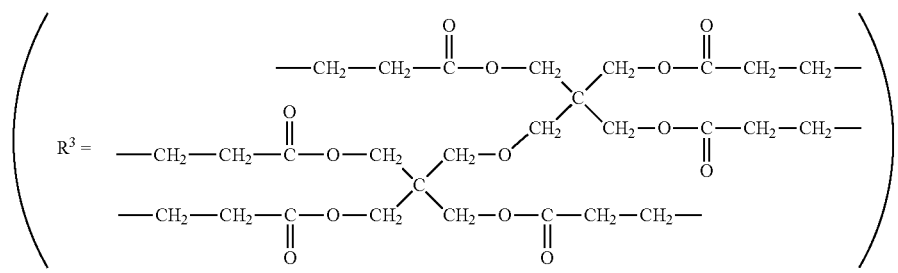

(C-34)
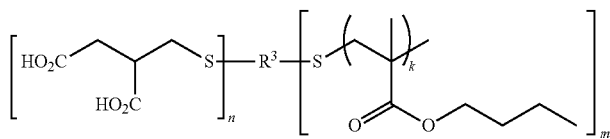
(n = 3, m = 3, k = 5)
(C-35)
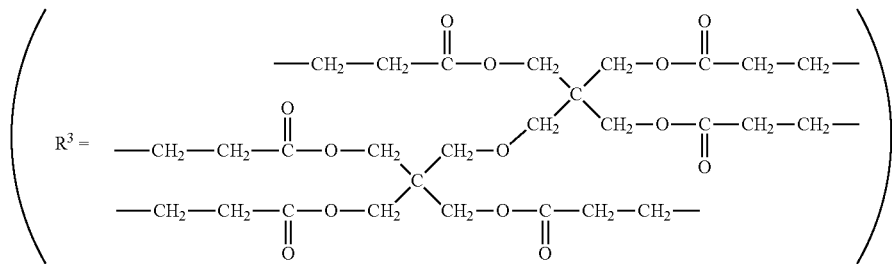
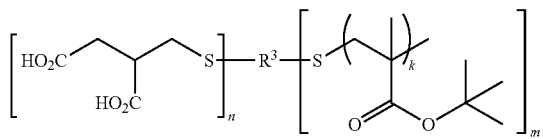
(n = 3, m = 3, k = 5)
(C-36)
(C-37)
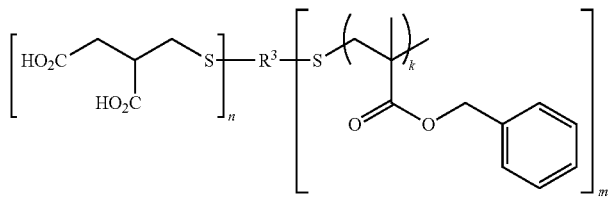
(n = 3.5, m = 2.5, k1 + k2 = 14, k1/k2 = 13/1)

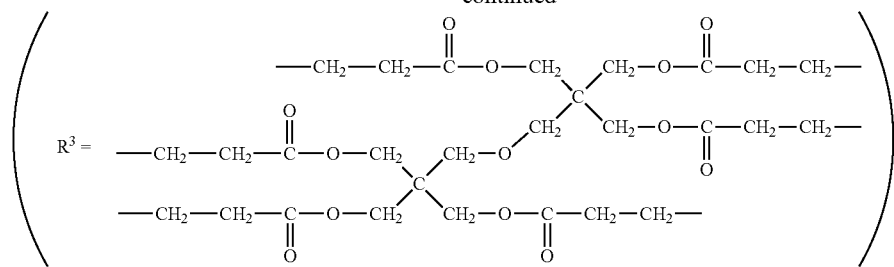
(C-38)
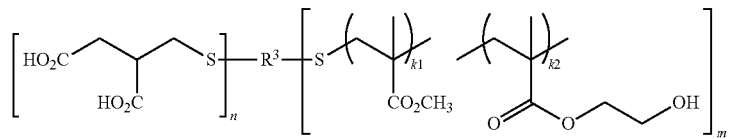
(n = 4.5, m = 1.5, k1 + k2 = 18.3, k1/k2 = 7/3)
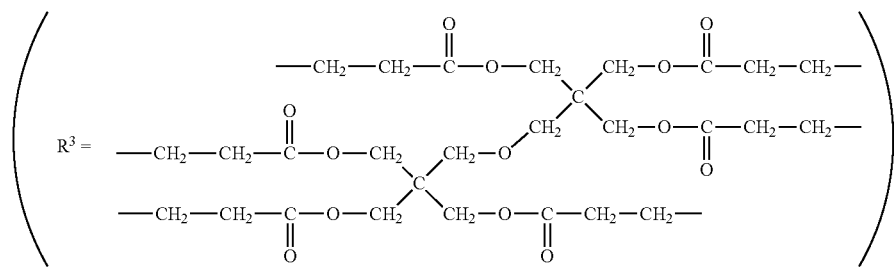
(C-39)
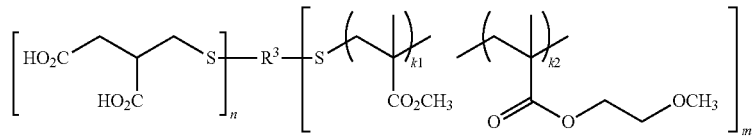
(n = 4.5, m = 1.5, k1 + k2 = 18.3, k1/k2 = 7/3)
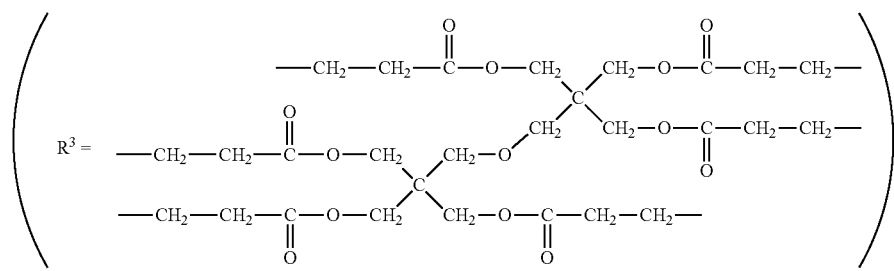
(C-40)
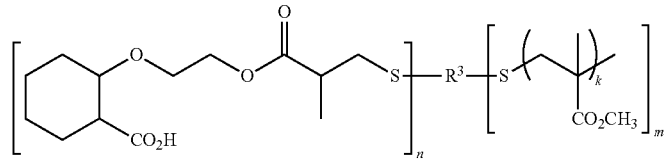
(n = 5, m = 1, k = 12)
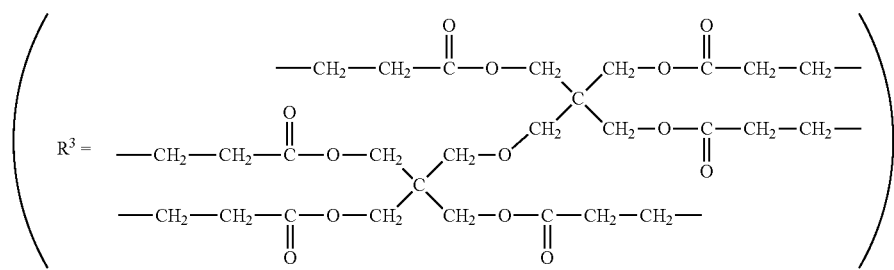

(C-41)
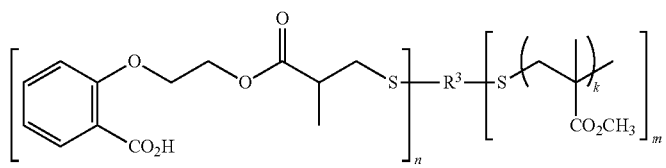
(n = 5, m = 1, k = 12)
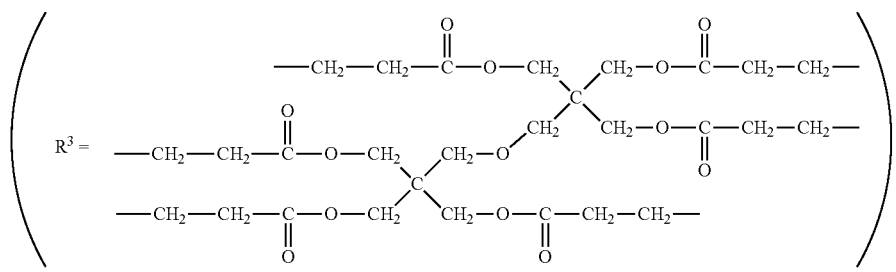
(C-42)
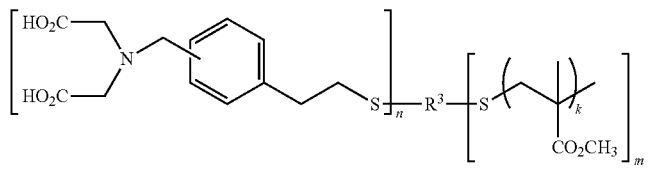
(n = 3.5, m = 2.5, k = 12)
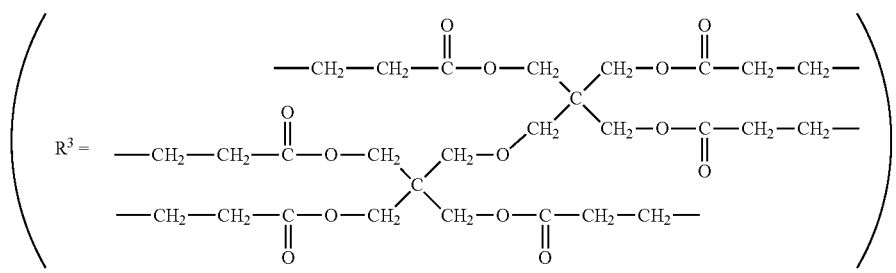
(C-43)
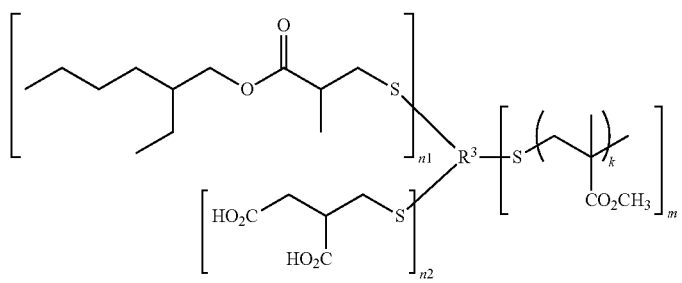
(n1 + n2 = 5, m = 1, k = 30, n1/n2 = 1/4)
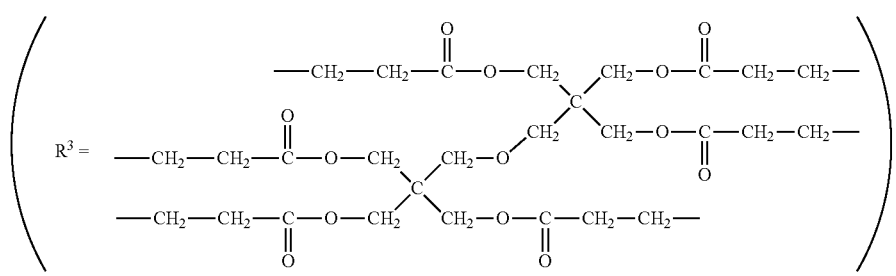

-continued
(C-44)
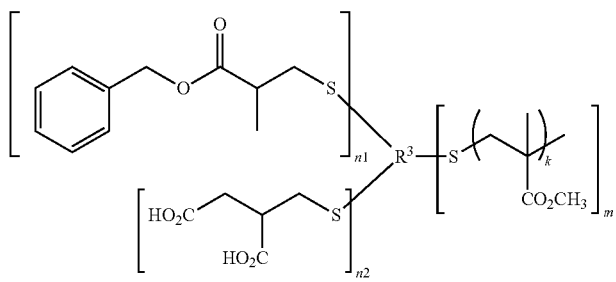
(n1 + n2 = 5, m = 1, k = 30, n1/n2 = 1/4)
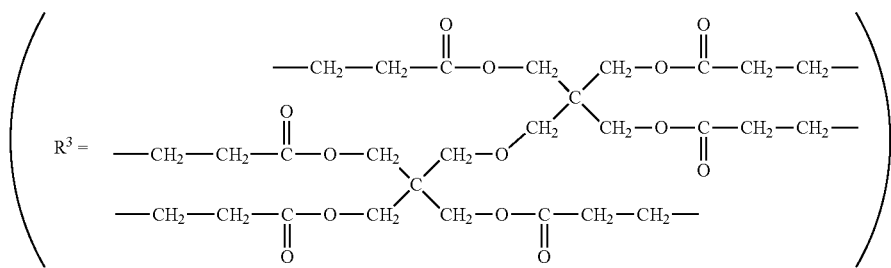
(C-45)
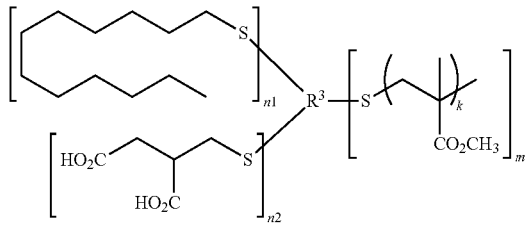
(n1 + n2 = 5, m = 1, k = 30, n1/n2 = 1/4)
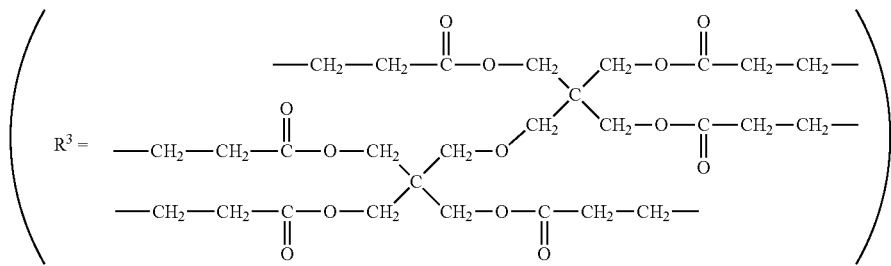
(C-46)
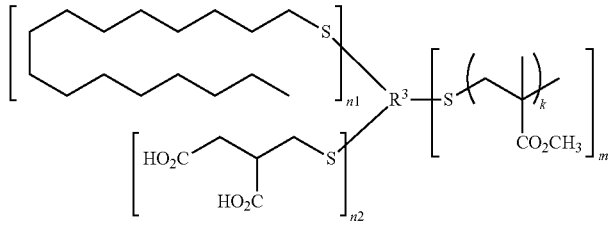
(n1 + n2 = 5, m = 1, k = 30, n1/n2 = 1/4)
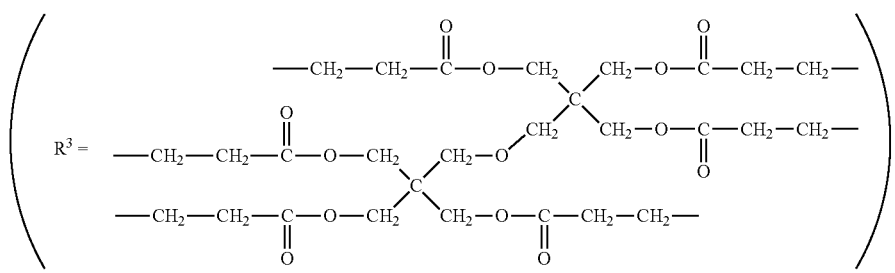

-continued
(C-47)
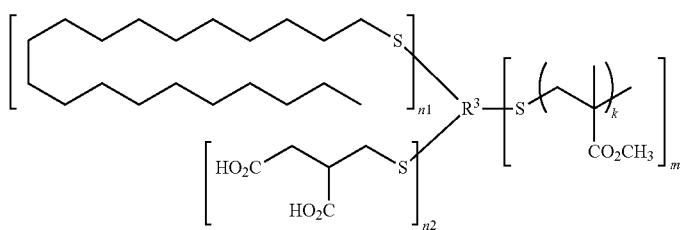
(n1 + n2 = 5, m = 1, k = 30, n1/n2 = 1/4)
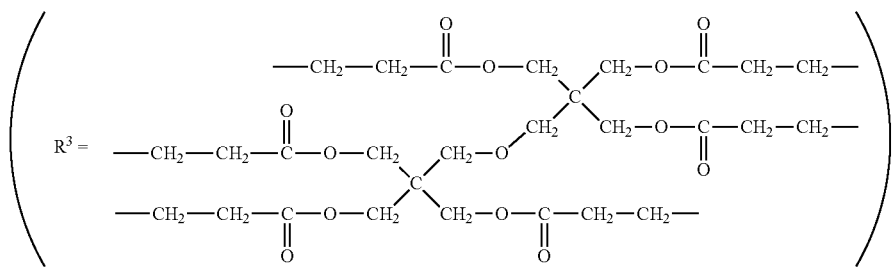
(C-48)
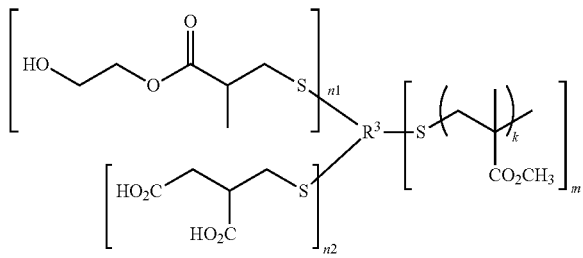
(n1 + n2 = 5, m = 1, k = 30, n1/n2 = 1/4)
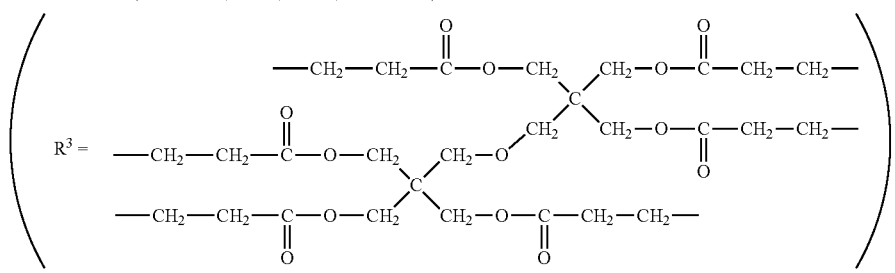
(C-49)
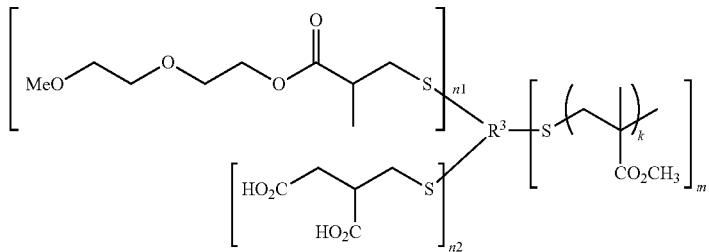
(n1 + n2 = 5, m = 1, k = 30, n1/n2 = 1/4)
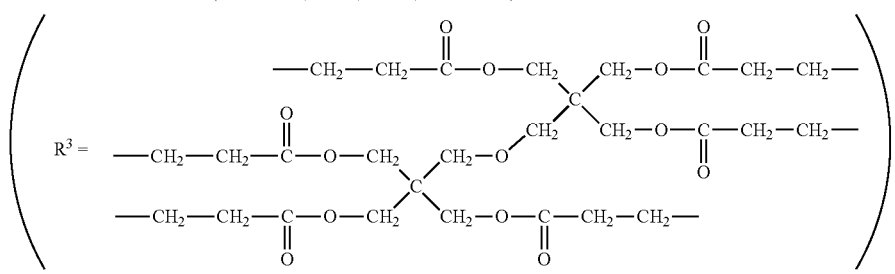

-continued
(C-50)
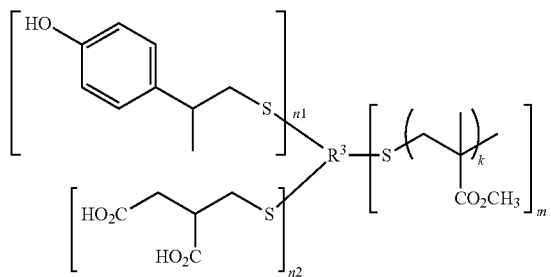
(n1 + n2 = 5, m = 1, k = 30, n1/n2 = 1/4)
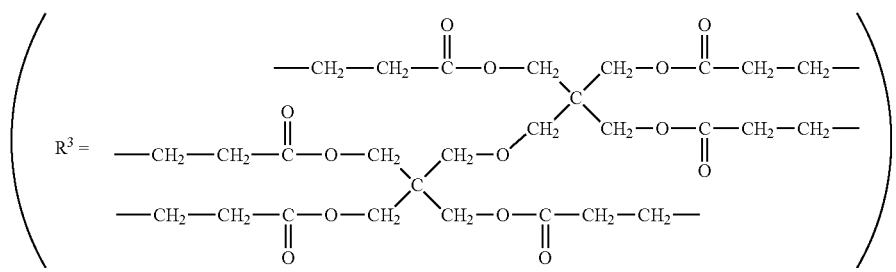
(C-51)
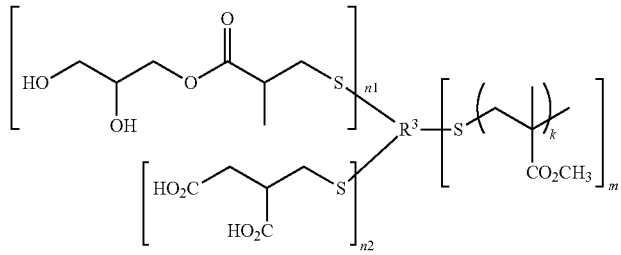
(n1 + n2 = 5, m = 1, k = 30, n1/n2 = 1/4)
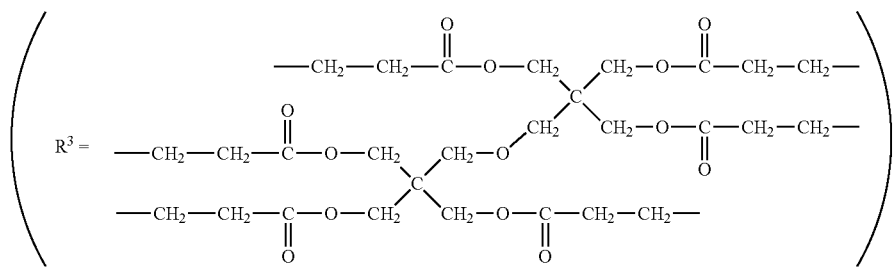
(C-52)
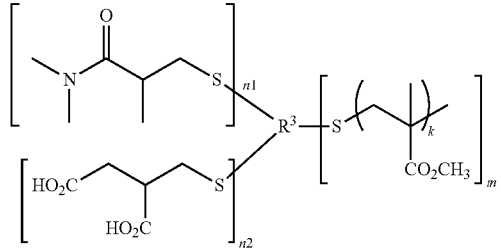
(n1 + n2 = 5, m = 1, k = 20, n1/n2 = 1/1)

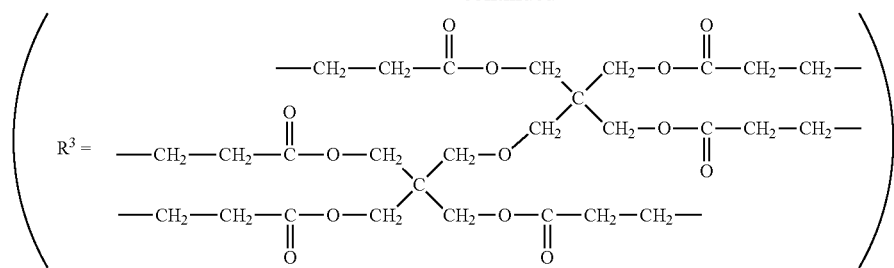
(C-53)
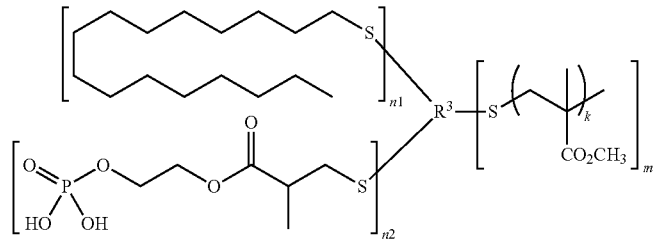
(n1 + n2 = 3, m = 3, k = 10, n1/n2 = 1/1)
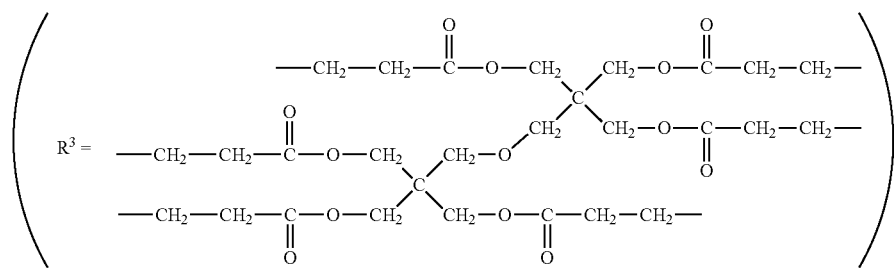
(C-54)
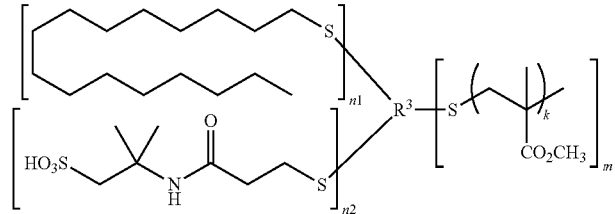
(n1 + n2 = 3, m = 3, k = 10, n1/n2 = 1/4)
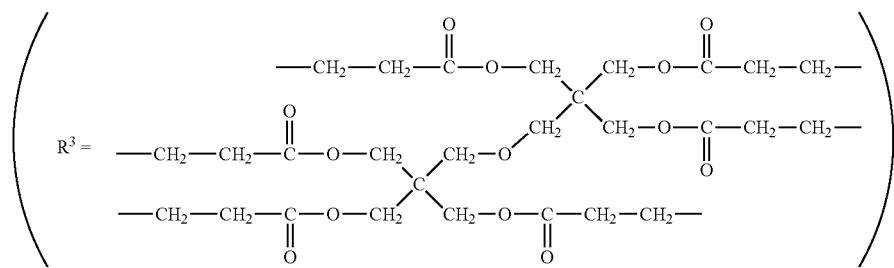
(C-55)
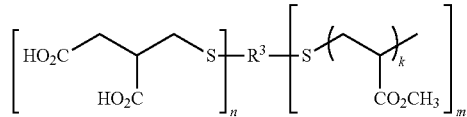
(n = 3.5, m = 2.5, k = 14)

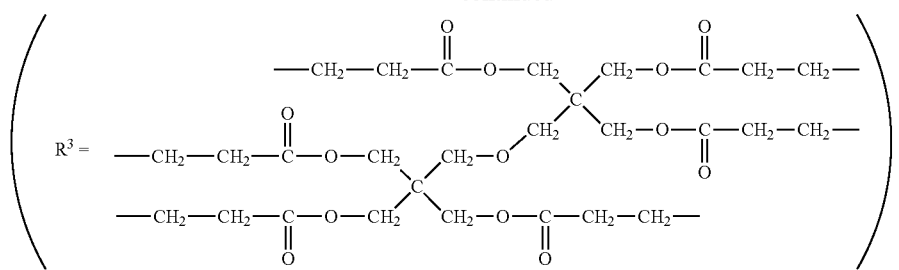
(C-56)
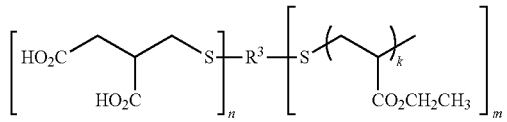
(n = 3.5, m = 2.5, k = 14)
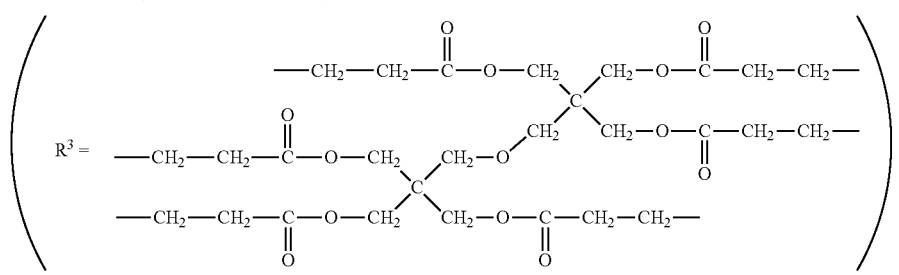
(C-57)
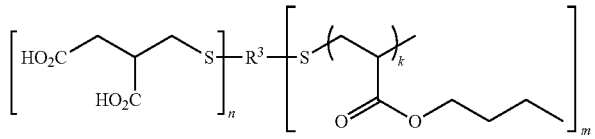
(n = 3, m = 3, k = 7.8)
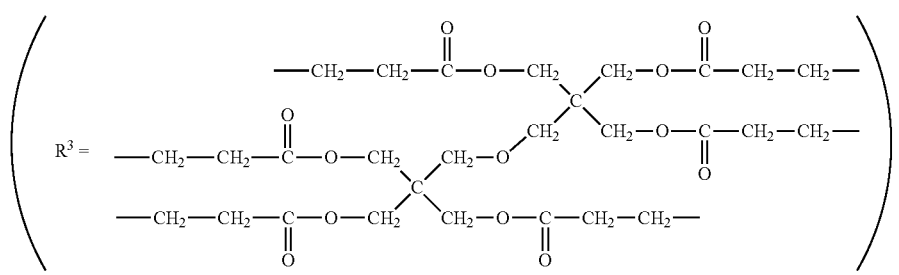
(C-58)
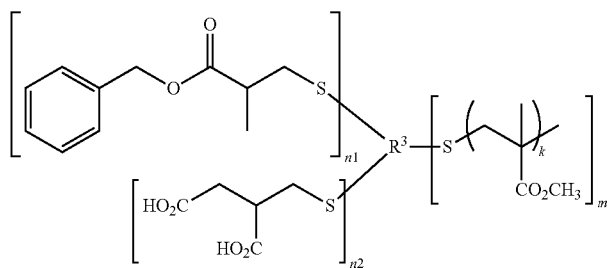
(n1 + n2 = 3, m = 1, k = 30, n1/n2 = 1/4)
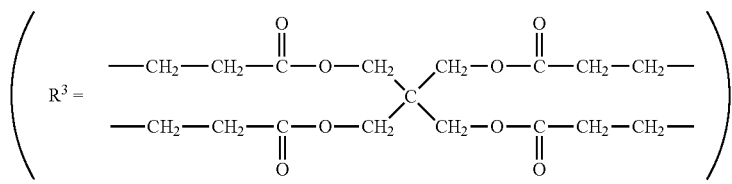

-continued
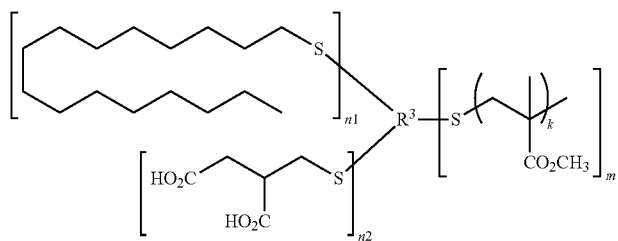
(n1 + n2 = 5, m = 1, k = 20, n1/n2 = 1/4)
(C-59)
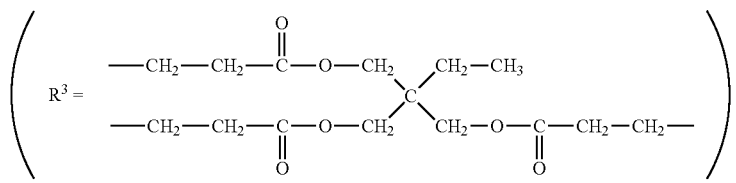
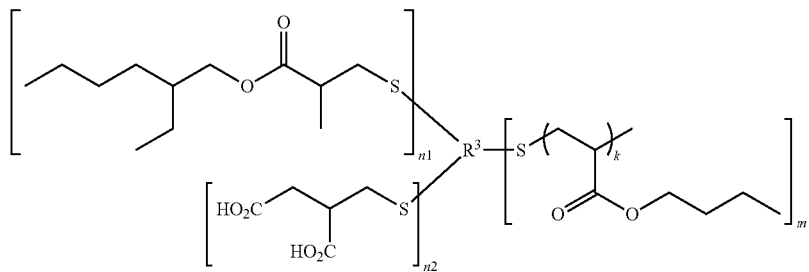
(n1 + n2 = 5, m = 1, k = 30, n1/n2 = 1/4)
(C-60)
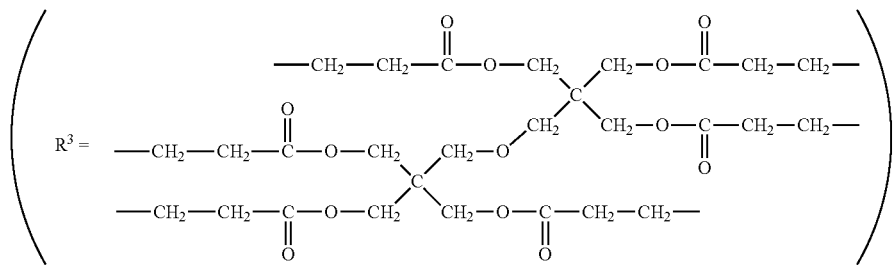
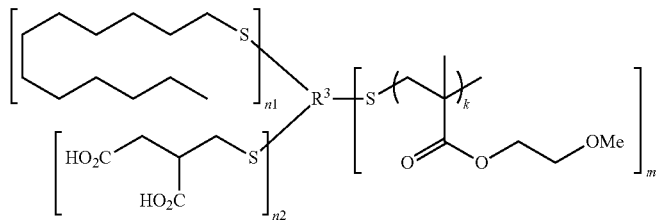
(n1 + n2 = 5, m = 1, k = 20, n1/n2 = 1/4)
(C-61)
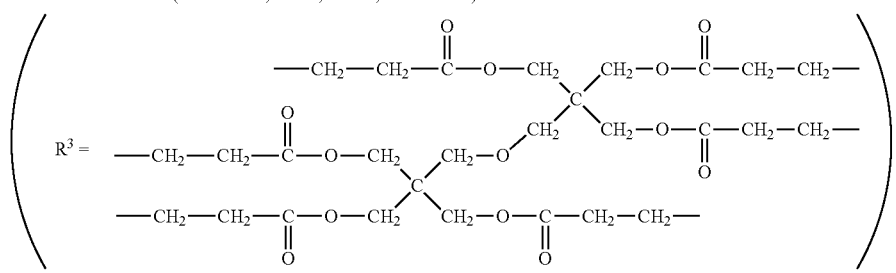

(Synthesis Example 7) Synthesis of Macromonomer A5

35.0 parts of 2-ethylhexanol, 215.0 parts of e-caprolactone, and 0.20 parts of dibutyl tin laurate were heated under nitrogen atmosphere at 90° C., for 5 hours, and subsequently at 110° C., for 1 hour, thereby obtaining a polyester monohydroxy body. The termination of the reaction was confirmed by measuring the loss of e-caprolactone by NMR. Subsequently, after the polyester monohydroxy body was left to stand in air, 0.071 parts of 2,6-di-t-butyl-4-methylphenol (BHT) and 37.7 parts of allyl succinic anhydride were added thereto, and the resulting mixture was reacted at 110° C., for 8 hours, thereby obtaining the following Macromonomer A5. The termination of the reaction was confirmed by measuring the loss of 95% or more of the allyl succinic anhydride by NMR. The weight average molecular weight of Macromonomer A5 in terms of polystyrene and the acid value thereof were found to be 1,400 and 54 mgKOH/g.

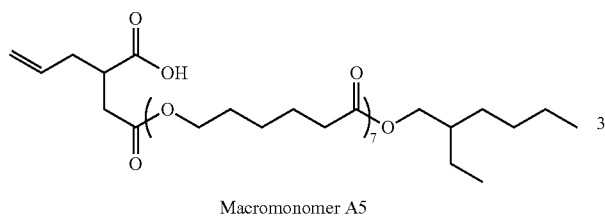

Macromonomer A5

(Synthesis Example 8) Synthesis of Macromonomer E5

200 parts of propylene glycol monomethyl ether acetate were put into a reaction vessel, and were heated to 80° C., while nitrogen gas was injected into the vessel. 40.1 parts of thioethanol, 360 parts of methyl methacrylate, 200 parts of propylene glycol monomethyl ether acetate, and 35.5 parts of V-601 were added to another vessel, and stirred, and then the resulting mixture was added dropwise to a reaction vessel which was stirred under heating at 80° C., over 2 hours. Further, after reaction was performed at the same temperature for 2 hours, 35.5 parts of V-601 was added thereto, and reaction was carried out at 90° C., for another 1 hour, thereby obtaining a polymethyl methacrylate monohydroxy body. The termination of the reaction was confirmed by measuring the loss of 99% or more of the double bond moieties of methyl methacrylate by NMR. Subsequently, after the polymethyl methacrylate monohydroxy body was left to stand under air, 0.134 g of 2,6-ditertiary butyl-4-methylphenol and 71.2 g of allyl succinic anhydride were added thereto, and reaction was carried out at 110° C., for 8 hours, thereby obtaining Macromonomer ES (concentration of solid content=28.9% by mass) shown below. The termination of the reaction was confirmed by measuring the loss of 95% or more of the allyl succinic anhydride by NMR. The weight average molecular weight of Macromonomer E5 in terms of polystyrene and the acid value thereof were found to be 1600 and 64 mgKOH/g.

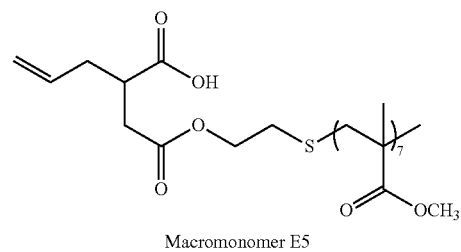

Macromonomer E5

Macromonomers A1 to A5 were synthesized in the same manner as in Synthesis Example 7, and Macromonomers E1 to E4 were synthesized in the same manner as in Synthesis Example 8. Each of the structural formulae and physical properties was shown below.

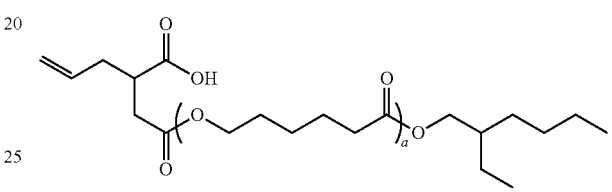

Macromonomer A1: a = 60
Macromonomer A2: a = 30
Macromonomer A3: a = 20
Macromonomer A4: a = 14
Macromonomer A5: a = 7

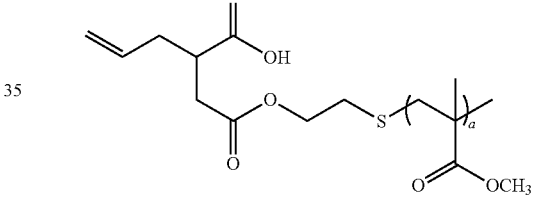

Macromonomer E1: a = 60
Macromonomer E2: a = 30
Macromonomer E3: a = 20
Macromonomer E4: a = 14
Macromonomer E5: a = 7

TABLE 2

| Macromonomer | Repeating unit a | Weight average molecular weight | Acid value |
|---|---|---|---|
| A1 | 60 | 7300 | 7 |
| A2 | 30 | 3900 | 16 |
| A3 | 20 | 2800 | 22 |
| A4 | 14 | 2200 | 31 |
| A5 | 7 | 1400 | 54 |
| E1 | 60 | 6800 | 9 |
| E2 | 30 | 3800 | 18 |
| E3 | 20 | 2900 | 27 |
| E4 | 14 | 2300 | 37 |
| E5 | 7 | 1600 | 64 |

(Synthesis Example 9) Synthesis of Polymer Compound (C-102)

20 parts of dipentaerythritol hexakis(3-mercpatopropionate) [(33); manufactured by Sakai Chemical Industry Co., Ltd.], 81.9 parts of Macromonomer A5, 7.67 parts of the aforementioned compound having a carbon-carbon double bond while having an adsorption site (A-1), and 255 parts of propylene glycol monomethyl ether acetate were put into a reaction vessel, and were heated to 90° C., while nitrogen gas was injected into the vessel. The resulting mixture was stirred at the same temperature for 15 minutes, and then 0.71 parts of V-601 was added thereto to initiate the reaction. After the reaction was carried out at the same temperature for 2 hours, 0.71 parts of V-601 was added thereto, and reaction was continuously carried out at 90° C., for 2 hours, thereby obtaining a solution of 30% by mass of polymer compound (C-102: weight average molecular weight in terms of polystyrene 4,600, and acid value 108 mgKOH/g). The termination of the reaction was confirmed by measuring the loss of 95% or more of the double bond moieties of Macromonomer A5 and pentenoic acid by NMR.

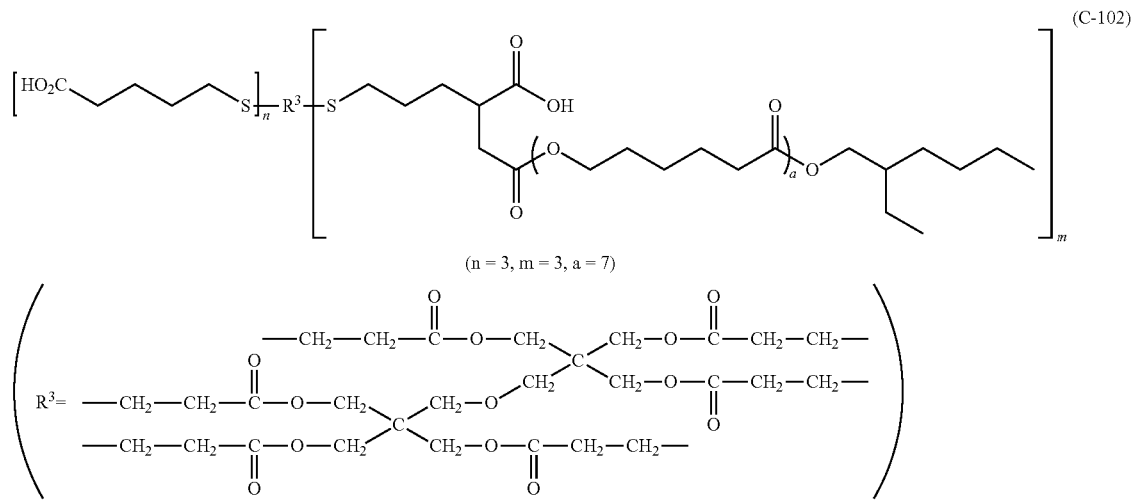

Polymer compounds (C-101) and (C-103) to (C-119) were also synthesized in the same manner as in Synthesis Example 9 [Synthesis of Polymer Compound (C-102)], except that the kind and content of "compound having a (m+n)-valent linking group $R^1$ and a mercapto group" (corresponding to the above-described "compound having 3 to 10 mercapto groups in a molecule thereof") to be a raw material, the kind and content of "compound having a substituent $A^1$ and a carbon-carbon double bond" (corresponding to the above-described "compound having a carbon-carbon double bond while having an adsorption site"), and the kind and content of "Macromonomer" (compound corresponding to a polymer chain represented by $P^1$, $P^2$ or $P^3$) were appropriately modified. The macromonomers used in the synthesis of (C-110) to (C-119) were appropriately selected from the following structures and used.

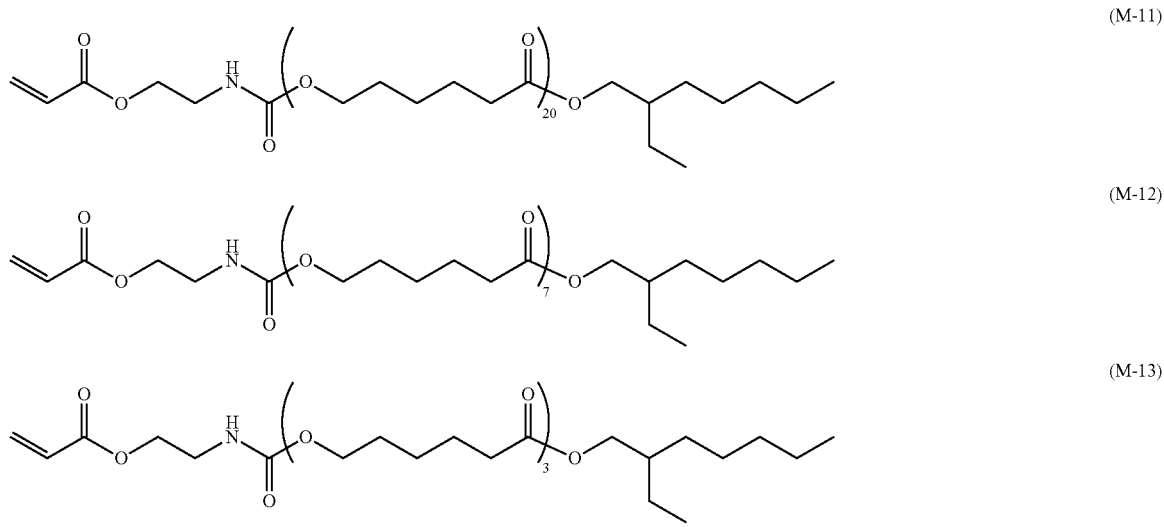

-continued

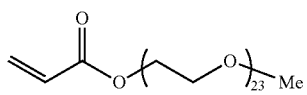
(M-17)

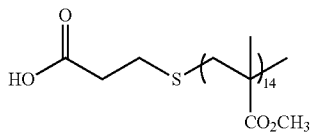
(N-1)

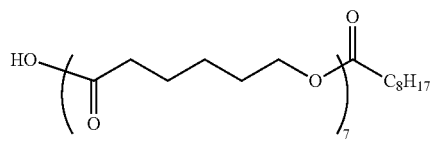
(N-2)

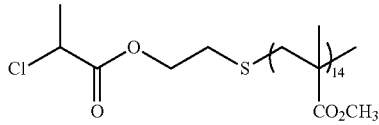
(N-3)

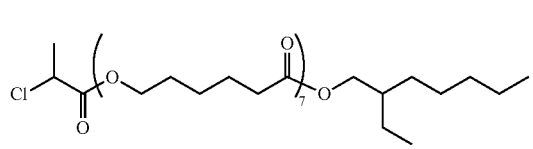
(N-4)

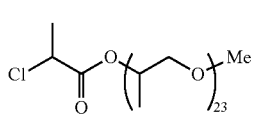
(N-5)

With respect to these synthesized polymer compounds (C-101) to (C-119), "a compound having a (m+n)-valent linking group $R^1$ and a mercapto group" to be a raw material, "a compound having a substituent $A^1$ and a carbon-carbon double bond" (the case of being used in combination represents each content molar ratio) to be a raw material, "Macromonomer" to be a raw material, an acid value, and a weight average molecular weight are summarized in the following Table 3.

TABLE 3

| Dispersant (Compound (B)) | Compound having (m + n)-valent linking group $R^1$ and mercapto group | Compound having substituent $A^1$ and carbon-carbon double bond Molar ratio in parenthesis | Macromonomer | n number | m number | Acid value of dispersant (mgKOH/g) | Weight average molecular weight |
|---|---|---|---|---|---|---|---|
| C-101 | 33 | A-3 | Macromonomer A4 | 3 | 3 | 110 | 7200 |
| C-102 | 33 | A-1 | Macromonomer A5 | 3 | 3 | 108 | 4600 |
| C-103 | 33 | A-9/A-3(1/1) | Macromonomer A4 | 3 | 3 | 80 | 7200 |
| C-104 | 33 | A-1 | Macromonomer A4 | 3 | 3 | 70 | 7000 |
| C-105 | 33 | A-3 | Macromonomer A1 | 4 | 2 | 40 | 16000 |
| C-106 | 27 | A-3 | Macromonomer A4 | 2 | 2 | 110 | 5200 |
| C-107 | 18 | A-3 | Macromonomer A4 | 1 | 2 | 70 | 5000 |
| C-108 | 33 | A-3 | Macromonomer E4 | 3 | 3 | 115 | 6800 |
| C-109 | 33 | A-3 | Macromonomer E1 | 5 | 1 | 70 | 11000 |
| C-110 | 33 | A-3 | M-12 | 3 | 3 | 77 | 7700 |
| C-111 | 33 | A-3 | M-13 | 2.5 | 3.5 | 85 | 5200 |
| C-112 | 33 | A-3 | M-17 | 3.5 | 2.5 | 82 | 7200 |
| C-113 | 33 | A-3 | N-1 | 3.5 | 2.5 | 79 | 6900 |
| C-114 | 33 | A-3 | N-2 | 3 | 3 | 84 | 5600 |
| C-115 | 33 | A-3 | N-3 | 3.5 | 2.5 | 77 | 7100 |
| C-116 | 33 | A-3 | N-4 | 3 | 3 | 81 | 5800 |
| C-117 | 33 | A-3 | N-5 | 3.5 | 2.5 | 82 | 6700 |
| C-118 | 33 | A-27/A-3(1/4) | M-11 | 3.5 | 2.5 | 78 | 5700 |
| C-119 | 33 | A-27/A-3(1/4) | N-3 | 4 | 2 | 80 | 6300 |

Hereinafter, structures of the synthesized polymer compounds (C-101) to (C-119) will be shown.

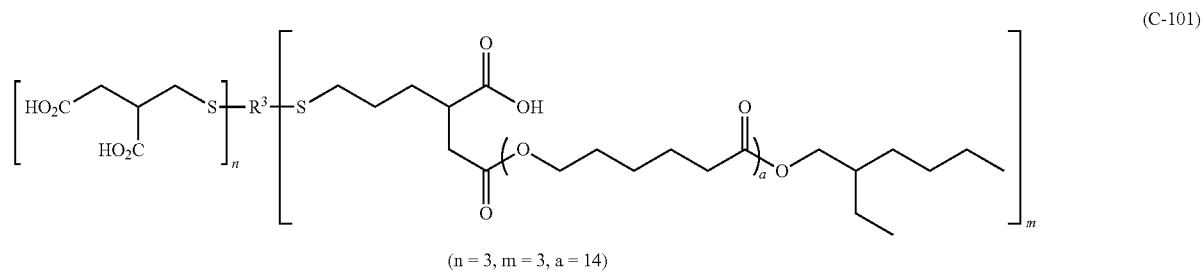
(C-101)

(n = 3, m = 3, a = 14)

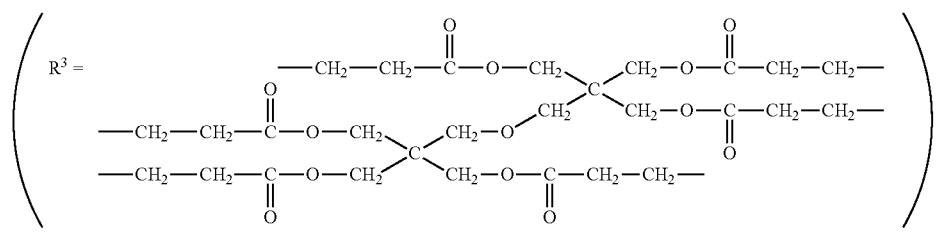
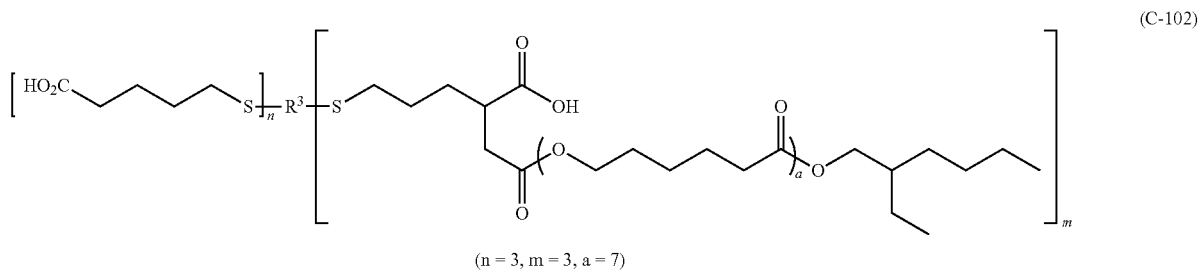
(C-102)
(n = 3, m = 3, a = 7)
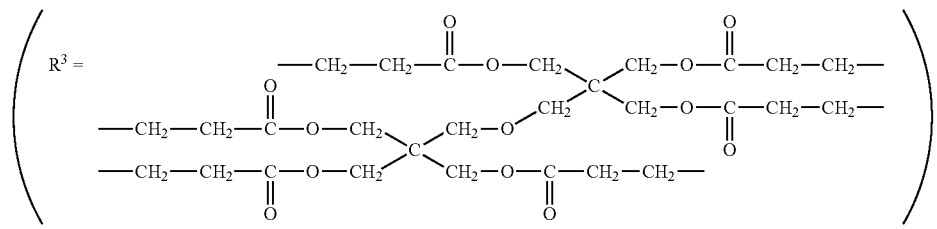
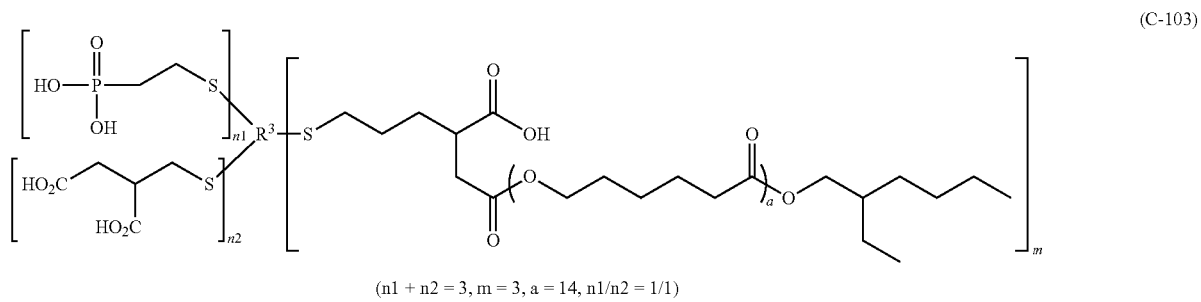
(C-103)
(n1 + n2 = 3, m = 3, a = 14, n1/n2 = 1/1)
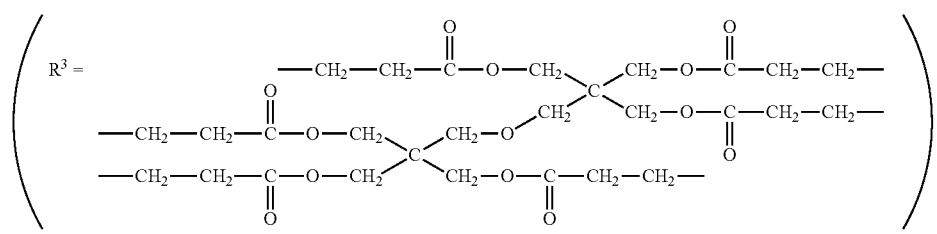
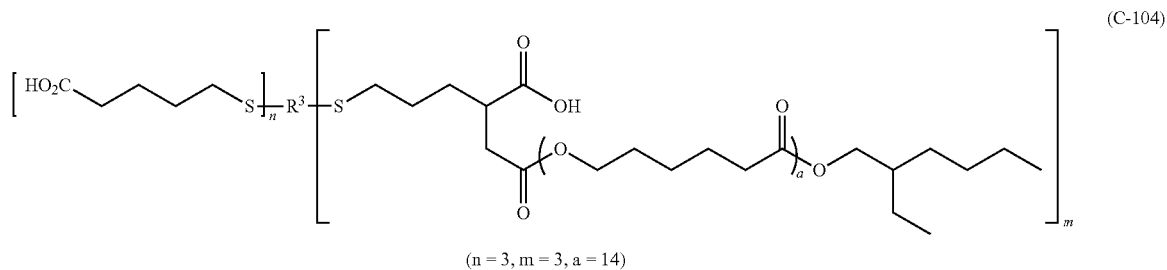
(C-104)
(n = 3, m = 3, a = 14)

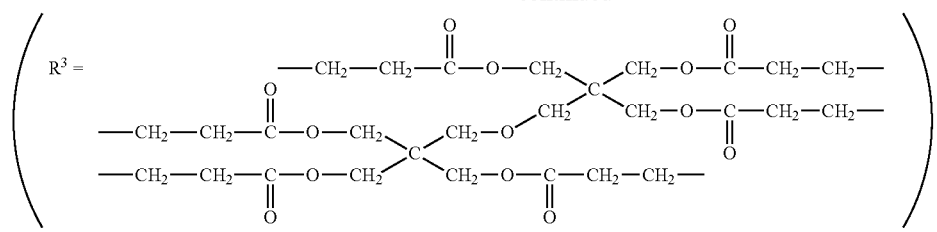
(C-105)
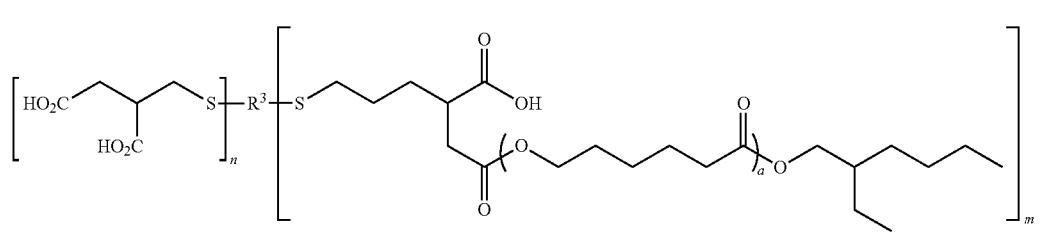
(n = 4, m = 2, a = 60)
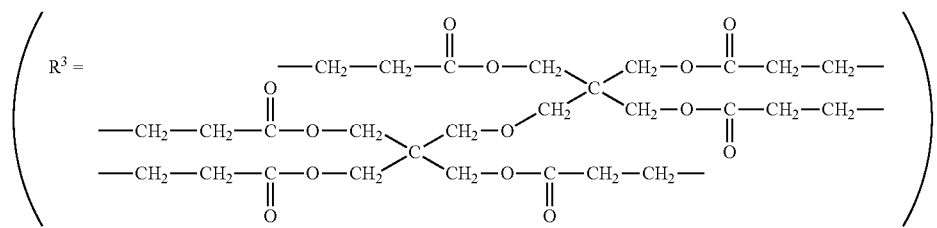
(C-106)
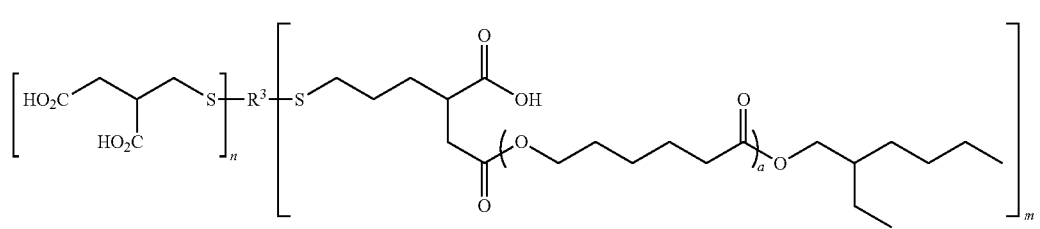
(n = 2, m = 2, a = 14)
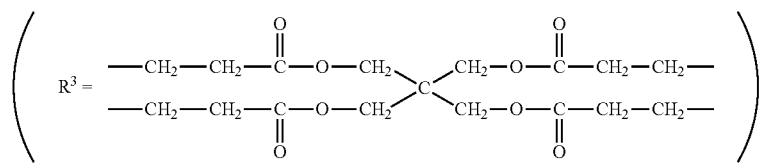
(C-107)
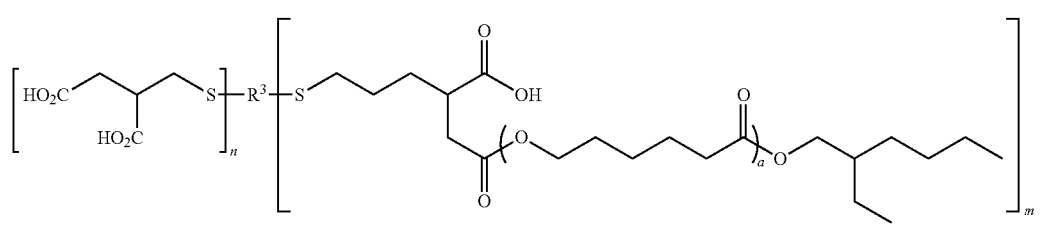
(n = 1, m = 2, a = 14)
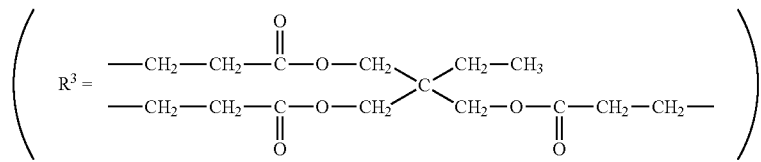

(C-108)
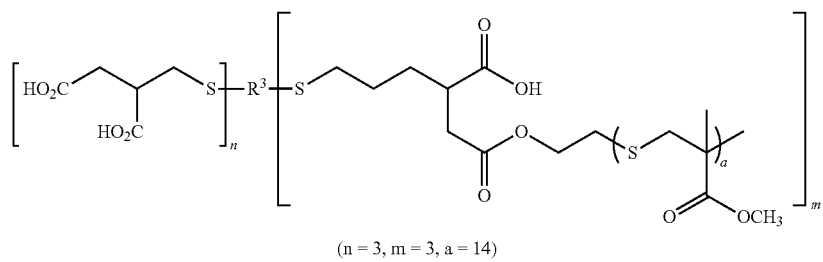
(n = 3, m = 3, a = 14)
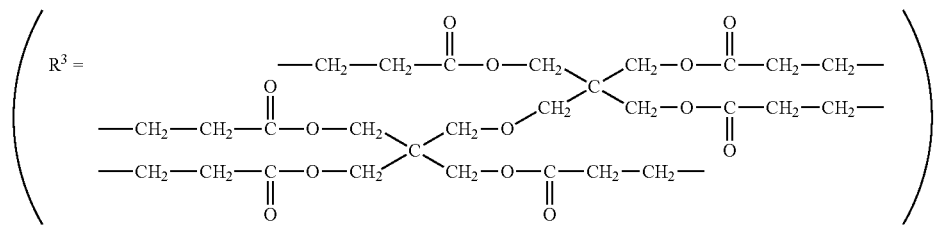
(C-109)
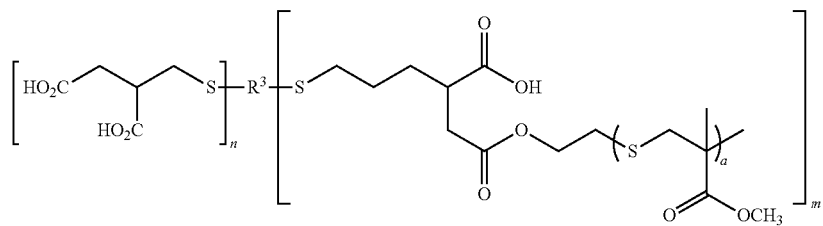
(n = 5, m = 1, a = 60)
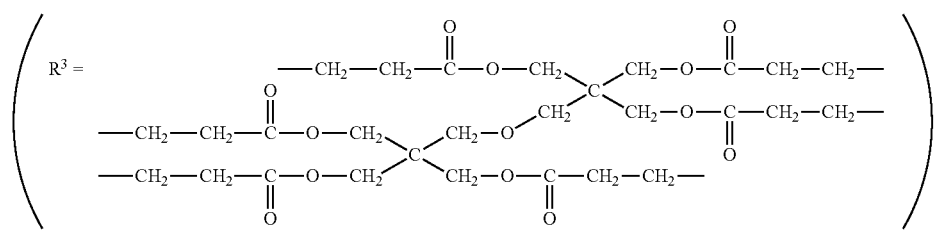
(C-110)
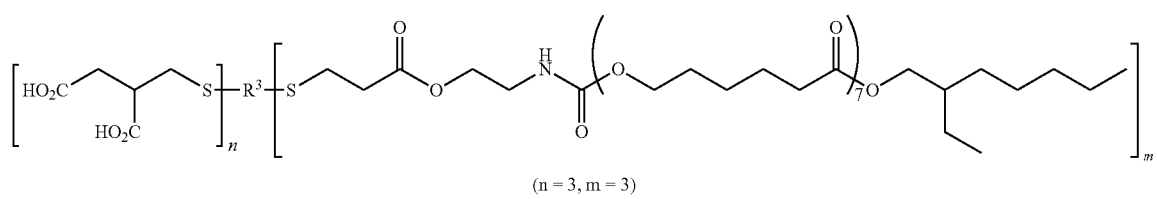
(n = 3, m = 3)
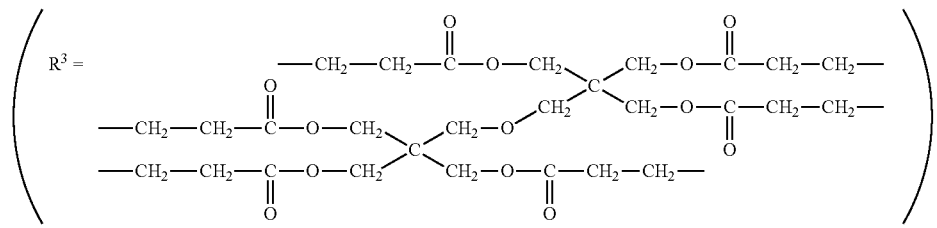
(C-111)
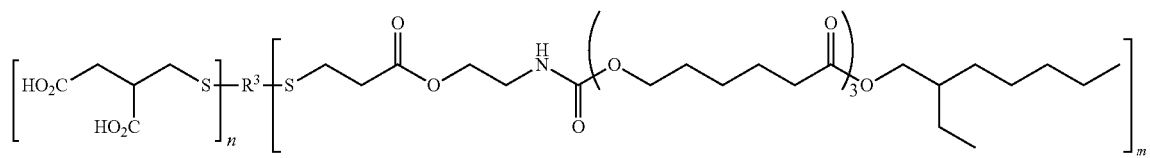
(n = 2.5, m = 3.5)

-continued
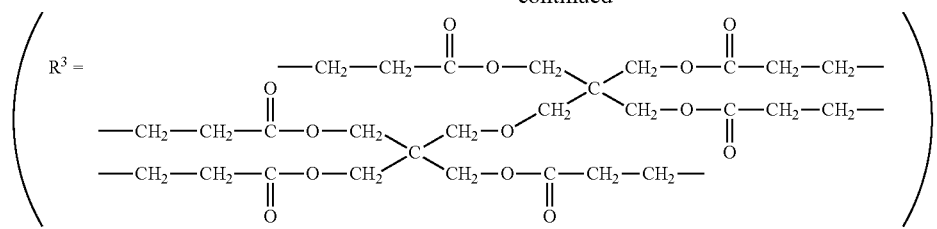
(C-112)
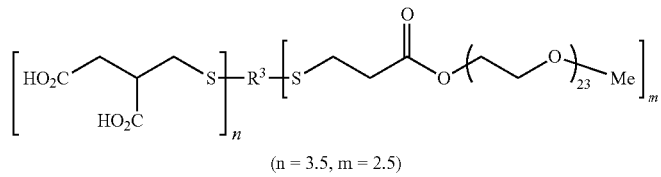
(n = 3.5, m = 2.5)
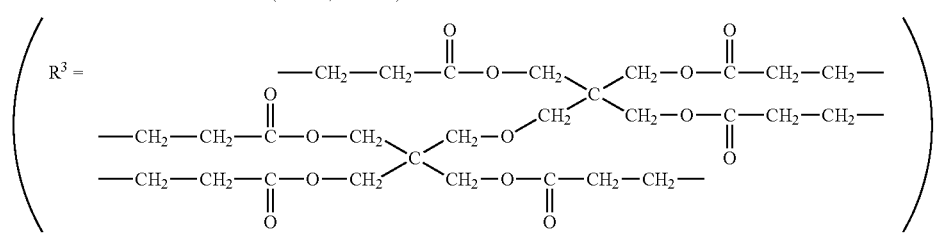
(C-113)
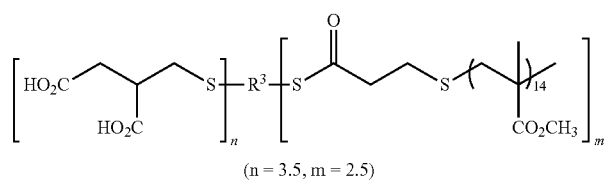
(n = 3.5, m = 2.5)
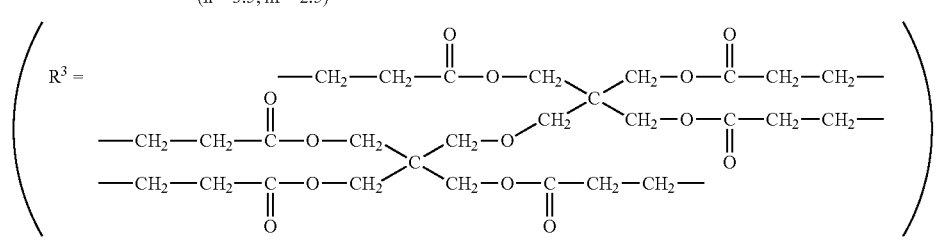
(C-114)
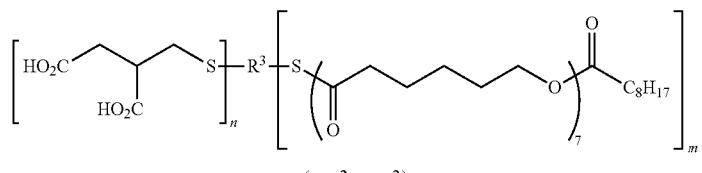
(n = 3, m = 3)
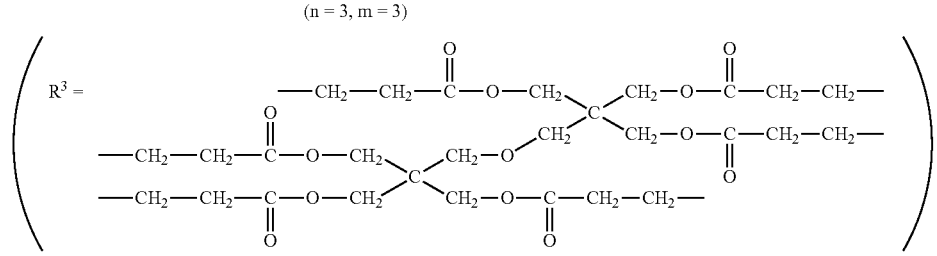
(C-115)
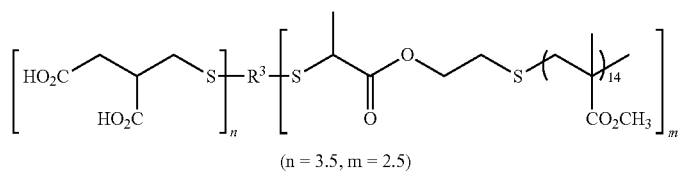
(n = 3.5, m = 2.5)

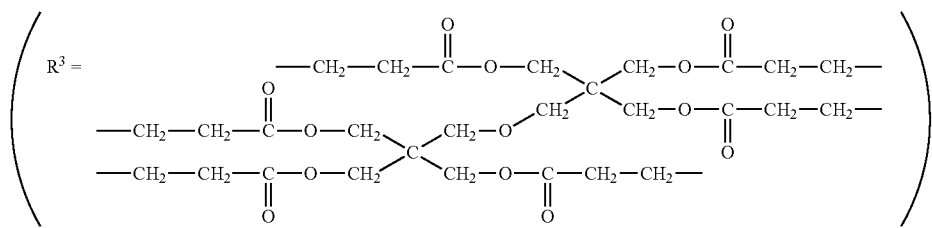
(C-116)
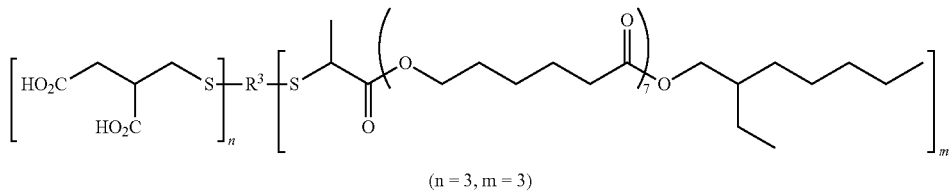
(n = 3, m = 3)
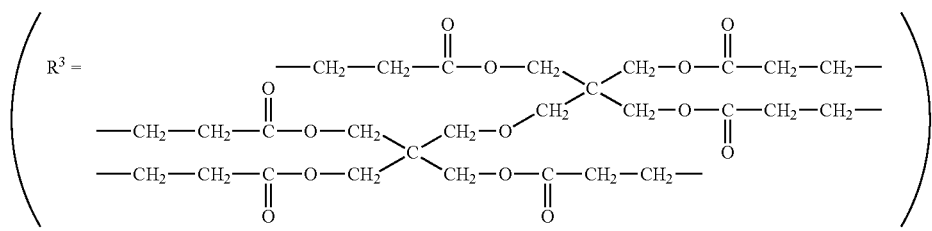
(C-117)
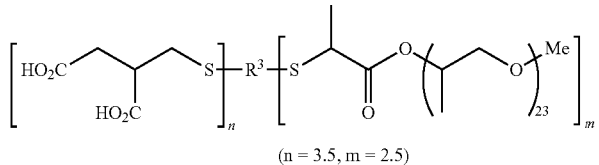
(n = 3.5, m = 2.5)
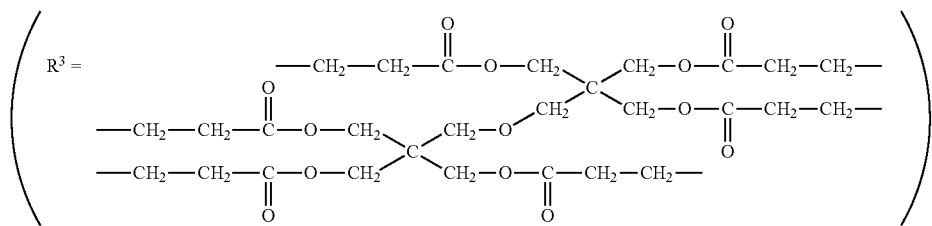
(C-118)
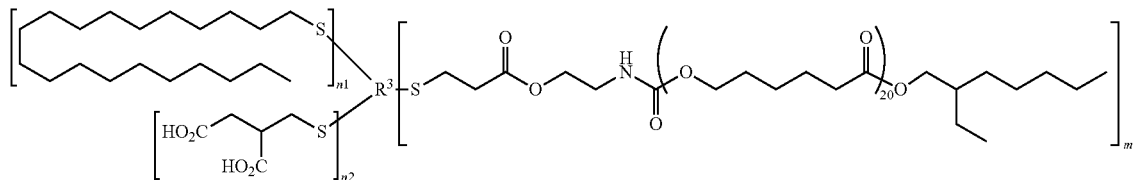
(n1 + n2 = 3.5, m = 2.5, n1/n2 = 1/4)

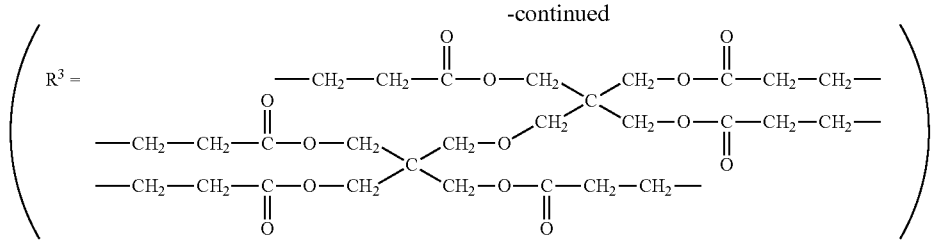

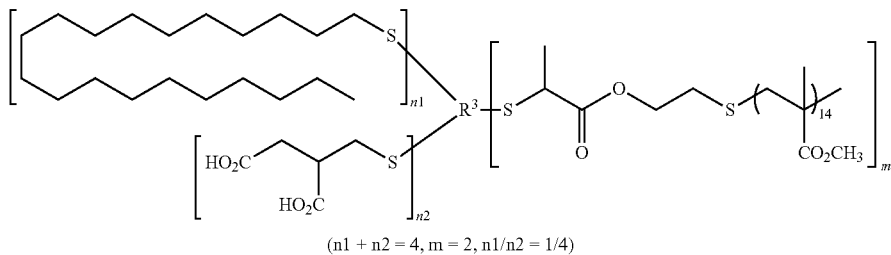

(n1 + n2 = 4, m = 2, n1/n2 = 1/4)

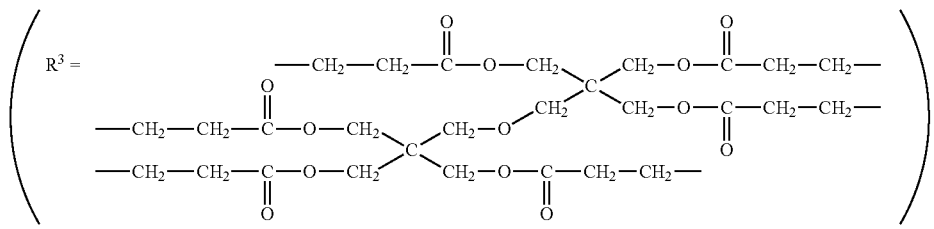

Example 1

Preparation of Titanium Dioxide Liquid Dispersion (Dispersion Composition)

A mixture solution having the following composition was subjected to dispersion treatment as follows by using Ultra Apex Mill manufactured by Kotobuki Industries Co., Ltd., as a circulation-type dispersion device (beadmill), thereby obtaining a titanium dioxide liquid dispersion as a dispersion composition.

~Composition~
Titanium dioxide (manufactured by Ishihara Sangyo Kaisha Ltd. TTO-51(C))(Purity 75% or more): 181.8 parts
Dispersant (Polymer compound (B)) C-4 (Solution of 30% by mass): 133.3 parts
Propylene glycol monomethyl ether acetate (PGMEA): 284.9 parts Further, the dispersion device is operated under the following conditions.
Bead diameter: φ0.05 mm
Bead Filling Ratio: 75 vol %
Circumferential Speed: 10 m/sec
Pump Supply Amount: 10 kg/hour
Cooling Water: Tap Water
Inner volume of bead mill annular passage: 0.15 L
Amount of mixed solution for dispersion treatment: 0.44 kg After the initiation of dispersion, average particle diameters were measured at a 30 minute interval (time for one pass).

The average particle diameter was decreased with the dispersion time (number of passes), but the variation amounts were gradually decreased. At a time point in which the variation in primary particle diameter when the dispersion time was extended by 30 min became 5 nm or less, the dispersion was terminated. Meanwhile, titanium dioxide particles in the liquid dispersion had a primary particle diameter of 40 nm.

Meanwhile, the primary particle diameter of titanium dioxide in the present Example refers to a value obtained by performing measurement on a diluted solution obtained by diluting a mixed solution or a liquid dispersion including titanium dioxide to 80 times with propylene glycol monomethyl ether acetate using a dynamic light scattering method.

This measurement uses a number average particle diameter obtained by performing measurement using MICROTRAC UPA-EX150 manufactured by Nikkiso Co., Ltd.

Preparation of Curable Composition 1

The titanium dioxide liquid dispersion (dispersion composition) obtained above was used and each component was mixed with each other so as to have the following composition, thereby obtaining a curable composition.

~Composition of Curable Composition~

| | |
|---|---|
| Titanium dioxide liquid dispersion prepared above (dispersion composition) | 81.98 parts |
| The following JER-157S65 (manufactured by Mitsubishi Chemical Corporation)(Polymerizable compound, T-4 in the following Table) | 3.72 parts |
| Binder polymer (Following M-1; Weight average molecular weight (Mw) and Copolymerization ratio (Weight ratio) are as follows) | 0.44 parts |
| *Surfactant Megafac F-781 (manufactured by DIC Co., Ltd.) | 0.03 parts |

-continued

| | |
|---|---|
| p-methoxyphenol | 0.01 parts |
| Propylene glycol monomethyl ether acetate | 13.82 parts |

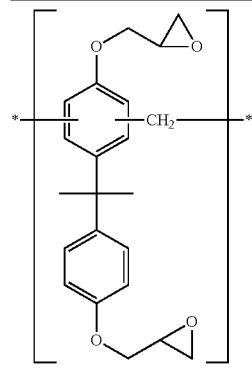

JER-157S65
Binder Polymer M-1

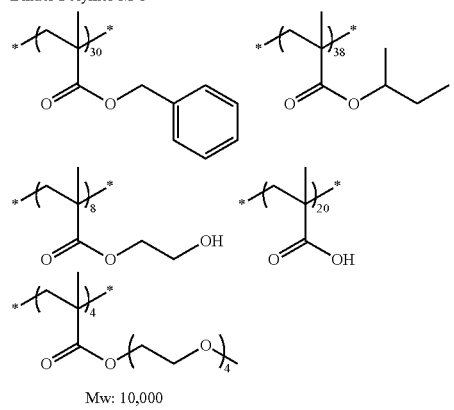

Mw: 10,000

(Manufacture of Cured Film (Transparent Film))

The curable composition obtained above was coated on a 12-inch silicon wafer by a spin coat method, followed by heating at 100° C., on a hot plate for 2 min to obtain a coating film having a film thickness of 1.05 μm. Further, the coating film was heated at 200° C., on a hot plate for 5 minutes to obtain a cured film (film thickness: 1.0 μm) as a transparent film.

[Measurement of Refractive Index of Transparent Film]

For the substrate obtained above, a refractive index of a transparent film to light having a wavelength of 635 nm was measured by using ellipsometry manufactured by J. A. Woollam Japan Corporation.

The results are shown in the following Table 4.

[Evaluation of Coated Surface Conditions]

Coated surface conditions were evaluated into 5 to 1 by visually observing and confirming the transparency of the coating film obtained by coating the curable composition as described above by the eye.

5: No change in transparency and no-problem level

4: Slight change in transparency in peripheral portion, but no change in central portion and practically no-problem level 3: Slight changes acknowledged on peripheral portion and central portion, but practically no-problem level 2: Uneven portions acknowledged on peripheral portion and central portion, and practically problematic level 1: Presence of uneven portions on the entire surface, and thus apparently unacceptable level The results are shown in the following Table 4.

[Evaluation of Solvent Resistance of Cured Film]

The cured film formed as described above was immersed in PGMEA for 5 minutes, and the refractive index of the transparent film (cured film) after immersion was measured in accordance with the aforementioned method. A value of change in refractive index after the treatment, which was calculated from [refractive index after immersion in solvent]−[refractive index before immersion in solvent], was used as an index of solvent resistance.

The results are shown in the following Table 4.

Examples 2 to 82 and Comparative Examples 1 to 5

The curable compositions in Examples 2 to 82 and Comparative Examples 1 to 5 were prepared in accordance with Example 1, except that the content of titanium dioxide with respect to the total solid content of the curable composition and the kinds of dispersant (polymer compound (B)) and polymerizable compound were changed as in the following Table 4.

That is, with respect to the examples in which C-4 used as the dispersant (polymer compound (B)) in Example 1 was changed, a titanium dioxide liquid dispersion obtained by using the dispersant (polymer compound (B)) shown in Table 4 instead of C-4 was used in the preparation of the titanium dioxide liquid dispersion used in Example 1.

Meanwhile, in Comparative Examples 1 and 2. SOL-SPERSE 500 manufactured by The Lubrizol Corporation and DISPERBYK180 manufactured by BYK Chemie GmbH were used as a dispersant different from the polymer compound (B) of the present invention.

Furthermore, with respect to the examples (Example 81 and 82) in which T-4 used in Example 1 as the polymerizable compound was changed, the following polymerizable compounds T-2 and T-3 were used instead of T-4 in the preparation of the curable composition in Example 1.

T-2: The following JER-1031S (manufactured by Mitsubishi Chemical Corporation)

T-3: The following EHPE-3150 (manufactured by Daicel Corporation; a 1,2-epoxy-4-(oxiranyl)cyclohexane addition product of 2,2-bis(hydroxymethyl)-1-butanol)

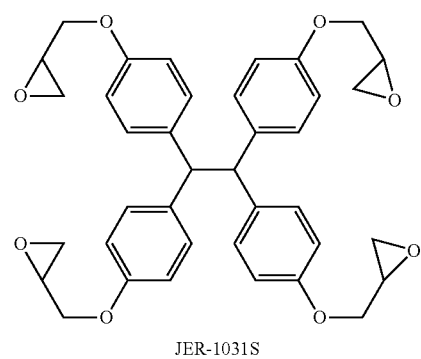

JER-1031S

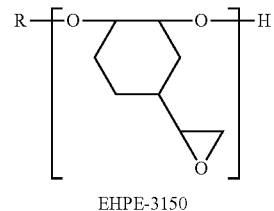

EHPE-3150

The content (concentration) of titanium dioxide with respect to the total solid content of the curable composition was changed by complementing an increase and decrease in content of titanium dioxide with an increase and decrease in content of the dispersant to prepare a titanium dioxide liquid dispersion while the total amount of titanium dioxide and the dispersant with respect to the total solid content of the curable composition was used in the same manner as in [the preparation of a titanium dioxide liquid dispersion (dispersion composition)] of Example 1.

In addition, the curable composition obtained was used to manufacture each of the transparent films in the same manner as in Example 1, followed by evaluation in the same manner as in Example 1. The results are shown in Table 4.

Example 83

Preparation of Curable Composition 2

The titanium dioxide liquid dispersion (dispersion composition) obtained above was used and each component was mixed with each other so as to have the following composition, thereby obtaining a curable composition.

~Composition of Curable Composition~

| | |
|---|---|
| Titanium dioxide liquid dispersion prepared above (dispersion composition) | 81.98 parts |
| Dipentaerythritol hexaacrylate (KAYARAD DPHA; manufactured by Nippon Kayaku Co., Ltd.)(Polymerizable compound, T-1 in the following Table) | 3.48 parts |
| Oxime-based photopolymerization initiator (Polymerization initiator, following K-1) | 0.24 parts |
| Binder polymer (the aforementioned M-1; Weight average molecular weight (Mw) and Copolymerization ratio (Weight ratio) are as described above) | 0.44 parts |
| Surfactant Megafac F-781 (manufactured by DIC Co., Ltd.) | 0.03 parts |
| p-methoxyphenol | 0.01 parts |
| Propylene glycol monomethyl ether acetate | 13.82 parts |

K-1

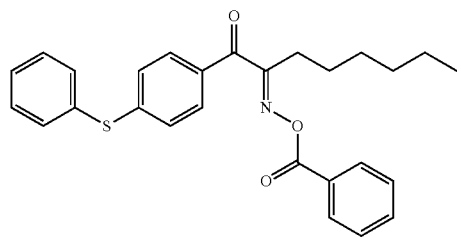

IRGACURE OXE01
(manufactured by
BASF Corp.)

K-2

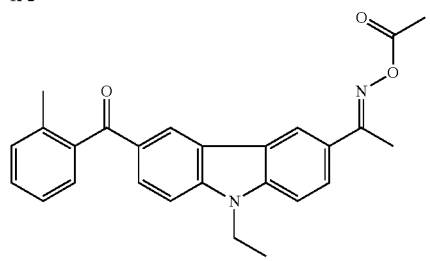

IRGACURE OXE02
(manufactured by
BASF Corp.)

K-3

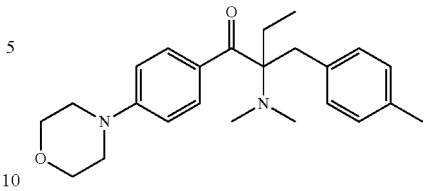

IRGACURE 379
(manufactured by
BASF Corp.)

K-4

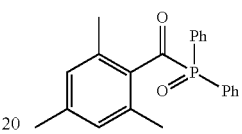

DAROCURE TPO
(manufactured by
BASF Corp.)

K-5

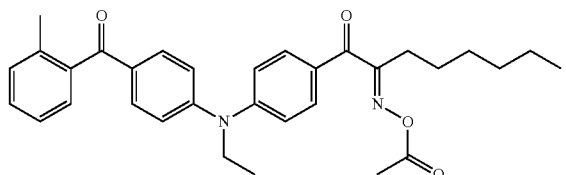

K-6

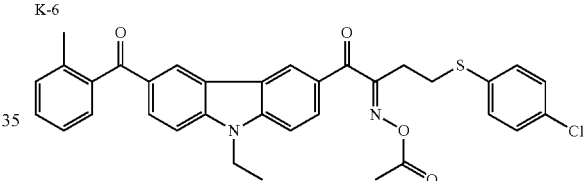

The curable composition obtained was used to manufacture each of the transparent films in the same manner as in Example 1, followed by evaluation in the same manner as in Example 1. The results are shown in Table 4.

Examples 84 to 88

Curable compositions of Examples 84 to 88 were prepared in accordance with Example 83, except that the kinds of dispersant (polymer compound (B)) and polymerization initiator were changed as in the following Table 4.

That is, with respect to the examples in which C-4 used as the dispersant (polymer compound (B)) in Example 77 was changed, a titanium dioxide liquid dispersion obtained by using the dispersant (polymer compound (B)) shown in Table 4 instead of C-4 was used in the preparation of the titanium dioxide liquid dispersion used in Example 83.

Further, with respect to the example in which the polymerization initiator was changed from the compound K-1 used in Example 83, a polymerization initiator shown in Table 4 instead of the compound K-1 was used in the preparation of the curable composition in Example 83.

In addition, the curable composition obtained was used to manufacture each of the transparent films in the same manner as in Example 1, followed by evaluation in the same manner as in Example 1. The results are shown in Table 4.

TABLE 4

| | Content of titanium dioxide in total solid content of composition | Dispersant | Acid value of dispersant (mgKOH/g) | Polymerizable compound | Polymerization initiator | Refractive index | Coated surface conditions | Solvent resistance (Change in refractive index after immersion in solvent) |
|---|---|---|---|---|---|---|---|---|
| Ex. 1 | 70% | C-4 | 102 | T-4 | — | 1.91 | 4 | −0.005 |
| Ex. 2 | 70% | C-5 | 80 | T-4 | — | 1.92 | 5 | −0.004 |
| Ex. 3 | 70% | C-6 | 59 | T-4 | — | 1.90 | 5 | −0.004 |
| Ex. 4 | 70% | C-7 | 72 | T-4 | — | 1.88 | 5 | −0.006 |
| Ex. 5 | 70% | C-8 | 35 | T-4 | — | 1.87 | 5 | −0.007 |
| Ex. 6 | 70% | C-9 | 82 | T-4 | — | 1.90 | 5 | −0.005 |
| Ex. 7 | 70% | C-10 | 81 | T-4 | — | 1.90 | 5 | −0.005 |
| Ex. 8 | 70% | C-11 | 52 | T-4 | — | 1.91 | 5 | −0.004 |
| Ex. 9 | 70% | C-12 | 31 | T-4 | — | 1.90 | 5 | −0.005 |
| Ex. 10 | 70% | C-13 | 76 | T-4 | — | 1.92 | 5 | −0.018 |
| Ex. 11 | 70% | C-14 | 79 | T-4 | — | 1.90 | 5 | −0.004 |
| Ex. 12 | 70% | C-15 | 68 | T-4 | — | 1.91 | 5 | −0.005 |
| Ex. 13 | 70% | C-16 | 99 | T-4 | — | 1.91 | 4 | −0.005 |
| Ex. 14 | 70% | C-17 | 85 | T-4 | — | 1.91 | 5 | −0.006 |
| Ex. 15 | 70% | C-18 | 82 | T-4 | — | 1.92 | 5 | −0.004 |
| Ex. 16 | 70% | C-19 | 47 | T-4 | — | 1.89 | 5 | −0.003 |
| Ex. 17 | 70% | C-20 | 80 | T-4 | — | 1.90 | 5 | −0.003 |
| Ex. 18 | 70% | C-21 | 40 | T-4 | — | 1.89 | 5 | −0.003 |
| Ex. 19 | 70% | C-22 | 80 | T-4 | — | 1.89 | 5 | −0.006 |
| Ex. 20 | 70% | C-23 | 75 | T-4 | — | 1.89 | 5 | −0.005 |
| Ex. 21 | 70% | C-24 | 97 | T-4 | — | 1.94 | 4 | −0.007 |
| Ex. 22 | 70% | C-25 | 95 | T-4 | — | 1.93 | 4 | −0.008 |
| Ex. 23 | 70% | C-26 | 99 | T-4 | — | 1.92 | 4 | −0.003 |
| Ex. 24 | 70% | C-27 | 77 | T-4 | — | 1.94 | 5 | −0.007 |
| Ex. 25 | 70% | C-28 | 77 | T-4 | — | 1.94 | 5 | −0.009 |
| Ex. 26 | 70% | C-29 | 85 | T-4 | — | 1.93 | 5 | −0.005 |
| Ex. 27 | 70% | C-30 | 79 | T-4 | — | 1.94 | 5 | −0.007 |
| Ex. 28 | 70% | C-31 | 80 | T-4 | — | 1.92 | 5 | −0.022 |
| Ex. 29 | 70% | C-32 | 82 | T-4 | — | 1.92 | 5 | −0.010 |
| Ex. 30 | 70% | C-33 | 79 | T-4 | — | 1.92 | 5 | −0.011 |
| Ex. 31 | 70% | C-34 | 99 | T-4 | — | 1.91 | 5 | −0.008 |
| Ex. 32 | 70% | C-35 | 103 | T-4 | — | 1.90 | 4 | −0.009 |
| Ex. 33 | 70% | C-36 | 62 | T-4 | — | 1.90 | 5 | −0.012 |
| Ex. 34 | 70% | C-37 | 110 | T-4 | — | 1.91 | 4 | −0.005 |
| Ex. 35 | 70% | C-38 | 111 | T-4 | — | 1.91 | 4 | −0.006 |
| Ex. 36 | 70% | C-39 | 105 | T-4 | — | 1.91 | 4 | −0.008 |
| Ex. 37 | 70% | C-110 | 77 | T-4 | — | 1.91 | 5 | −0.005 |
| Ex. 38 | 70% | C-111 | 85 | T-4 | — | 1.92 | 5 | −0.004 |
| Ex. 39 | 70% | C-101 | 110 | T-4 | — | 1.90 | 4 | −0.005 |
| Ex. 40 | 70% | C-102 | 108 | T-4 | — | 1.91 | 4 | −0.005 |
| Ex. 41 | 70% | C-103 | 80 | T-4 | — | 1.89 | 5 | −0.007 |
| Ex. 42 | 70% | C-104 | 70 | T-4 | — | 1.90 | 5 | −0.009 |
| Ex. 43 | 70% | C-105 | 40 | T-4 | — | 1.88 | 5 | −0.010 |
| Ex. 44 | 70% | C-106 | 110 | T-4 | — | 1.91 | 4 | −0.005 |
| Ex. 45 | 70% | C-107 | 70 | T-4 | — | 1.90 | 5 | −0.008 |
| Ex. 46 | 70% | C-108 | 115 | T-4 | — | 1.91 | 4 | −0.008 |
| Ex. 47 | 70% | C-109 | 70 | T-4 | — | 1.88 | 5 | −0.008 |
| Ex. 48 | 70% | C-40 | 86 | T-4 | — | 1.90 | 5 | −0.005 |
| Ex. 49 | 70% | C-41 | 87 | T-4 | — | 1.90 | 5 | −0.007 |
| Ex. 50 | 70% | C-42 | 85 | T-4 | — | 1.90 | 5 | −0.007 |
| Ex. 51 | 70% | C-43 | 99 | T-4 | — | 1.93 | 5 | −0.005 |
| Ex. 52 | 70% | C-44 | 100 | T-4 | — | 1.91 | 5 | −0.007 |
| Ex. 53 | 70% | C-45 | 98 | T-4 | — | 1.91 | 5 | −0.005 |
| Ex. 54 | 70% | C-46 | 99 | T-4 | — | 1.91 | 5 | −0.004 |
| Ex. 55 | 70% | C-47 | 97 | T-4 | — | 1.92 | 5 | −0.009 |
| Ex. 56 | 70% | C-48 | 99 | T-4 | — | 1.93 | 4 | −0.012 |
| Ex. 57 | 70% | C-49 | 98 | T-4 | — | 1.91 | 4 | −0.009 |
| Ex. 58 | 70% | C-50 | 101 | T-4 | — | 1.91 | 4 | −0.008 |
| Ex. 59 | 70% | C-51 | 100 | T-4 | — | 1.92 | 4 | −0.008 |
| Ex. 60 | 70% | C-52 | 83 | T-4 | — | 1.91 | 5 | −0.003 |
| Ex. 61 | 70% | C-53 | 38 | T-4 | — | 1.90 | 5 | −0.006 |
| Ex. 62 | 70% | C-54 | 30 | T-4 | — | 1.89 | 5 | −0.006 |
| Ex. 63 | 70% | C-55 | 92 | T-4 | — | 1.92 | 5 | −0.004 |
| Ex. 64 | 70% | C-56 | 80 | T-4 | — | 1.92 | 5 | −0.019 |
| Ex. 65 | 70% | C-57 | 80 | T-4 | — | 1.91 | 5 | −0.016 |
| Ex. 66 | 70% | C-58 | 69 | T-4 | — | 1.90 | 5 | −0.009 |
| Ex. 67 | 70% | C-59 | 56 | T-4 | — | 1.90 | 5 | −0.011 |
| Ex. 68 | 70% | C-60 | 84 | T-4 | — | 1.92 | 5 | −0.010 |
| Ex. 69 | 70% | C-61 | 102 | T-4 | — | 1.92 | 4 | −0.011 |
| Ex. 70 | 70% | C-112 | 82 | T-4 | — | 1.91 | 5 | 0.008 |
| Ex. 71 | 70% | C-113 | 79 | T-4 | — | 1.92 | 5 | −0.006 |
| Ex. 72 | 70% | C-114 | 84 | T-4 | — | 1.92 | 5 | −0.011 |
| Ex. 73 | 70% | C-115 | 77 | T-4 | — | 1.92 | 5 | −0.008 |
| Ex. 74 | 70% | C-116 | 81 | T-4 | — | 1.92 | 5 | −0.013 |
| Ex. 75 | 70% | C-117 | 82 | T-4 | — | 1.91 | 5 | 0.004 |

TABLE 4-continued

| | Content of titanium dioxide in total solid content of composition | Dispersant | Acid value of dispersant (mgKOH/g) | Polymerizable compound | Polymerization initiator | Refractive index | Coated surface conditions | Solvent resistance (Change in refractive index after immersion in solvent) |
|---|---|---|---|---|---|---|---|---|
| Ex. 76 | 70% | C-118 | 78 | T-4 | — | 1.91 | 5 | −0.008 |
| Ex. 77 | 70% | C-119 | 80 | T-4 | — | 1.92 | 5 | −0.005 |
| Ex. 78 | 80% | C-4 | 102 | T-4 | — | 1.98 | 4 | −0.005 |
| Ex. 79 | 60% | C-5 | 80 | T-4 | — | 1.81 | 5 | −0.005 |
| Ex. 80 | 50% | C-6 | 59 | T-4 | — | 1.72 | 5 | −0.006 |
| Ex. 81 | 70% | C-5 | 80 | T-2 | — | 1.92 | 5 | −0.004 |
| Ex. 82 | 70% | C-4 | 102 | T-3 | — | 1.91 | 4 | −0.006 |
| Ex. 83 | 70% | C-4 | 102 | T-1 | K-1 | 1.91 | 4 | −0.032 |
| Ex. 84 | 70% | C-5 | 80 | T-1 | K-2 | 1.92 | 5 | −0.034 |
| Ex. 85 | 70% | C-6 | 59 | T-1 | K-5 | 1.92 | 5 | −0.029 |
| Ex. 86 | 70% | C-4 | 102 | T-1 | K-6 | 1.91 | 4 | −0.027 |
| Ex. 87 | 70% | C-5 | 80 | T-1 | K-3 | 1.90 | 5 | −0.045 |
| Ex. 88 | 70% | C-6 | 59 | T-1 | K-4 | 1.89 | 5 | −0.051 |
| C. Ex. 1 | 70% | SOLSPERSE 5000 | — | T-4 | — | 1.81 | 1 | −0.058 |
| C. Ex. 2 | 70% | DISPERBYK180 | — | T-4 | — | 1.83 | 1 | −0.064 |
| C. Ex. 3 | 70% | C-1 | 241 | T-4 | — | 1.91 | 3 | −0.005 |
| C. Ex. 4 | 70% | C-2 | 200 | T-4 | — | 1.90 | 3 | −0.006 |
| C. Ex. 5 | 70% | C-3 | 158 | T-4 | — | 1.91 | 3 | −0.004 |

As apparent from Table 4, it can be seen that in Comparative Examples 1 and 2 in which polymer compound (B) was not used, the refractive index was slightly low, and coated surface conditions also deteriorated.

Furthermore, it can be seen that in Comparative Examples 3 to 5 in which the dispersant satisfying Formula (1) had an acid value of 120 mgKOH/g or more, the refractive index was high, but coated surface conditions slightly deteriorated.

Meanwhile, it can be seen that in Examples 1 to 88 in which the polymer compound (B) of the present invention was used, the refractive index was high, and coated surface conditions were particularly good.

In particular, it can be seen that in Examples 1 to 82 in which an epoxy-based compound was used as a polymerizable compound and in Examples 83 to 86 in which an oxime-based compound was used as a polymerization initiator, solvent resistance was excellent, and in Examples 1 to 82 in which an epoxy-based compound was used as a polymerizable compound, solvent resistance was particularly high.

Further, it could be confirmed that in the curable compositions of Examples 2, 6, 17, 19, 20, 28, 29, 30, 37, 38, 41, 42, 45, 50, 60, 64, 65, 68, 70 to 77, 79, 81, 84, and 87 in which Dispersants C-5, C-9, C-20, C-22, C-23, C-31, C-32, C-33, C-42, C-52, C-56, C-57, C-60, C-103, C-104, C-107, and C-110 to C-119, which had a weight average molecular weight of 5,000 to 8,000 and an acid value of 70 to 90 mgKOH/g, were used, the transmittance of the cured film at a wavelength of 400 nm was 90% or more, and the transmittance of the cured film in visible light was particularly excellent.

Although examples in which a transparent film is formed on a silicon wafer have been described in the Examples, when a solid-state imaging device is manufactured, the silicon wafer may be substituted with a substrate for a solid-state imaging device, with a photodiode, a light-shielding film, a device protective film, and the like formed thereon.

A light-shielding film formed of tungsten, such that only a light-receiving part of a photodiode is open, is formed on a silicon wafer with the photodiode and a transfer electrode formed thereon to form a device protective layer formed of silicon nitride such that the entire surface of the light-shielding film formed and the photodiode light-receiving part (opening in the light-shielding film) are covered.

Subsequently, the curable composition in the Example, which was prepared as an undercoat layer as described above, was coated on the formed device protective layer so as to have a film thickness of 0.50 µm, followed by heating with a hot plate at 100° C. for 2 min. Subsequently, the film was heated at 230° C., for 10 min by using a hot plate and cured. Thereon, each of the red pixels, blue pixels, and green pixels with a side length of 1.4 µm was formed by a method described in Example 16 of Japanese Patent Application Laid-Open No. 2010-210702 A and then a color filter was prepared.

Thereon, the curable composition in the Example, prepared as described above, was coated so as to have a film thickness of 1.5 µm, and heated at 100° C., for 2 min by using a hot plate, followed by heating at 230° C., for 10 min by using a hot plate to cure the film.

Furthermore. HPR-204ESZ-9-5 mPa·s (resist liquid manufactured by Fujifilm Electronic Materials Co., Ltd.) was coated thereon, followed by heating at 90° C., for 1 min by using a hot plate. The coating film was exposed at 100 mJ/cm2 via a mask having a plurality of square patterns with a side length of 1.4 µm by an i-ray stepper (product name: FPA-3000i5+, manufactured by Canon Inc.). Here, the mask was disposed such that the plurality of square patterns in the mask had positions corresponding to the red pixels, blue pixels, and green pixels in the color filter, respectively.

The film was subjected to puddle development using the alkaline developing solution HPRD-429E (manufactured by Fujifilm Electronic Materials Co., Ltd.) at room temperature for 60 sec, followed by rinsing with pure water by spin shower for 20 sec. Thereafter, the film was further washed with pure water, and then the substrate was dried with a high-speed rotation to form a resist pattern. The film was subjected to a post-bake treatment on a hot plate at 200° C., for 300 sec to shape the resist into a lens-type shape.

The substrate thus-obtained was subjected to a dry etching treatment under the following conditions by using a dry etching device (manufactured by Hitachi High-Technologies Corporation: U-621), so that a transparent film of the present invention having a high refractive index was processed so as to be used as a microlens.

RF Power: 800 W
Antenna bias: 100 W
Wafer bias: 500 W
Chamber inner pressure: 0.5 Pa
Substrate temperature: 50° C.
Kind of mixed gas and flow rate: CF4/C4F$_6$/O2/Ar=175/25/50/200 ml/min
Photoresist etching rate: 140 nm/min When the device obtained was used to photograph an image, a good image could be obtained.

INDUSTRIAL APPLICABILITY

According to the present invention, it is possible to provide a dispersion composition which has a high refractive index and has excellent surface conditions of a film surface after coating, a curable composition using the same, a transparent film, a microlens, and a solid-state imaging device.

Although the present invention has been described in detail with reference to specific embodiments, it is obvious to those skilled in the art that various changes or modifications can be made without departing from the spirit and scope of the present invention.

The present application is based on Japanese Patent Application (Patent application No. 2012-192559) filed on Aug. 31, 2012, and Japanese Patent Application (Patent application No. 2013-026068) filed on Feb. 13, 2013, the content of which is incorporated herein by reference.

EXPLANATION OF REFERENCE NUMERALS AND SYMBOLS

1: TFT (Thin-Film Transistor), 2: Wiring, 3: Insulating film, 4: Planarization film, 5: First electrode, 6: Glass substrate, 7: Contact hole, 8: Insulating film, 10: Liquid crystal display device, 12: Backlight unit, 14, 15: Glass substrate, 16: TFT, 17: Cured film, 18: Contact hole, 19: ITO transparent electrode, 20: Liquid crystal, 22: Color filter, 30: Electrostatic capacitance-type input device. 31: Front plate, 32: Mask layer. 33: First transparent electrode pattern, 33a: Pad part, 33b: Connection part, 34: Second transparent electrode pattern, 35: Insulating layer, 36: Conductive element, 37: Transparent protective layer, 38: Opening.

What is claimed is:

1. A dispersion composition comprising:
   titanium oxide particles (A) having a primary particle diameter of 1 nm to 100 nm;
   a polymer compound (B) having a weight average molecular weight of 5,000 to 8,000, an acid value of 70 to 90 mgKOH/g and being represented by Formula (1); and
   a solvent (C):

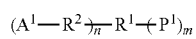

Formula (1)

wherein, in Formula (1),
$R^1$ represents a (m+n)-valent linking group,
$R^2$ represents a single bond or a divalent linking group,
$A^1$ represents a monovalent substituent having at least one group selected from the group consisting of an acid group, a urea group, a urethane group, a group having a coordinating oxygen atom, a group having a basic nitrogen atom, a phenol group, an alkyl group, an aryl group, a group having an alkyleneoxy chain, an imide group, an alkyloxycarbonyl group, an alkyl amino carbonyl group, a carboxylate group, a sulfonamide group, a heterocyclic group, an alkoxysilyl group, an epoxy group, an isocyanate group, and a hydroxyl group, n $A^1$'s and n $R^2$'s may be the same or different,
m is 1 to 4, n is 2 to 7, and m+n satisfies 3 to 10, and
$P^1$ represents a polymer chain, and m $P^1$'s may be the same or different, wherein the titanium oxide particles (A) are colorless or transparent, the content of the titanium oxide particles (A) is 65% by mass or more with respect to the total solid components in the dispersion composition, and if a cured layer having a thickness of 1.0 μm is formed with the dispersion composition, then the light transmittance of the cured layer in the direction of the thickness of the cured layer is 90% or more over the entire wavelength region of 400 to 700 nm.

2. The dispersion composition according to claim 1, wherein the titanium oxide particles (A) are particles surface-treated with an organic compound.

3. The dispersion composition according to claim 2, wherein the organic compound is a stearic acid.

4. The dispersion composition according to claim 1, wherein the polymer chain represented by $P^1$ is a polymer chain derived from at least one selected from a polymer or copolymer of vinyl monomers, an ester-based polymer, an ether-based polymer, a urethane-based polymer, an amide-based polymer, an epoxy-based polymer, a silicone-based polymer and a modified product or copolymer thereof.

5. The dispersion composition according to claim 1, wherein the polymer chain represented by $P^1$ contains at least one repeating unit, and the repeating number of the at least one repeating unit is 3 to 60.

6. A curable composition comprising the dispersion composition according to claim 1 and a polymerizable compound (D).

7. The curable composition according to claim 6, wherein the polymerizable compound (D) is at least one selected from the group consisting of a compound having two or more epoxy groups or oxetanyl groups in a molecule and a compound having two or more terminal ethylenically unsaturated bonds in a molecule.

8. The curable composition according to claim 6, further comprising at least one selected from the group consisting of a polymerization initiator (E) and a binder polymer.

9. The curable composition according to claim 8, wherein the polymerization initiator (E) is an oxime-based polymerization initiator.

10. The curable composition according to claim 6, wherein the composition is for forming a microlens or for forming an undercoat film of a color filter.

11. A transparent film formed by using the curable composition according to claim 6.

12. A microlens formed by using a transparent film obtained by the curable composition according to claim 10.

13. A solid-state imaging device comprising the microlens according to claim 12.

14. A dispersion composition comprising:
    titanium oxide particles (A) having a primary particle diameter of 1 nm to 100 nm;

a polymer compound (B) having a weight average molecular weight of 5,000 to 8,000, an acid value of 70 to 90 mgKOH/g and being represented by Formula (1); and a solvent (C):

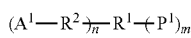

Formula (1)

wherein, in Formula (1), $R^1$ represents a (m+n)-valent linking group, $R^2$ represents a single bond or a divalent linking group, $A^1$ represents a monovalent substituent having at least one group selected from the group consisting of an acid group, a urea group, a urethane group, a group having a coordinating oxygen atom, a group having a basic nitrogen atom, a phenol group, an alkyl group, an aryl group, a group having an alkyleneoxy chain, an imide group, an alkyloxycarbonyl group, an alkyl amino carbonyl group, a carboxylate group, a sulfonamide group, a heterocyclic group, an alkoxysilyl group, an epoxy group, an isocyanate group, and a hydroxyl group, n $A^1$'s and n $R^2$'s may be the same or different, m is 1 to 4, n is 2 to 7, and m+n satisfies 3 to 10, and $P^1$ represents a polymer chain, and m $P^1$'s may be the same or different, wherein the titanium oxide particle (A) is colorless or transparent, and $R^1$ in Formula (1) is a group represented by any one of the following Formulae:

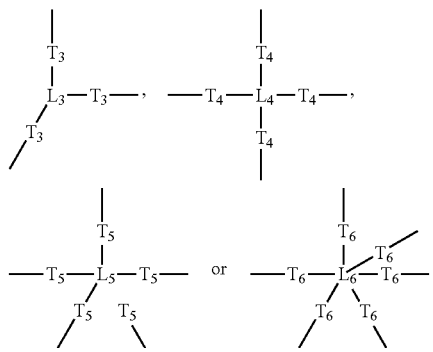

wherein, in the above Formulae, $L_3$ represents a trivalent group, $T_3$ represents a single bond or a divalent linking group, and three $T_3$'s may be the same or different, $L_4$ represents a tetravalent group, $T_4$ represents a single bond or a divalent linking group, and four $T_4$'s may be the same or different, $L_5$ represents a pentavalent group, $T_5$ represents a single bond or a divalent linking group, and five $T_5$'s may be the same or different, $L_6$ represents a hexavalent group, $T_6$ represents a single bond or a divalent linking group, and six $T_6$'s may be the same or different, and if a cured layer having a thickness of 1.0 μm is formed with the dispersion composition, then the light transmittance of the cured layer in the direction of the thickness of the cured layer is 90% or more over the entire wavelength region of 400 to 700 nm.

15. The dispersion composition according to claim 1, wherein $R^1$ in Formula (1) is one selected from the group consisting of the following structures:

(1)

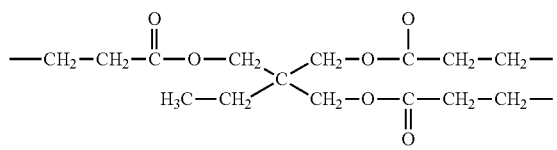

(2)

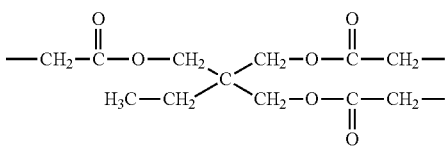

(3)

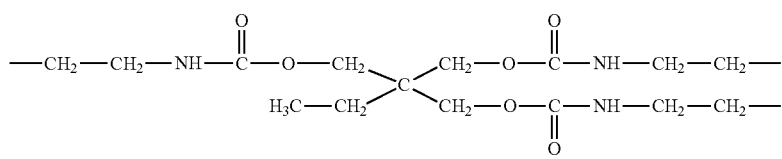

(4)

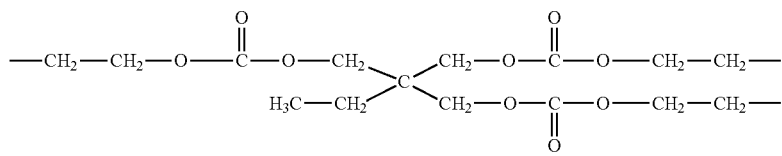

(5)

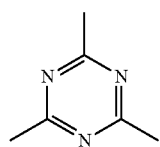

(6)

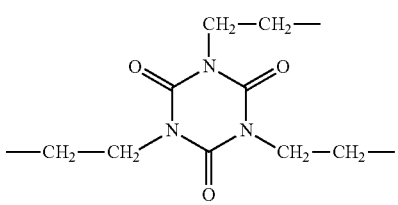

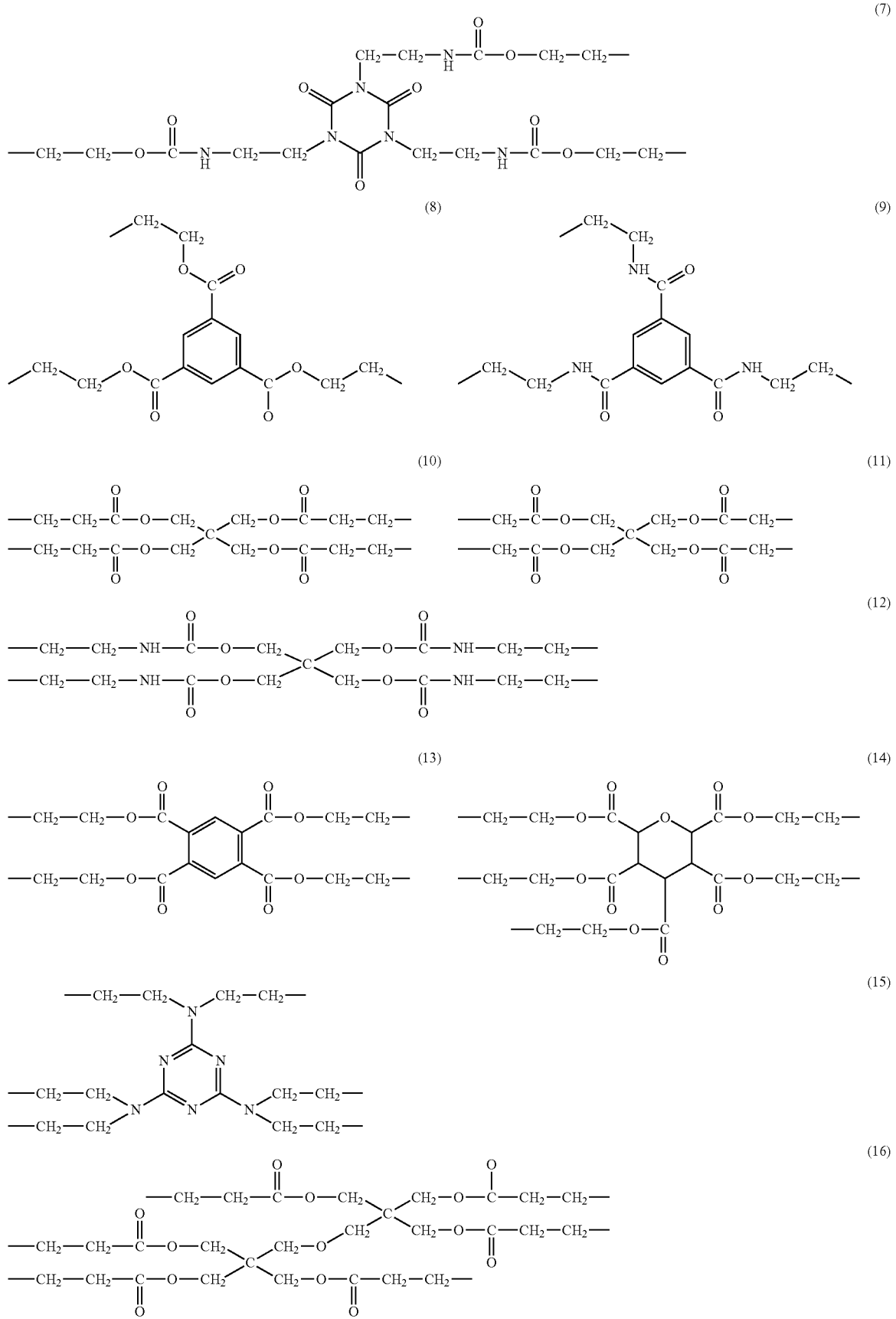

(17)
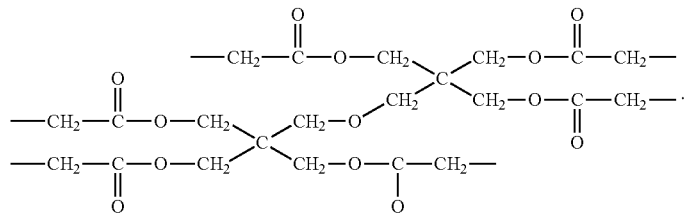
16. The dispersion composition according to claim 14, wherein $R^1$ in Formula (1) is one selected from the group consisting of the following structures:
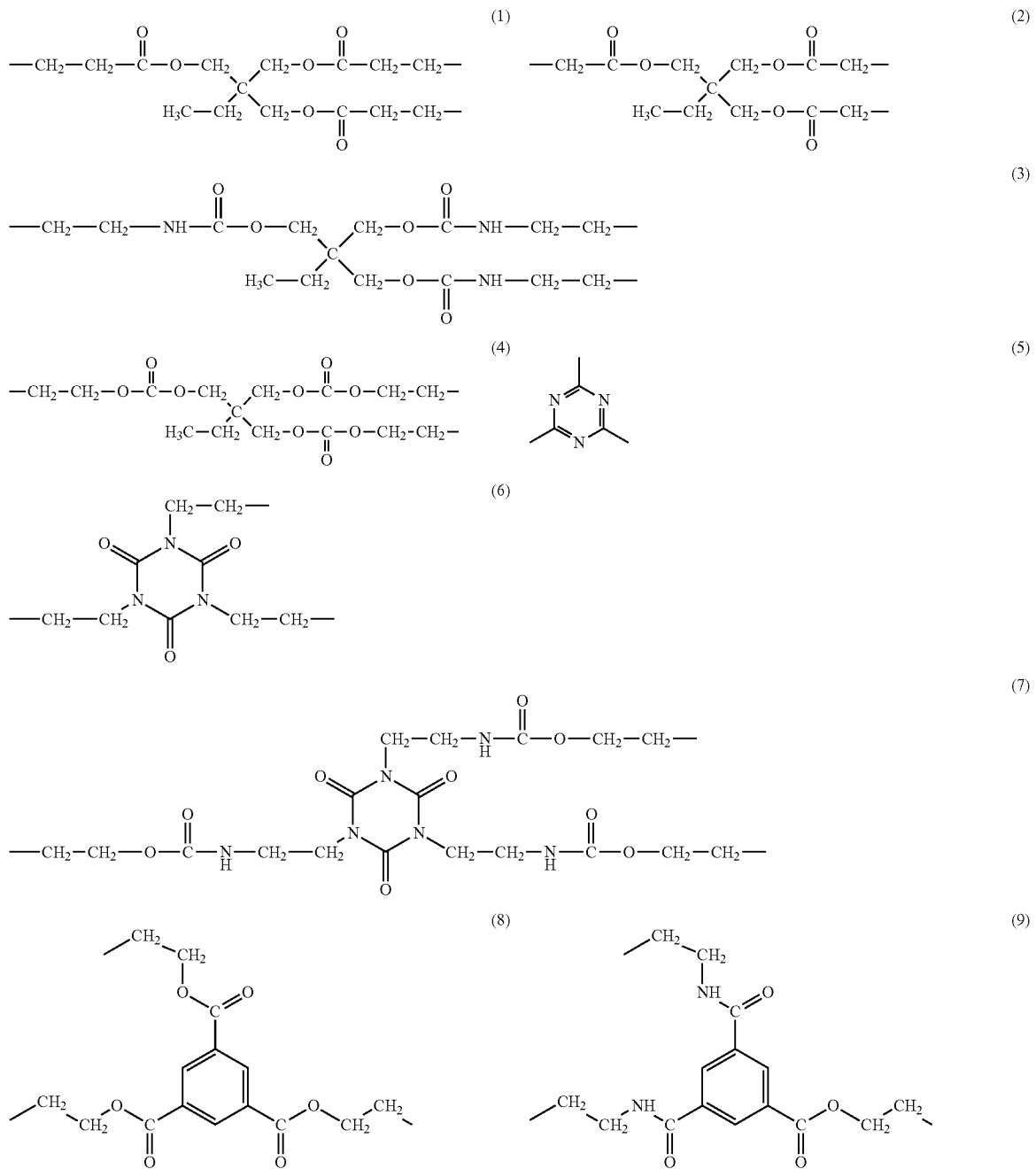

-continued
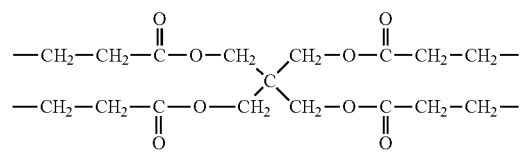 (10)
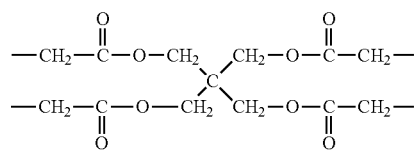 (11)
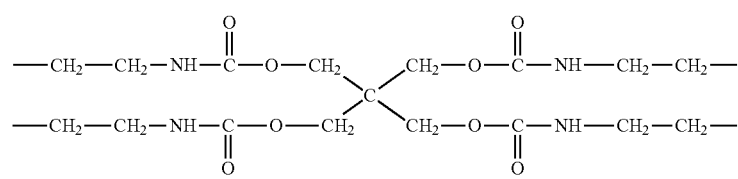 (12)
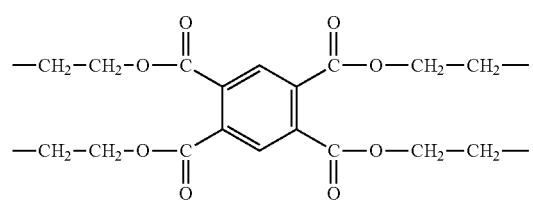 (13)
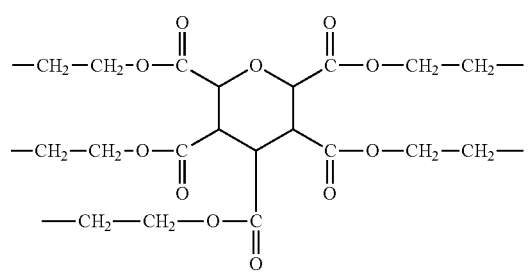 (14)
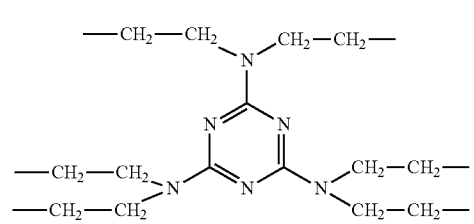 (15)
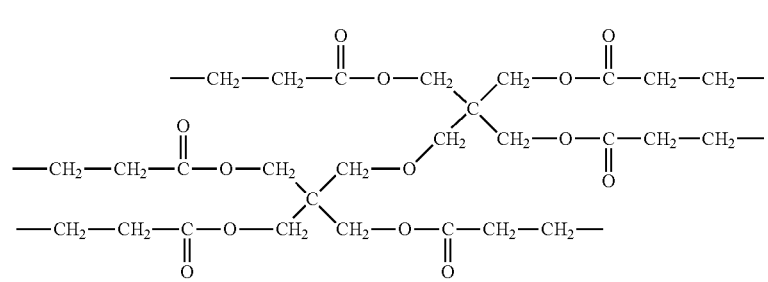 (16)
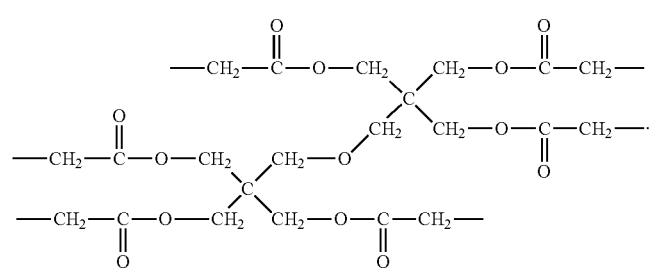 (17)

17. The dispersion composition according to claim 1, wherein $R^1$ in Formula (1) is one selected from the group consisting of the following structures:
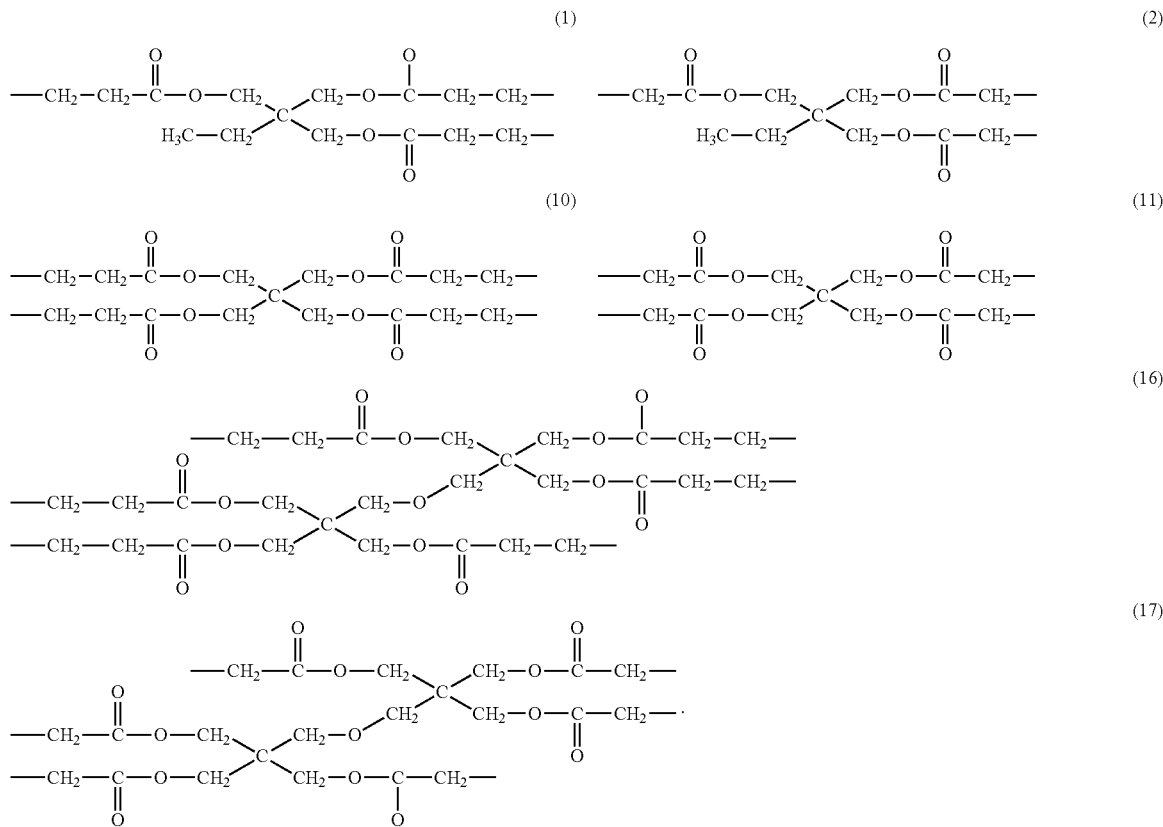
18. The dispersion composition according to claim 14, wherein $R^1$ in Formula (1) is one selected from the group consisting of the following structures:
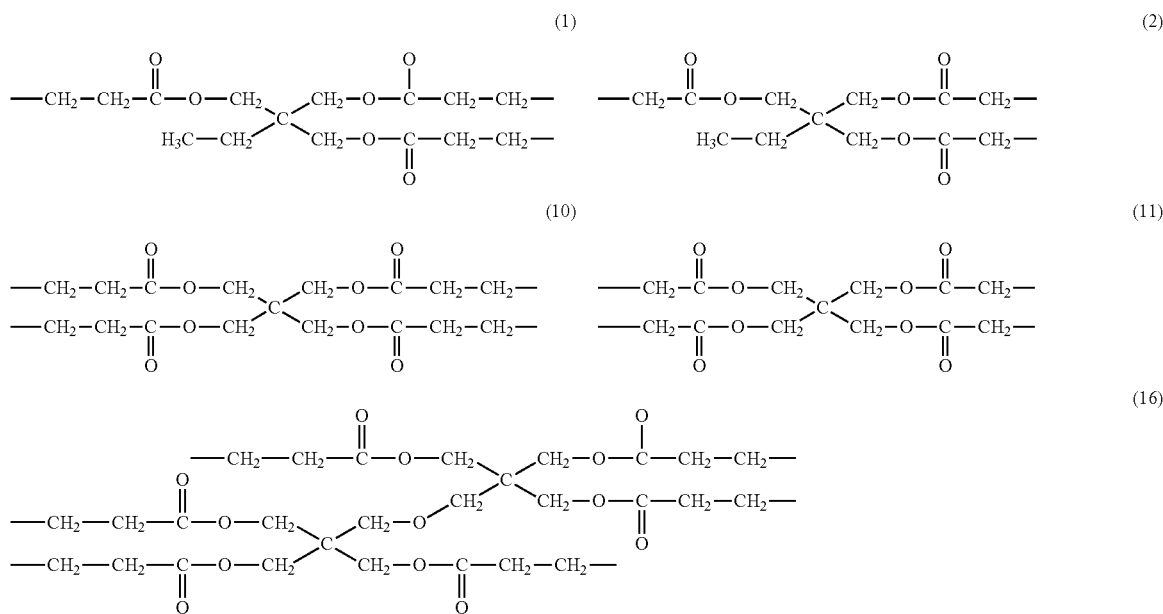

-continued

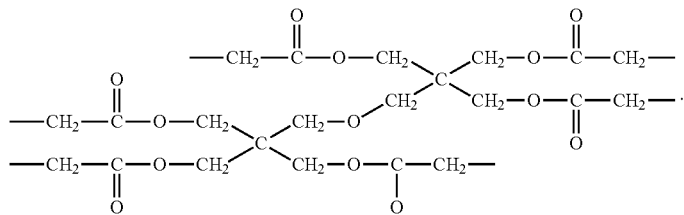

(17)

19. The dispersion composition according to claim 1, wherein $A^1$ in Formula (1) is a monovalent substituent having at least one group selected from the group consisting of an acid group, a phenol group, an alkyl group, an aryl group, a group having an alkyleneoxy chain, a hydroxyl group, a urea group, a urethane group, a sulfonamide group, an imide group and a group having a coordinating oxygen atom.

20. The dispersion composition according to claim 1, wherein $A^1$ in Formula (1) is a monovalent substituent having at least one functional group with a pKa of 5 or more.

21. The dispersion composition according to claim 20, wherein the functional group with a pKa of 5 or more is a group having a coordinating oxygen atom, a group having a basic nitrogen atom, a phenol group, a urea group, a urethane group, an alkyl group, an aryl group, an alkyloxycarbonyl group, an alkyl amino carbonyl group, a group having an alkyleneoxy chain, an imide group, a carboxylate group, a sulfonamide group, a hydroxyl group or a heterocyclic group.

22. The dispersion composition according to claim 1, wherein $R^1$ in Formula (1) is a group represented by any one of the following Formulae:

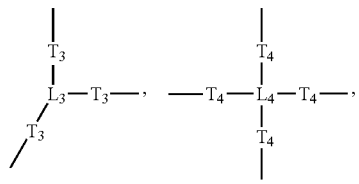

-continued

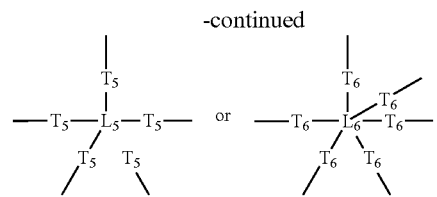

wherein, in the above Formulae, $L_3$ represents a trivalent group $T_3$ represents a single bond or a divalent linking group, and three $T_3$'s may be the same or different, $L_4$ represents a tetravalent group, $T_4$ represents a single bond or a divalent linking group, and four $T_4$'s may be the same or different, $L_5$ represents a pentavalent group, $T_5$ represents a single bond or a divalent linking group, and five $T_5$'s may be the same or different, $L_6$ represents a hexavalent group, and $T_6$ represents a single bond or a divalent linking group, and six $T_6$'s may be the same or different.

* * * * *